US006927455B2

(12) United States Patent
Narazaki

(10) Patent No.: US 6,927,455 B2
(45) Date of Patent: Aug. 9, 2005

(54) POWER SEMICONDUCTOR DEVICE HAVING SEMICONDUCTOR-LAYER-FORMING POSITION CONTROLLED BY ION IMPLANTATION WITHOUT USING PHOTORESIST PATTERN, AND METHOD OF MANUFACTURING SUCH POWER SEMICONDUCTOR DEVICE

(75) Inventor: Atsushi Narazaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/437,062

(22) Filed: May 14, 2003

(65) Prior Publication Data

US 2004/0124464 A1 Jul. 1, 2004

(30) Foreign Application Priority Data

Dec. 25, 2002 (JP) ...................................... 2002-374582

(51) Int. Cl.[7] ................................................ H01L 29/76

(52) U.S. Cl. ....................... 257/341; 257/328; 257/329; 257/330; 257/332; 257/344; 257/365

(58) Field of Search ................................ 257/341, 328, 257/329, 330, 332, 344, 345; 438/197, 212, 226, 270

(56) References Cited

U.S. PATENT DOCUMENTS 4,135,955 A * 1/1979 Gasner et al. .............. 438/227
5,801,417 A * 9/1998 Tsang et al. ................ 257/333
6,188,105 B1 * 2/2001 Kocon et al. ............... 257/330
6,627,950 B1 * 9/2003 Bulucea et al. ............. 257/329

FOREIGN PATENT DOCUMENTS

WO WO99/12214 3/1999

OTHER PUBLICATIONS

S. Wolf, "Silicon Processing for the VLSI Era, vol. 2—Process Integration," Lattice Press, Sunset Beach, CA (1990), pp. 5–6.*

* cited by examiner

*Primary Examiner*—Eddie Lee
*Assistant Examiner*—Thomas Magee
(74) *Attorney, Agent, or Firm*—Oblon, Spivak, McClelland, Maier & Neustadt, P.C.

(57) ABSTRACT

A first insulator (710) having an opening within a central region (551) is formed on a main surface (61S) of an epitaxial layer (610). Then, p-type impurities are ion implanted through the opening of the first insulator (710) and then heat treatment is carried out, thereby to form a p base layer (621) in the main surface (61S). An insulating film is formed to fill in the opening and then etched back, thereby to form a second insulator (720) on a side surface (71W) of the first insulator (710). Under conditions where the second insulator (720) is present, n-type impurities are ion implanted through the opening and then heat treatment is carried out, thereby to form an $n^+$ source layer (630) in the main surface (61S) of the p base layer (621).

28 Claims, 136 Drawing Sheets

F I G . 1
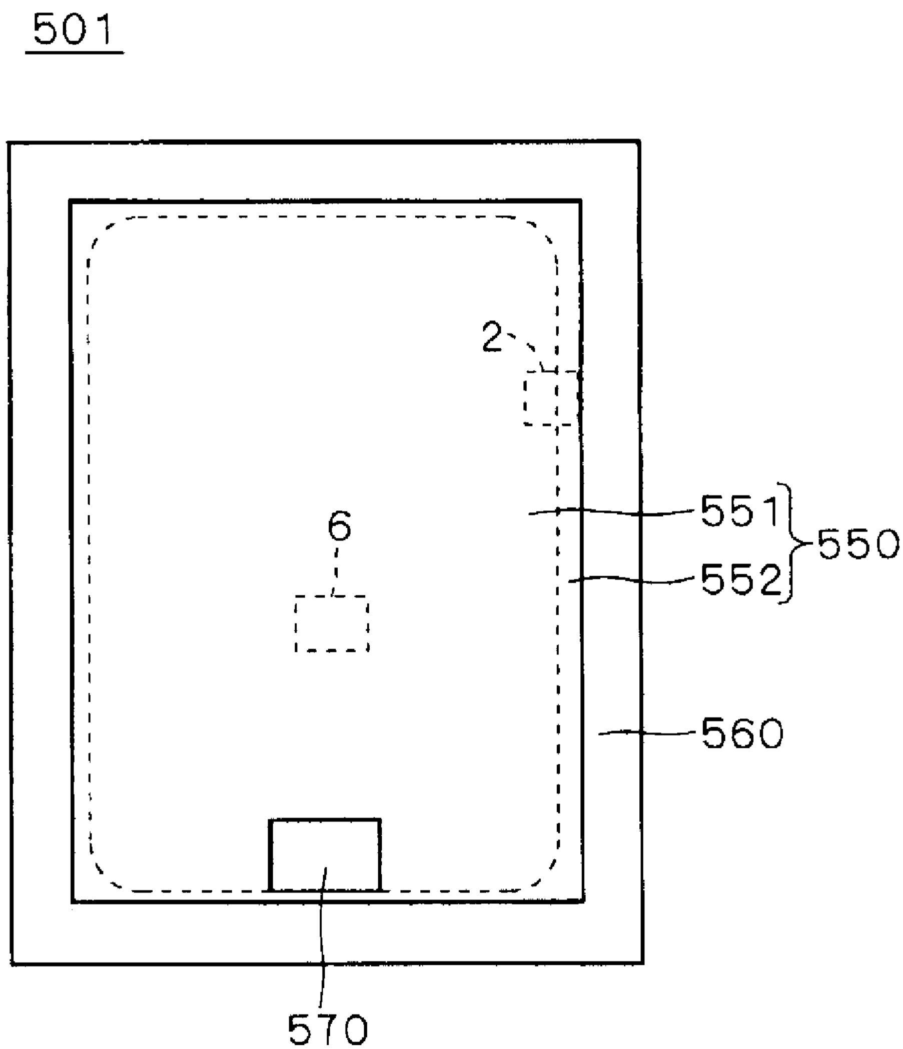

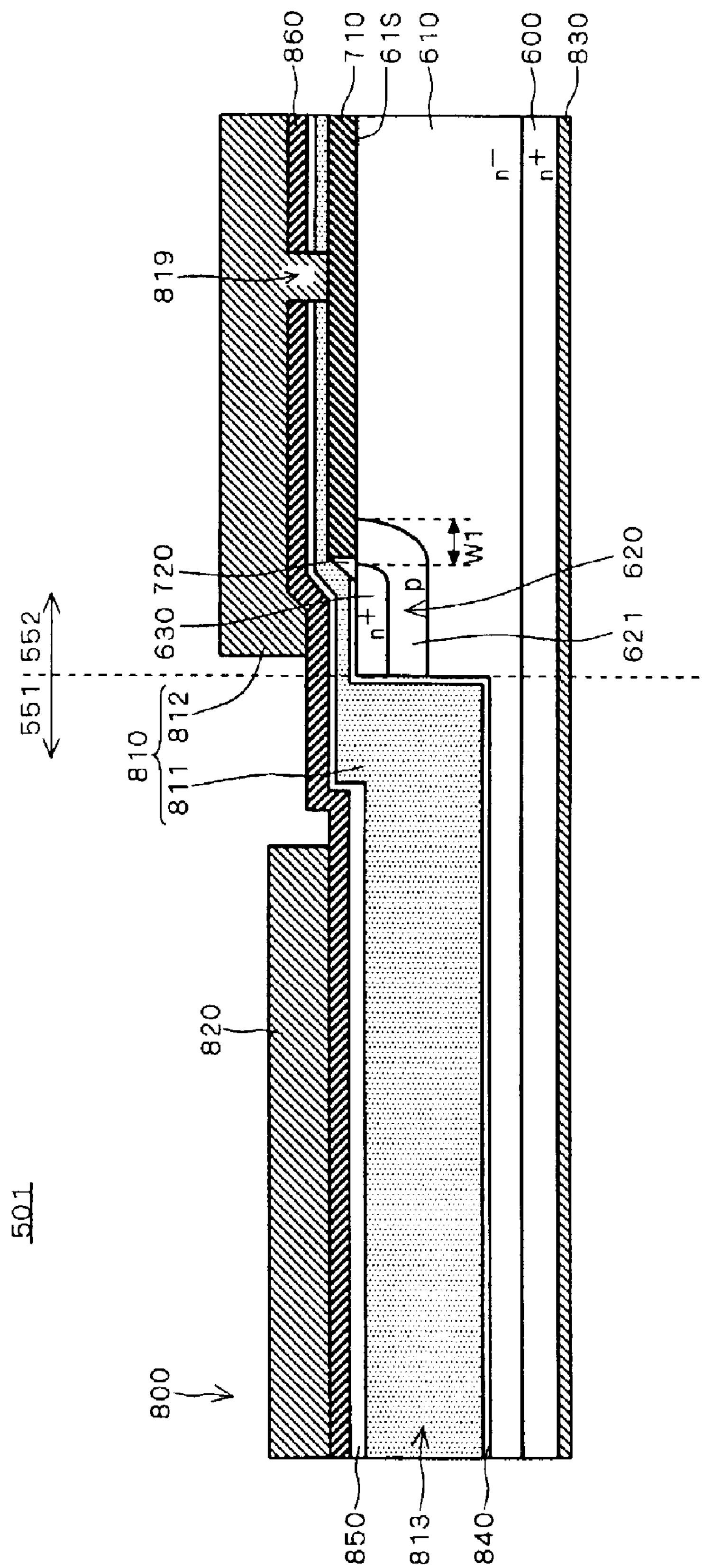
F I G . 3

F I G . 5
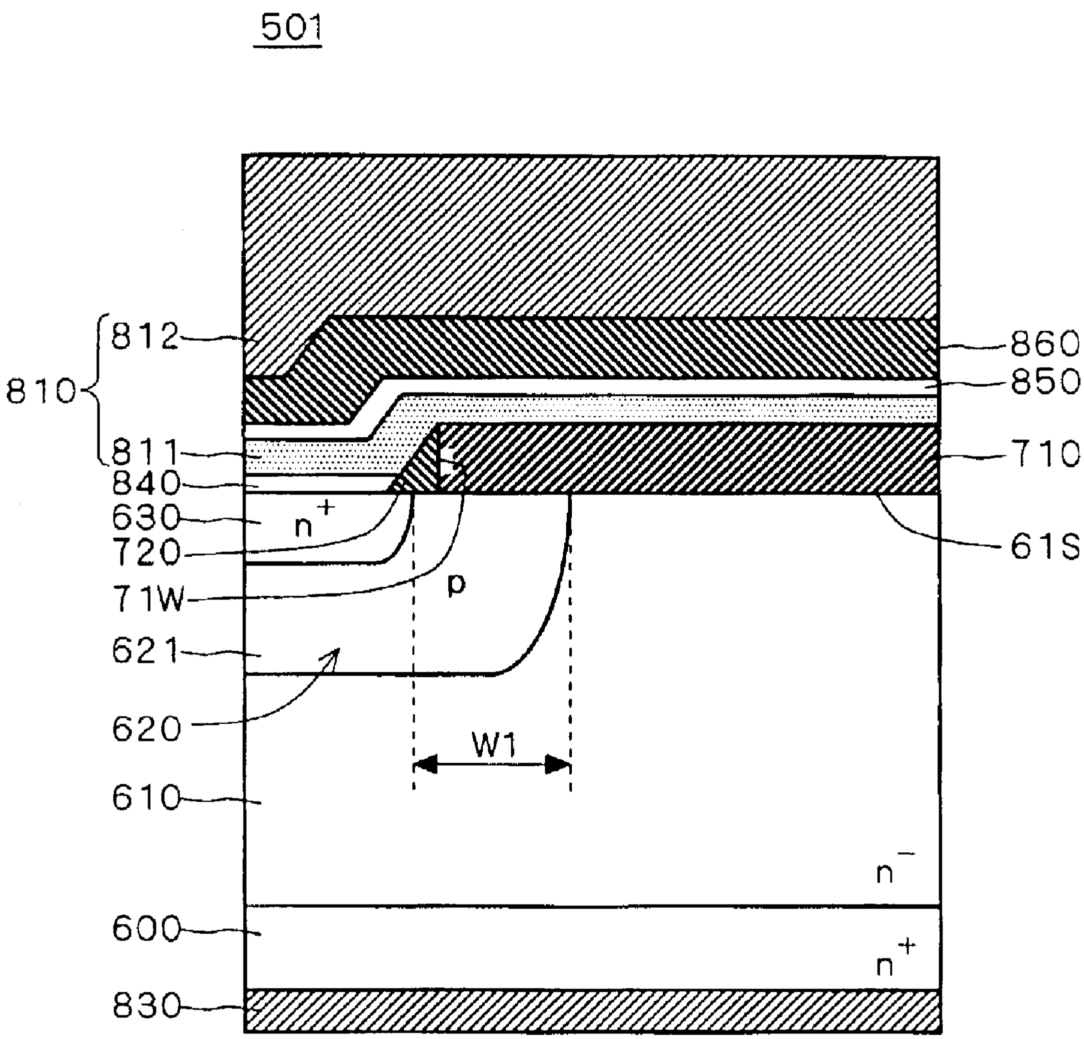

F I G . 6
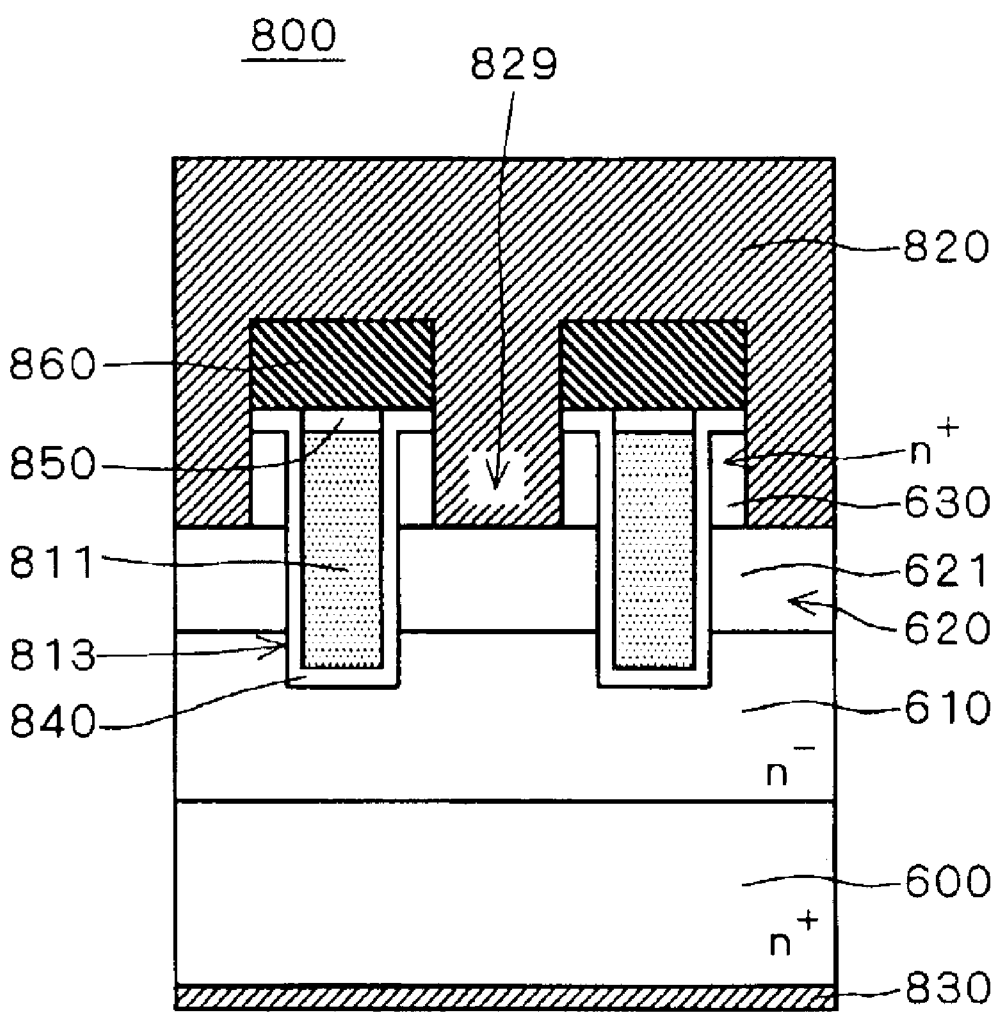

F I G . 3 5 A
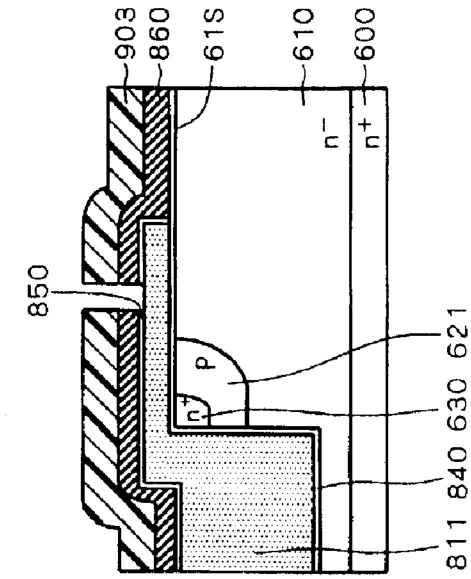
F I G . 3 5 B
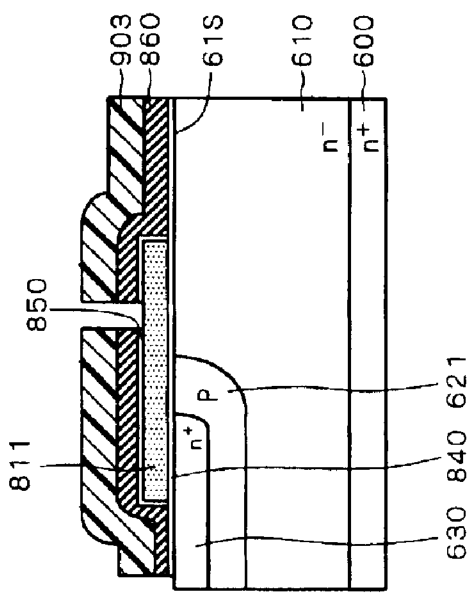
F I G . 3 5 C
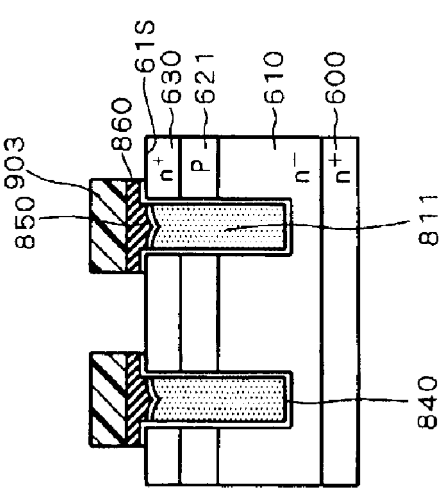

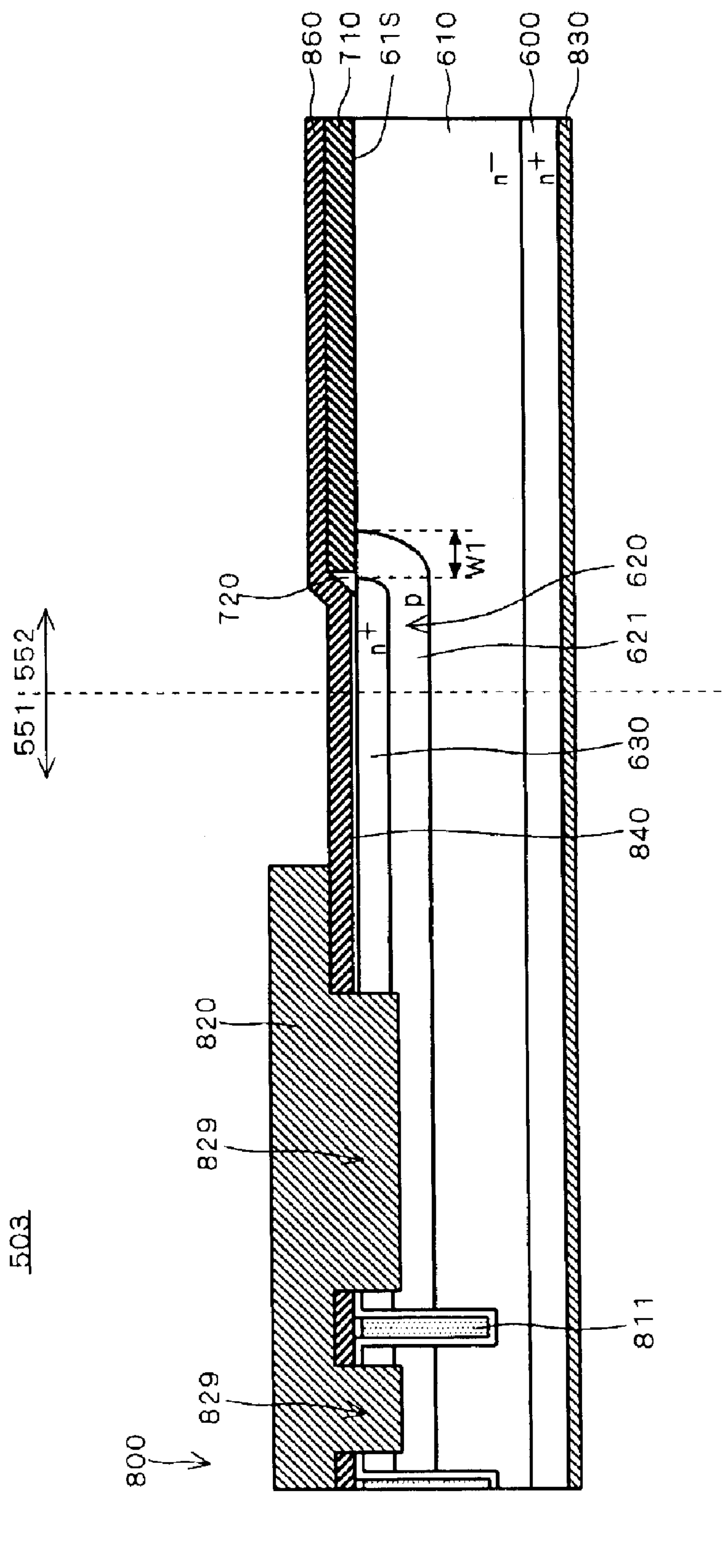
F I G . 4 1

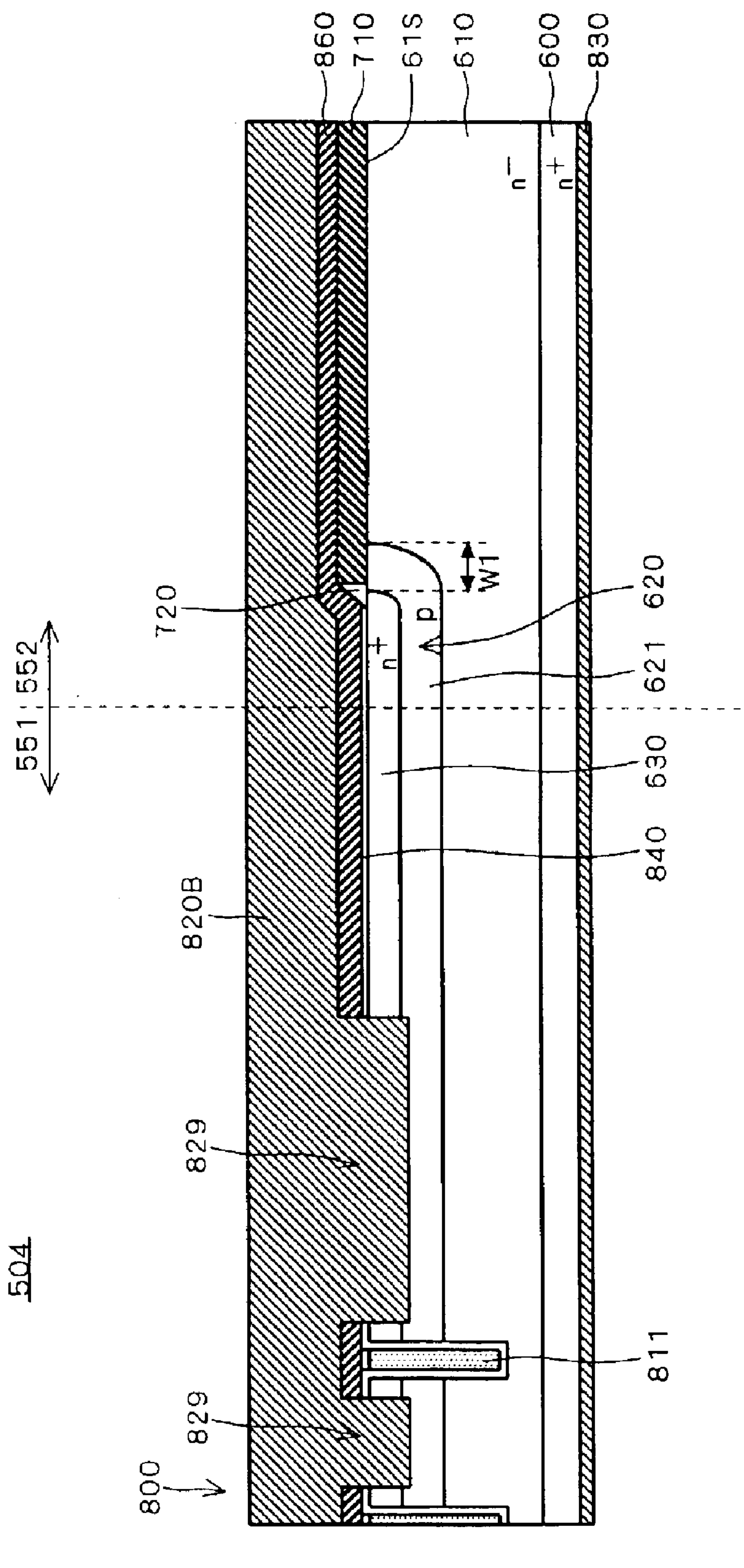
F I G . 4 4

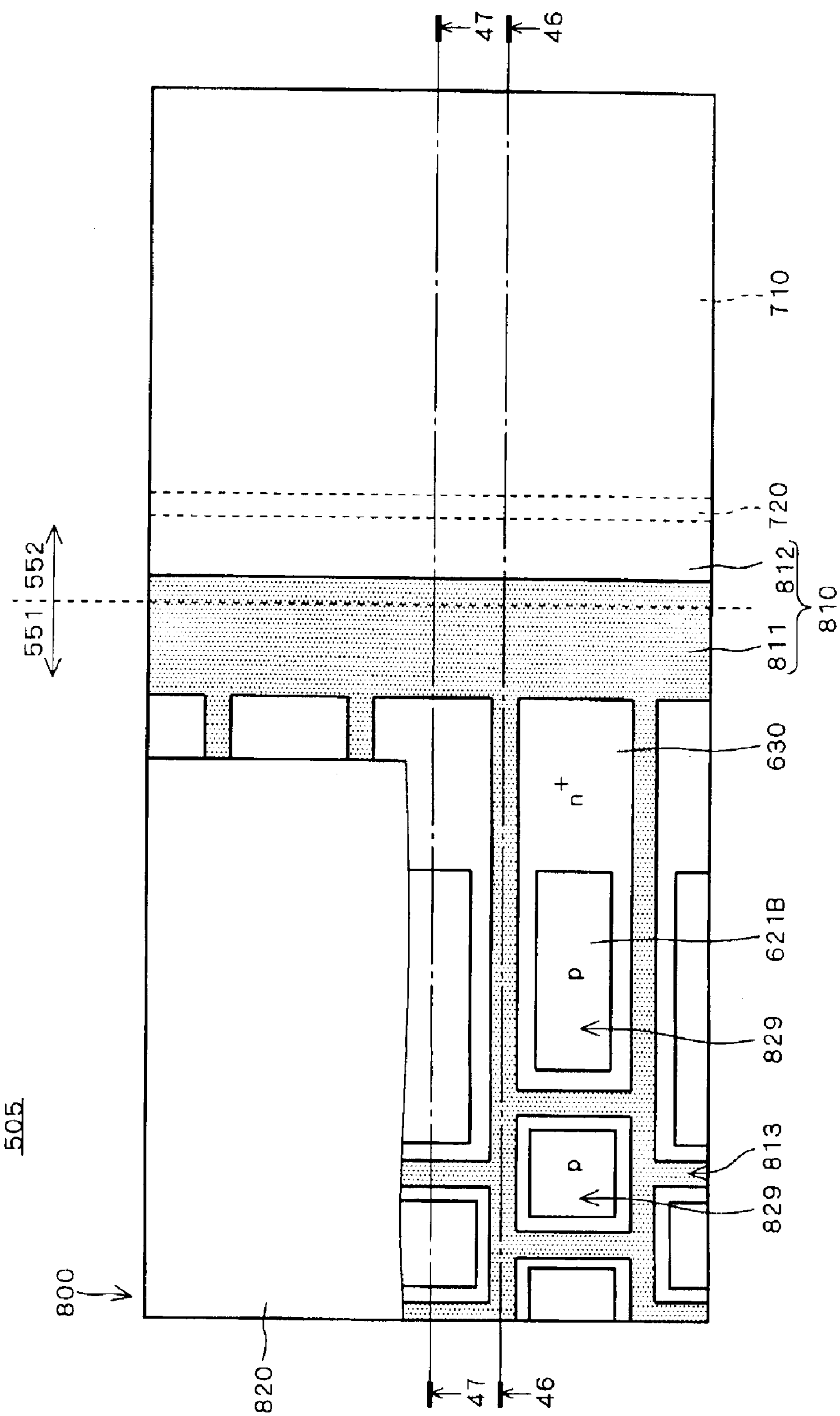
F I G . 4 5

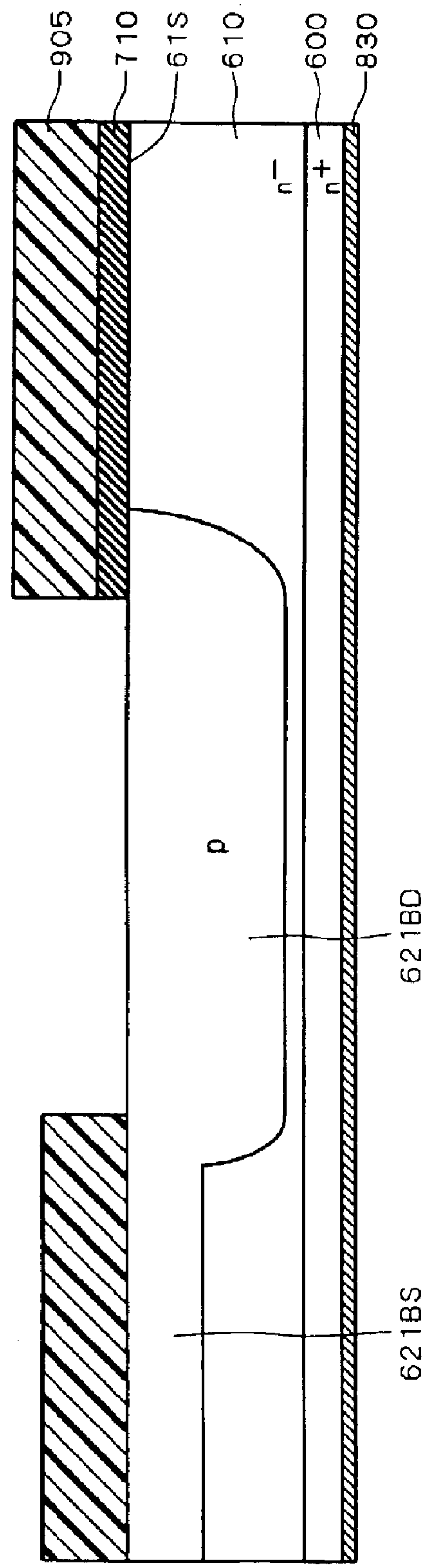
F I G . 4 8

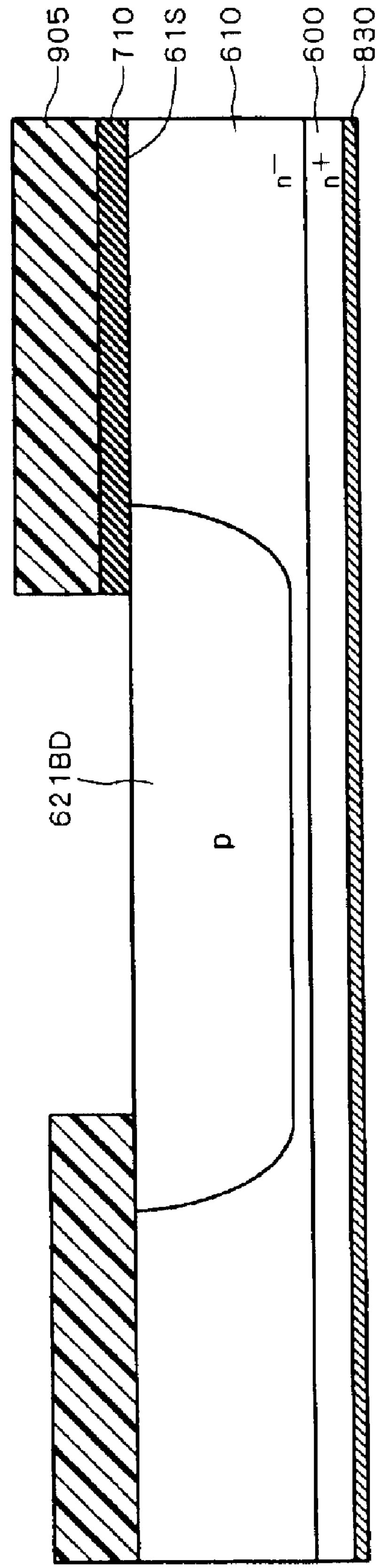
F I G . 4 9

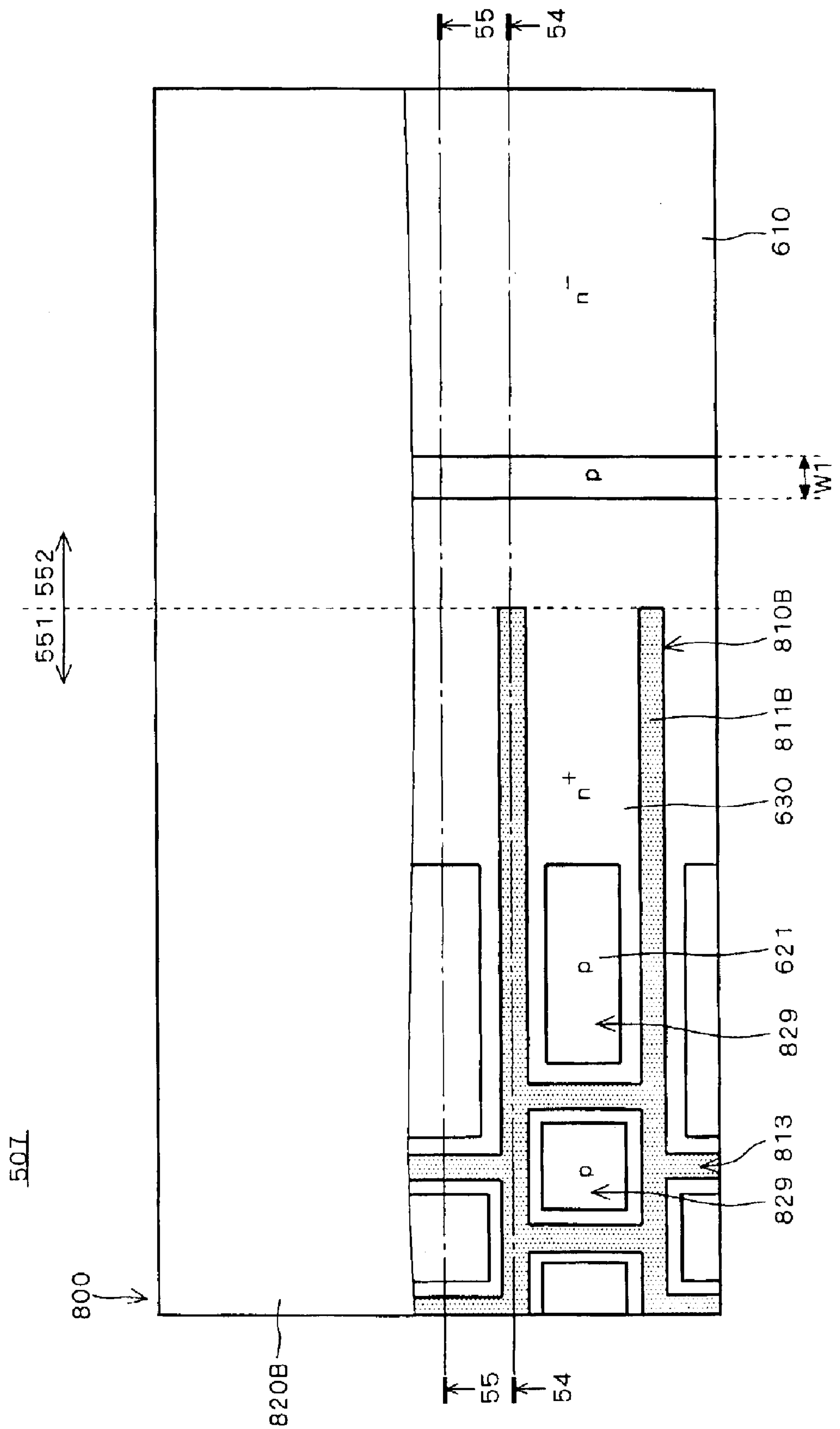
F I G . 5 3

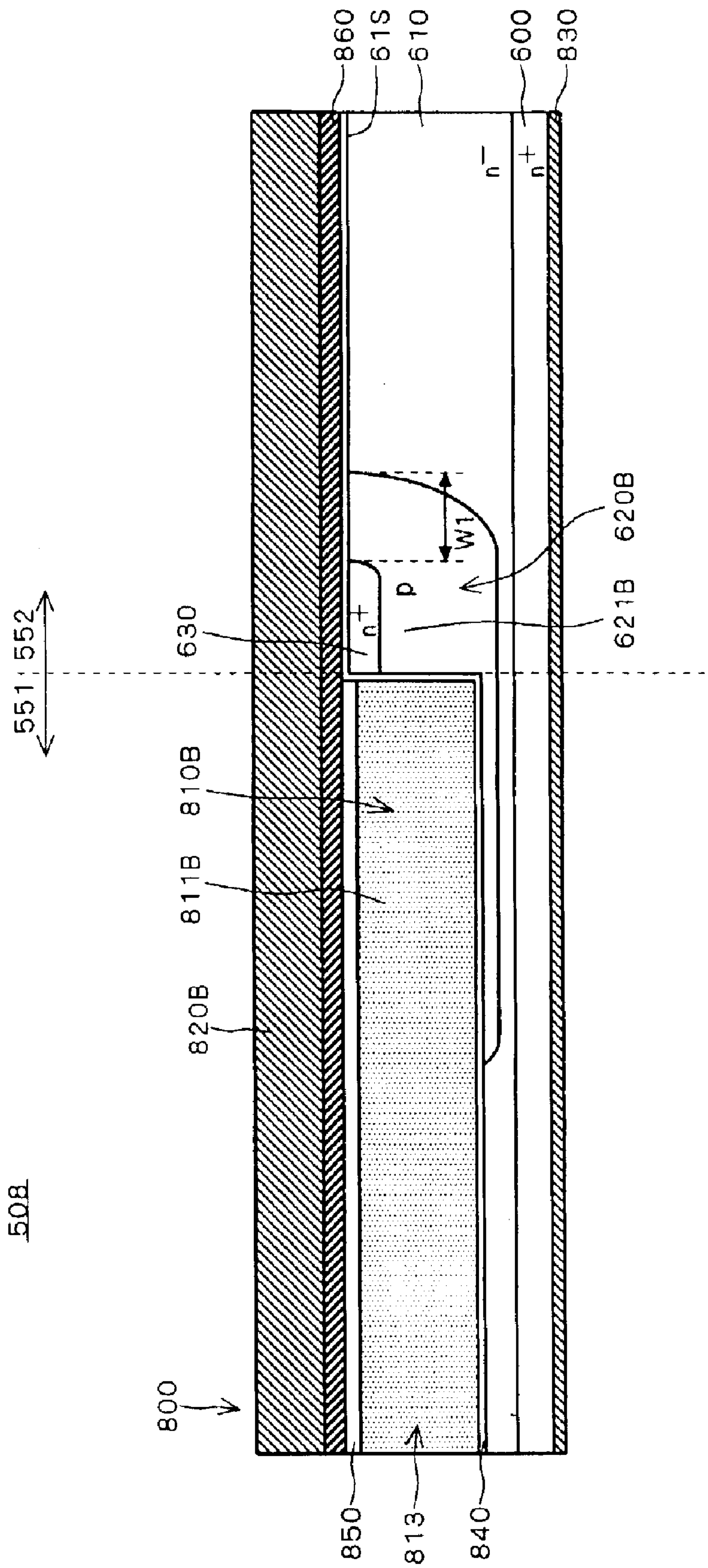
F I G . 5 7

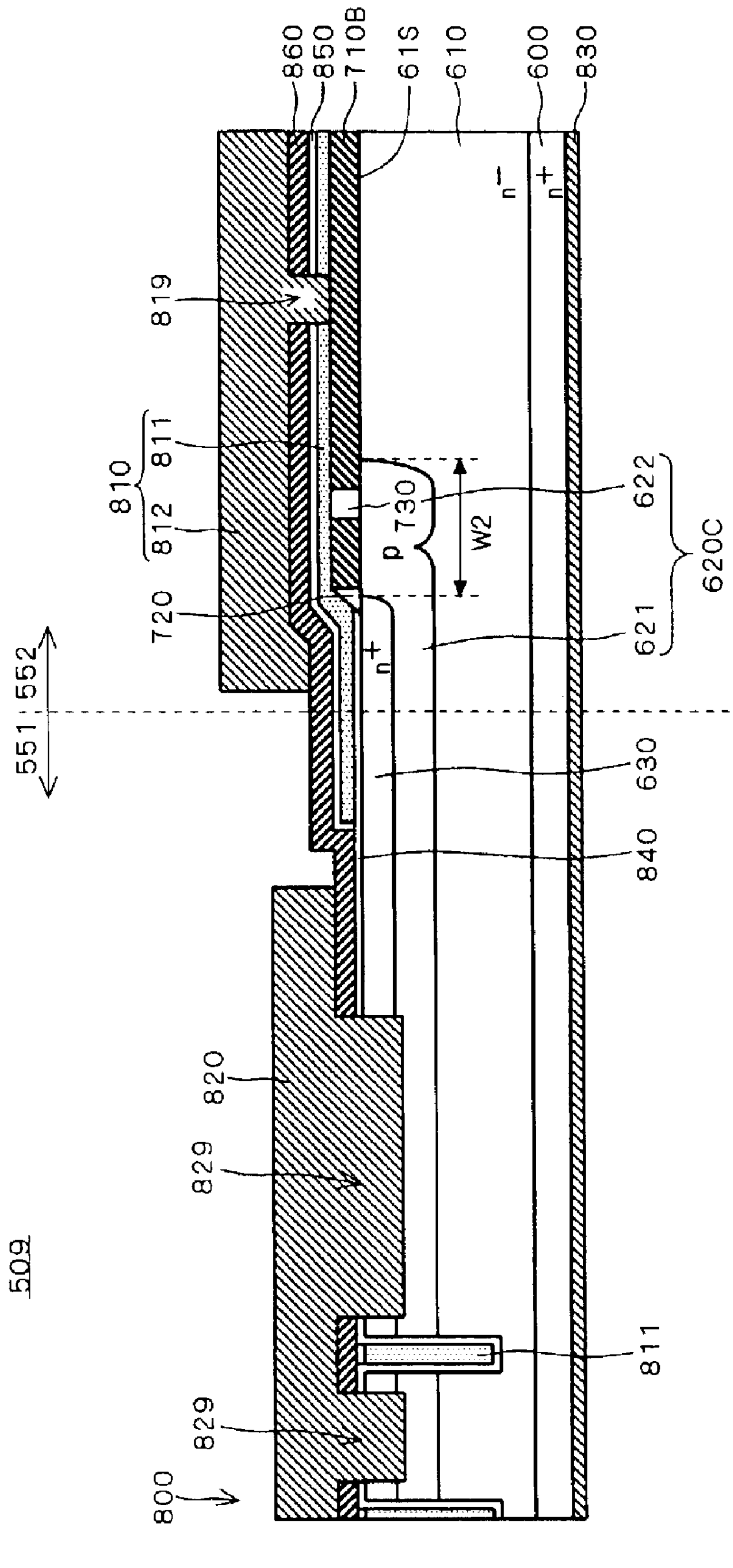
F I G . 6 1

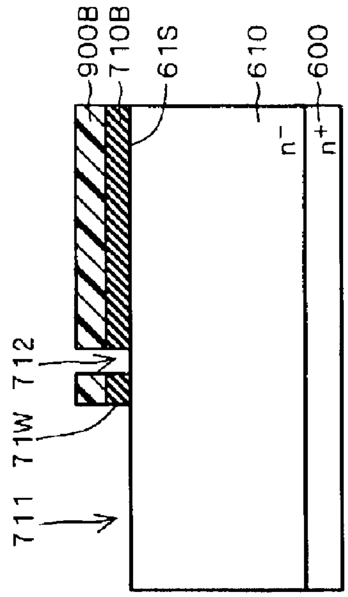
F I G . 6 3 A
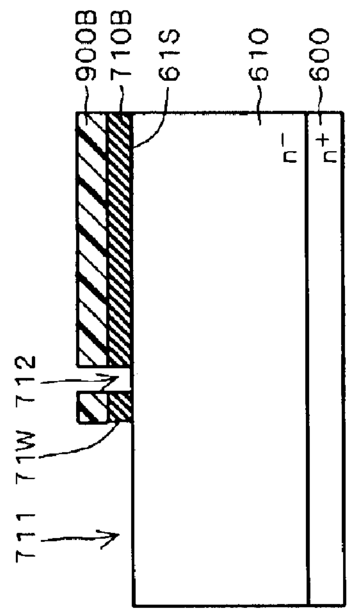
F I G . 6 3 B
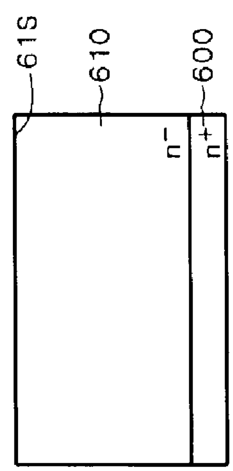
F I G . 6 3 C

510

F I G . 9 3
511
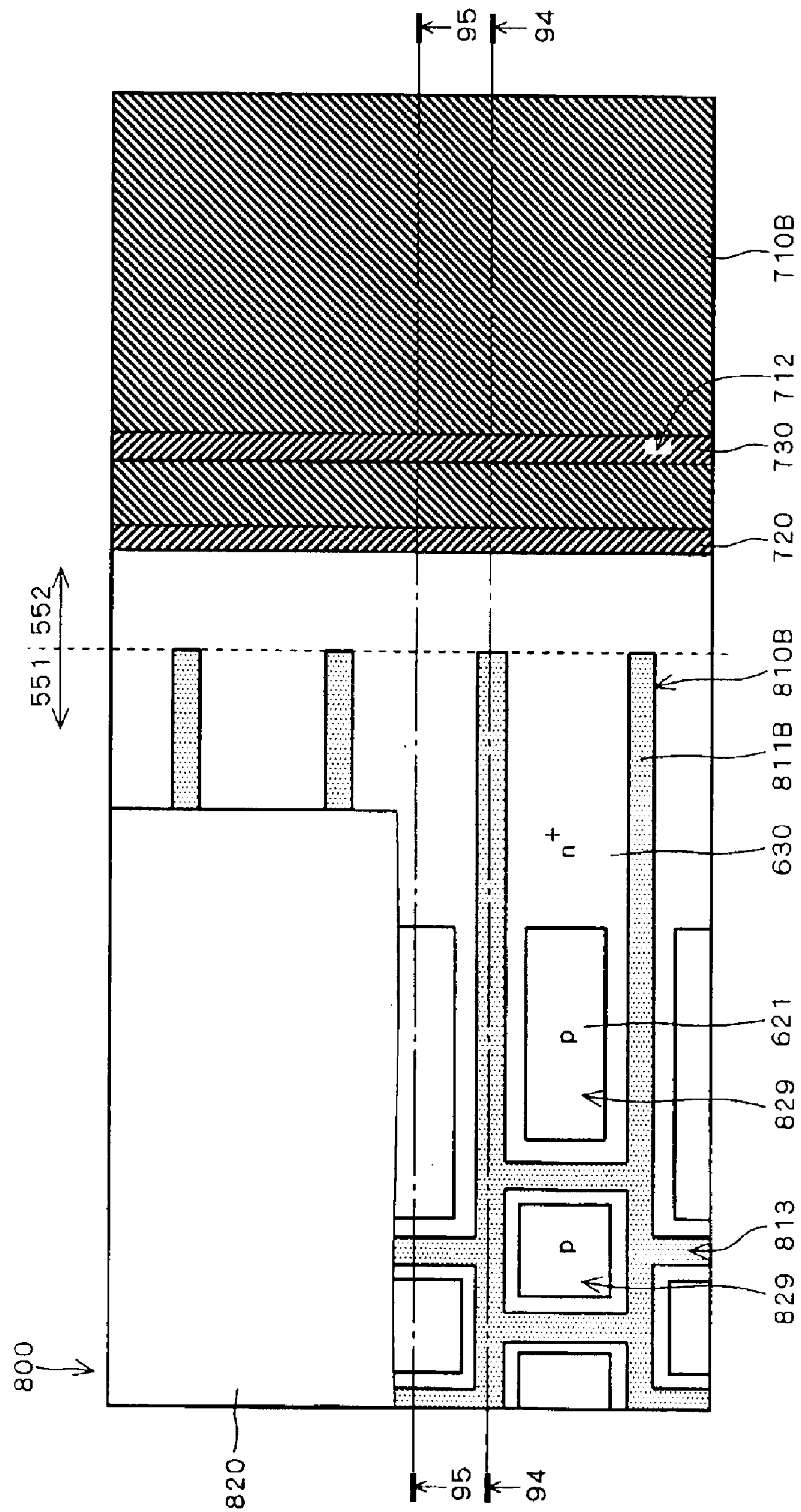

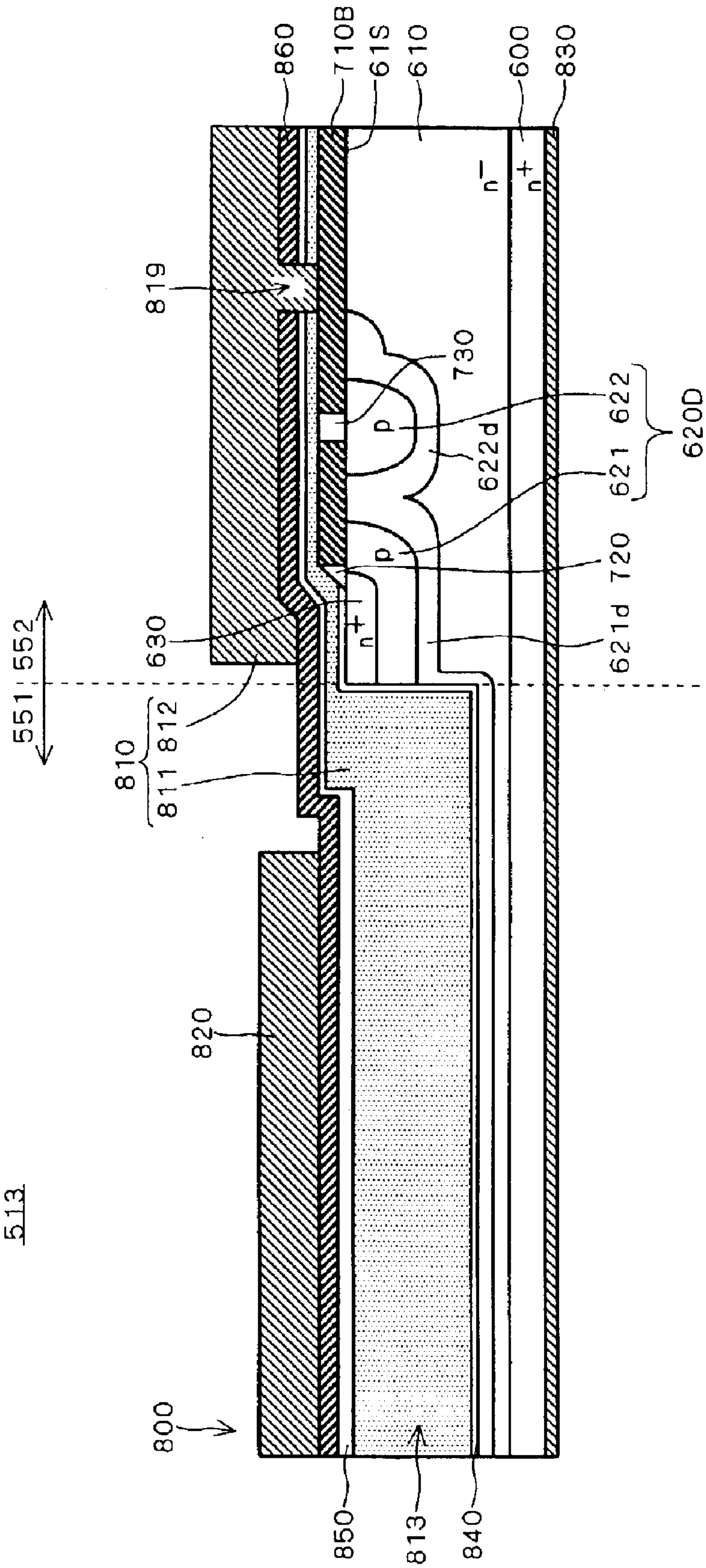
F I G . 1 0 0

F I G . 1 0 2
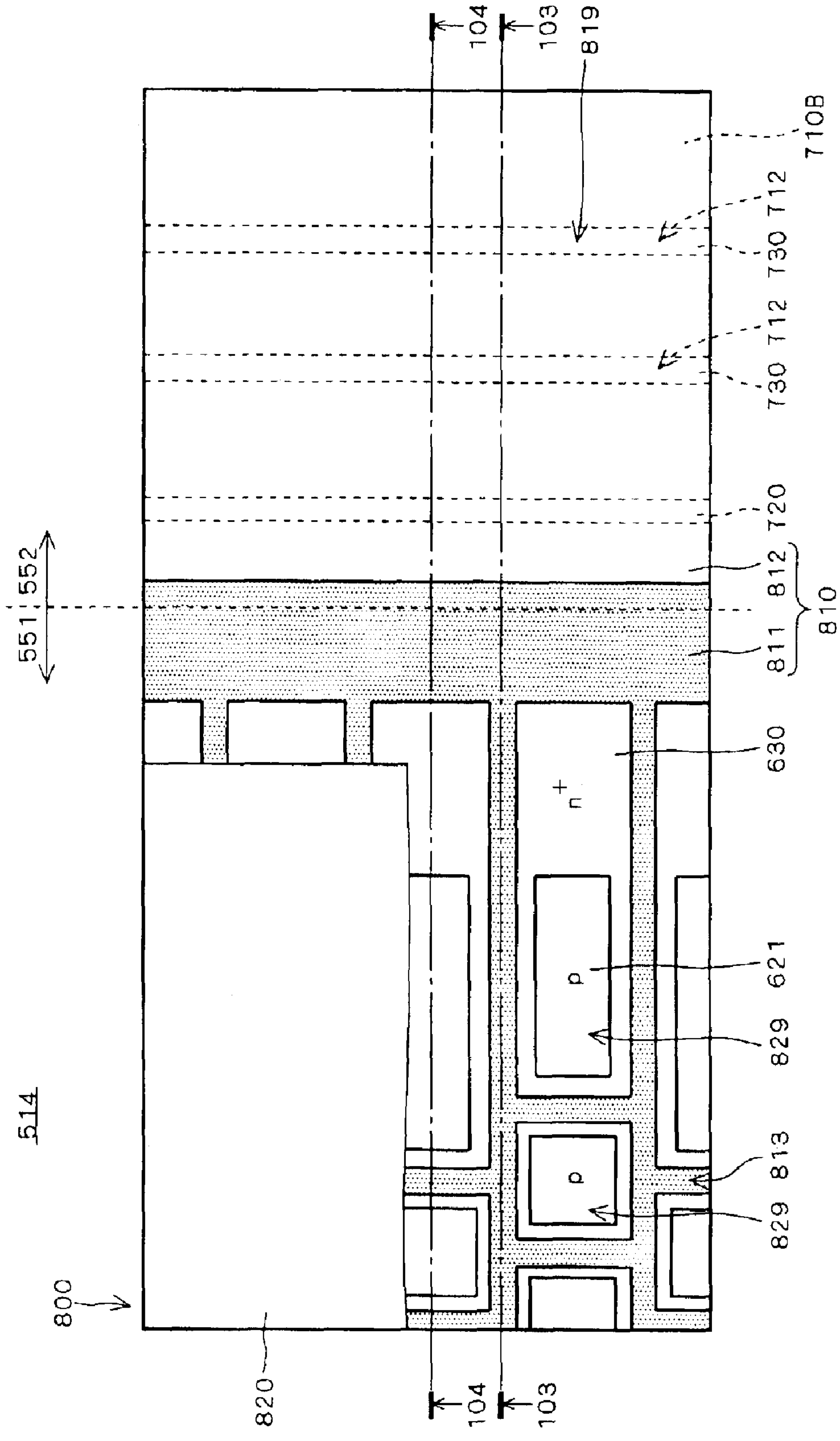

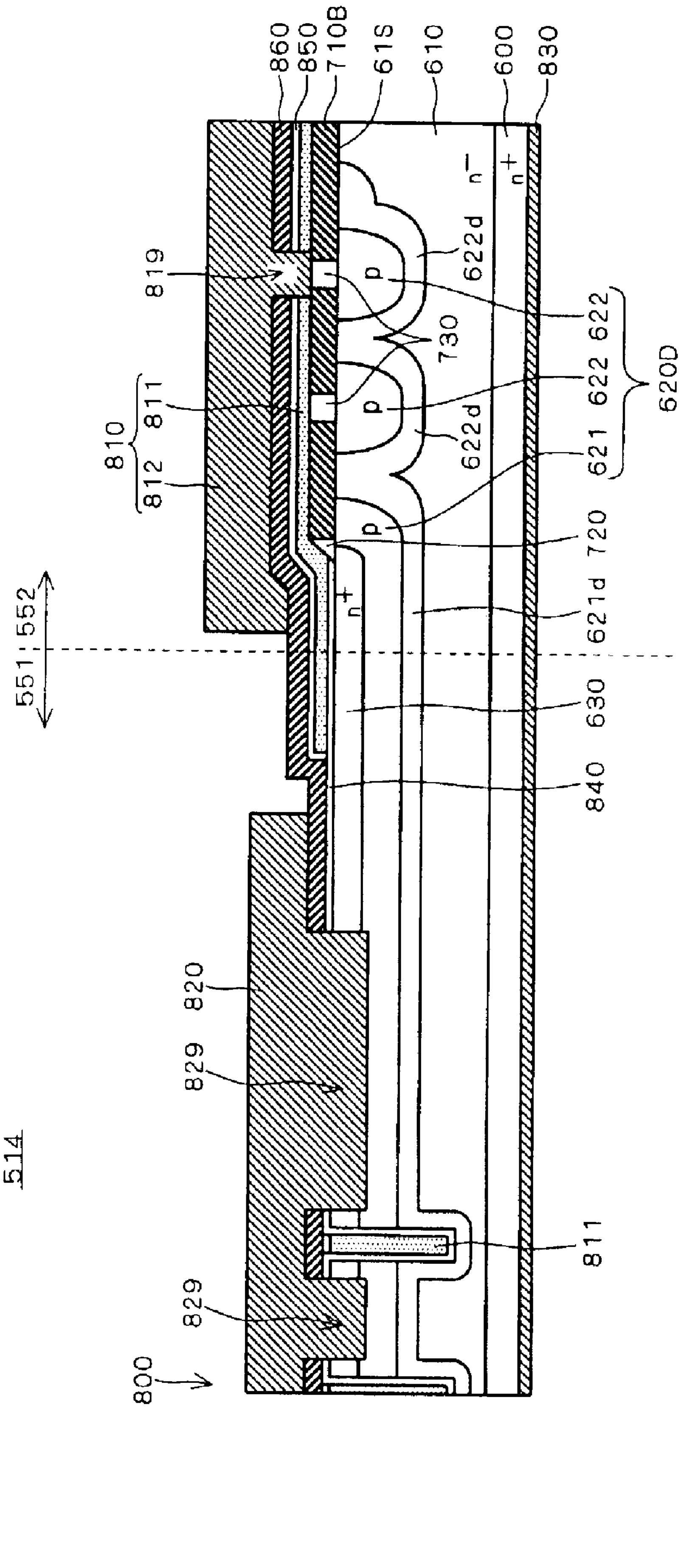
F I G . 1 0 4
514

515

F I G . 1 0 7
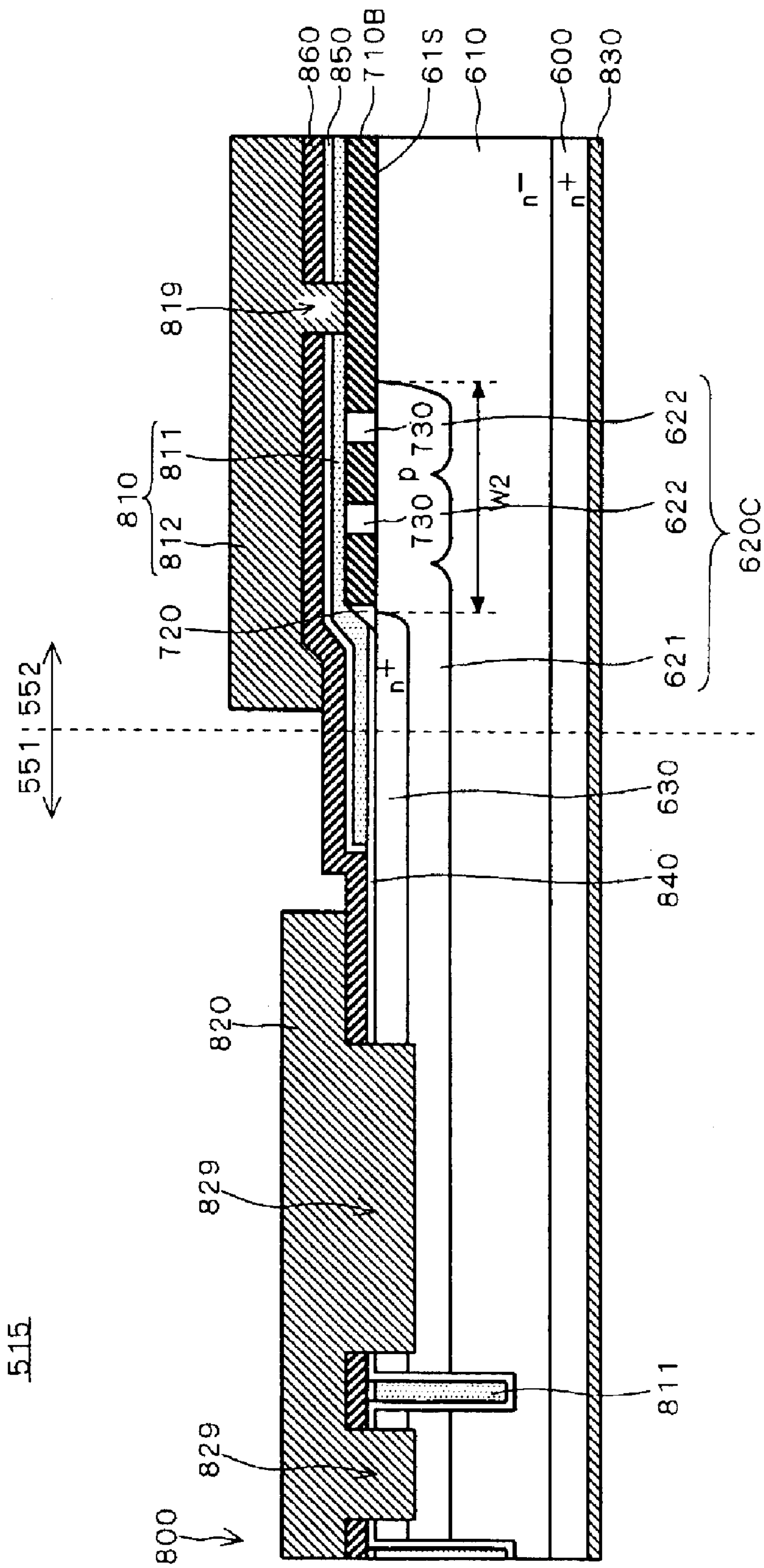

F I G . 1 0 8
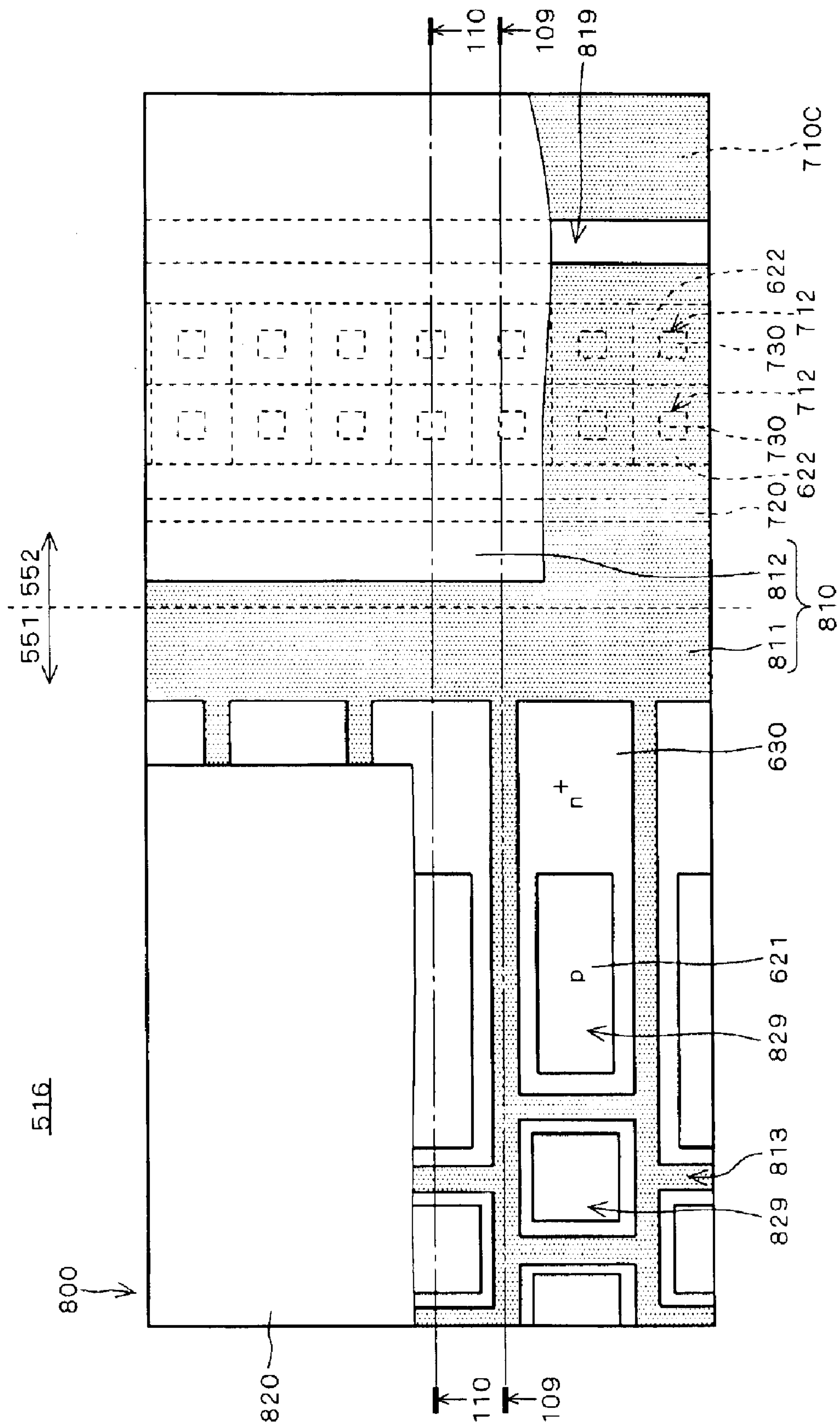

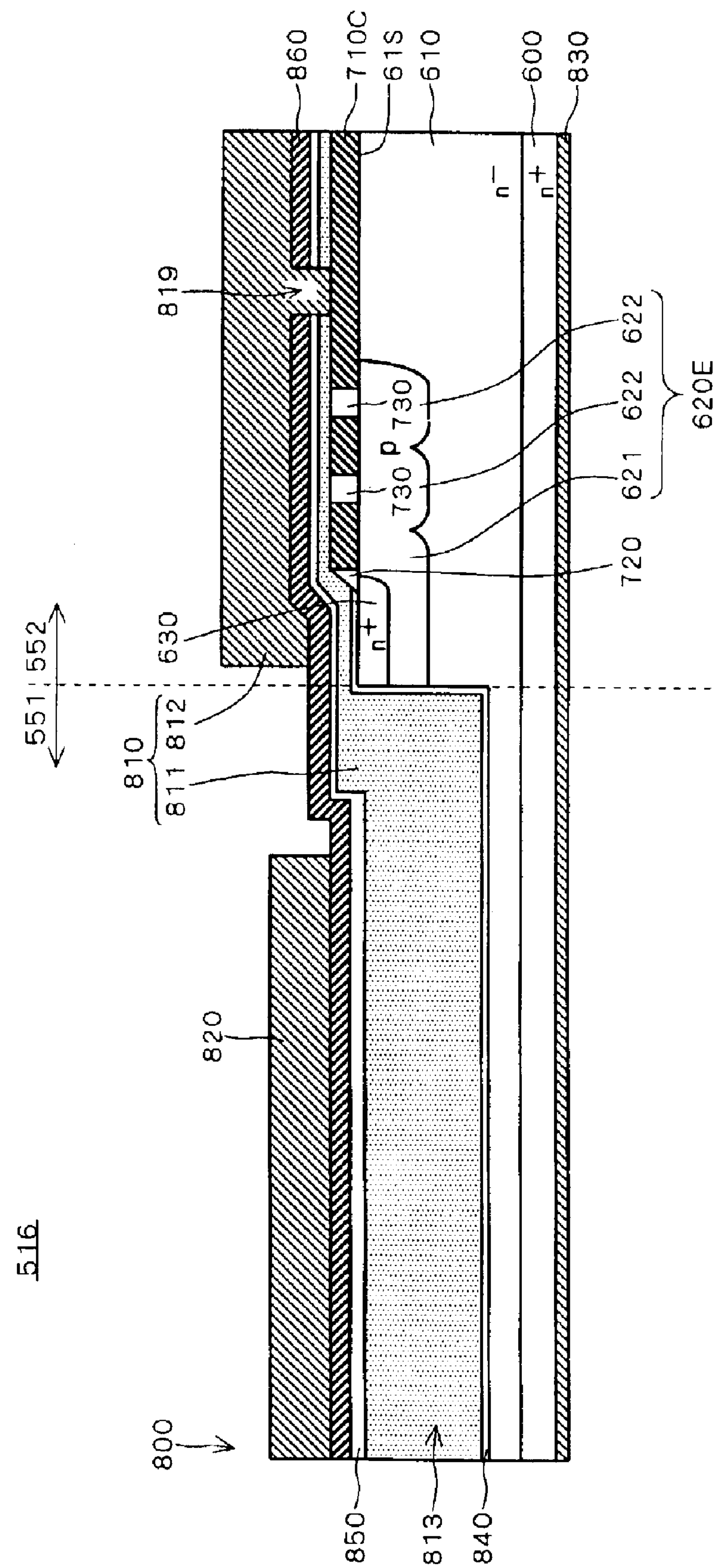
F I G . 1 0 9

F I G . 1 1 1
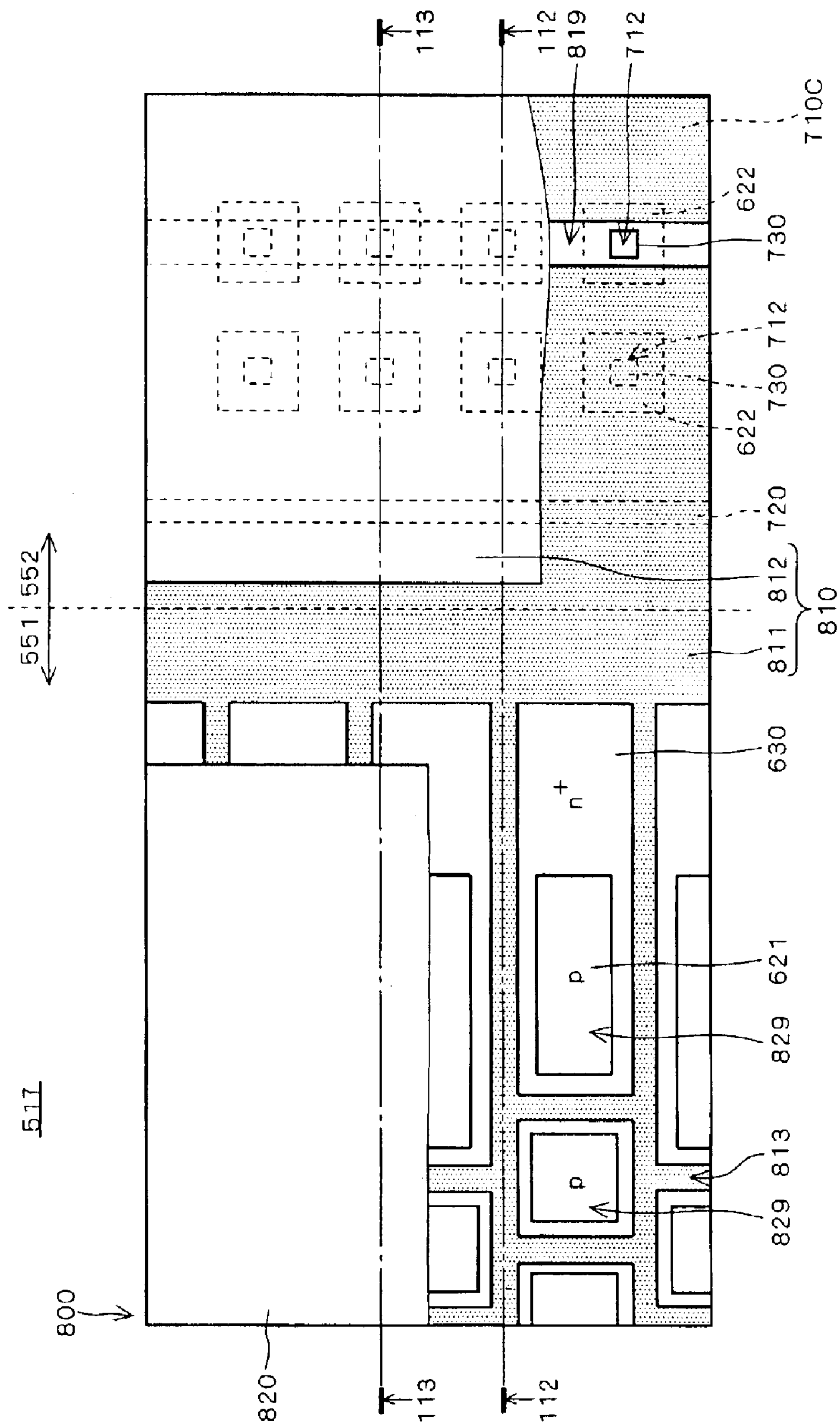

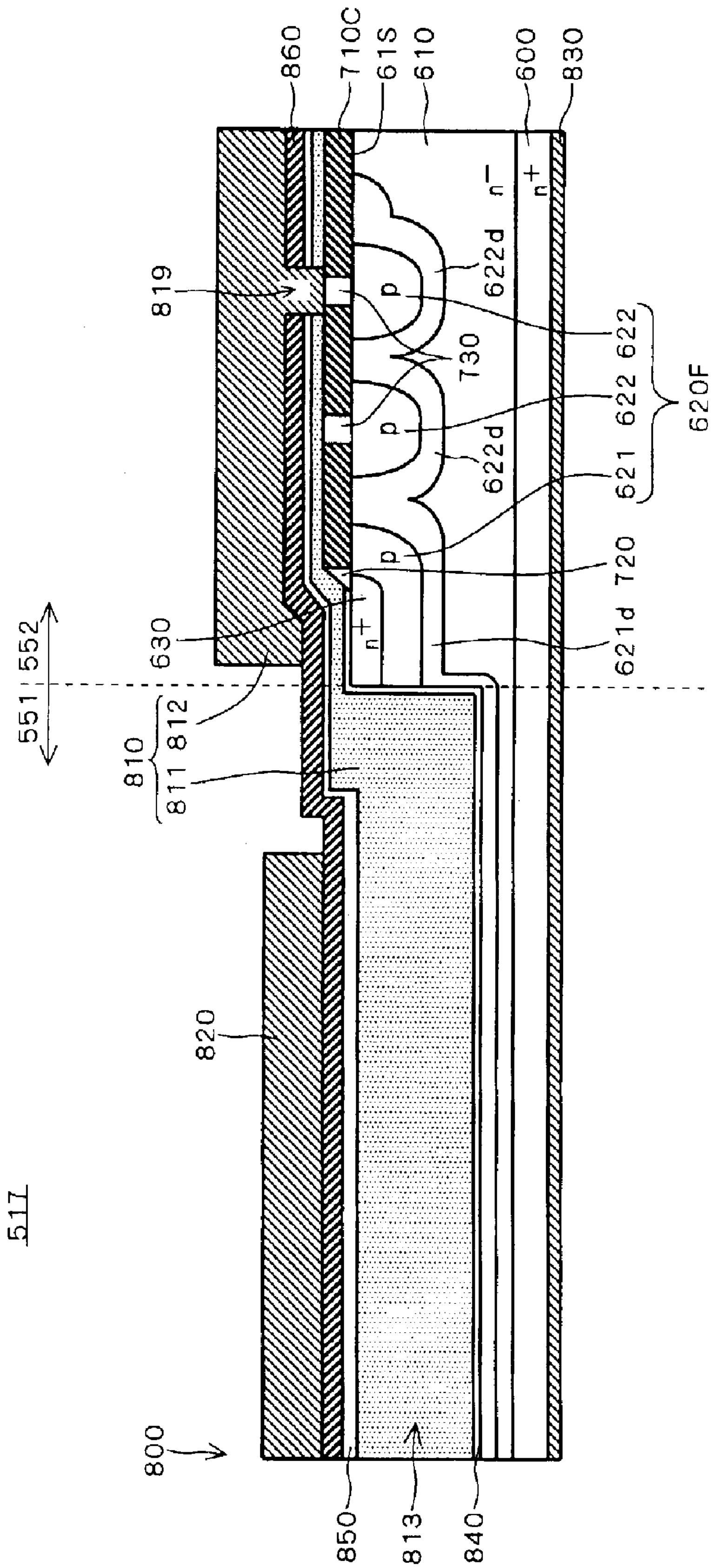
F I G . 1 1 2

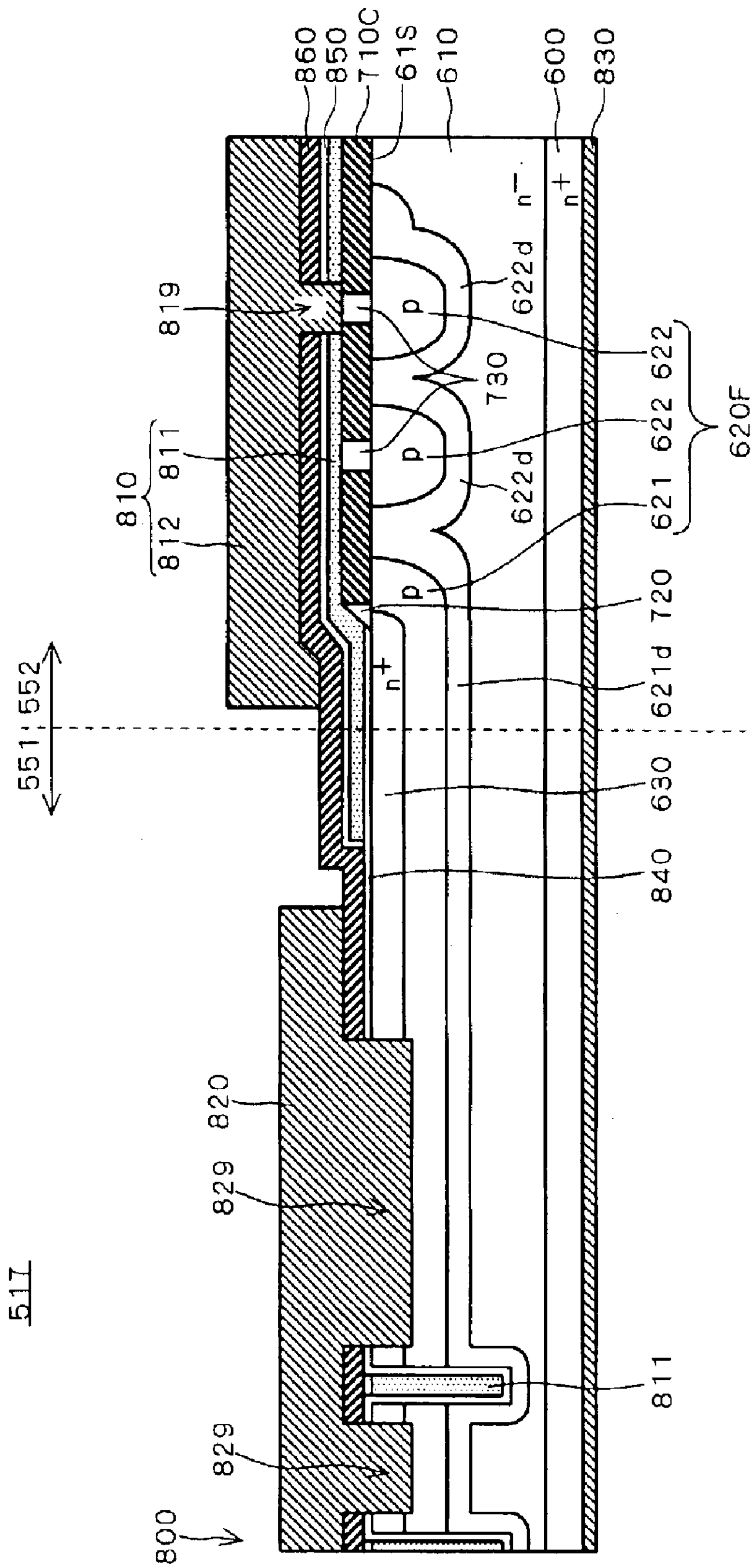
F I G . 1 1 3

F I G . 1 1 8
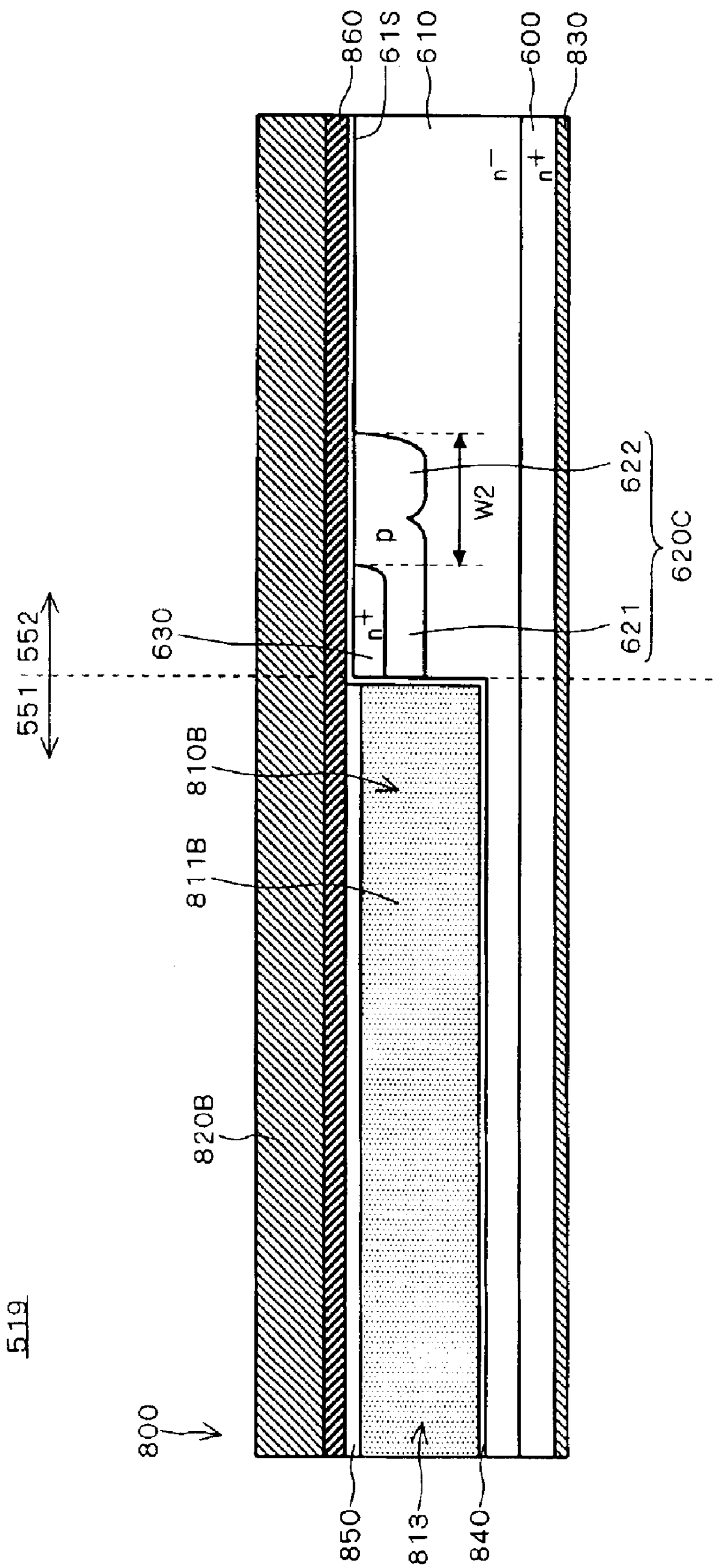

F I G . 1 1 9
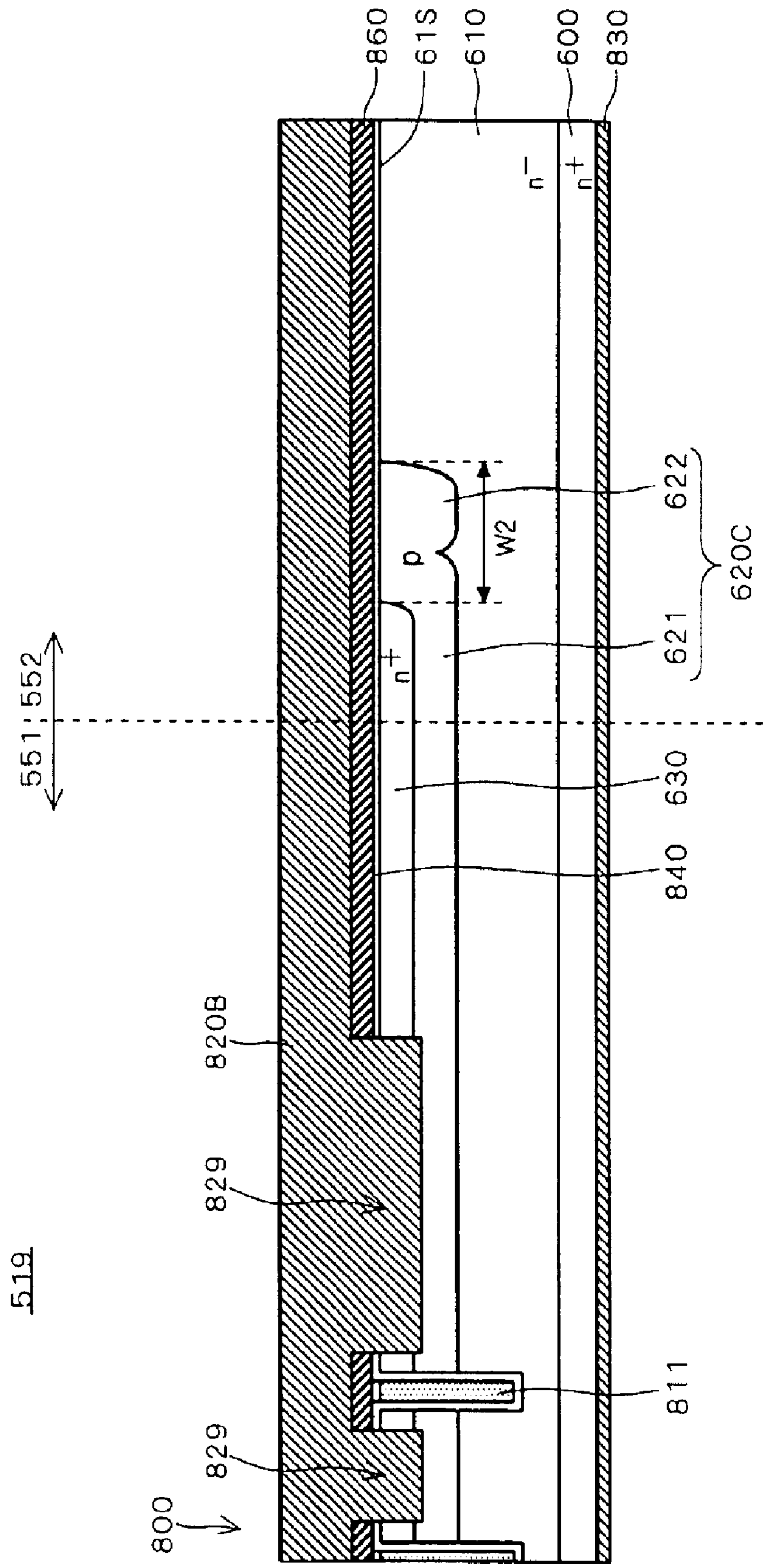

F I G . 1 2 3
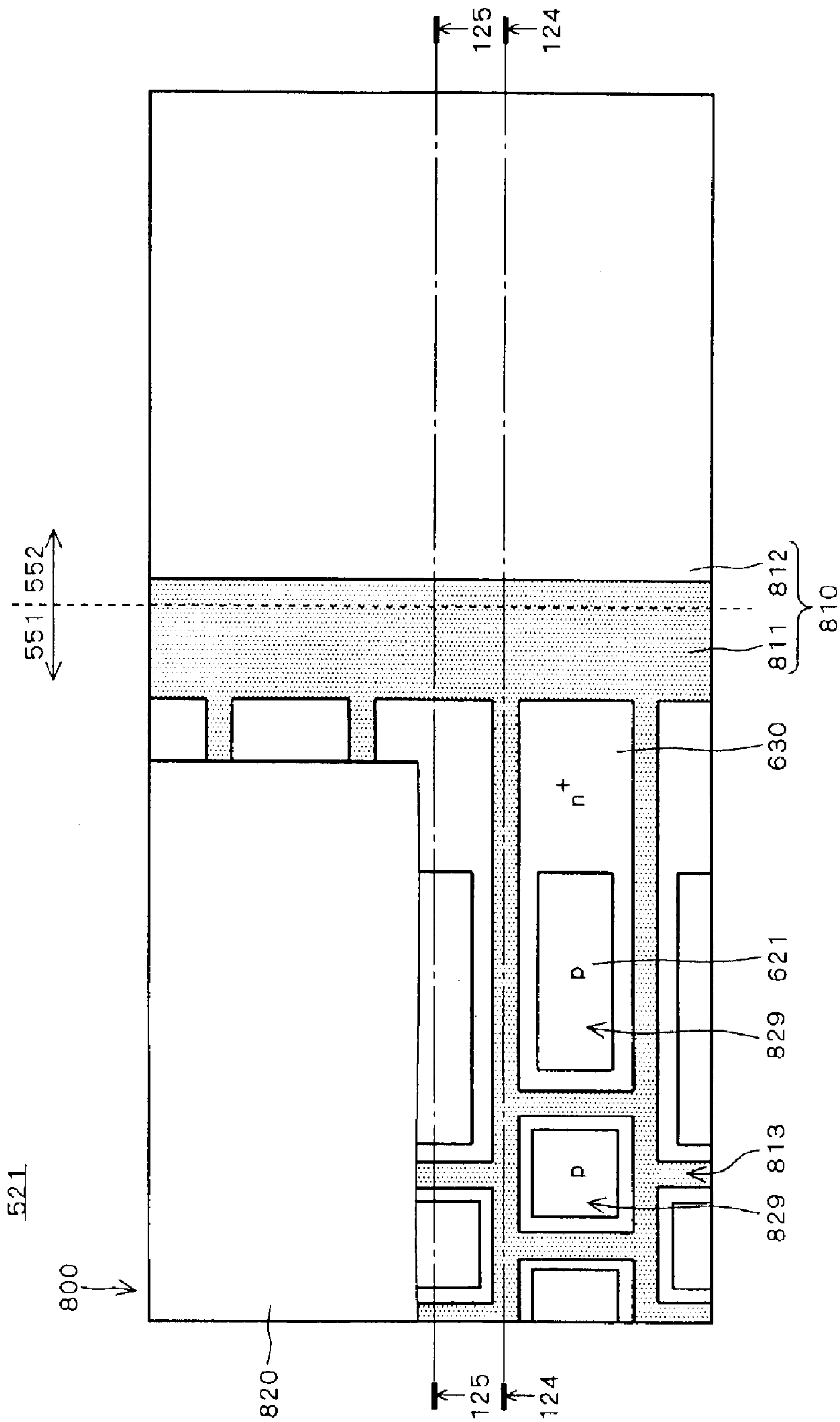

F I G . 1 2 4
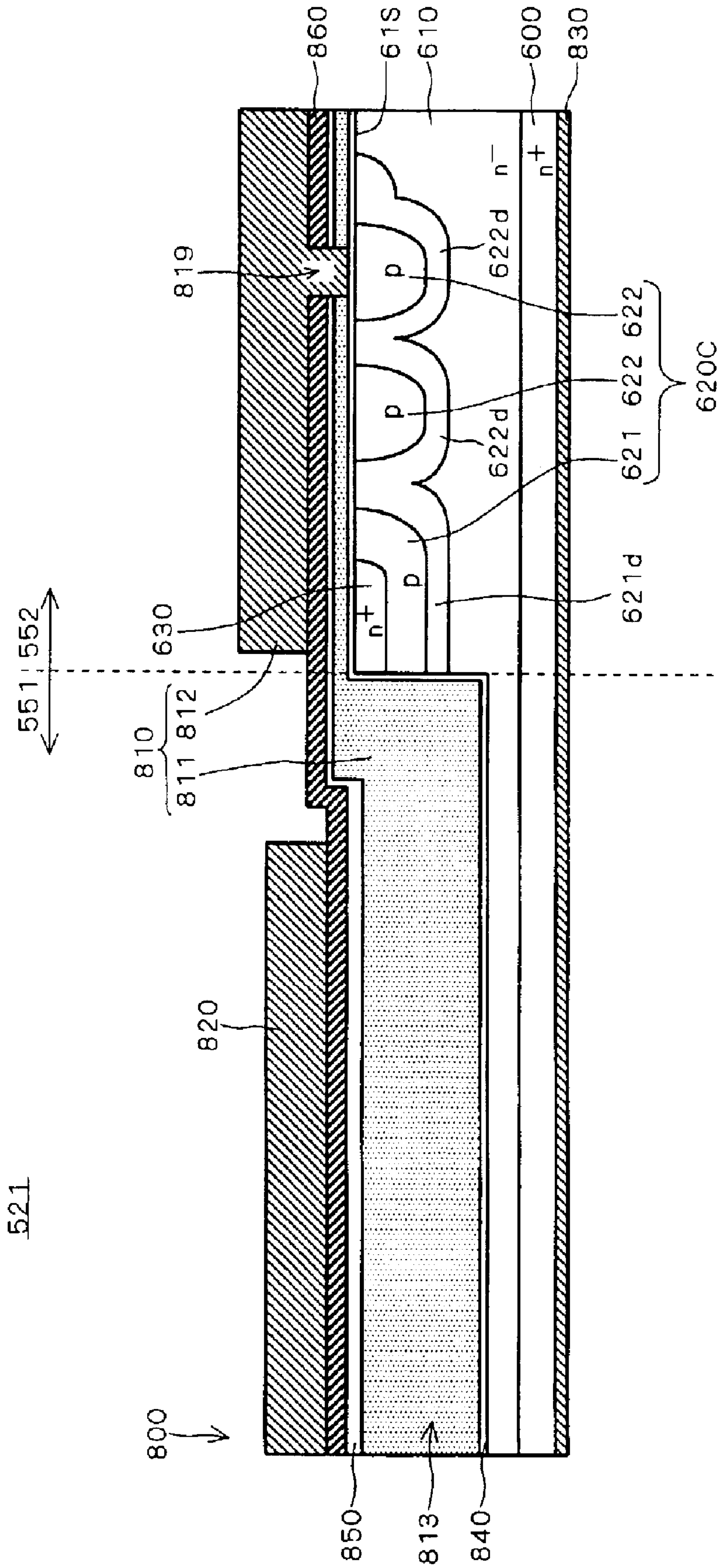

F I G . 1 2 6
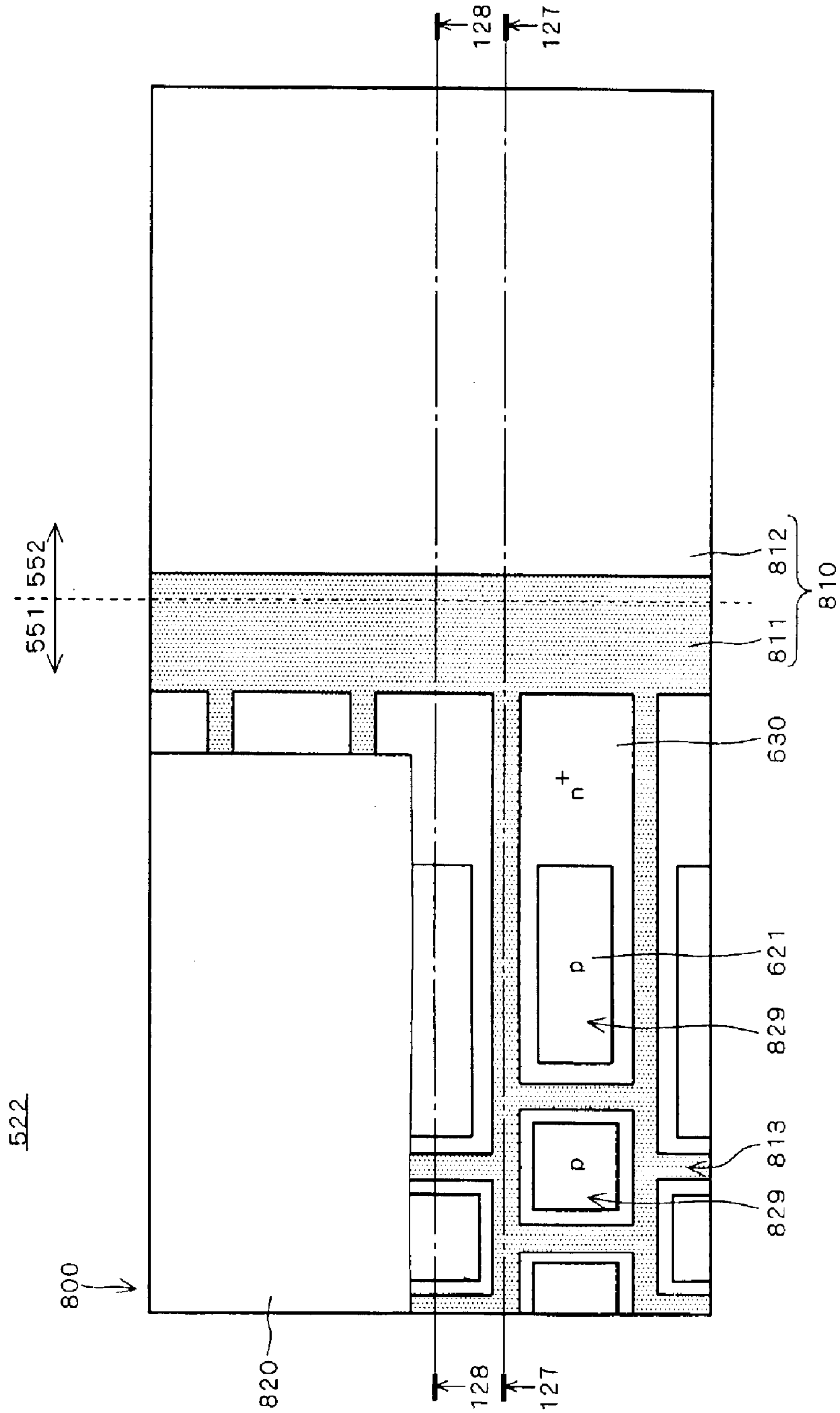

F I G . 1 2 9
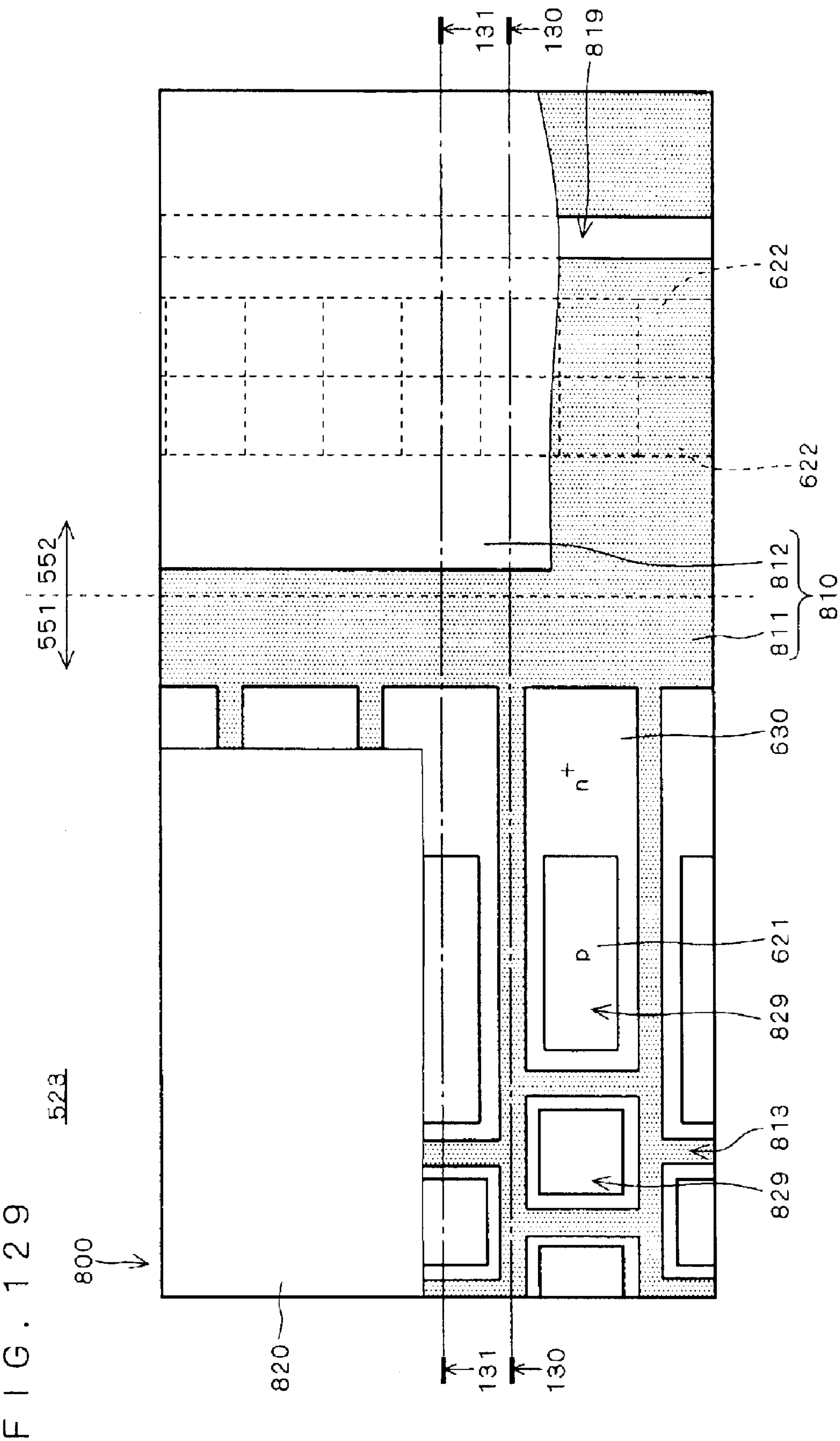

F I G . 1 3 5
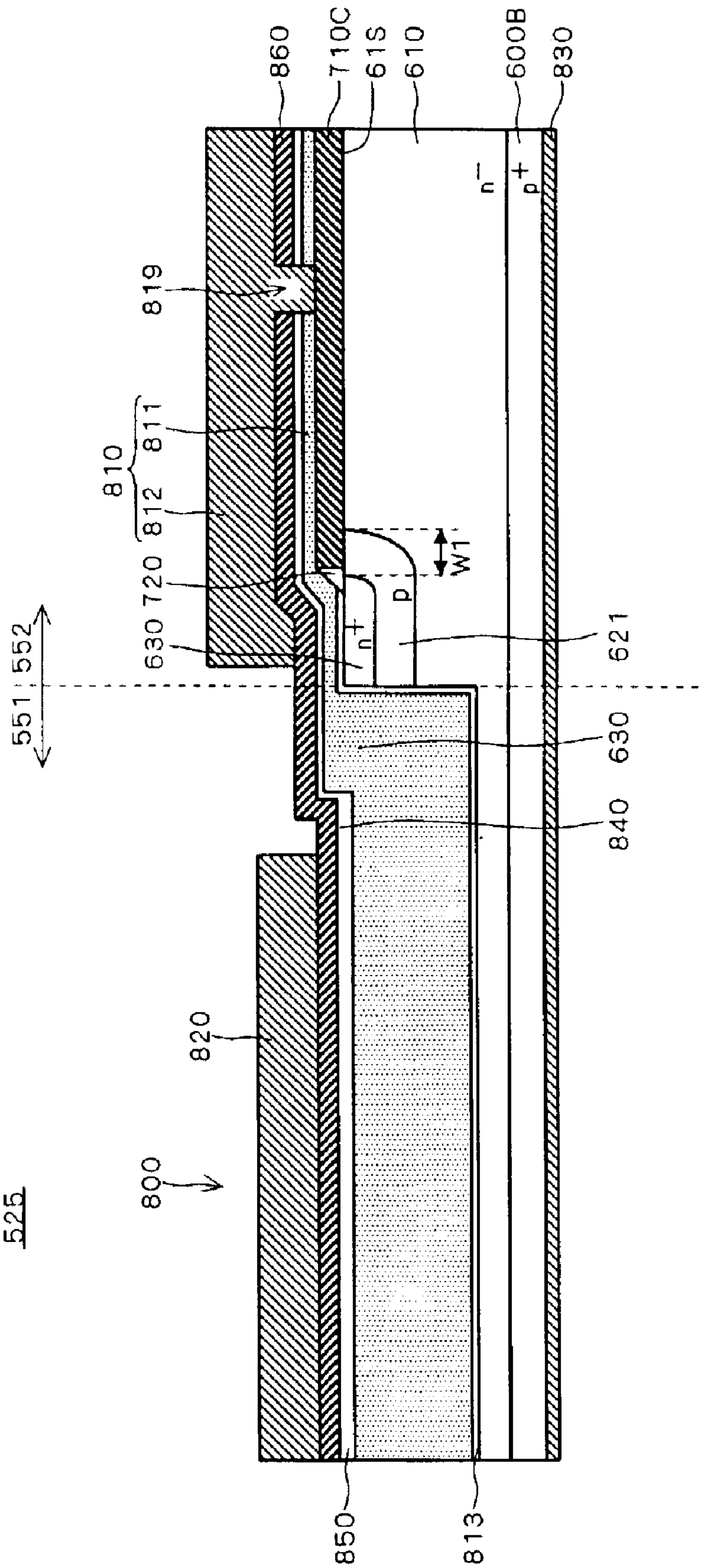

F I G . 1 3 6
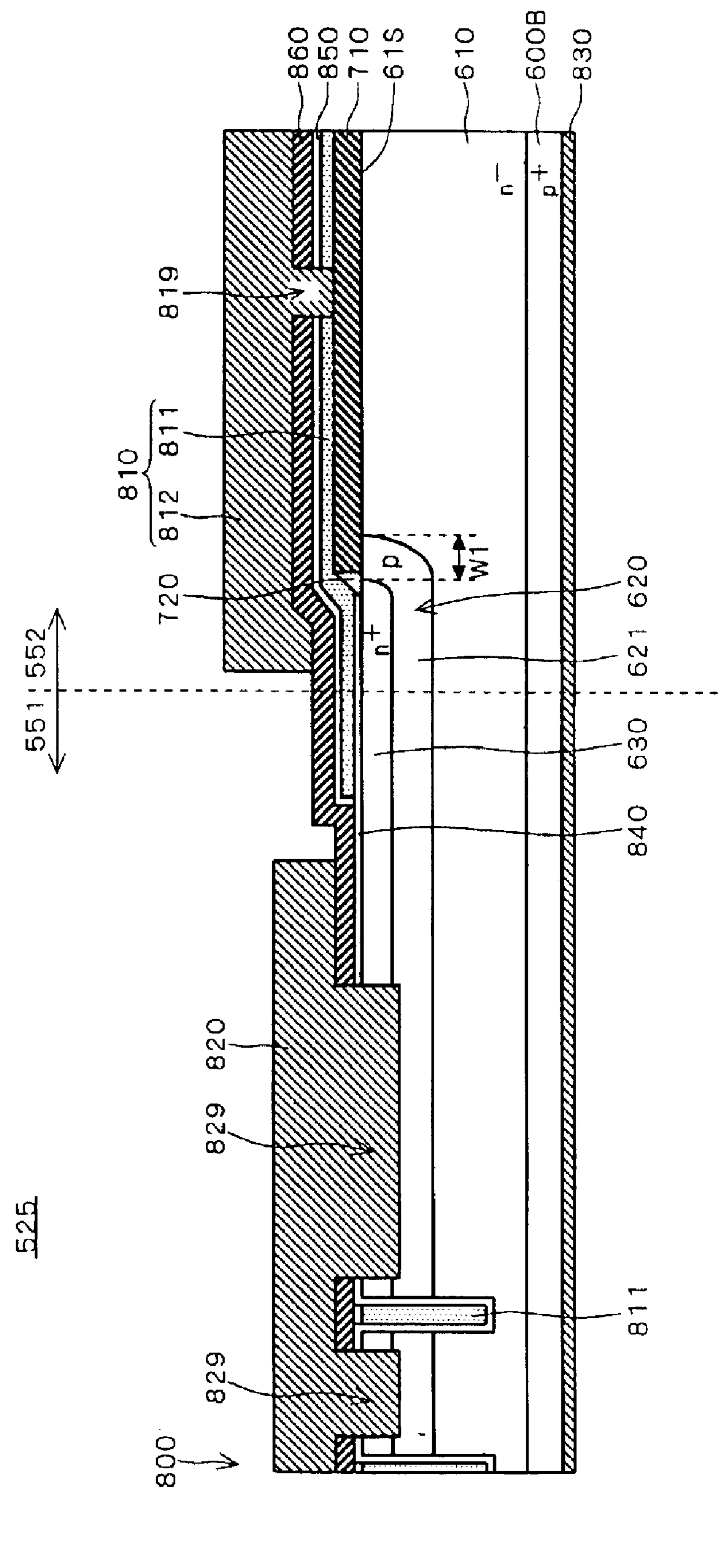

POWER SEMICONDUCTOR DEVICE HAVING SEMICONDUCTOR-LAYER-FORMING POSITION CONTROLLED BY ION IMPLANTATION WITHOUT USING PHOTORESIST PATTERN, AND METHOD OF MANUFACTURING SUCH POWER SEMICONDUCTOR DEVICE

BACKGROUND OF THE INVENTION

1. Field of the Invention

The present invention relates to a power semiconductor device and a method of manufacturing the same, and especially to a technique for reducing photolithography process steps and preventing a decrease in breakdown voltage due to the reduction of the process steps.

2. Description of the Background Art

A conventional power MOSFET (Metal Oxide Semiconductor Field Effect Transistor) is manufactured as follows.

First, an $n^-$-type silicon layer is grown epitaxially on an $n^+$-type silicon substrate. A silicon oxide film (hereinafter also referred to as an "oxide film") is then formed on a main surface of the above epitaxial layer. A photoresist pattern is formed on the oxide film using photolithography techniques and using the photoresist pattern as a mask, a portion of the oxide film which is located within a central region of an element configuration part is etched to form an opening. At this time, a portion of the epitaxial layer which is located within an outer peripheral region (peripheral region) of the element configuration part is covered (masked) with the remaining oxide film. Then, using the photoresist pattern and the open oxide film as masks, p-type impurities (such as boron) are ion implanted and then heat treatment is carried out, thereby to form a p base layer of the power MOSFET in the main surface of the epitaxial layer. Thereafter, the photoresist pattern is removed.

Then, a photoresist pattern having an opening within the central region is formed using photolithography techniques. At this times, the opening of the photoresist pattern is formed narrower than that of the above oxide film, so that not only the oxide film but also a portion of the p base layer in the vicinity of the opening of the oxide film are covered with the photoresist pattern. Using the photoresist pattern as a mask, n-type impurities (such as arsenic) are ion implanted and then heat treatment is carried out, thereby to form an $n^+$ source layer of the power MOSFET in the main surface of the p base layer. Thereafter, the photoresist pattern is removed.

Then, an insulating film is formed across the surface by CVD (Chemical Vapor Deposition) to cover the above oxide film and the exposed main surface in the opening of the oxide film. Subsequently, a photoresist pattern having an opening corresponding to a gate trench is formed on the insulating film by using photolithography techniques and the above insulating film is etched using the photoresist pattern as a mask. After removal of the photoresist pattern, using the patterned insulating film as a mask, the $n^+$ source layer, the p base layer and the epitaxial layer are etched to form a gate trench. Thereafter, the insulating film used as a mask is removed and a gate oxide film is formed on the exposed surface.

Then, n-type polysilicon is deposited by CVD to fill in the gate trench and to extend to a level above the main surface. The polysilicon is then etched back to a predetermined thickness. A photoresist pattern is formed using photolithography techniques to cover a portion of the polysilicon which is extended out of the trench onto the oxide film. Thereafter, using the photoresist pattern as a mask, the polysilicon is dry etched to the same level as the main surface or to a level therebelow. This forms a gate polysilicon electrode. For normal operation of the MOS transistor, the upper surface of the polysilicon in the trench should be located at a higher level than a junction face between the p base layer and the $n^+$ source layer. Thereafter, the photoresist pattern is removed.

A cap oxide film is formed on the exposed surface of the polysilicon, and borophoshposilicate glass (BPSG) as an interlayer insulation film is further deposited by CVD.

Then, a photoresist pattern having openings for source and gate contact holes is formed on the interlayer insulation film by using photolithography techniques. Using the photoresist pattern as a mask, the interlayer insulation film and the like are etched to form source and gate contact holes. Thereafter, the photoresist pattern is removed. The source contact hole is formed to extend through the $n^+$ source layer to the p base layer in the vicinity of the gate polysilicon electrode. The gate contact hole is formed on the oxide film within the outer peripheral region to expose therein a portion of the gate polysilicon electrode which is extended out of the gate trench.

Then, a conductive Al—Si film is deposited across the surface by sputtering so as to fill in the source and gate contact holes and a photoresist pattern is formed on the Al—Si film by using photolithography techniques. Using the photoresist pattern as a mask, etching is performed to form a source aluminum electrode and a gate aluminum electrode of the Al—Si film. The photoresist pattern is then removed.

Thereafter, a conductive Ti—Ni—Au alloy is deposited by sputtering on the entire surface of the substrate on the side opposite the epitaxial layer, thereby to form a drain electrode.

Through the aforementioned process steps, a conventional power MOSFET is completed.

Now, the breakdown voltage of the aforementioned conventional power MOSFET is described. Under conditions where the source aluminum electrode is placed at a ground potential and the drain electrode is placed at a positive potential, a depletion layer is generated at the junction between the p base layer and the epitaxial layer. Since the depletion layer generally spreads in proportion to the ½-th power of the applied voltage, current also increases in proportion to the ½-th power of the voltage. If the strength of an electric field applied to the depletion layer exceeds a certain value with increased voltage, an avalanche breakdown occurs. Usually, in order to prevent the occurrence of an avalanche breakdown, a voltage equivalent to about 80% of the avalanche breakdown voltage is employed. At this time, since the outer end of the p base layer has a curvature, the electric field applied to the depletion layer is further increased and the breakdown voltage becomes smaller than a one-dimensional pn junction breakdown voltage. Thus, several structures are suggested for improving the breakdown voltage of a power device having a curvature. Examples of typical structures include a field ring (or guard ring) structure and a field plate structure which are widely and commonly used. In the field ring structure, by forming a p-type layer being in a multiple floating state in the outer periphery of the p base layer which forms a main junction, the curvature is reduced and the depletion layer is kept uniform. In the field plate structure, an electrode is located directly above and outside the p base layer through an insulating film and a negative voltage is applied to that electrode, which allows easy outward spread of the depletion layer and reduction of the curvature.

The aforementioned conventional manufacturing method is introduced in, for example, International Publication No. 99/12214.

The aforementioned conventional power MOSFET manufacturing method utilizes photolithography techniques in the following six process steps: (1) the step of forming the p base layer; (2) the step of forming the $n^+$ source layer; (3) the step of forming the gate trench; (4) the step of patterning the gate polysilicon electrode; (5) the step of forming the contact holes; and (6) the step of patterning the aluminum electrode.

If the photolithography process step that is used in forming the $n^+$ source layer is eliminated for reduction of manufacturing process steps, the following problem arises. That is, ion implantation for formation of the $n^+$ source layer must be performed in a self-aligned manner, using as a mask, again the oxide film which was used in ion implantation for formation of the p base layer (double diffusion techniques). In this case, the outer end of the $n^+$ source layer is located closer to the outer end of the p base layer than when using the previously described mask for formation of the $n^+$ source layer (i.e., a photoresist pattern having an opening narrower than that of the oxide film). That is, the p base layer has a narrower width in its outer peripheral portion; in other words, a distance between the outer peripheries of the p base layer and the $n^+$ source layer is reduced. This can easily cause punch-through, thereby decreasing the breakdown voltage.

SUMMARY OF THE INVENTION

An object of the present invention is to provide a power semiconductor device capable of reducing photolithography process steps and preventing a decrease in breakdown voltage due to the reduction of the process steps, and to provide a method of manufacturing such a power semiconductor device.

According to an aspect of the present invention, the power semiconductor device includes a power semiconductor element within an element configuration part having a central region and an outer peripheral region. The power semiconductor device includes a first semiconductor layer of a first conductivity type, a first insulator, a second insulator, a second semiconductor layer of a second conductivity type opposite the first conductivity type, and a third semiconductor layer of the first conductivity type. The first semiconductor layer includes a main surface extending across the central region and the outer peripheral region. The first insulator is provided on the main surface to have a first opening within the central region and includes a side surface forming the first opening. The second insulator is provided on the side surface of the first insulator to narrow the first opening. The second semiconductor layer is provided in the main surface. The second semiconductor layer includes a first portion which forms part of the power semiconductor element within the central region and which extends on the side of the outer peripheral region to face the first insulator. The third semiconductor layer is provided in a portion of the main surface where the first portion is provided, forms another part of the power semiconductor element in the central region in the portion where the first portion is provided, and extends on the side of the outer peripheral region to face the second insulator.

According to another aspect of the present invention, the method of manufacturing a power semiconductor device includes the following steps (a) through (h). The power semiconductor device includes a power semiconductor element within an element configuration part having a central region and an outer peripheral region. The step (a) is to prepare a first semiconductor layer of a first conductivity type. The first semiconductor layer has a main surface extending across the central region and the outer peripheral region. The step (b) is to form a first insulating film on the main surface across the central region and the outer peripheral region. The step (c) is to open the first insulating film, thereby to form a first insulator having at least one opening. The step (d) is to ion implant impurities of a second conductivity type opposite the first conductivity type through the at least one opening. The step (e) is to carry out heat treatment after the step (d). The step (f) is to form a second insulating film to fill in the at least one opening. The step (g) is to etch back the second insulating film. The at least one opening includes a first opening within the central region. The step (c) includes the step of (c-1) forming the first opening in the first insulating film. The step (d) includes the step of (d-1) ion implanting the impurities of the second conductivity type through the first opening, thereby to form a first portion of a second semiconductor layer of the second conductivity type in the main surface. The step (g) includes the step of (g-1) forming a second insulator from the second insulating film on the side surface of the first insulator which forms the first opening, thereby to narrow the first opening. The step (h) is to, after the step (g), ion implant impurities of the first conductivity type through the first opening under conditions where the second insulator is present, thereby to form a third semiconductor layer of the first conductivity type in a portion of the main surface where the first portion is provided.

The present invention allows reduction of photolithography process steps and can prevent a decrease in breakdown voltage due to the reduction of the process steps.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view for explaining a power semiconductor device according to a first preferred embodiment;

FIG. 3 is a cross-sectional view taken along line 3—3 of FIG. 2;

FIG. 5 is a partial enlarged view of FIG. 3;

FIG. 6 is a cross-sectional view of a portion 6 encircled by dashed line in FIG. 1

FIGS. 28 through 38 are cross-sectional views for explaining a manufacturing method of the power semiconductor device according to the second preferred embodiment;

FIG. 41 is a cross-sectional view taken along line 41—41 of FIG. 39;

FIG. 44 is a cross-sectional view taken along line 44—44 of FIG. 42;

FIG. 45 is a plan view for explaining a power semiconductor device according to a fifth preferred embodiment;

FIG. 48 is a cross-sectional view for explaining a manufacturing method of the power semiconductor device according to the fifth preferred embodiment;

FIG. 49 is a cross-sectional view for explaining another manufacturing method of the power semiconductor device according to the fifth preferred embodiment;

FIG. 53 is a plan view for explaining a power semiconductor device according to a seventh preferred embodiment;

FIG. 57 is a cross-sectional view taken along line 57—57 of FIG. 56;

FIG. 61 is a cross-sectional view taken along line 61—61 of FIG. 59;

FIGS. 63 through 77 are cross-sectional views for explaining a manufacturing method of the power semiconductor device according to the ninth preferred embodiment;

FIG. 93 is a plan view for explaining a power semiconductor device according to an eleventh preferred embodiment;

FIG. 100 is a cross-sectional view taken along line 100—100 of FIG. 99;

FIG. 102 is a plan view for explaining a power semiconductor device according to a fourteenth preferred embodiment;

FIG. 104 is a cross-sectional view taken along line 104—104 of FIG. 102;

FIG. 107 is a cross-sectional view taken along line 107—107 of FIG. 105;

FIG. 108 is a plan view for explaining a power semiconductor device according to a sixteenth preferred embodiment;

FIG. 109 is a cross-sectional view taken along line 109—109 of FIG. 108;

FIG. 111 is a plan view for explaining a power semiconductor device according to a seventeenth preferred embodiment;

FIG. 112 is a cross-sectional view taken along line 112—112 of FIG. 111;

FIG. 113 is a cross-sectional view taken along line 113—113 of FIG. 111;

FIG. 118 is a cross-sectional view taken along line 118—118 of FIG. 117;

FIG. 119 is a cross-sectional view taken along line 119—119 of FIG. 117;

FIG. 123 is a plan view for explaining a power semiconductor device according to a twenty-first preferred embodiment;

FIG. 124 is a cross-sectional view taken along line 124—124 of FIG. 123;

FIG. 126 is a plan view for explaining a power semiconductor device according to a twenty-second preferred embodiment;

FIG. 129 is a plan view for explaining a power semiconductor device according to a twenty-third preferred embodiment;

FIGS. 135 and 136 are cross-sectional views for explaining a power semiconductor device according to a twenty-fifth preferred embodiment.

DESCRIPTION OF THE PREFERRED EMBODIMENTS

First Preferred Embodiment

Figure 2:
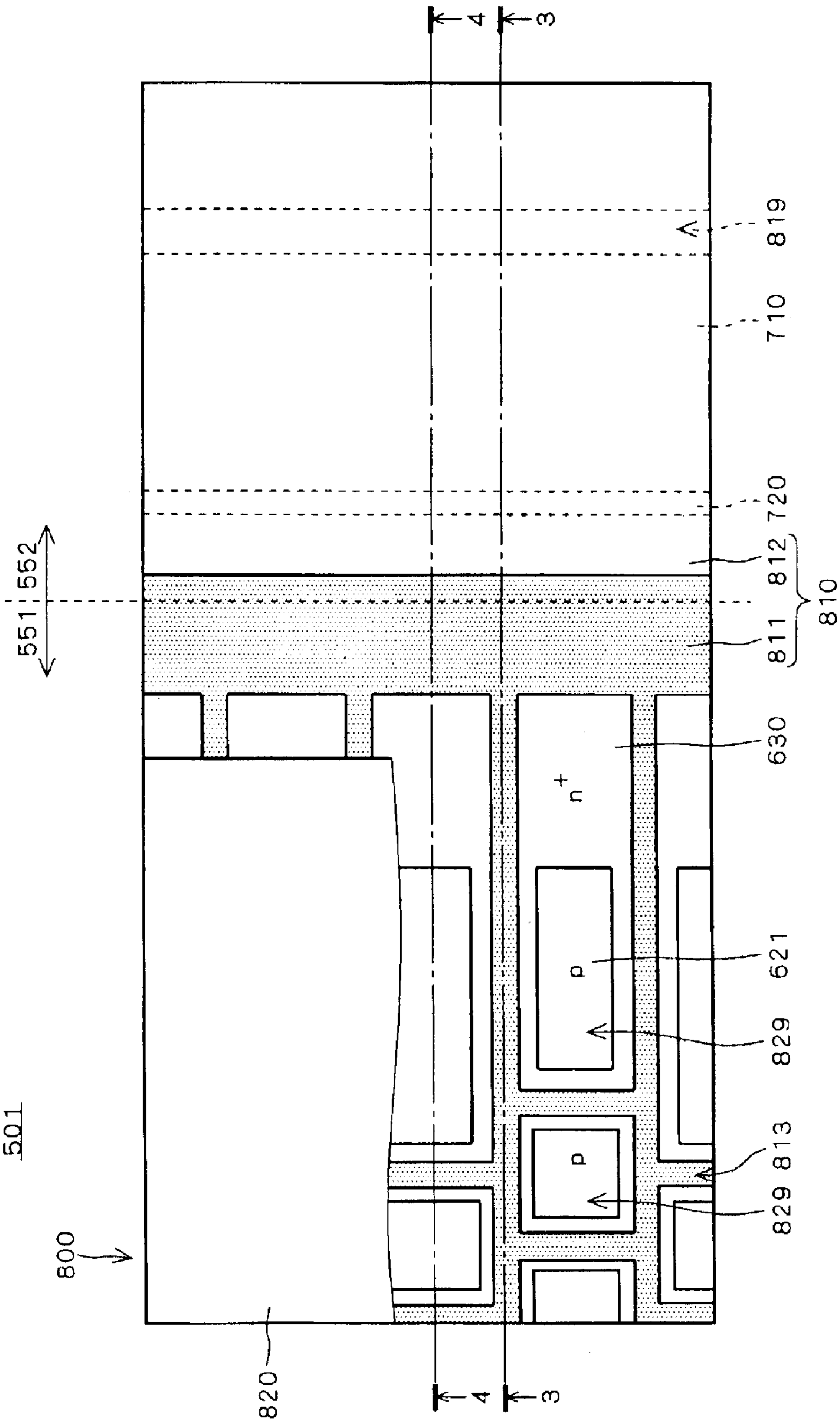
FIG. 2 is an enlarged view of a portion 2 encircled by dashed line in FIG. 1.

FIG. 1 shows a plan view for explaining a power semiconductor device (hereinafter also referred to simply as a "semiconductor device") 501 according to a first preferred embodiment.

As shown in FIG. 1, the semiconductor device 501 is roughly divided into an element configuration part 550 and a dicing part 560 surrounding the element configuration part 550. The element configuration part 550 includes a central region (or cell region) 551 and an outer peripheral region 552 surrounding the central region 551.

Figure 4:
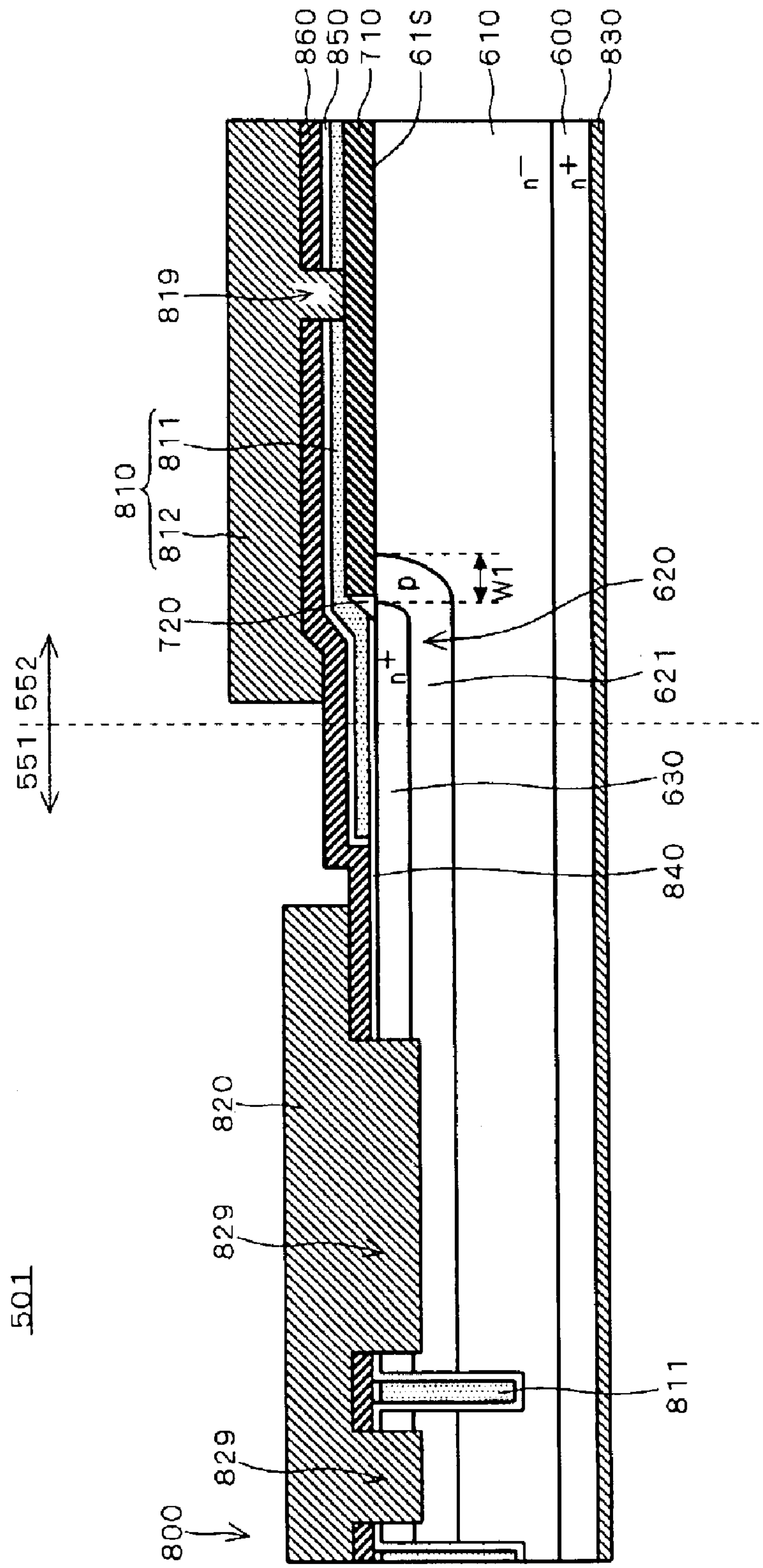
FIG. 4 is a cross-sectional view taken along line 4—4 of FIG. 2.

FIG. 2 shows an enlarged plan view of a portion 2 encircled by dashed line in FIG. 1 (a portion in the vicinity of the boundary between the central region 551 and the outer peripheral region 552). FIG. 3 shows a cross-sectional view (of a silicon mesa region) taken along line 3—3 of FIG. 2, FIG. 4 shows a cross-sectional view taken along line 4—4 of FIG. 2, and FIG. 5 shows part of FIG. 3 (or FIG. 4) in enlarged dimension. FIG. 6 shows an enlarged view of a portion 6 (central region 551) encircled by dashed line in FIG. 1. In FIG. 2 and subsequent similar plan views, for films 840, 850, 860 and the like are not shown and an electrode 820 and the like are broken away. Further, for simplicity of illustration, small parts such as a second insulator 720 in FIG. 3 are not hatched.

In the following description, for convenience's sake, the outermost end of a gate trench (hereinafter also referred to simply as a "trench") 813 for a gate electrode (control electrode) 810 is determined as the boundary between the central region 551 and the outer peripheral region 552; however, it should be understood that the boundary is not limited thereto. For example, the position of a side surface 71W of a first insulator 710 (see FIG. 5) may be determined as the above boundary. Or, the end of the second insulator 720 farther away from the first insulator 710 may be determined as the above boundary.

In the element configuration part 550 of the semiconductor device 501, a power semiconductor element (hereinafter also referred to simply as a "semiconductor element") 800 having a MOS transistor structure (described later) is formed which is an n-channel type power MOSFET (Metal-Oxide-Semiconductor Field Effect Transistor) in the present example. The MOS transistor structure of the semiconductor element 800 is built in the central region 551.

As shown in FIGS. 2 through 6, the semiconductor device 501 includes a substrate configured of an $n^+$-type silicon substrate 600 containing a high concentration of n-type (first conductive type) impurities and an $n^-$-type silicon epitaxial layer (first semiconductor layer) 610 located on the main surface of the substrate 600, and various elements are formed in and on this two-layer substrate. This two-layer substrate extends across (i.e., includes) the element configuration part 550 and the dicing part 560, so that a main surface 61S of the epitaxial layer 610 (the main surface on the side opposite the one adjoining the substrate 600) extends across the element configuration part 550 and the dicing part 560.

In the outer peripheral region 552, the first insulator 710 in film form of, for example, silicon oxide is located on the main surface 61S of the epitaxial layer 610. The first insulator 710 has an opening (first opening) 711 within the central region 551 (see FIG. 8 described later) and, as viewed in plan, it is shaped to surround the MOS transistor structure in the central region 551. The first insulator 710 has the side surface 71W (see FIG. 5) which forms the opening 711 and faces toward (the center of) the central region 551.

On the side surface 71W of the first insulator 710, the second insulator 720 of, for example, silicon oxide is located in contact with the main surface 61S of the epitaxial layer 610. This formation of the second insulator 720 narrows the opening 711. The second insulator 720 is of the same shape as a so-called sidewall spacer (which is formed beside the gate electrode of a MOSFET and used in forming, for example, an LDD (Lightly Doped Drain) region). In the illustrated example, the second insulator 720 is of about the same height (the dimension in a direction of the normal to the main surface 61S, i.e., the longitudinal direction in the views of FIGS. 3 to 5) as the first insulator 710, and its width (the dimension in a direction parallel to the main surface 61S and intersecting (orthogonal to) the side surface 71W, i.e., the horizontal direction in the views of FIGS. 3 to 5) becomes smaller as the second insulator 720 appears away from the main surface 61S in the direction of its height. In the drawings, the (side) surface of the second insulator 720 on the central region 551 side is a plane surface (thus the second insulator 720 is in the shape of a triangle as viewed in section); however, that side surface may be a curved surface.

In the main surface 61S of the epitaxial layer 610, a p-type layer (second semiconductor layer) 620 of p-type silicon containing p-type (second conductivity type) impurities such as boron is formed, which includes a p base layer (first portion) 621 of the power MOSFET. The p base layer 621 is formed to a predetermined depth from the main surface 61S, but it does not extend to the substrate 600. The p base layer 621 is formed throughout the central region 551 and extends on the side of the outer peripheral region 552 (in the present example, extends into the outer peripheral region 552). At this time, the (outer) end portion of the p base layer 621 extends to a position opposite the end portion of the first insulator 710 in the vicinity of the second insulator 720. The p base layer 621 forms part of the MOS transistor structure in the central region 551.

In the following description, a portion of the main surface 61S of the epitaxial layer 610 where the p-type layer 620 is formed is also referred to as a "main surface 61S of the p-type layer 620" and also similarly as a "main surface 61S of the p base layer 621. "

In the main surface 61S of the p base layer 621, an $n^+$-type silicon layer (third semiconductor layer) 630 containing a high concentration of n-type impurities such as arsenic is formed. The $n^+$-type silicon layer 630 forms an $n^+$ source layer of the power MOSFET and is thus hereinafter also referred to as an "$n^+$ source layer 630. " The $n^+$ source layer 630 is formed to a predetermined depth from the main surface 61S, but it does not extend to the bottom of the p base layer 621, i.e., it is shallower than the p base layer 621 and does not extend beyond the depth of the p base layer 621. The $n^+$ source layer 630 is formed within the central region 551 and extends on the side of the outer peripheral region 552 (in the present example, extends into the outer peripheral region 552). At this time, the (outer) end of the $n^+$ source layer 630 is located in a position opposite the second insulator 720 but not to face the first insulator 710. The $n^+$ source layer 630 forms part of the MOS transistor structure in the central region 551.

In the following description, a portion of the main surface 61S of the epitaxial layer 610 where the $n^+$ source layer 630 is formed is referred to also as a "main surface 61S of the $n^+$ source layer 630. "

As shown in FIG. 2, the reticular gate trench 813, as viewed in plan, is formed within the central region 551. As shown in FIGS. 3, 4 and 6, the trench 813 extends from the main surface 61S through the $n^+$ source layer 630 and the p base layer 621 to the depth of the epitaxial layer 610. However, the trench 813 does not extend to the substrate 600. A gate insulating film 840 of, for example, silicon oxide is located on the inner surface of the trench 813, and a gate polysilicon electrode 811 of highly doped polysilicon is located on the gate insulating film 840 to fill in the gate trench 813. The gate polysilicon electrode 811 is connected with a gate pad 570 (see FIG. 1).

As shown in FIGS. 3 to 5, the gate insulating film 840 extends out of the trench 813 onto the main surface 61S. More specifically, the gate insulating film 840 extends on the main surface 61S of the $n^+$ source layer 630, with its end portion in contact with the second insulator 720. The gate insulating film 840 is thinner than the first insulator 710. Further, as shown in FIGS. 2 to 5, the gate polysilicon electrode 811 also extends out of the trench 813 and spreads over the gate insulating film 840, the second insulator 720 and the first insulator 710 in contact therewith.

For the purpose of insulation, a cap oxide film 850 is located to cover the gate polysilicon electrode 811. Further, an interlayer insulation film 860 of, for example, borophosphposilicate glass (BPSG) is located to cover the epitaxial layer 610 on the main surface 61S side.

In the outer peripheral region 552, a gate contact hole 819 is formed to extend through the interlayer insulation film 860, the cap oxide film 850 and the gate polysilicon electrode 811, but not to extend to the main surface 61S. In the present example, as shown in FIG. 2, the gate contact hole 819 is in a linear form as viewed in plan. Further, a gate aluminum electrode 812 of, for example, conductive Al—Si is formed on the interlayer insulation film 860 to be in contact with the gate polysilicon electrode 811 within the gate contact hole 819.

A portion of the gate polysilicon electrode 811 which is extended out of the trench 813 extends opposite the main surface 61S with the gate insulating film 840, the second insulator 720 and the first insulator 710 sandwiched in between and extends away from the central region 551 beyond the p-type layer 620 (i.e., the p base layer 621). The gate aluminum electrode 812 is located opposite the main surface 61S with the portion of the gate polysilicon electrode 811 which is extended out of the trench 813 sandwiched in between. The aluminum electrode 812 extends from the vicinity of the outermost end of the trench 813 toward the side away from the central region 551 beyond the location of the p-type layer 620.

In the power semiconductor device 501, the gate electrode 810 configured of the gate polysilicon electrode 811 and the gate aluminum electrode 812 forms the control electrode 810 of the MOS transistor structure which is described later. The gate electrode 810 of the power semiconductor device 501 is formed to extend opposite the main surface 61S with a portion of the gate insulating film 840 on the main surface 61S and the first and second insulators 710 and 720 sandwiched in between and further to extend away from the central region 551 beyond the p-type layer 620 (i.e., to extend beyond the location of the p-type layer 620). The gate aluminum electrode 812 carries out the function of reducing the interconnect resistance of the gate polysilicon electrode 811.

On the other hand, in the central region 551 as shown in FIGS. 2, 4 and 6, source contact holes 829 are formed to extend to the p base layer 621 through the interlayer insulation film 860, the portion of the gate insulating film 840 on the main surface 61S, and the $n^+$ source layer 630. The source contact holes 829 are formed in the meshes (in the example of FIG. 2, square meshes as viewed in plan) of the reticular gate polysilicon electrode 811, so that the $n^+$ source layer 630 remains in the vicinity of the gate polysilicon electrode 811. Then, a source electrode (main electrode) 820 of, for example, conductive Al—Si is formed on the interlayer insulation film 860 within the central region 551, to be in contact with the $n^+$ source layer 630 and the p base layer 621 in each of the source contact holes 829. In the semiconductor device 501, the source electrode 820 does not extend into the outer peripheral region 552.

On the substrate 600, a drain electrode (main electrode) 830 of, for example, Ti—Ni—Au alloy is formed throughout the central region 551 and the outer peripheral region 552.

At this time, the source electrode 820 and the drain electrode 830 are formed to sandwich the semiconductor layers 610, 620 and 630 in between in a direction of stack of those layers 610, 620 and 630 (in other words, in a direction of the normal to the main surface 61S).

The gate electrode 810, the gate insulating film 840 and the semiconductor layers 610, 620 and 630 constitute a MOS transistor structure of the power semiconductor element 800 (in the present example, the n-channel power MOSFET), in which structure a main current flowing through a main current path between the source and drain electrodes 820 and 830 is controlled by the gate electrode 810 (or a portion thereof in the trench 813), and more specifically, by the applied voltage to the gate electrode 810.

Figure 7A:
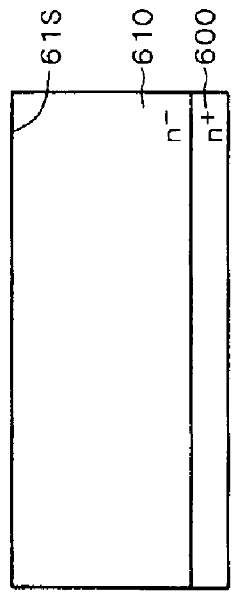
FIGS. 7 through 22 are cross-sectional views for explaining a manufacturing method of the power semiconductor device according to the first preferred embodiment.
Figure 7B:
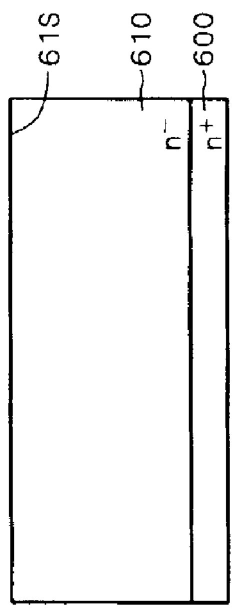
Figure 7C:
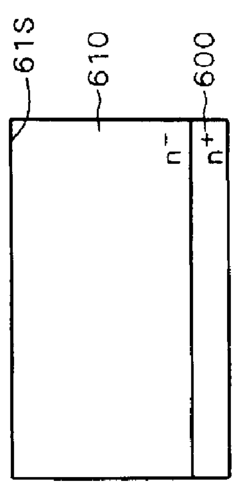
Figure 8A:
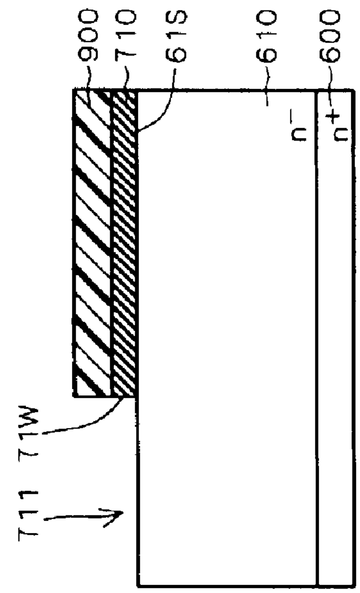
Figure 8B:
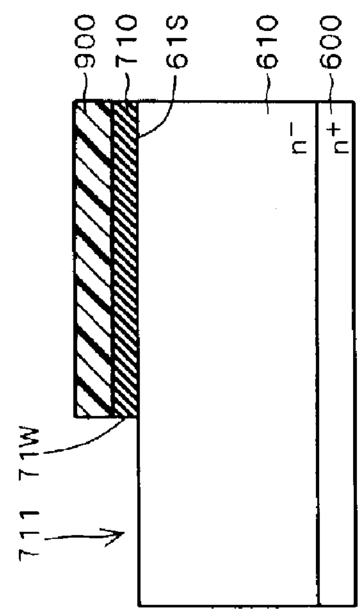
Figure 8C:
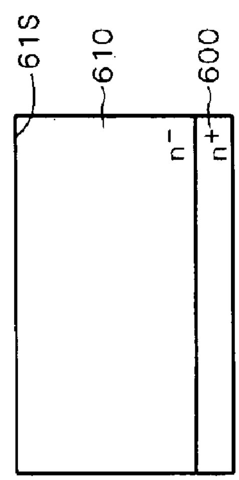

Next, a method of manufacturing the power semiconductor device 501 is described with reference also to the cross-sectional views of FIGS. 7 through 22. FIGS. 7A, 8A, and so on through FIG. 22A correspond to FIG. 3; FIGS. 7B, 8B, and so on through FIG. 22B correspond to FIG. 4; and FIGS. 7C, 8C, and so on through FIG. 22C correspond to FIG. 6. For example, FIGS. 7A, 7B and 7C are generically referred to as "FIG. 7" and the same is true for FIGS. 8 through 22.

First, the $n^+$-type silicon substrate 600 containing a high concentration of n-type impurities is prepared and the $n^-$-type silicon layer (first semiconductor layer) 610 is grown epitaxially on the substrate 600 (see FIG. 7). The substrate 600 and the epitaxial layer 610 include the element configuration part 550 and the dicing part 560, and the main surface 61S of the epitaxial layer 610 extends across the element configuration part 550 and the dicing part 560.

A first insulating film of, for example, silicon oxide and a photoresist film are formed in this order on the entire main surface 61S of the epitaxial layer 610 (thus, the first insulating film and the photoresist film are formed throughout the central region 551 and the outer peripheral region 552). The photoresist film is then patterned using photolithography techniques to form a photoresist pattern 900 which corresponds to the previously described first insulator 710 (see FIG. 8). Using the photoresist pattern 900 as a mask, etching is performed to form the opening (first opening) 711 in the first insulating film in the central region 551 (see FIG. 8). Thereby, the remaining portion of the first insulating film in the outer peripheral region 552 forms the first insulator 710 (see FIG. 8). Thereafter, the photoresist pattern 900 is removed.

Figure 9A:
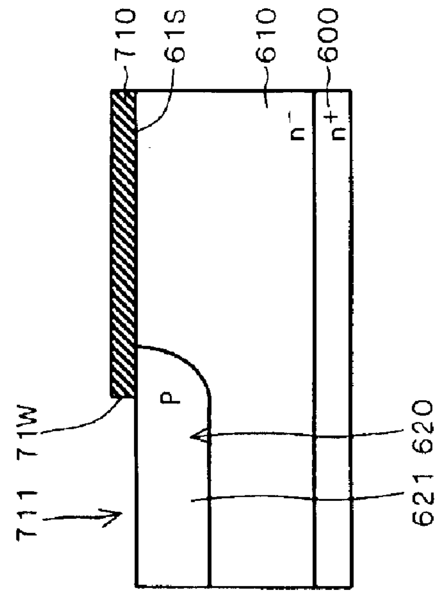
Figure 9B:
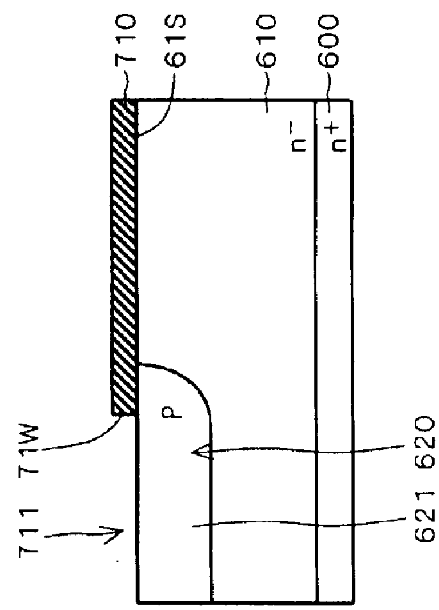
Figure 9C:
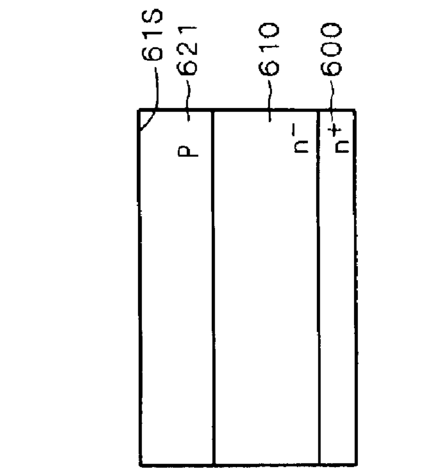

Then, p-type impurities (such as boron) are ion implanted using the first insulator 710 as a mask, in other words, through the opening 711 of the first insulator 710 and then heat treatment is carried out, thereby to form the p base layer (first portion) 621 of the p-type layer (second semiconductor layer) 620 in the main surface 61S of the epitaxial layer 610 (see FIG. 9).

Figure 10A:
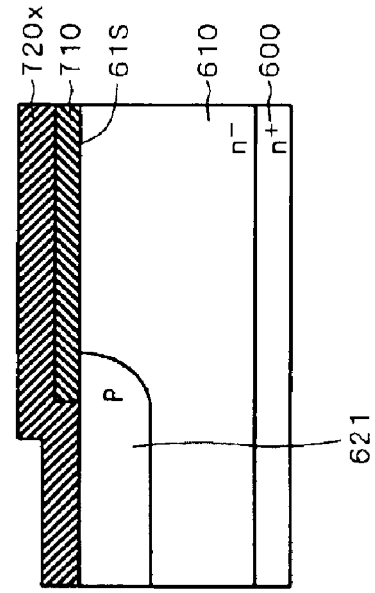
Figure 10B:
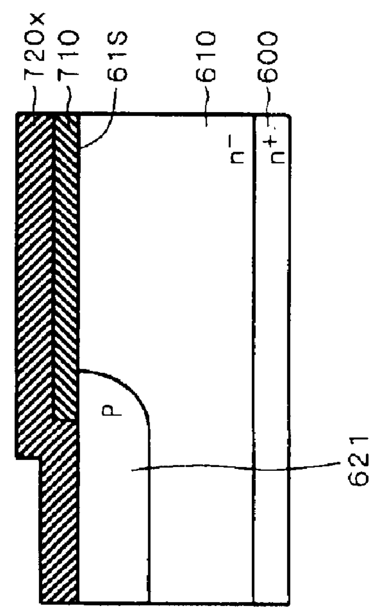
Figure 10C:
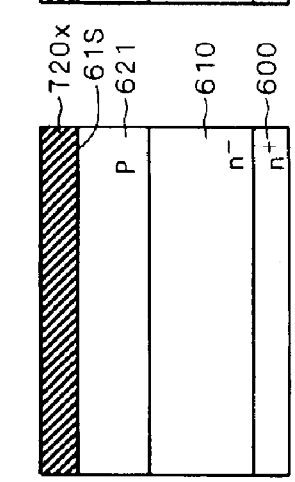
Figure 11A:
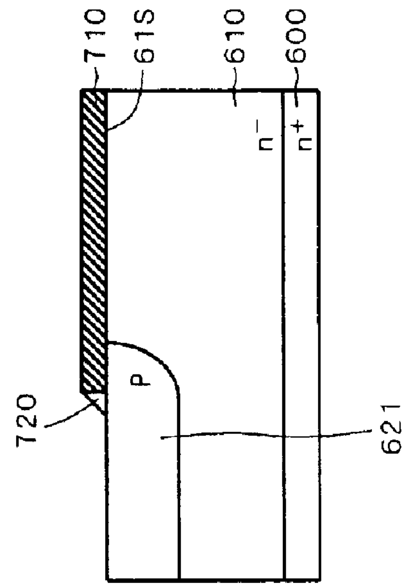
Figure 11B:
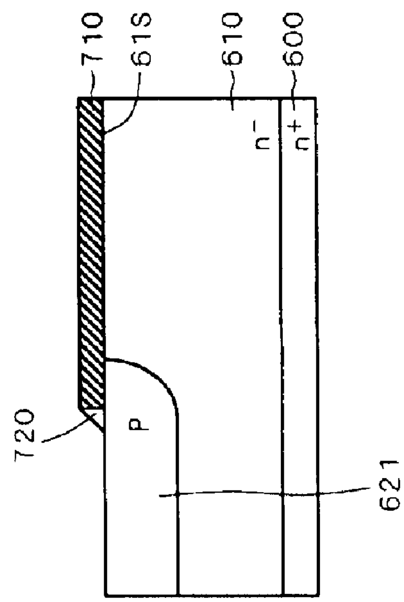
Figure 11C:
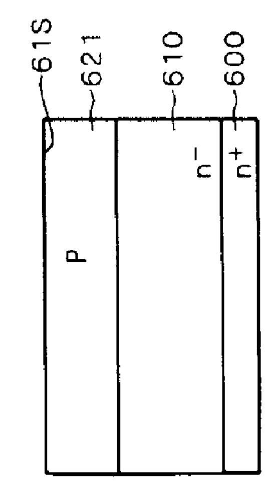

After that, a second insulating film 720*x* of, for example, silicon oxide is formed by CVD (Chemical Vapor Deposition) to fill in the opening 711 (see FIG. 10). At this time, the second insulating film 720*x* is formed in contact with the side surface 71W (see FIG. 9) and the main surface 61S which are exposed in the opening 711. The second insulating film 720*x* is then etched back by dry etching to expose the p base layer 621 in the opening 711 and to form the second insulator 720 from the second insulating film 720*x* on the side surface 71W (see FIGS. 11 and 9). This formation of the second insulator 720 narrows the opening 711.

Figure 12A:
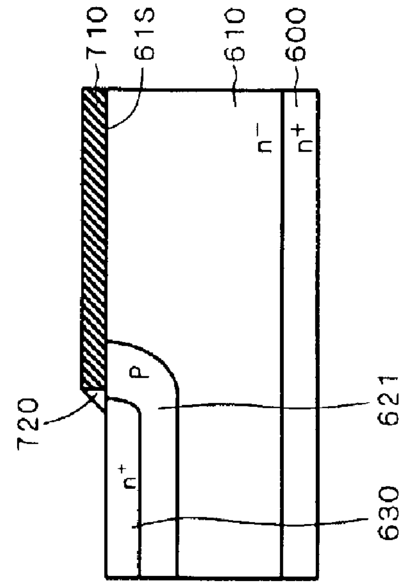
Figure 12B:
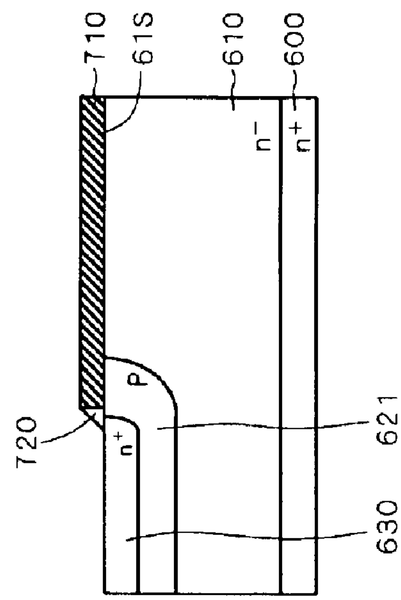
Figure 12C:
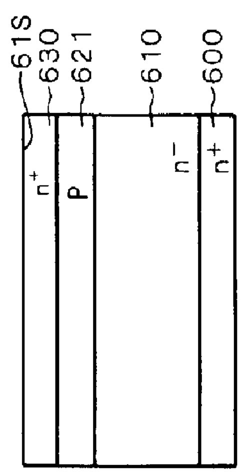
Figure 13A:
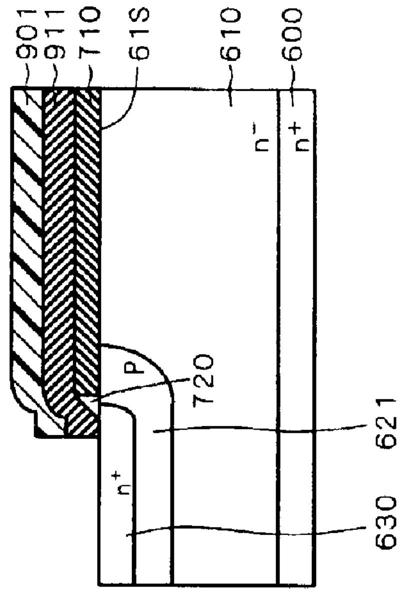
Figure 13B:
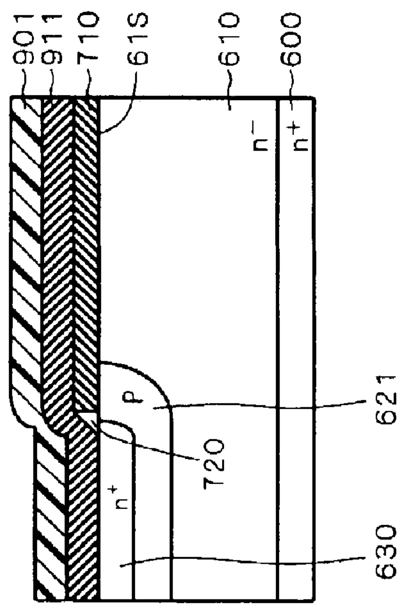
Figure 13C:
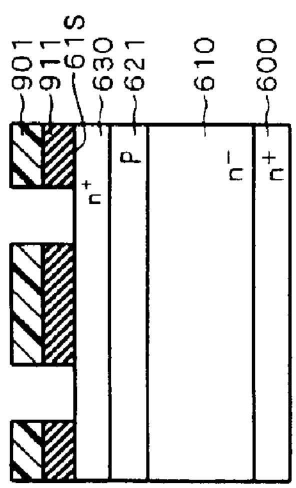

Under conditions where the second insulator 720 is present, n-type impurities (such as arsenic) are ion implanted through the opening 711 and then heat treatment is carried out, thereby to form the $n^+$ source layer 630 in the main surface 61S of the p base layer 621 (see FIG. 12).

Then, a silicon oxide film 911 is formed across the surface by CVD to cover the exposed main surface 61S of the $n^+$ source layer 630 and the first and second insulators 710 and 720. Subsequently, using photolithography techniques, a photoresist pattern 901 which corresponds to the pattern of the gate trench 813 is formed on the oxide film 911. The oxide film 911 is then pattern by dry etching using the photoresist pattern 901 as a mask (see FIG. 13).

Figure 14A:
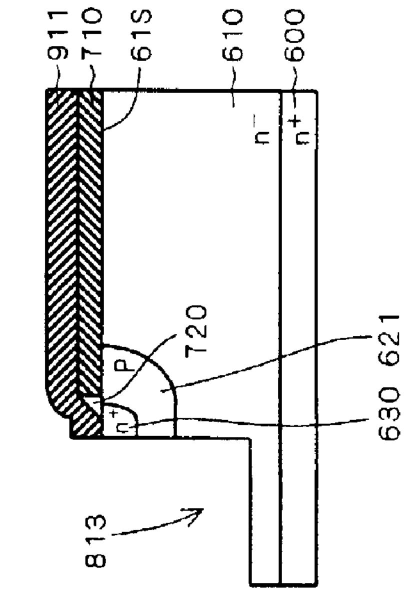
Figure 14B:
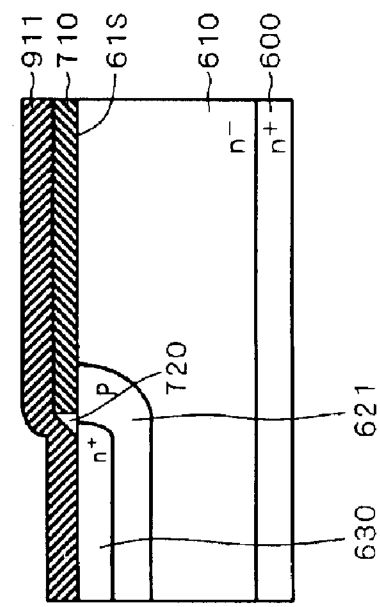
Figure 14C:
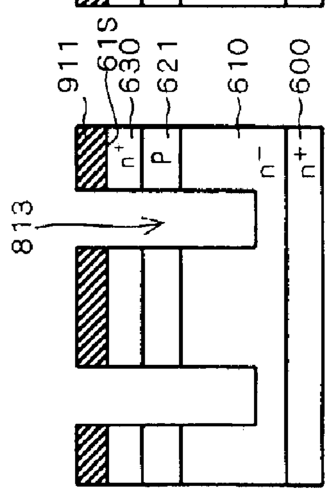

After removal of the photoresist pattern 901, the epitaxial layer 610 (more specifically, the $n^+$ source layer 630, the p base layer 621 and the epitaxial layer 610) is etched using the patterned oxide film 911 as a mask, thereby to form the gate trench 813 (see FIG. 14). Thereafter, the oxide film 911 is removed by etching.

Figure 15A:
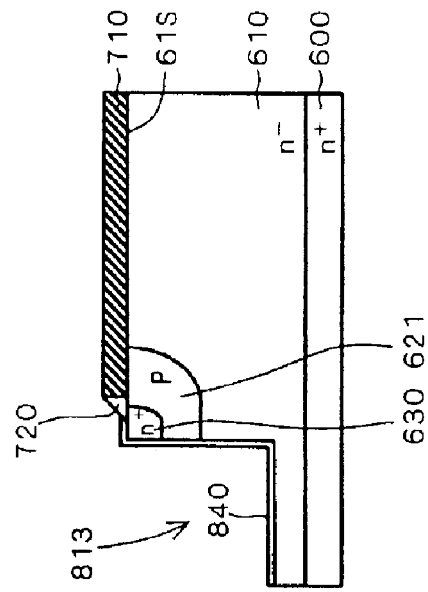
Figure 15B:
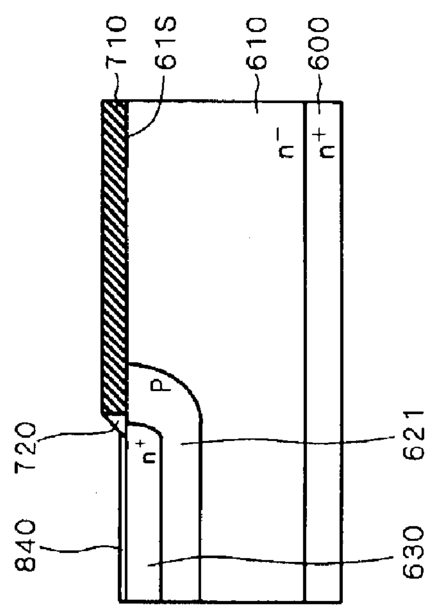
Figure 15C:
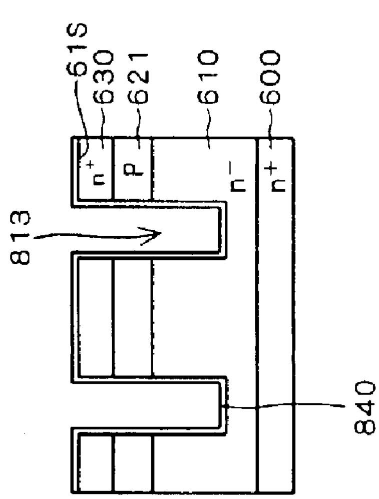

Then, the exposed surface of the epitaxial layer 610 (more specifically, the exposed surfaces of the $n^+$ source layer 630, the p base layer 621 and the epitaxial layer 610) is subjected to, for example, thermal oxidation to form the gate insulating film 840 (see FIG. 15).

Figure 16A:
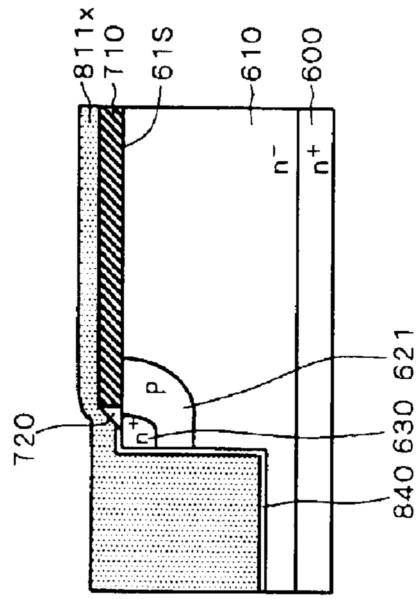
Figure 16B:
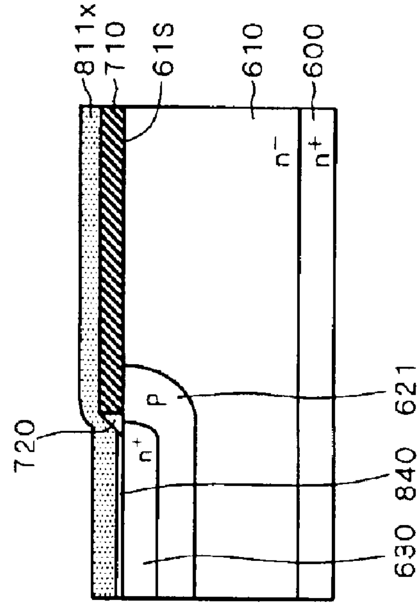
Figure 16C:
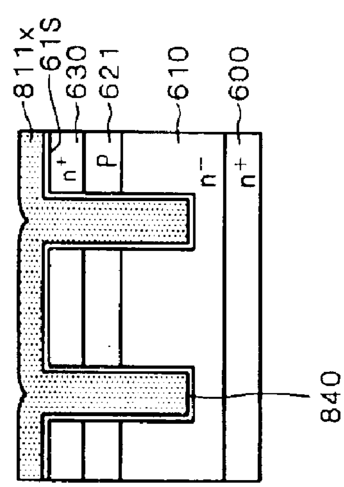

Then, a highly doped polysilicon film 811*x* is formed by CVD to fill in the gate trench 813 and further to be deposited on the first and second insulators 710 and 720 (see FIG. 16).

Figure 17A:
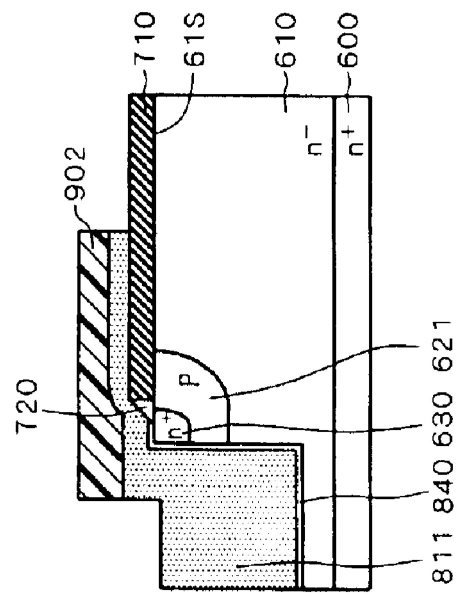
Figure 17B:
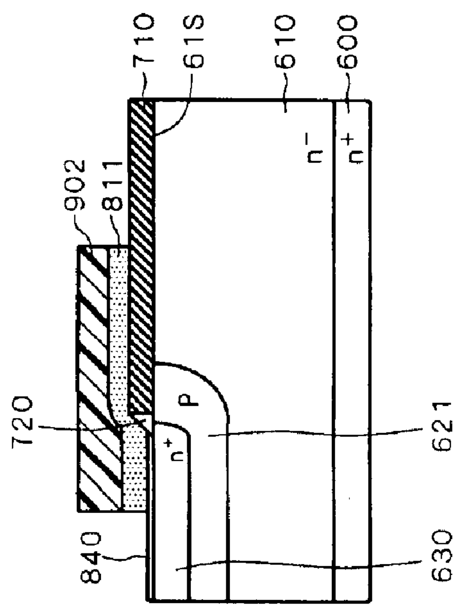
Figure 17C:
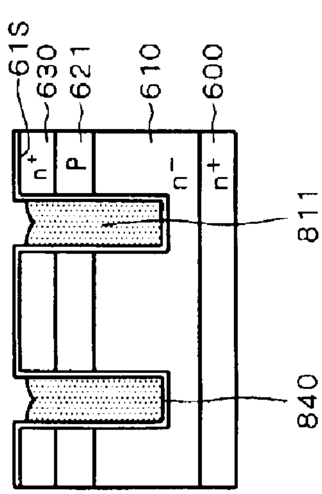

After that, using photolithography techniques, a photoresist pattern 902 is formed to cover an end portion of the polysilicon film 811*x* in the gate trench 813 and a portion thereof which extends from the end portion onto the first and second insulators 710 and 720 (see FIG. 17). The polysilicon film 811*x* is then dry etched using the photoresist pattern 902 as a mask, thereby to form the gate polysilicon electrode 811 (see FIG. 17). For normal operation of the MOS transistor, the etch back of the polysilicon film 811*x* is performed such that the upper surface of the gate polysilicon electrode 811 within the gate trench 813 should be located at a level above the junction face between the p base layer 621 and the $n^+$ source layer 630 and below the main surface 61S.

Figure 18A:
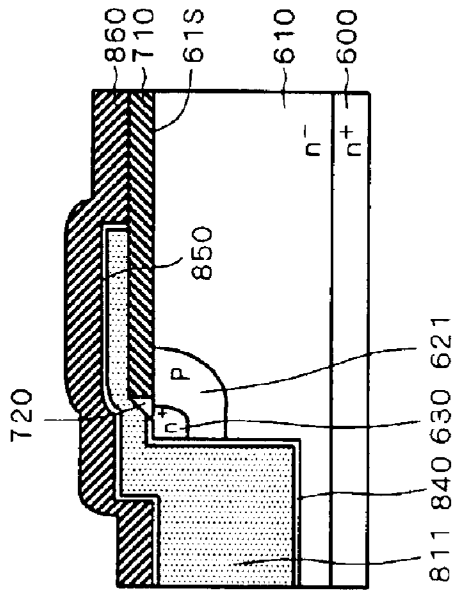
Figure 18B:
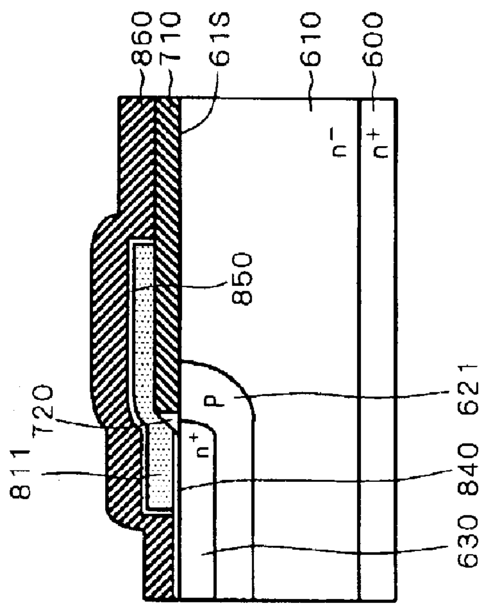
Figure 18C:
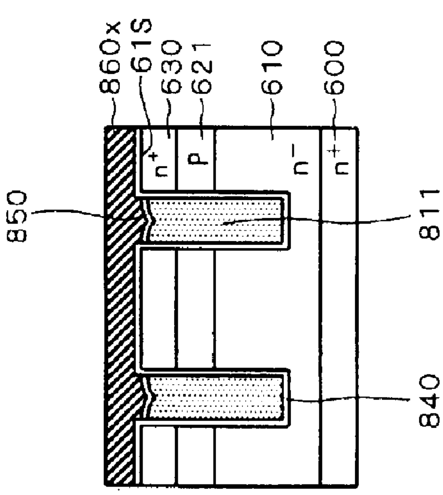

After removal of the photoresist pattern 902, the cap oxide film 850 is formed for the purpose of insulating the exposed surface of the gate polysilicon electrode 811 (see FIG. 18). Further, the interlayer insulation film 860 of, for example, BPSG is formed by CVD to cover the gate polysilicon electrode 811 and the like (see FIG. 18).

Figure 19A:
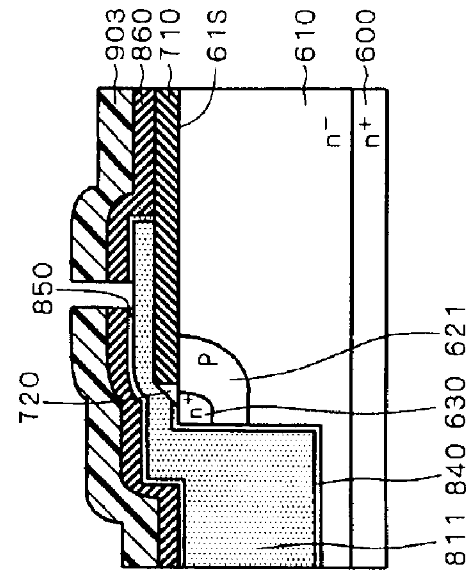
Figure 19B:
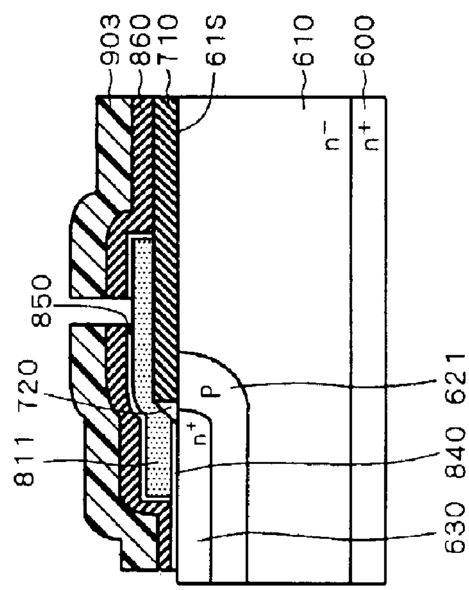
Figure 19C:
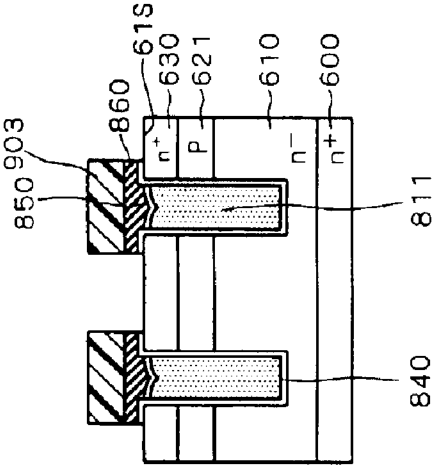

Then, using the photolithography techniques, a photoresist pattern 903 having openings for the gate contact hole 819 and the source contact holes 829 is formed on the interlayer insulation film 860 (see FIG. 19). The interlayer insulation film 860 and the cap oxide film 850 are then opened by dry etching using the photoresist pattern 903 as a mask (see FIG. 19).

Figure 20A:
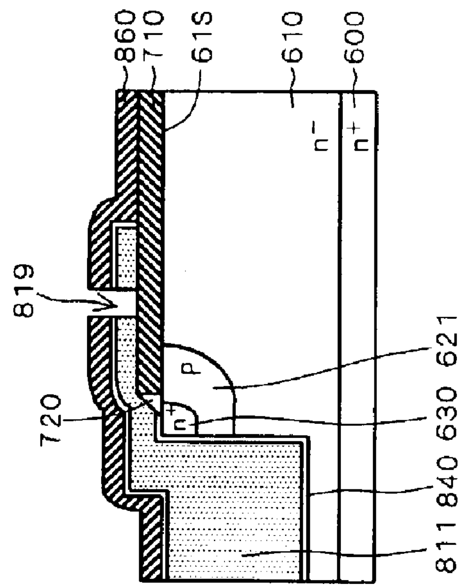
Figure 20B:
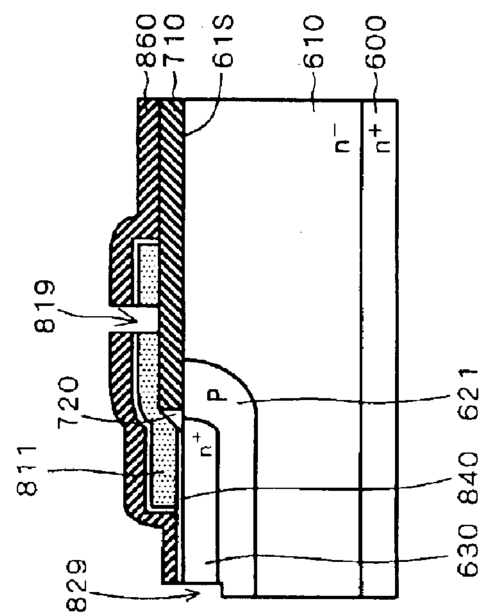
Figure 20C:
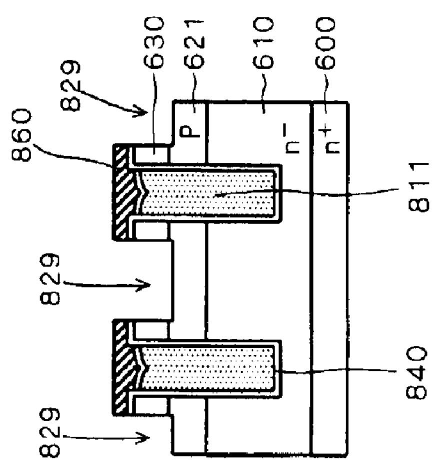

After removal of the photoresist pattern 903, the gate polysilicon electrode 811 and the $n^+$ source layer 630 are etched using the opened interlayer insulation film 860 as a mask, thereby to form the gate contact hole 819 and the source contact holes 829 (see FIG. 20). The source contact holes 829 are formed to extend through the $n^+$ source layer 630 to expose therein the p base layer 621.

Figure 21A:
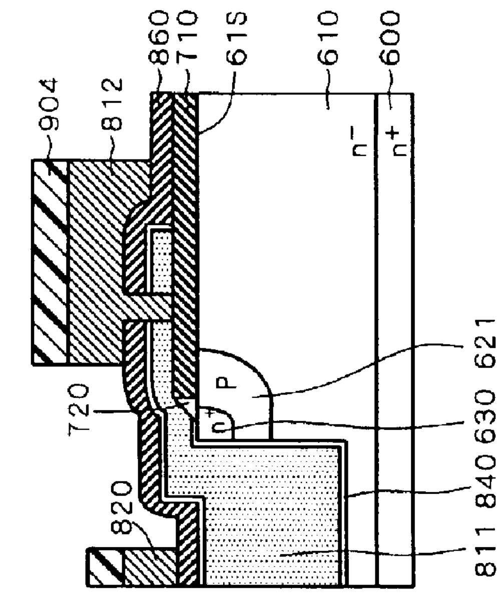
Figure 21B:
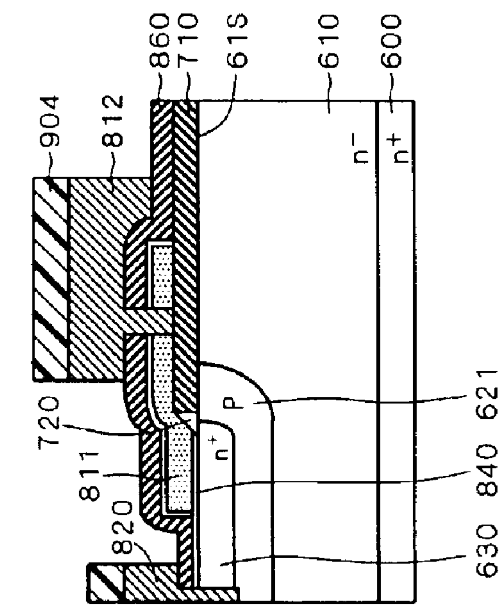
Figure 21C:
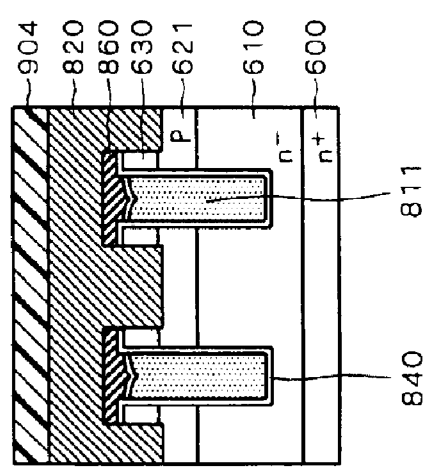
Figure 22A:
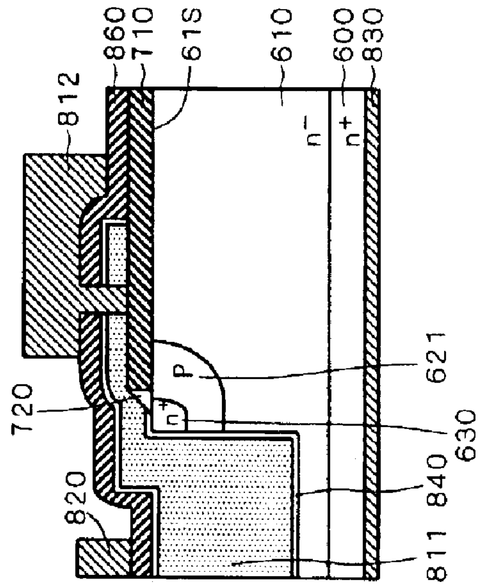
Figure 22B:
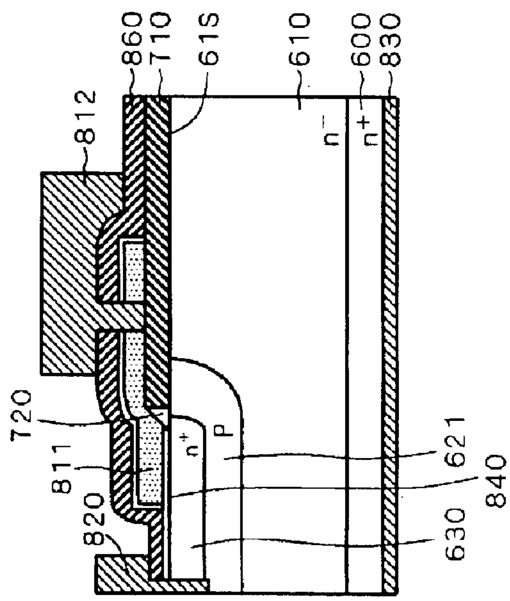
Figure 22C:
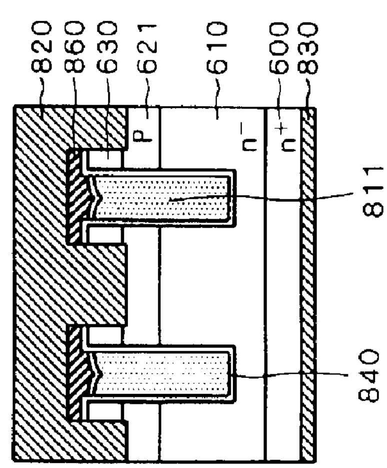

Then, a conductive Al—Si film is deposited on the entire interlayer insulation film 860 by sputtering to fill in the gate contact hole 819 and the source contact holes 829, and a photoresist pattern 904 is formed on the Al—Si film, using photolithography techniques (see FIG. 21). Using the photoresist pattern 904 as a mask, etching is performed to form the gate aluminum electrode 812 and the source electrode 820 from Al—Si film in the previously described configuration (see FIG. 21). By controlling the pattern shapes of the gate polysilicon electrode 811 and the gate aluminum electrode 812, the gate electrode 810 can be obtained which has the aforementioned configuration, more specifically, which extends opposite the main surface 61S with the portion of the gate insulating film 840 on the main surface 61S and the first and second insulators 710 and 720 sandwiched in between and which extends away from the central region 551 beyond the p-type layer 620. Thereafter, the photoresist pattern 904 is removed.

Then, a conductive Ti—Ni—Au alloy is deposited by sputtering on the entire main surface of the substrate 600 on the side opposite the epitaxial layer 610, thereby to form the drain electrode 830 (see FIG. 22).

In the power semiconductor device 501 as above described, n-type impurities for the $n^+$ source layer 630 are ion implanted through the opening 711 under conditions where the second insulator 720 is present (see FIG. 12). At this time, unlike the conventional manufacturing method, photolithography techniques are not used because the second insulator 720 is formed by etching back the second insulating film 720*x* (see FIGS. 10 and 11). This achieves cost reduction, and further eliminates the need for high precision alignment that is required for photolithography techniques, thereby improving yields.

Besides, as compared with a semiconductor device which is manufactured by the previously described manufacturing method without using the second insulator 720 (in which method, a mask used in ion implantation for formation of the p base layer is used again in ion implantation for formation of the $n^+$ source layer), the semiconductor device 501 is less apt to cause punch-through and can thus improve the breakdown voltage. This is for the following reason. As previously described, ion implantation for formation of the $n^+$ source layer 630 is performed using the first and second insulators 710 and 720 as masks. Thus, the width W1 (see FIGS. 3 and 4) of the outer end portion of the p-type layer 620 (the p base layer 621), in other words, the distance W1 between the outer peripheries of the p-type layer 620 and the $n^+$ source layer 630, becomes greater than that in the previously described manufacturing method which does not use the second insulator 720. This reduces the occurrence of punch-through in the outer end portion of the p-type layer 620.

In this way, the semiconductor device 501 can reduce photolithography process steps and can prevent a decrease in breakdown voltage due to the reduction of the process steps.

Further, the gate electrode 810 is formed not only within the gate trench 813 but also extends opposite the main surface 61S with the portion of the gate insulating film 840 on the main surface 61S and the first and second insulators 710 and 720 sandwiched in between and extends away from the central region 551 beyond the p-type layer 620 (i.e., extends beyond the location of the p-type layer 620). The gate electrode 810, therefore, carries out the functions of controlling a main current flowing between the source and drain electrodes 820 and 830 and achieving the field plate effect during operation of the semiconductor device 501 (i.e., when the source electrode 820 is placed at a ground potential and the drain electrode 830 is placed at a positive potential), thereby improving the breakdown voltage.

Figure 23:
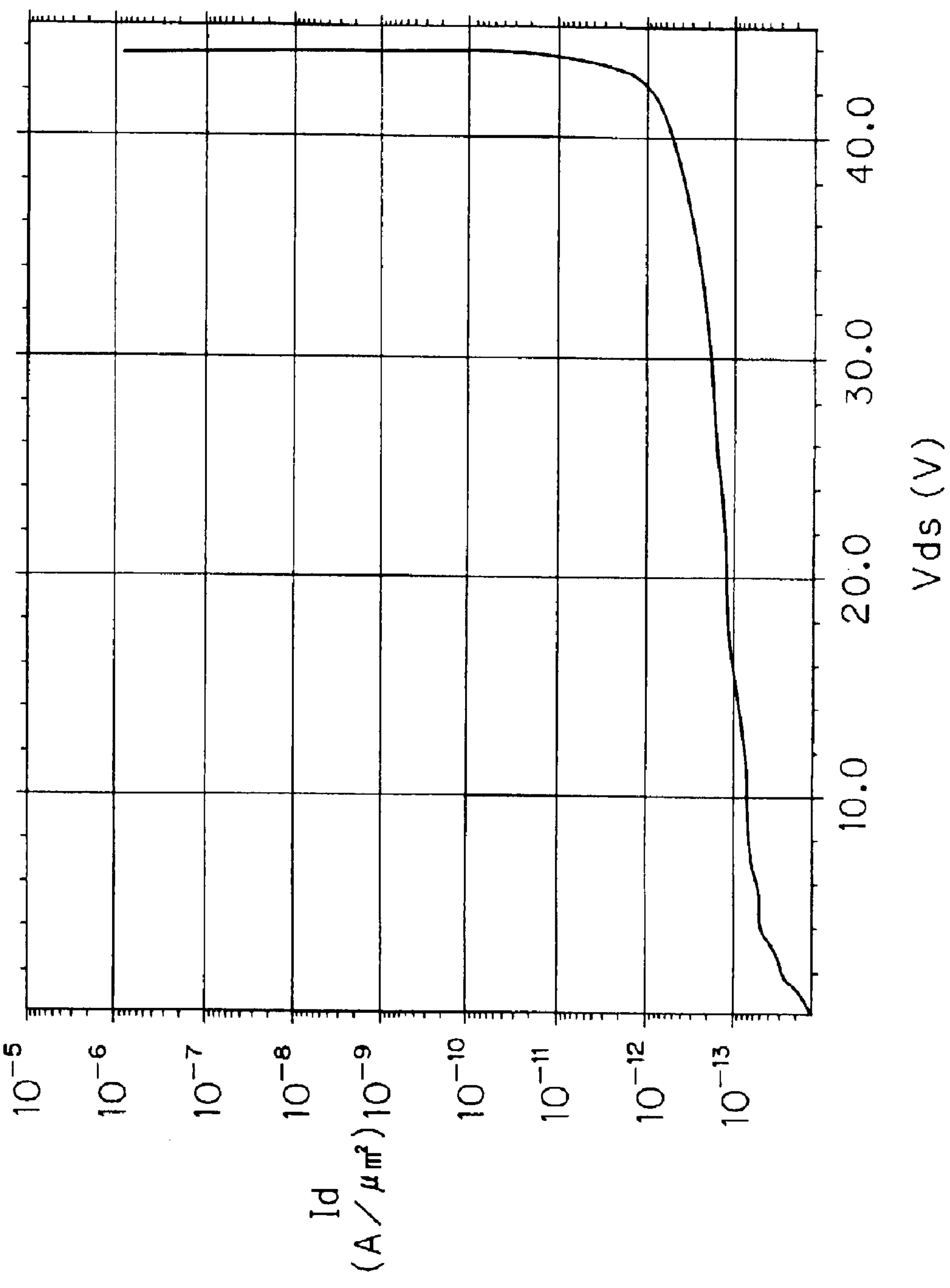
FIG. 23 is a graph for explaining the power semiconductor device according to the first preferred embodiment.
Figure 24:
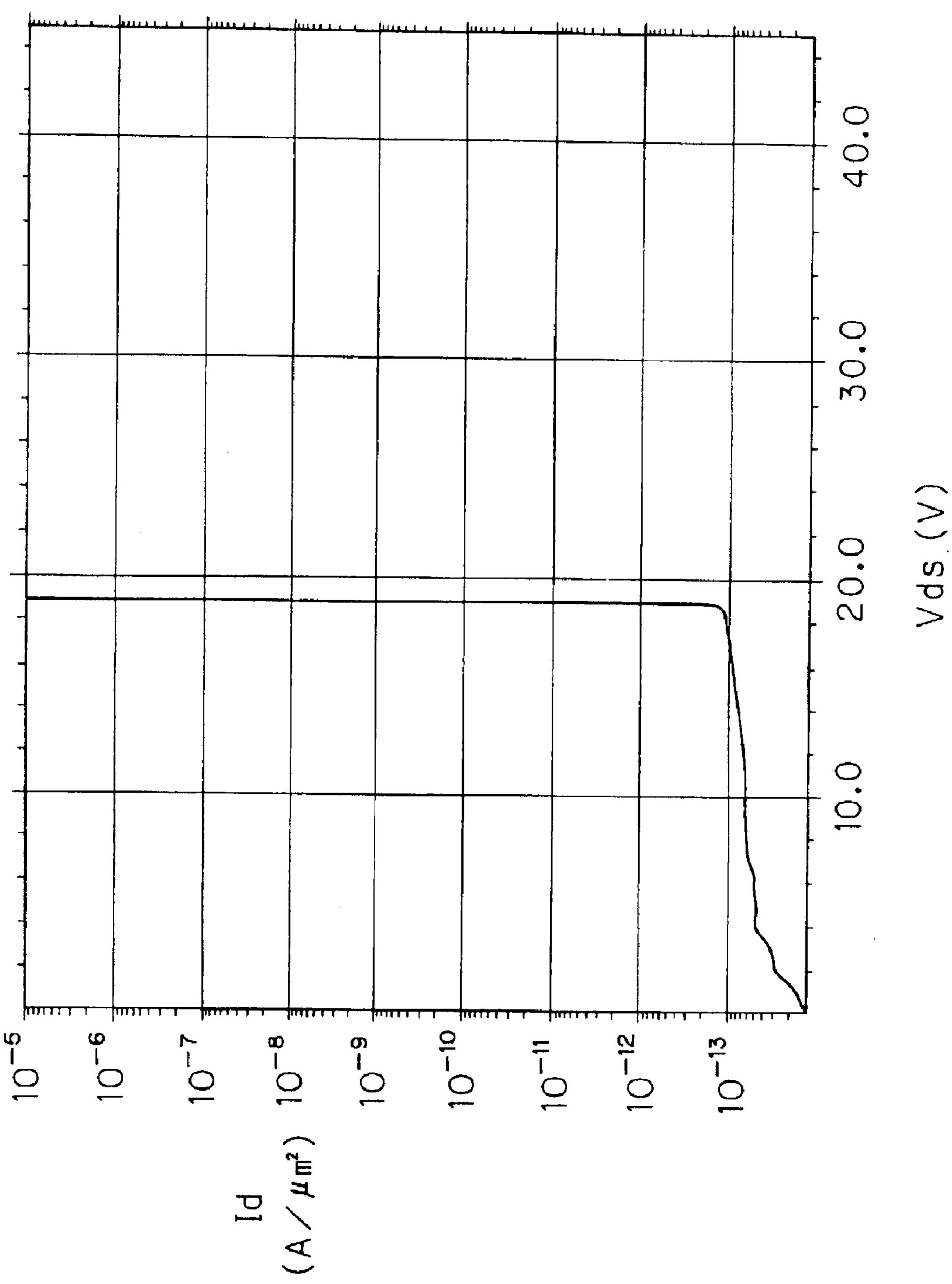
FIG. 24 is a graph for explaining a power semiconductor device for use in comparison.

FIGS. 23 and 24 show the results of calculating, using a device simulator "Medici", the drain-source breakdown voltage of the power semiconductor device 501 and a power semiconductor device for comparison which is manufactured by the previously described manufacturing method not using the second insulator 720. It can be seen that, while the breakdown voltage of the semiconductor device for comparison is about 19 volts as shown in FIG. 24, the breakdown voltage of the semiconductor device 501 is increased to about 44 volts as shown in FIG. 23.

Second Preferred Embodiment

Figure 25:
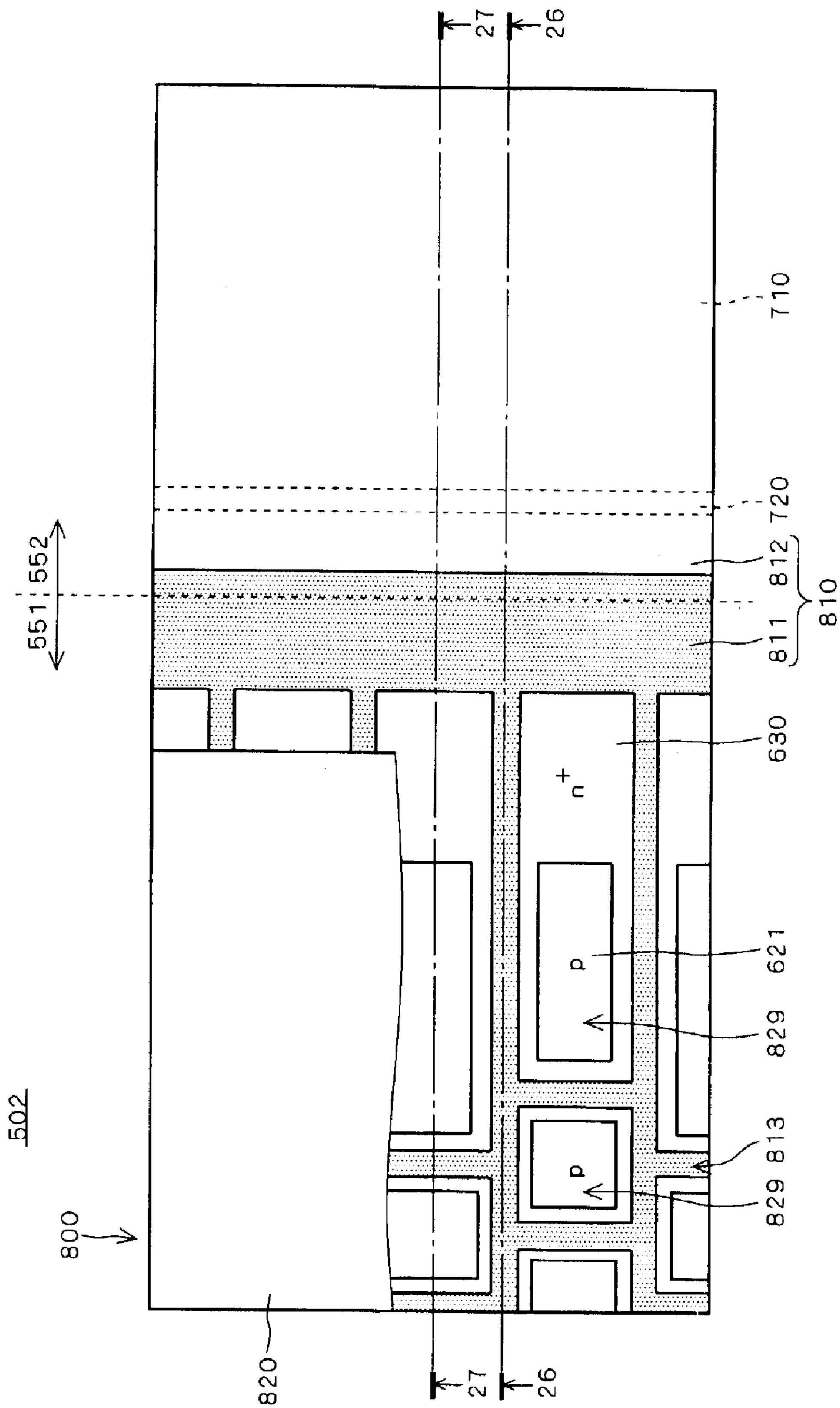
FIG. 25 is a plan view for explaining a power semiconductor device according to a second preferred embodiment.
Figure 26:
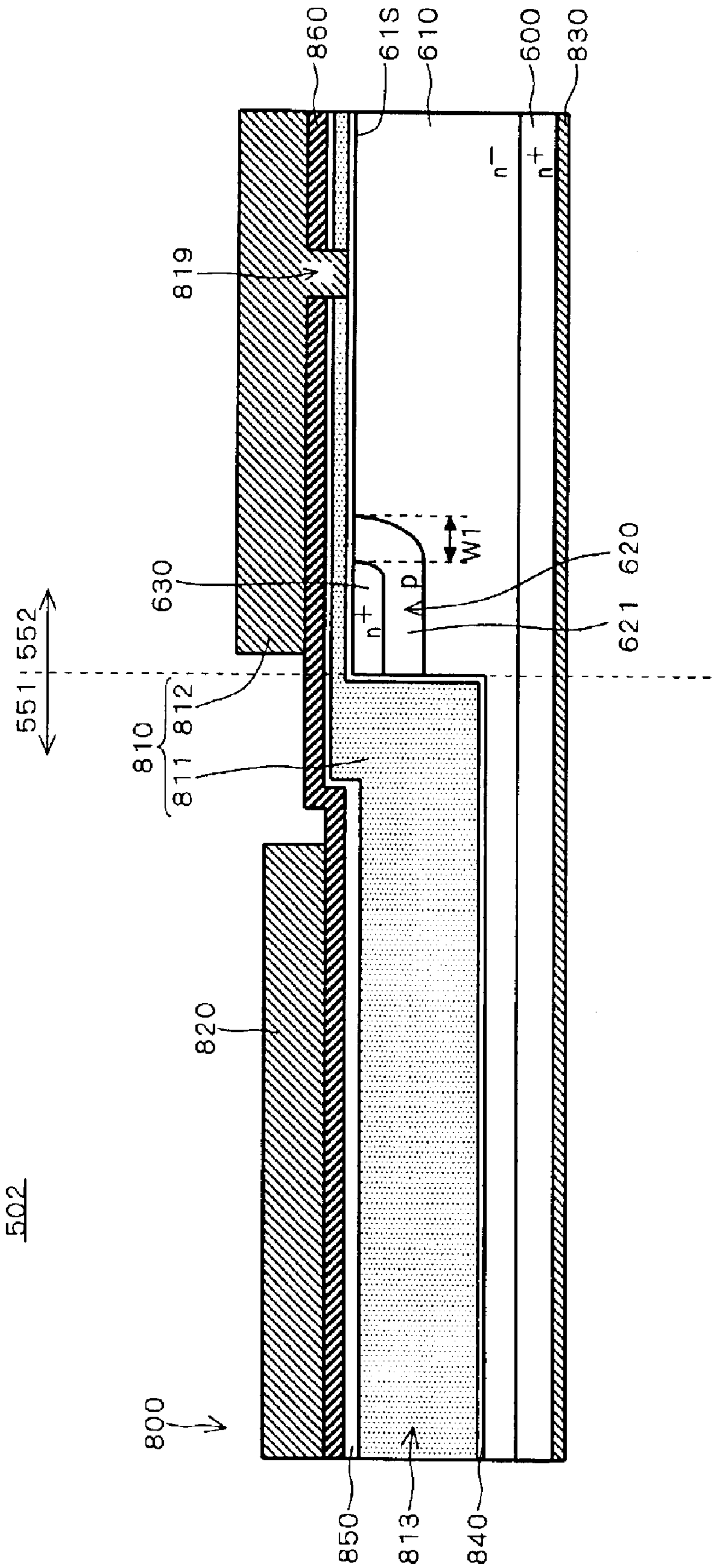
FIG. 26 is a cross-sectional view taken along line 26—26 of FIG. 25.
Figure 27:
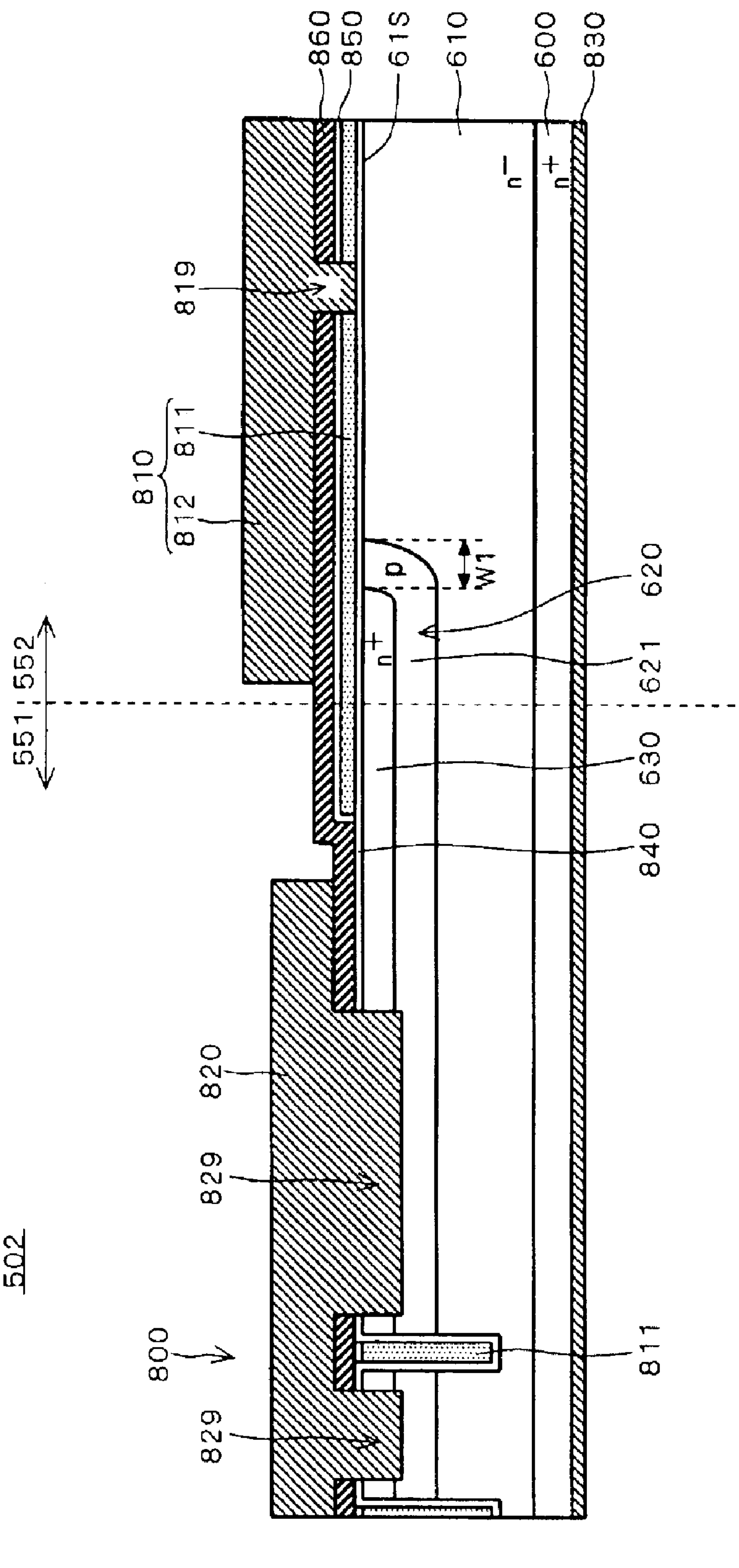
FIG. 27 is a cross-sectional view taken along line 27—27 of FIG. 25.

FIG. 25 shows a plan view for explaining a power semiconductor device 502 according to a second preferred embodiment, FIG. 26 shows a cross-sectional view taken along line 26—26 of FIG. 25, and FIG. 27 shows a cross-sectional view taken along line 27—27 of FIG. 25. The semiconductor device 502 is configured by removing the first and second insulators 710 and 720 from the semiconductor device 501 (see FIGS. 2–4). In the semiconductor device 502, therefore, the gate insulating film 840 outside the gate trench 813 extends also into a region where the first and second insulator 710 and 720 had been located. The other parts of the configuration of the semiconductor device 502 are basically identical to those of the previously described semiconductor device 501.

Figure 28A:
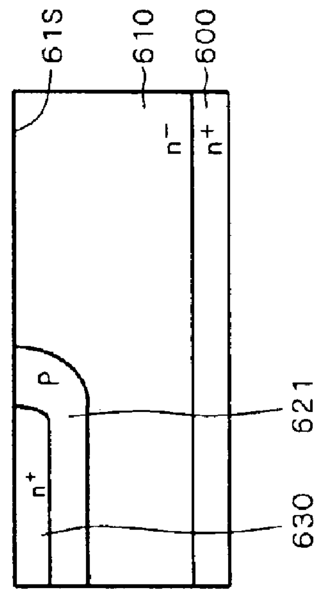
Figure 28B:
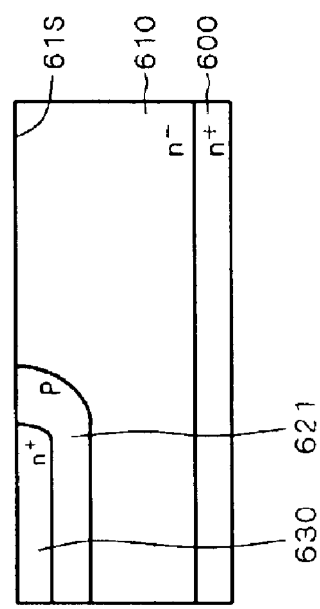
Figure 28C:
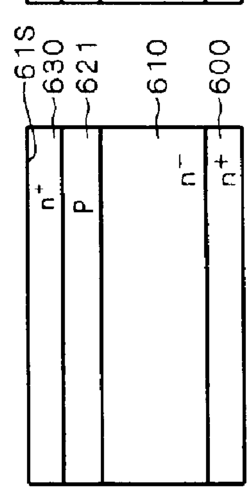
Figure 29A:
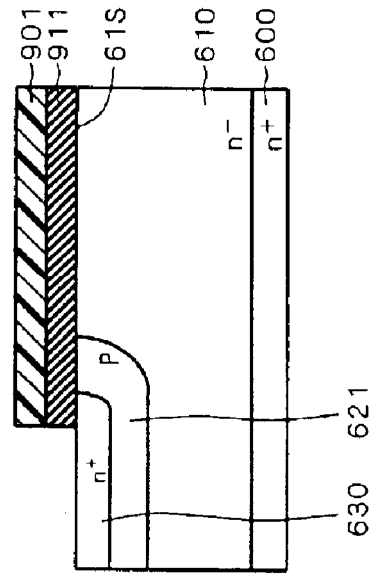
Figure 29B:
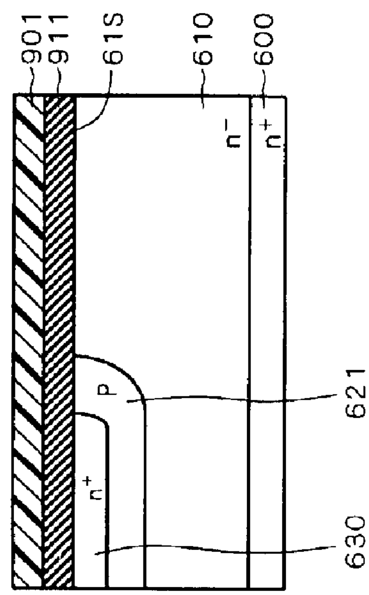
Figure 29C:
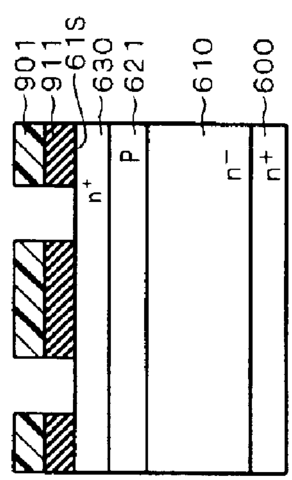
Figure 30A:
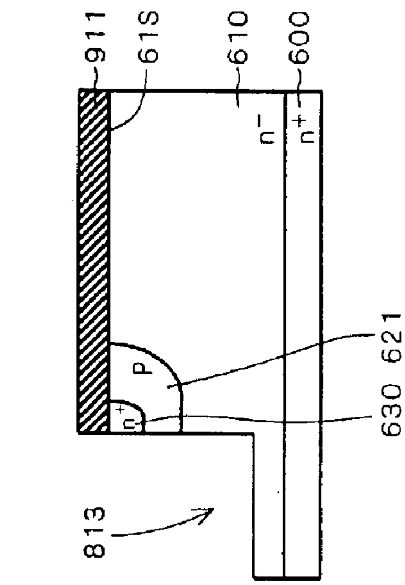
Figure 30B:
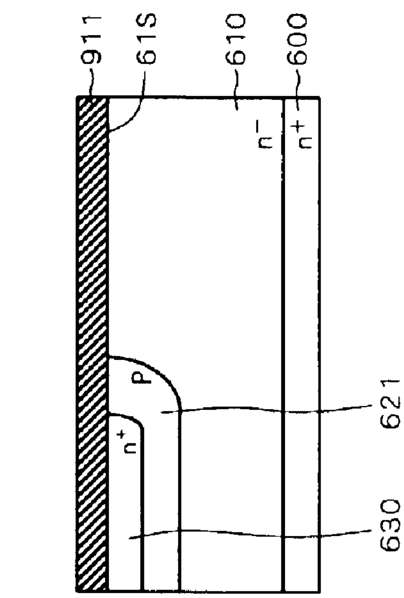
Figure 30C:
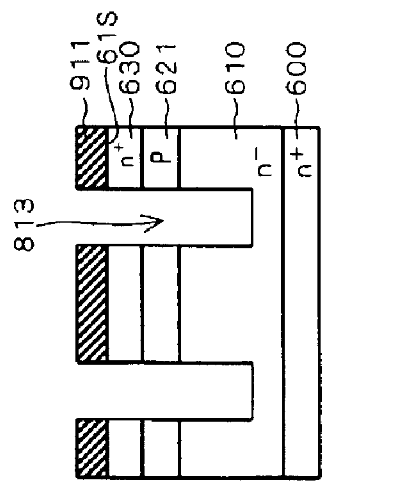

Next, a method of manufacturing the semiconductor device 502 is described with reference also to FIGS. 28 through 38. FIGS. 28A, 29A, and so on through FIG. 38A correspond to FIG. 25; FIGS. 28B, 29B, and so on through FIG. 38B correspond to FIG. 26; and FIGS. 28C, 29C, and so on through FIG. 38C correspond to FIG. 27.

First, the process steps until the formation of the $n^+$ source layer 630 are performed according to the previously described manufacturing method of the semiconductor device 501 (see FIG. 12).

Then, the first and second insulators 710 and 720 are removed by wet etching (see FIG. 28).

Subsequent process steps are basically identical to those in the previously-described manufacturing method of the semiconductor device 501. More specifically, the oxide film 911 is formed and patterned corresponding to the gate trench 813 (see FIG. 29). Since, in the manufacturing method of the semiconductor device 502, the first and second insulators 710 and 720 were removed as above described, the oxide film 911 is formed in contact with the main surface 61S in a region where the first and second insulators 710 and 720 had been located. Then, the gate trench 813 is formed using the patterned oxide film 911 as a mask (see FIG. 30).

Figure 31A:
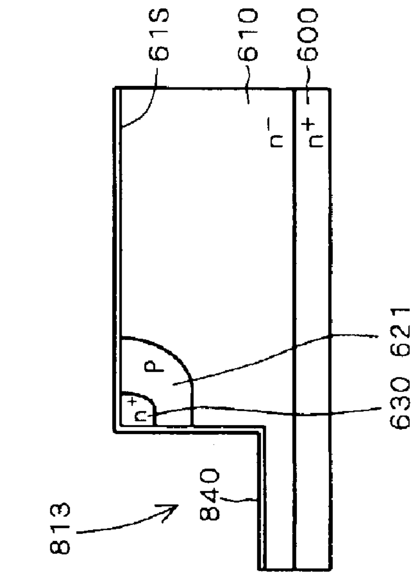
Figure 31B:
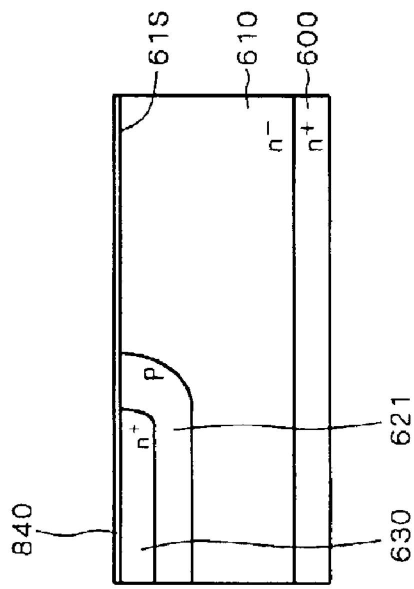
Figure 31C:
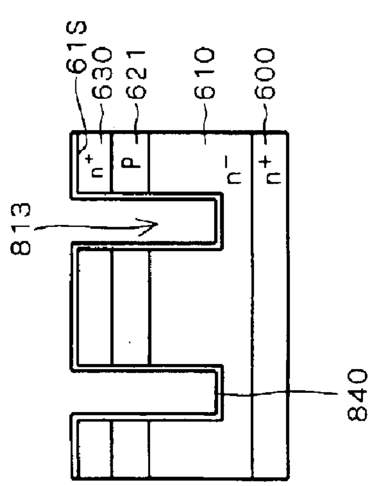

After removal of the oxide film 911, the gate insulating film 840 is formed (see FIG. 31). Since, in the manufacturing method of the semiconductor device 502, the first and second insulators 710 and 720 were removed as above described, the gate insulating film 840 extends also into the region where the first and second insulators 710 and 720 had been located.

Subsequently, the polysilicon film 811*x* is formed (see FIG. 32) and patterned to form the gate polysilicon electrode 811 (see FIG. 33). Then, the cap oxide film 850 and the interlayer insulation film 860 are formed (see FIG. 34). The interlayer insulation film 860 and the cap oxide film 850 are then opened (see FIG. 35) to form the gate contact hole 819 and the source contact holes 829 (see FIG. 36). Then, an Al—Si film is formed on the interlayer insulation film 860 and patterned to form the gate aluminum electrode 812 and the source electrode 820 (see FIG. 37). Further, the drain electrode 830 is formed (see FIG. 38).

Thus, like the power semiconductor device 501, the power semiconductor device 502 can reduce photolithography process steps and can prevent a decrease in breakdown voltage due to the reduction of the process steps.

At this time, since the semiconductor device 502 does not have the first and second insulators 710 and 720, the gate insulating film 840 thinner than the first insulator 710 is spread between the portion of the gate electrode 810 outside the trench 813 and the main surface 61S. Thus, the portion of the gate electrode 810 outside the trench 813 is closer to the main surface 61S. The semiconductor device 502, therefore, can further increase the field plate effect by the gate electrode 810, thereby further improving the breakdown voltage.

Third Preferred Embodiment

Figure 39:
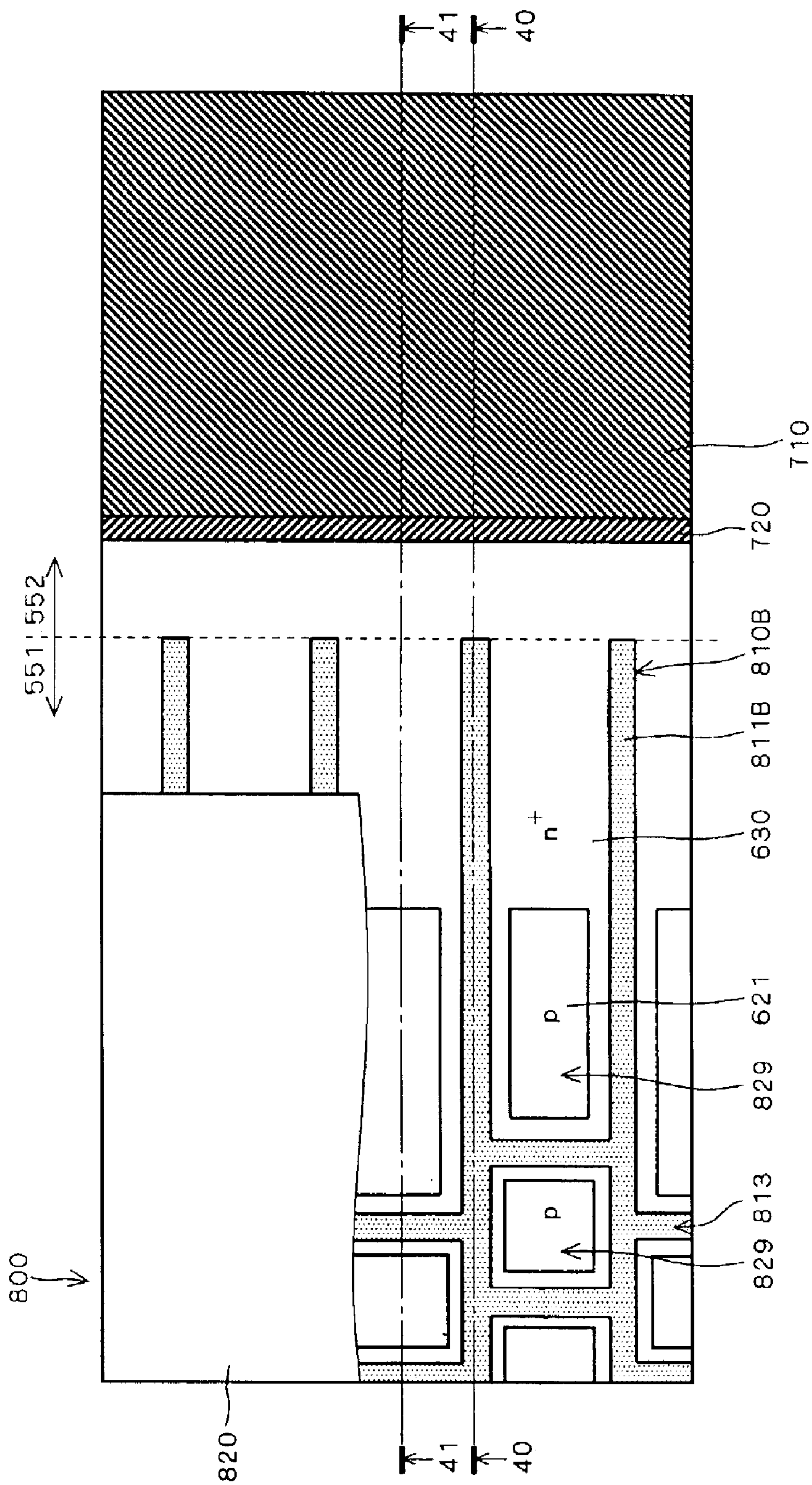
FIG. 39 is a plan view for explaining a power semiconductor device according to a third preferred embodiment.
Figure 40:
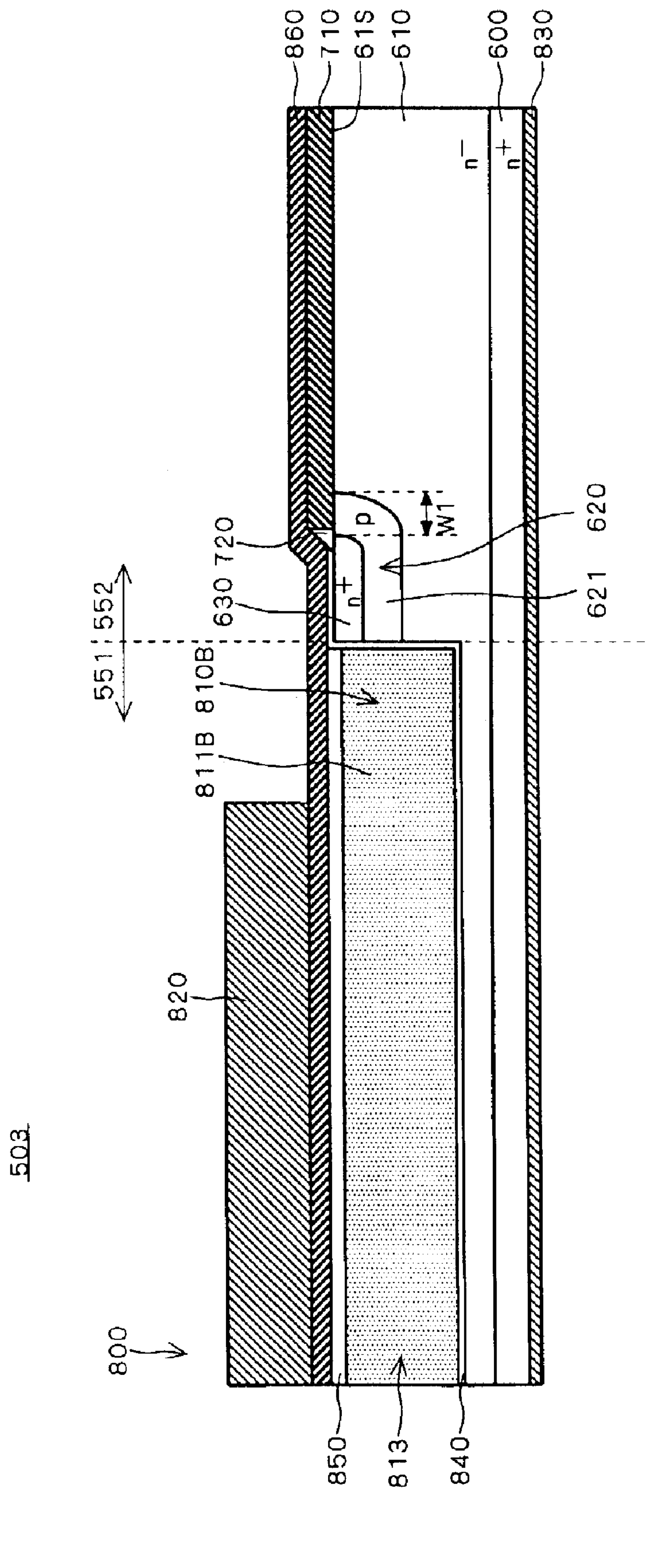
FIG. 40 is a cross-sectional view taken along line 40—40 of FIG. 39.

FIG. 39 shows a plan view for explaining a power semiconductor device 503 according to a third preferred embodiment, FIG. 40 shows a cross-sectional view taken along line 40—40 of FIG. 39, and FIG. 41 shows a cross-sectional view taken along line 41—41 of FIG. 39. The semiconductor device 503 is configured by replacing the gate electrode 810 in the semiconductor device 501 (see FIGS. 2–4) with a gate electrode 810B. The other parts of the configuration of the semiconductor device 503 are basically identical to those of the previously described semiconductor device 501.

More specifically, the gate electrode 810B is configured of a gate polysilicon electrode 811B which is configured by removing a portion of the previously described gate polysilicon electrode 811 which is extended out of the trench 813 (see FIGS. 2–4) and thus, it does not include the previously described gate aluminum electrode 812 (see FIGS. 2–4). That is, unlike the previously described semiconductor device 501, the semiconductor device 503 has the gate electrode 810B which does not extend away from the central region 551 beyond the p-type layer 620 (i.e., which does not extend beyond the location of the p-type layer 620); in other words, the gate electrode 810B does not extend into the outer peripheral region 552. In the semiconductor device 503, the cap oxide film 850 also does not extend into the outer peripheral region 552. Since the gate electrode 810B does not extend out of the trench 813, the interlayer insulation film 860 is in contact with a portion of the gate insulating film 840 on the main surface 61S and with the first and second insulators 710 and 720.

Figure 32A:
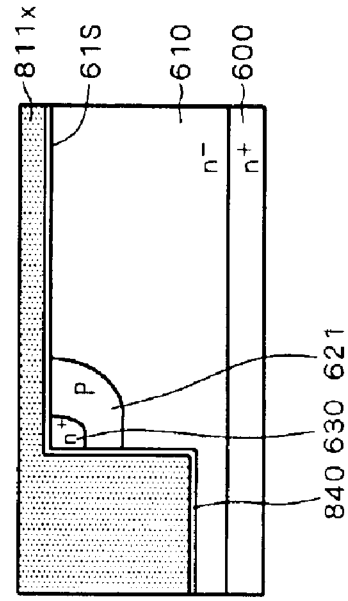
Figure 32B:
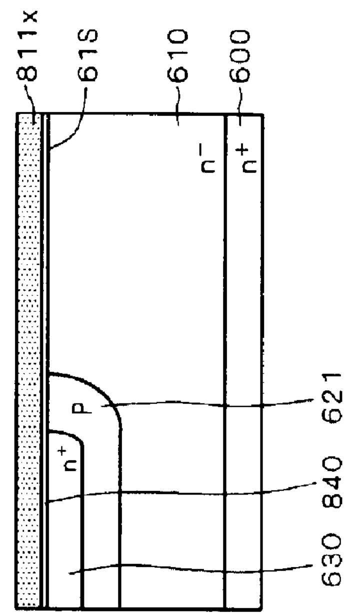
Figure 32C:
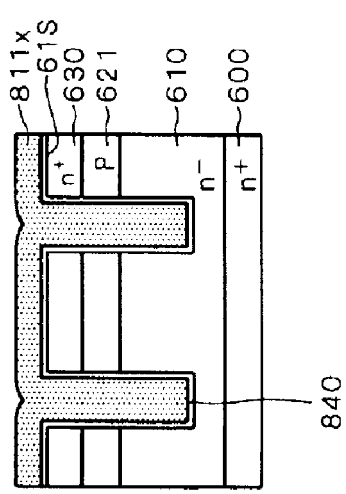
Figure 33A:
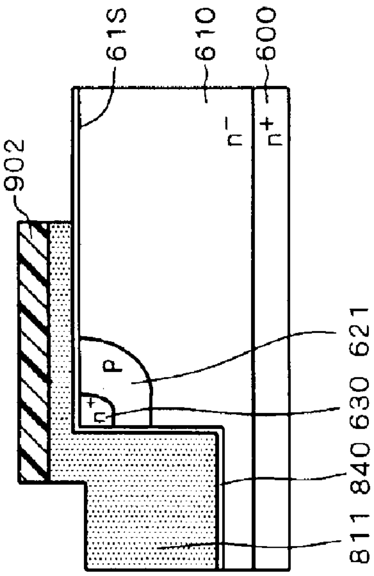
Figure 33B:
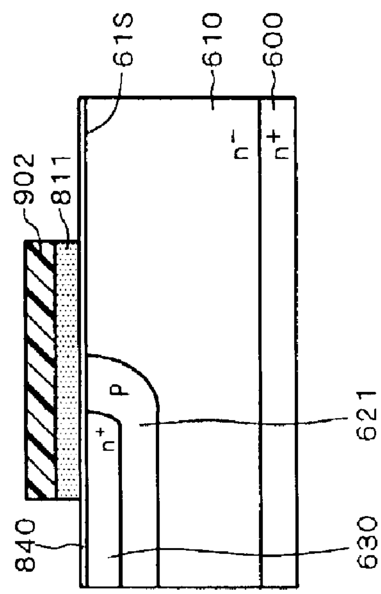
Figure 33C:
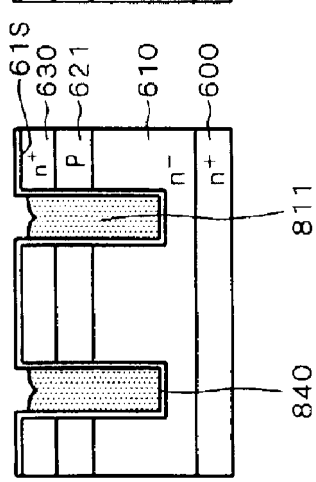
Figures 34A, 34B, 34C:
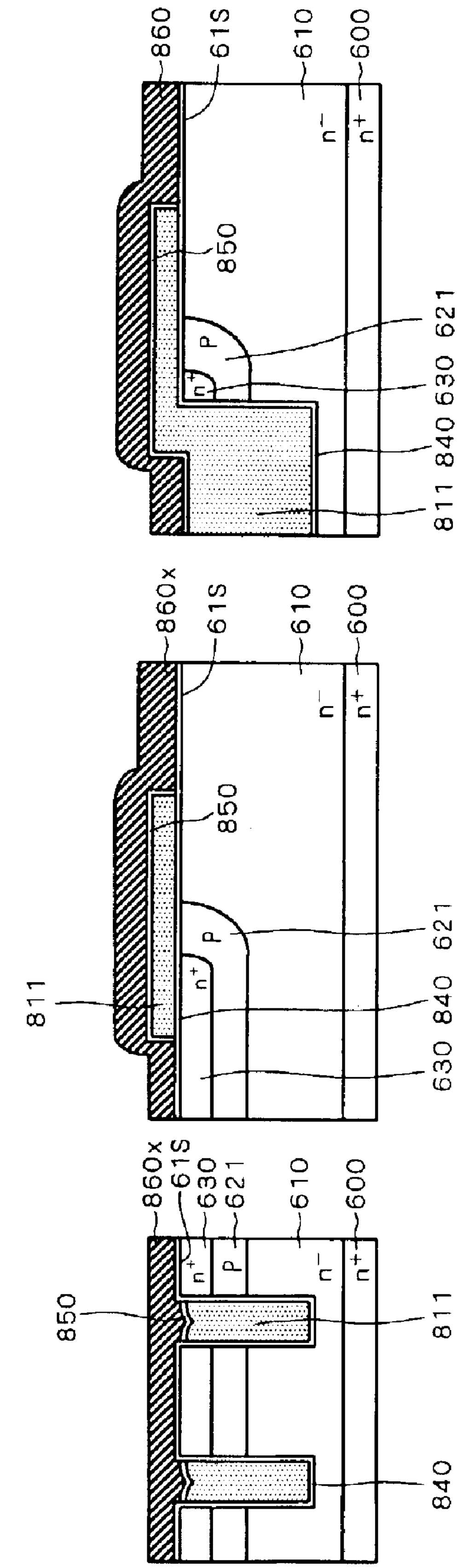
Figure 36A:
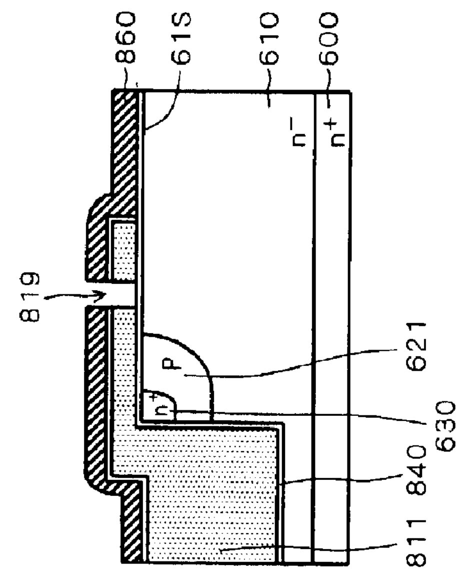
Figure 36B:
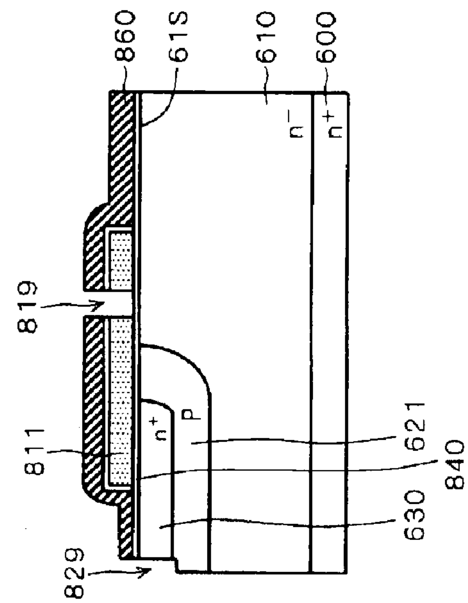
Figure 36C:
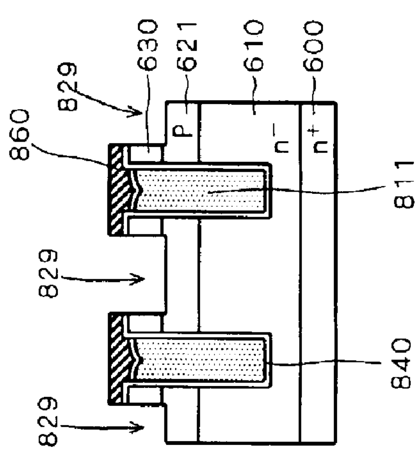
Figure 37A:
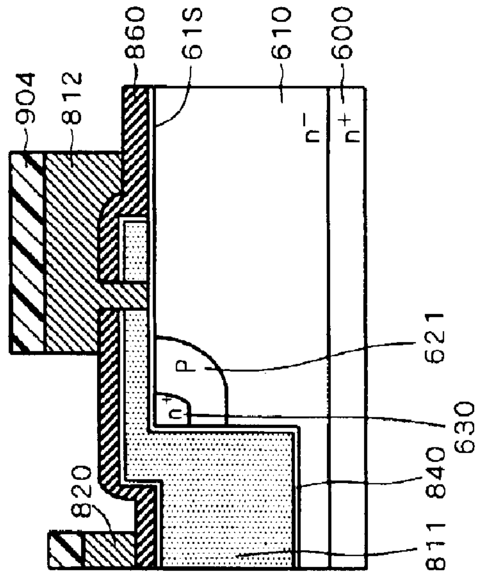
Figure 37B:
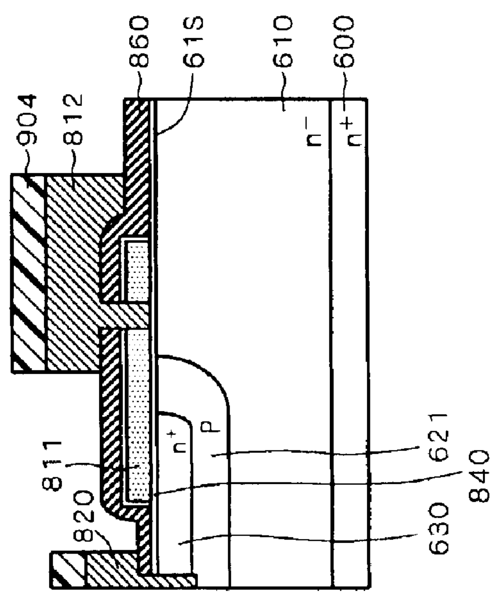
Figure 37C:
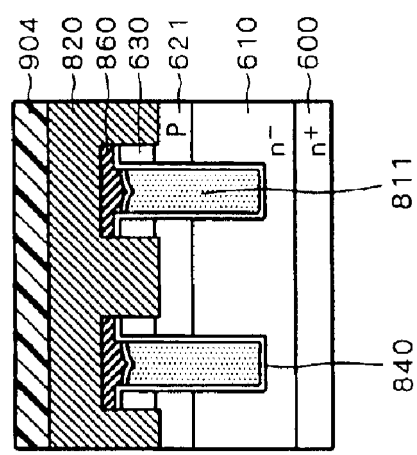
Figure 38A:
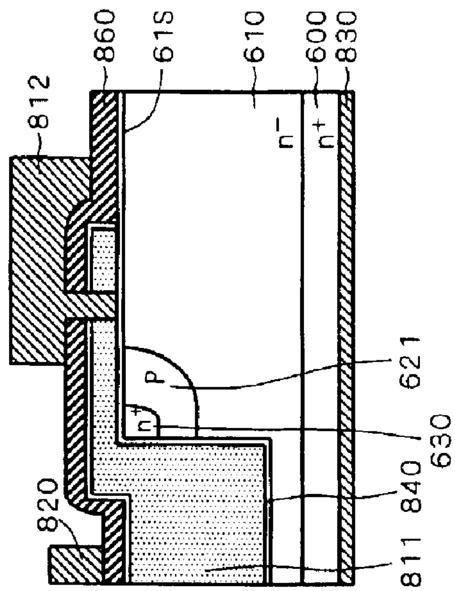
Figure 38B:
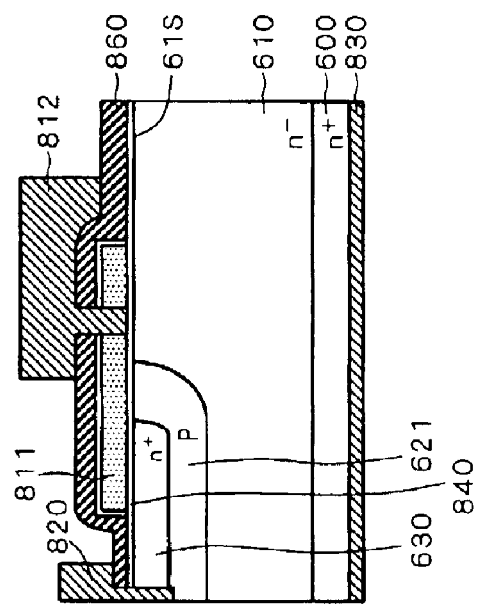
Figure 38C:
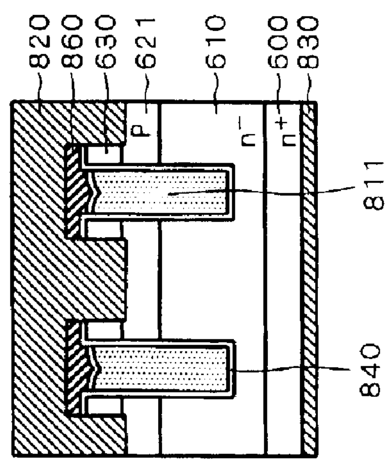

The semiconductor device 503 with this configuration can be manufactured by, for example, etching back the polysilicon film 811*x* without using the photoresist pattern 902 in the manufacturing method of the semiconductor device 501 (see FIGS. 32 and 33).

Like the power semiconductor device 501, the power semiconductor device 503 can reduce photolithography process steps and can prevent a decrease in breakdown voltage due to the reduction of the process steps.

Fourth Preferred Embodiment

The aforementioned semiconductor device 503 (see FIGS. 39–41) fails to achieve the field plate effect by the gate electrode 810B because the gate electrode 810B does not face the main surface 61S within the outer peripheral region 552, and thus cannot achieve a resultant effect of improving the breakdown voltage. This fourth preferred embodiment contemplates improvements on this point.

Figure 42:
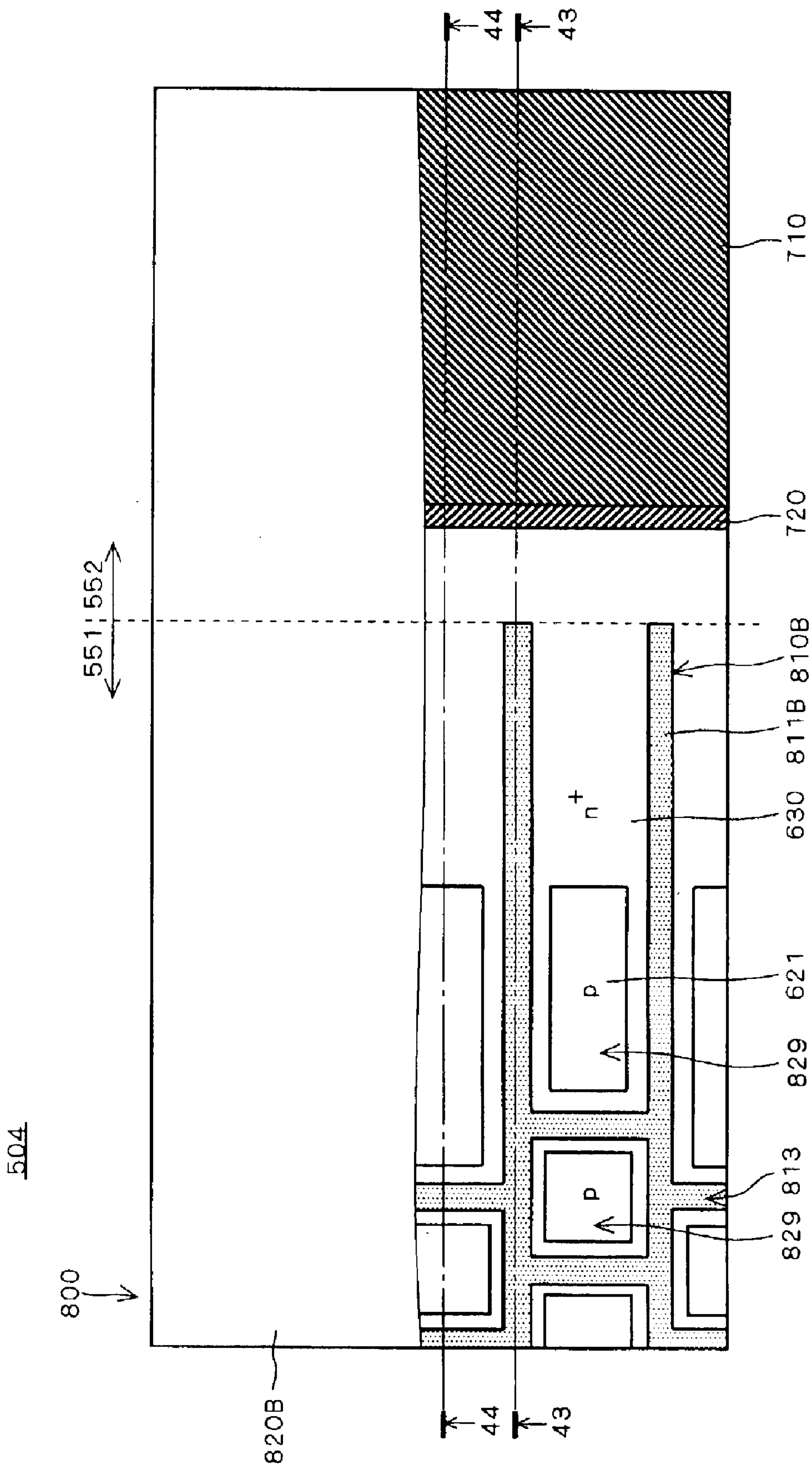
FIG. 42 is a plan view for explaining a power semiconductor device according to a fourth preferred embodiment.
Figure 43:
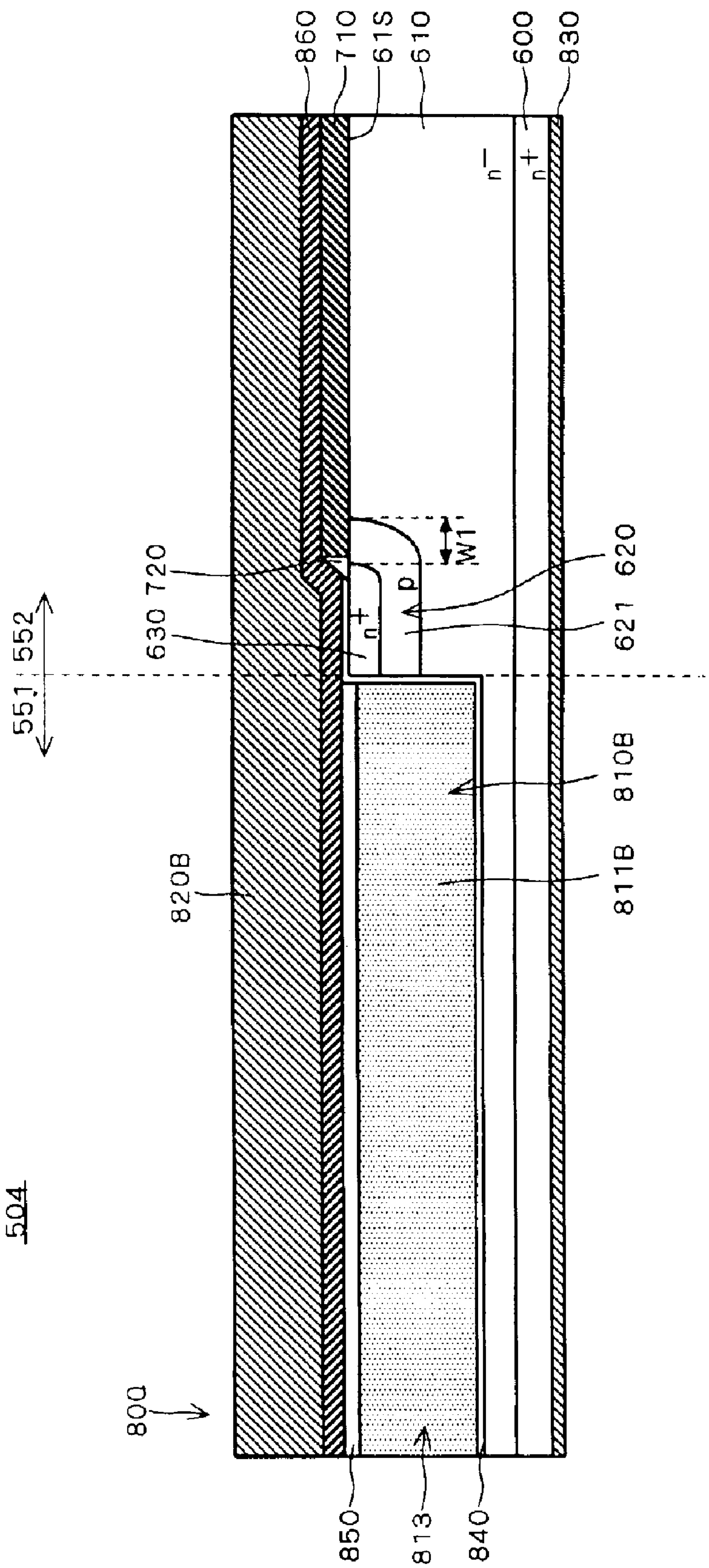
FIG. 43 is a cross-sectional view taken along line 43—43 of FIG. 42.

FIG. 42 shows a plan view for explaining a power semiconductor device 504 according to the fourth preferred embodiment, FIG. 43 shows a cross-sectional view taken along line 43—43 of FIG. 42, and FIG. 44 shows a cross-sectional view taken along line 44—44 of FIG. 42. The semiconductor device 504 is configured by replacing the source electrode 820 in the aforementioned semiconductor device 503 (see FIGS. 39–41) with a source electrode 820B which is configured by extending the source electrode 820 into the outer peripheral region 552. The other parts of the configuration of the semiconductor device 504 are basically identical to those of the previously described semiconductor device 503.

In the semiconductor device 504, the source electrode 820B extends into the outer peripheral region 552 so as to face the main surface 61S with the portion of the gate insulating film 840 on the main surface 61S and the second and first insulators 720 and 710 sandwiched in between, and further to extend away from the central region 551 beyond the p-type layer 620, i.e., the p base layer 621 (to extend beyond the location of the p-type layer 620). This source electrode 820B can be formed by controlling the patterning of the Al—Si film located on the interlayer insulation film 860 (see FIG. 37).

The power semiconductor device 504 can achieve the same effect as the aforementioned power semiconductor device 503, and because of the field plate effect achieved by the source electrode 820B, it can further improve the breakdown voltage as compared with the semiconductor device 503.

Fifth Preferred Embodiment

Figure 46:
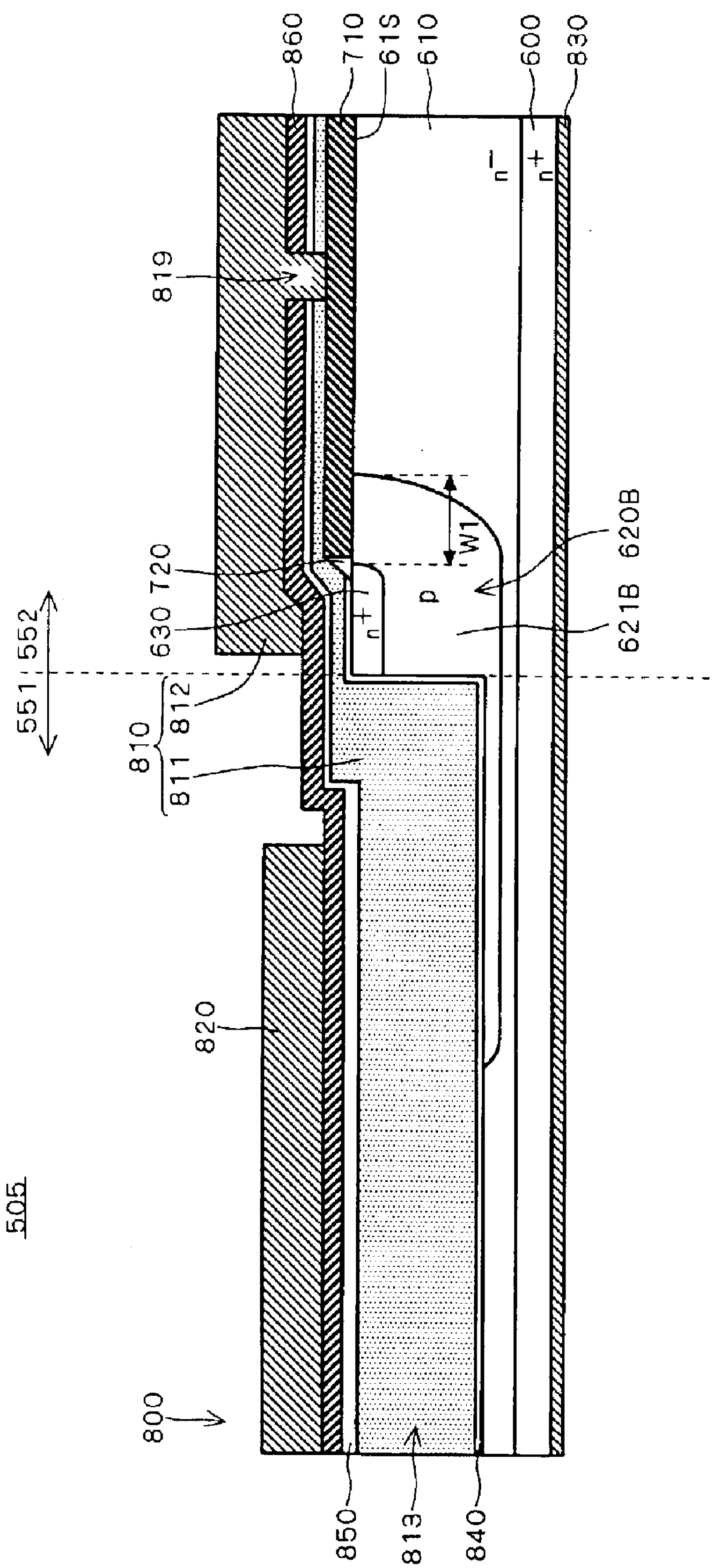
FIG. 46 is a cross-sectional view taken along line 46—46 of FIG. 45.
Figure 47:
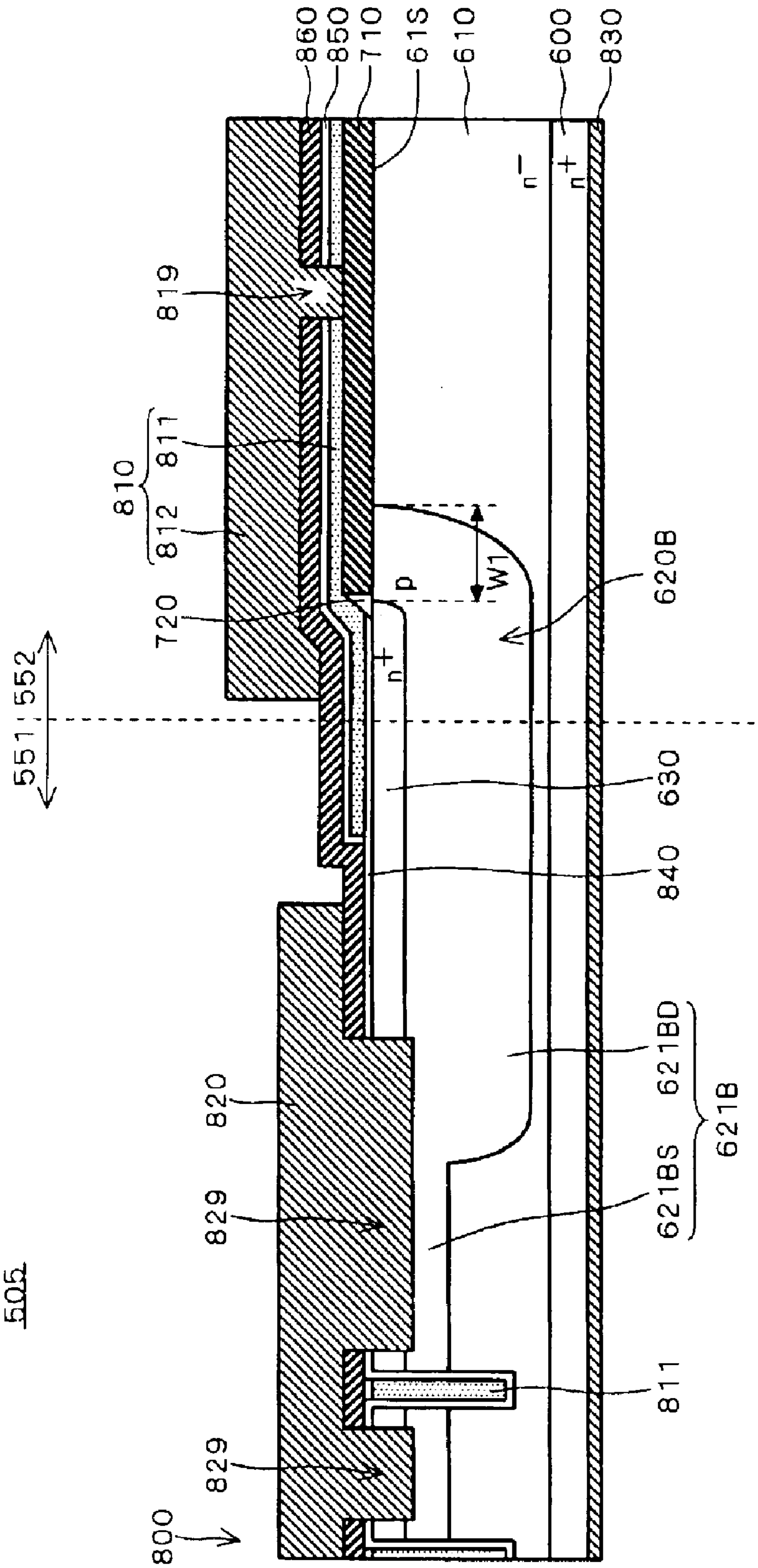
FIG. 47 is a cross-sectional view taken along line 47—47 of FIG. 45.

FIG. 45 shows a plan view for explaining a power semiconductor device 505 according to a fifth preferred embodiment, FIG. 46 shows a cross-sectional view taken along line 46—46 of FIG. 45, and FIG. 47 shows a cross-sectional view taken along line 47—47 of FIG. 45. The semiconductor device 505 is configured by replacing the p-type layer 620 in the semiconductor device 501 (see FIGS. 2–4) with a p-type layer (second semiconductor layer) 620B. The other parts of the configuration of the semiconductor device 505 are basically identical to those of the previously described semiconductor device 501.

More specifically, as illustrated in FIGS. 46 and 47, the p-type layer 620B is configured of a p base layer 621B which is formed by extending an end portion of the previously described p base layer 621 (see FIGS. 2 and 3) from the main surface 61S deeper than a portion thereof within the central region 551. The deepest part of the above deep portion 621BD of the p base layer 621B is at a level below the gate trench 813 (at a position closer to the substrate 600). The above deep portion 621BD extends to a position opposite the first insulator 710. The p base layer 621B can be formed as follows.

First, the process steps until the formation of the p base layer 621 (which later forms a shallow portion 621BS of the p base layer 621B) are performed according to the previously described manufacturing method of the semiconductor device 501 (see FIG. 9). Then, a photoresist pattern 905 which is opened to expose the end portion of the p base layer 621 is formed on the first insulator 710 and the main surface 61S (see FIG. 48). Using the photoresist pattern 905 as a mask, p-type impurities (such as boron) are ion implanted and then heat treatment is carried out, thereby to form the deep portion 621BD of the p base layer 621B (see FIG. 48). This forms the p base layer 621B.

Alternatively, the ion implantation for formation of the deep portion 621BD of the p base layer 621B may be performed prior to the ion implantation for formation of the shallow portion 621BS of the p base layer 621B (i.e., the previously described ion implantation for formation of the p base layer 621) (see FIG. 49).

Heat treatment may be carried out individually after the ion implantation for the shallow portion 621BS and after the ion implantation for the deep portion 621BD, or such two heat treatments may be performed at one time.

The power semiconductor device 505 can achieve the same effect as the previously described power semiconductor device 501. At this time, with the presence of the deep portion 621BD of the p base layer 621B, the width W1 of the outer end portion of the p-type layer 620B (the p base layer 621B) becomes greater than the corresponding width W1 of the p-type layer 620. This can further reduce the occurrence of punch-through and thereby improve the breakdown voltage.

Sixth Preferred Embodiment

Figure 50:
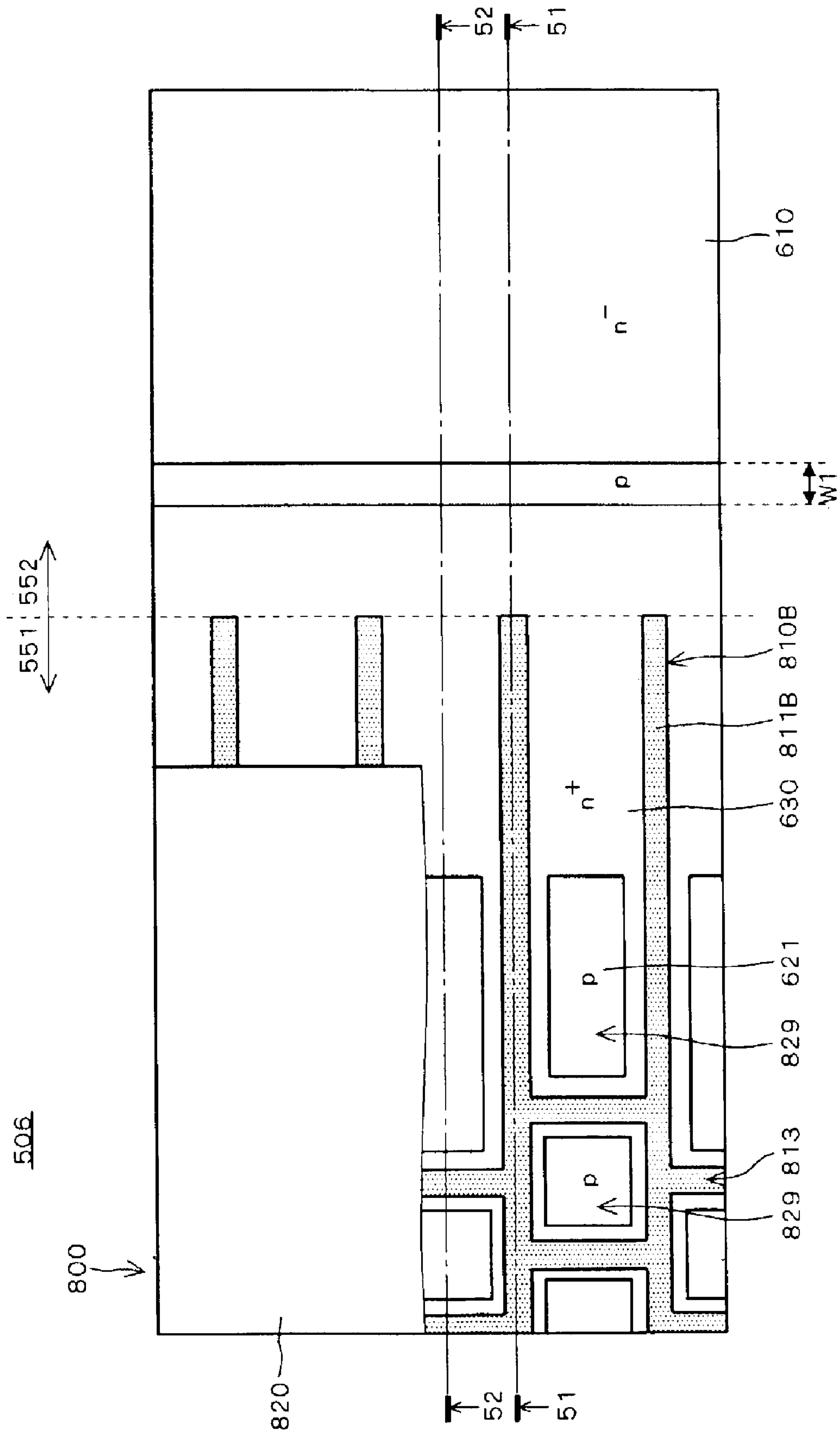
FIG. 50 is a plan view for explaining a power semiconductor device according to a sixth preferred embodiment.
Figure 51:
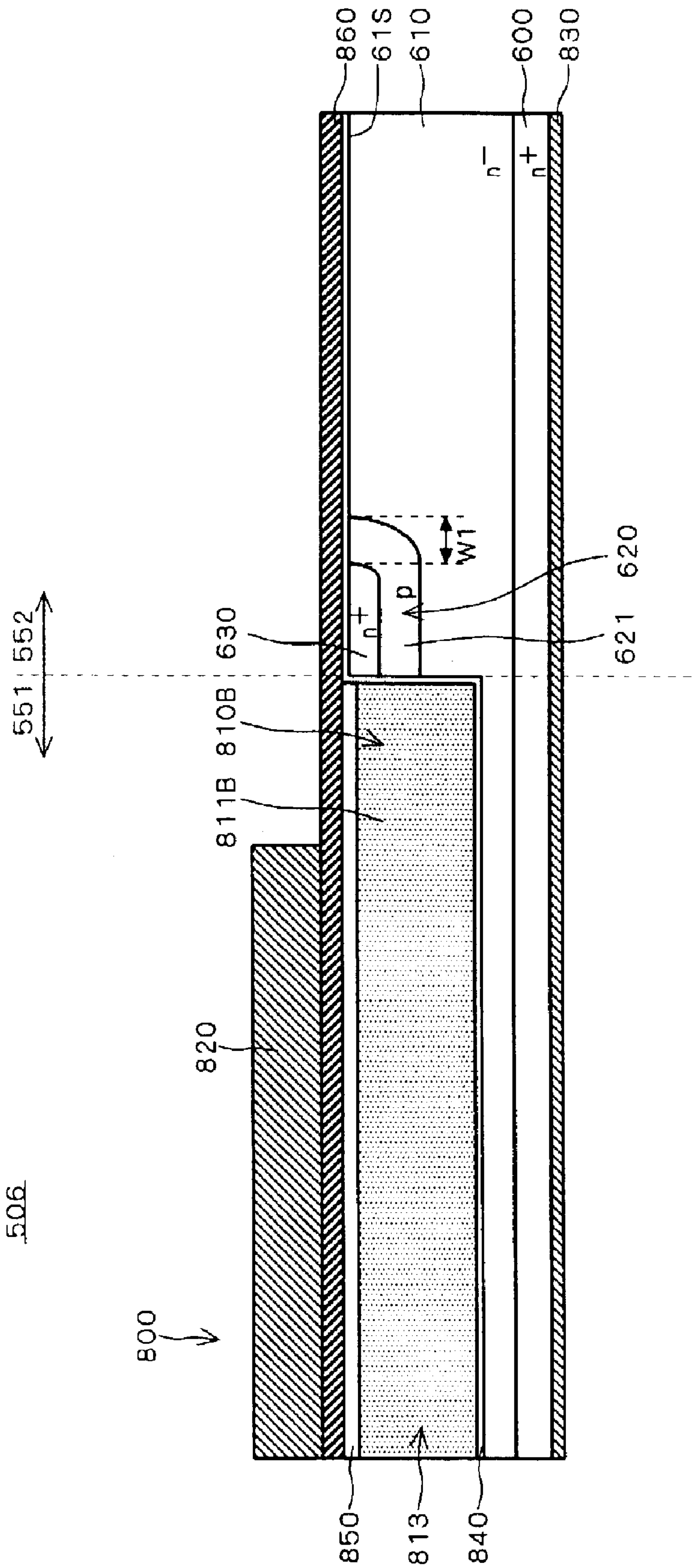
FIG. 51 is a cross-sectional view taken along line 51—51 of FIG. 50.
Figure 52:
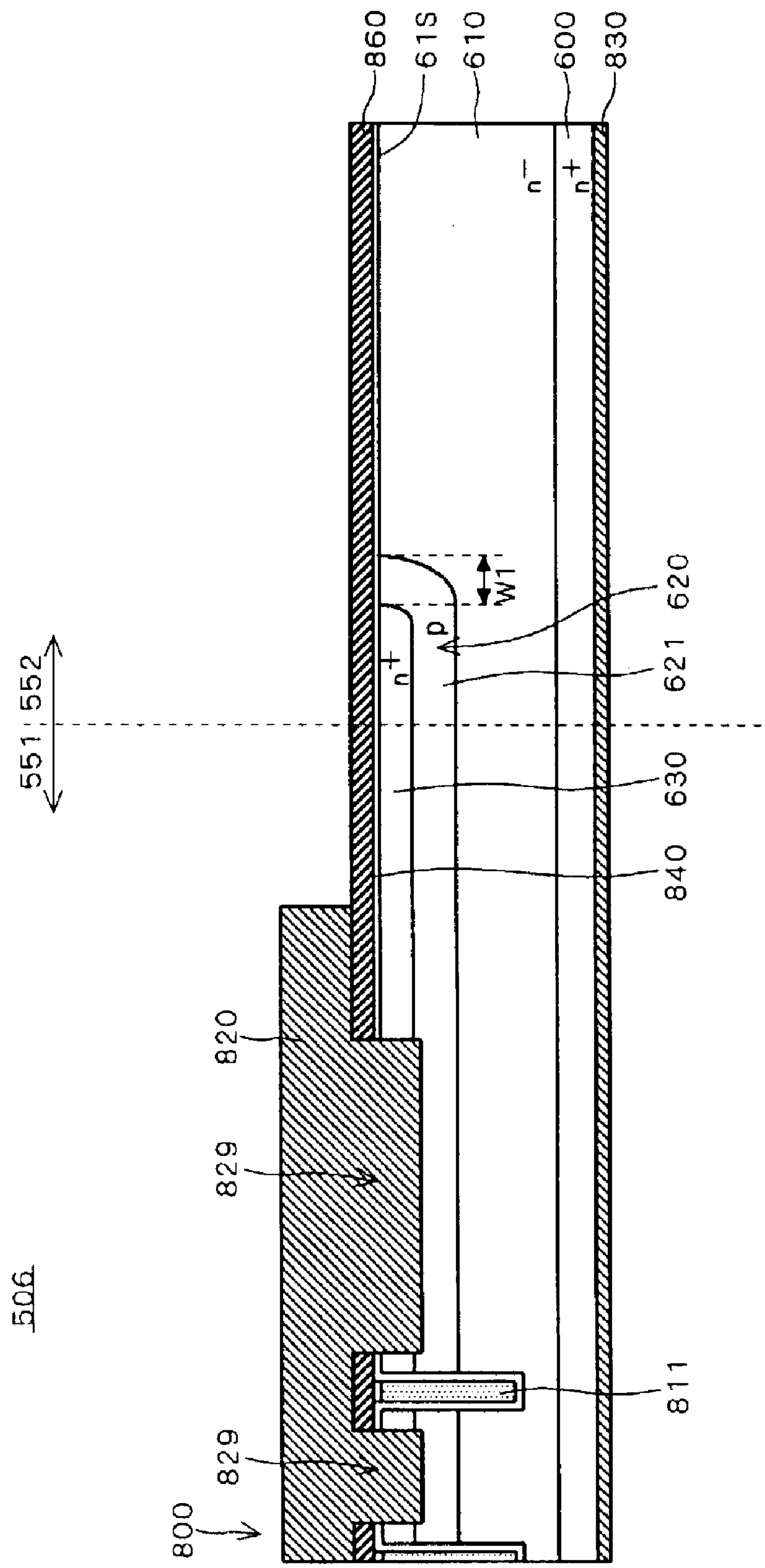
FIG. 52 is a cross-sectional view taken along line 52—52 of FIG. 50.

FIG. 50 shows a plan view for explaining a power semiconductor device 506 according to a sixth preferred embodiment, FIG. 51 shows a cross-sectional view taken along line 51—51 of FIG. 50, and FIG. 52 shows a cross-sectional view taken along line 52—52 of FIG. 50. The semiconductor device 506 has a configuration achieved by a combination of the semiconductor device 502 (see FIGS. 25–27) and the semiconductor device 503 (see FIGS. 39–41). More specifically, the semiconductor device 506 is configured by removing the first and second insulators 710 and 720 from the semiconductor device 503, and the other parts of the configuration of the semiconductor device 506 are basically identical to those of the previously described semiconductor device 503. The semiconductor device 506 can be manufactured by a combination of the manufacturing methods of the semiconductor devices 502 and 503.

The power semiconductor device 506 can achieve the same effect as the previously described power semiconductor device 503.

Seventh Preferred Embodiment

Figure 54:
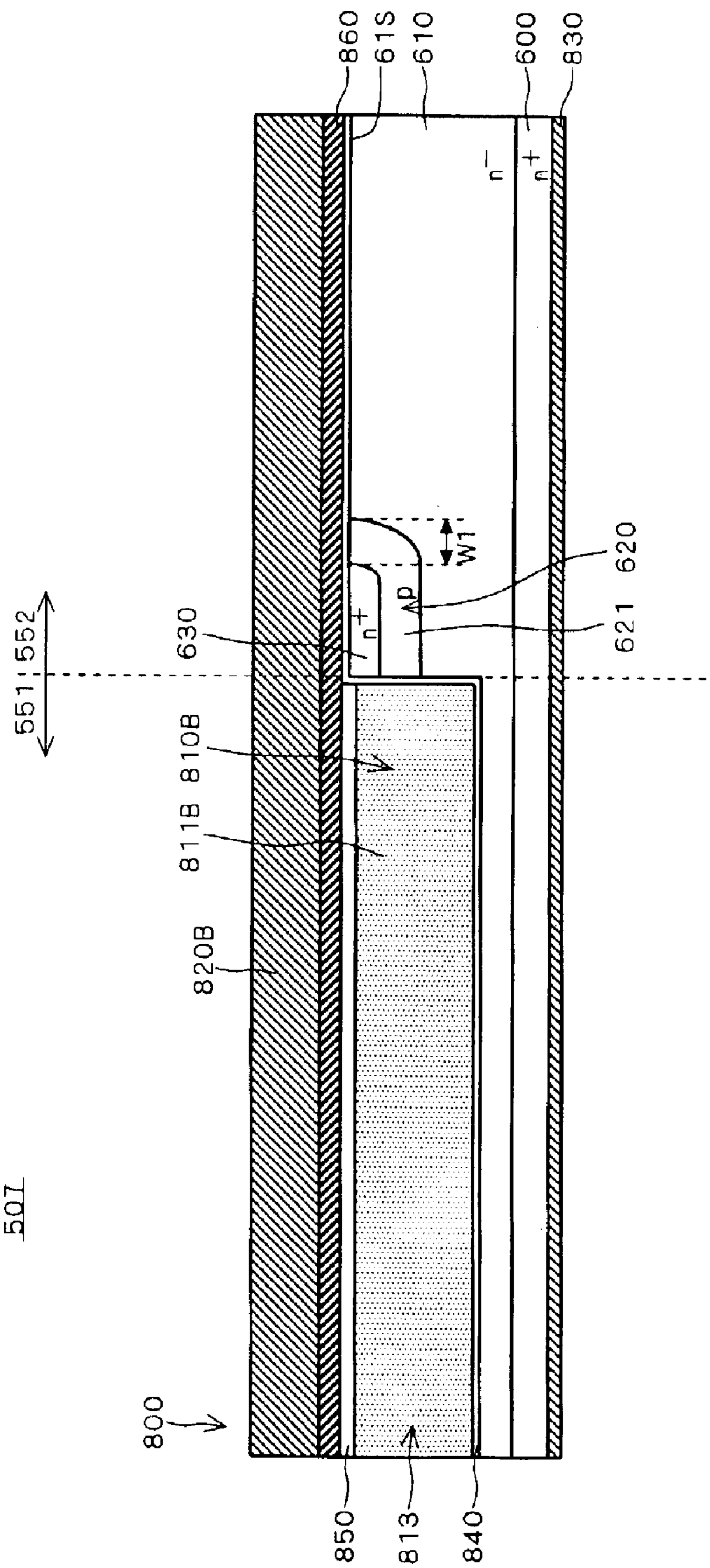
FIG. 54 is a cross-sectional view taken along line 54—54 of FIG. 53.
Figure 55:
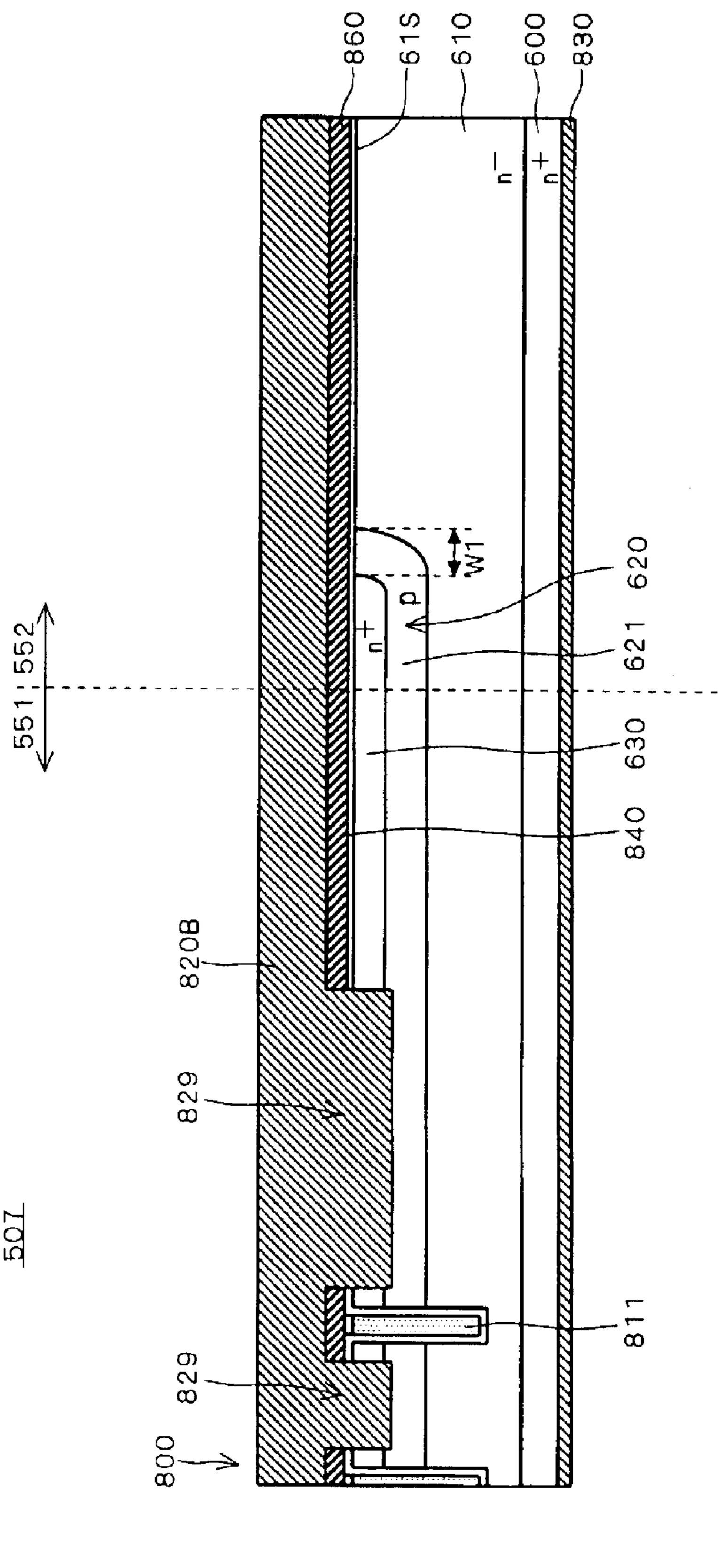
FIG. 55 is a cross-sectional view taken along line 55—55 of FIG. 53.

FIG. 53 shows a plan view for explaining a power semiconductor device 507 according to a seventh preferred embodiment, FIG. 54 shows a cross-sectional view taken along line 54—54 of FIG. 53, and FIG. 55 shows a cross-sectional view taken along line 55—55 of FIG. 53. The semiconductor device 507 has a configuration achieved by a combination of the semiconductor device 502 (see FIGS. 25–27) and the semiconductor device 504 (see FIGS. 42–44). More specifically, the semiconductor device 507 is configured by removing the first and second insulators 710 and 720 from the semiconductor device 504, and the other parts of the configuration of the semiconductor device 507 are basically identical to those of the previously described semiconductor device 504. The semiconductor device 507 can be manufactured by a combination of the manufacturing methods of the semiconductor devices 502 and 504.

The power semiconductor device 507 can achieve the same effect as the previously described power semiconductor devices 502 and 504. At this time, since the semiconductor device 507 does not have the first and second insulators 710 and 720, it can have a more powerful field plate effect achieved by the source electrode 820B than the semiconductor device 504, thereby further improving the breakdown voltage.

Eighth Preferred Embodiment

Figure 56:
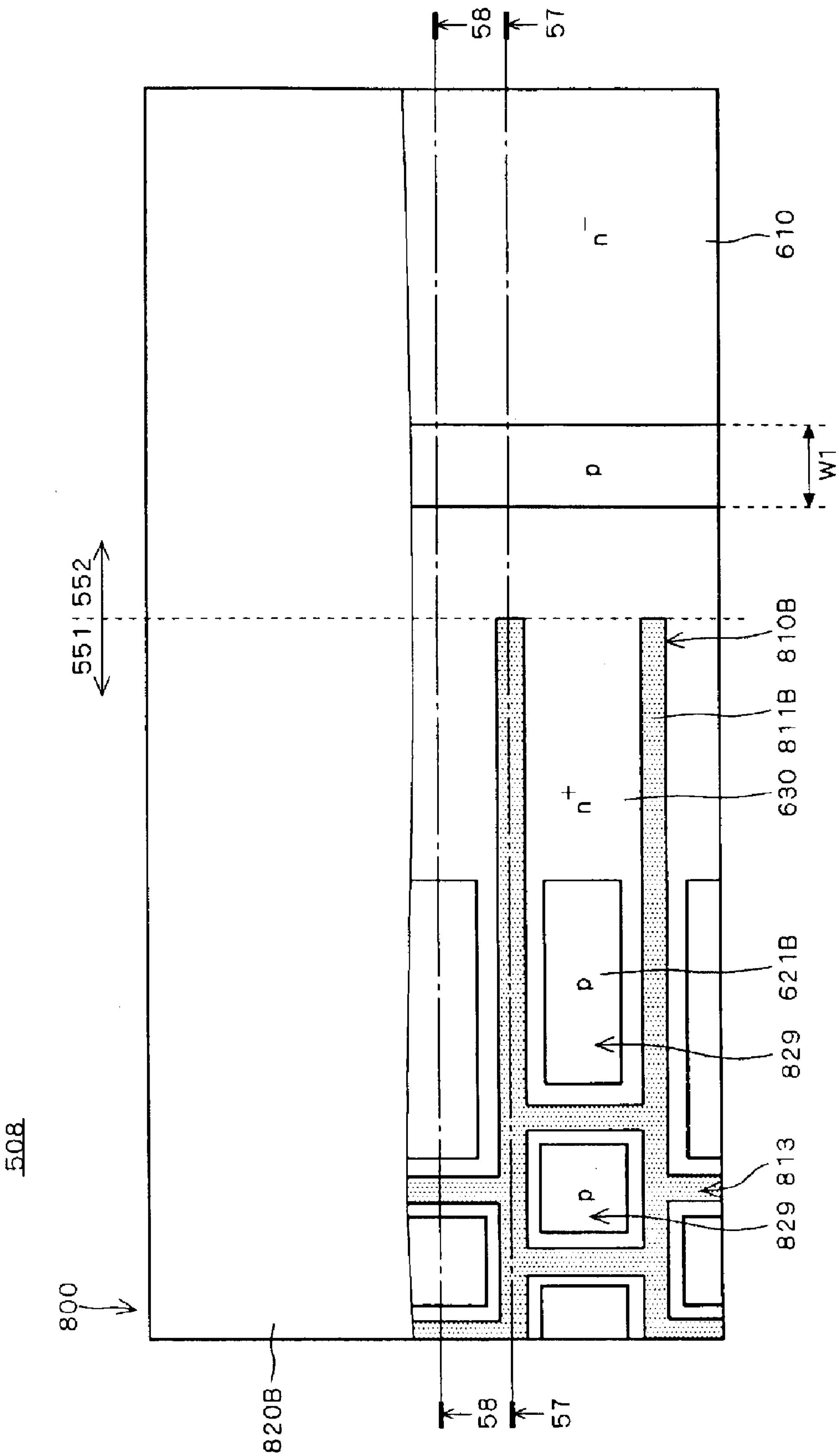
FIG. 56 is a plan view for explaining a power semiconductor device according to an eighth preferred embodiment.
Figure 58:
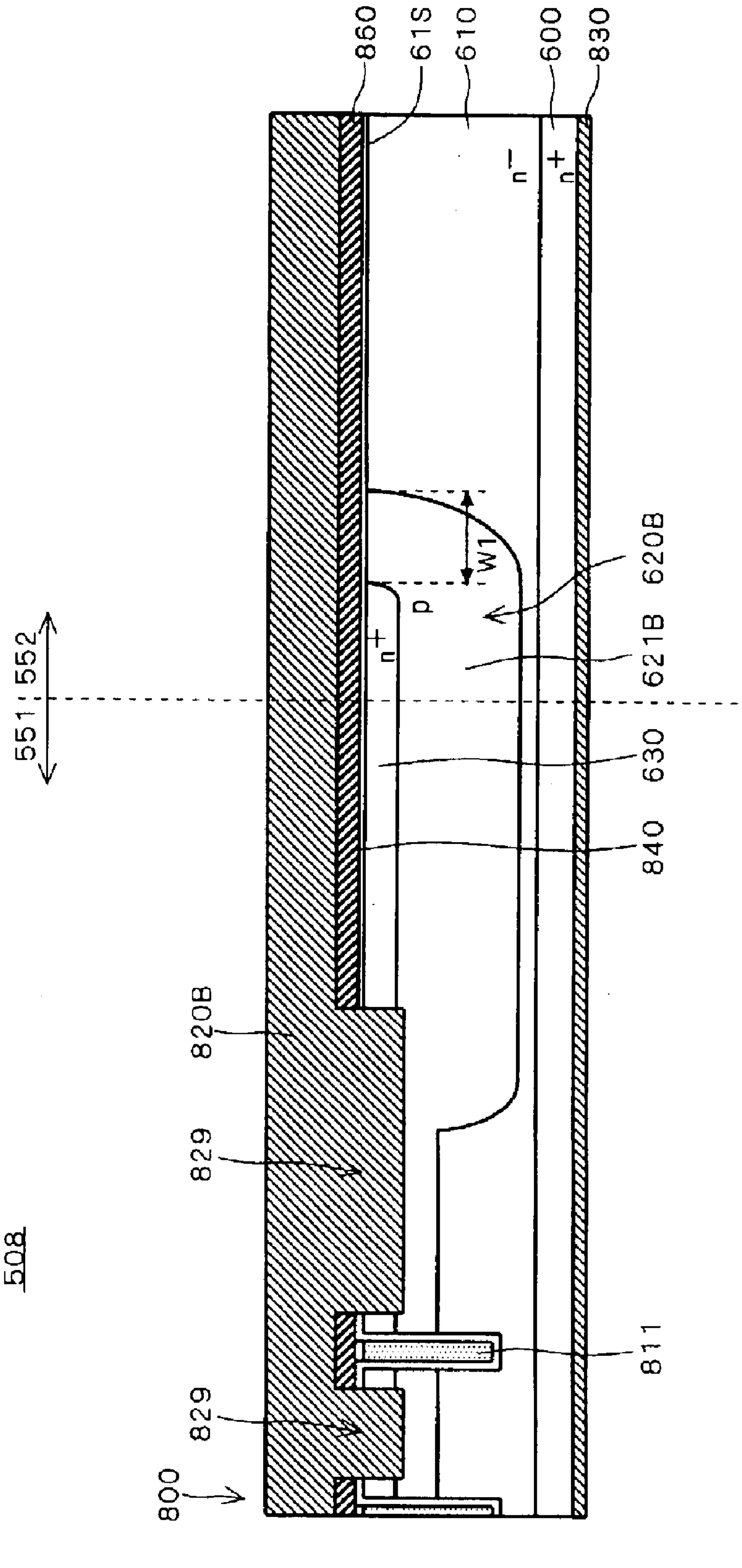
FIG. 58 is a cross-sectional view taken along line 58—58 of FIG. 56.

FIG. 56 shows a plan view for explaining a power semiconductor device 508 according to an eighth preferred embodiment, FIG. 57 shows a cross-sectional view taken along line 57—57 of FIG. 56, and FIG. 58 shows a cross-sectional view taken along line 58—58 of FIG. 56. The semiconductor device 508 has a configuration achieved by a combination of the semiconductor device 507 (see FIGS. 53–55) and the semiconductor device 505 (see FIGS. 45–47). More specifically, the semiconductor device 508 is configured by replacing the p-type layer 620 in the semiconductor device 507 with the p-type layer 620B, and the other parts of the configuration of the semiconductor device 508 are basically identical to those of the previously described semiconductor device 507.

The power semiconductor device 508 can achieve the same effect as the previously described power semiconductor devices 507 and 505.

Ninth Preferred Embodiment

Figure 59:
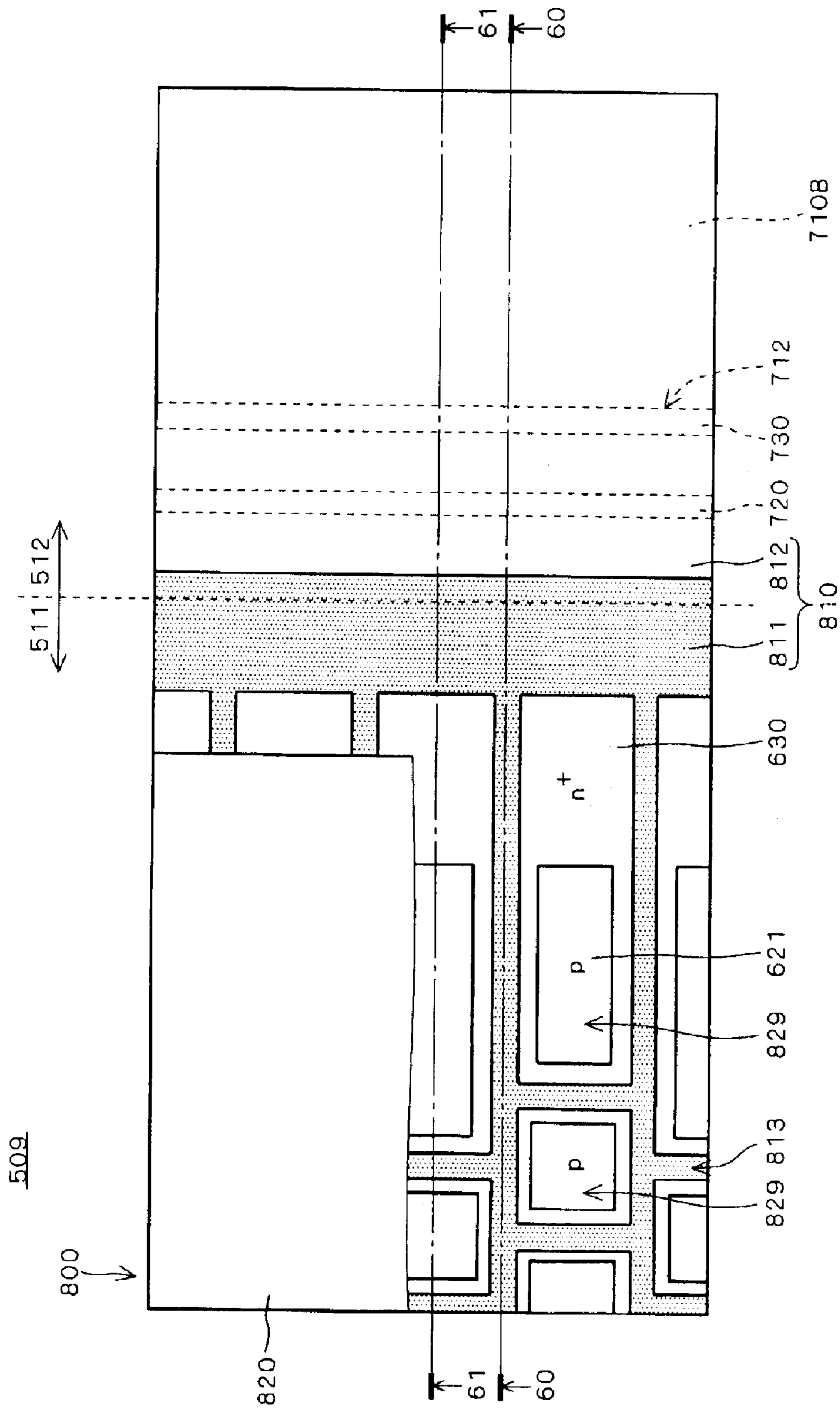
FIG. 59 is a plan view for explaining a power semiconductor device according to a ninth preferred embodiment.
Figure 60:
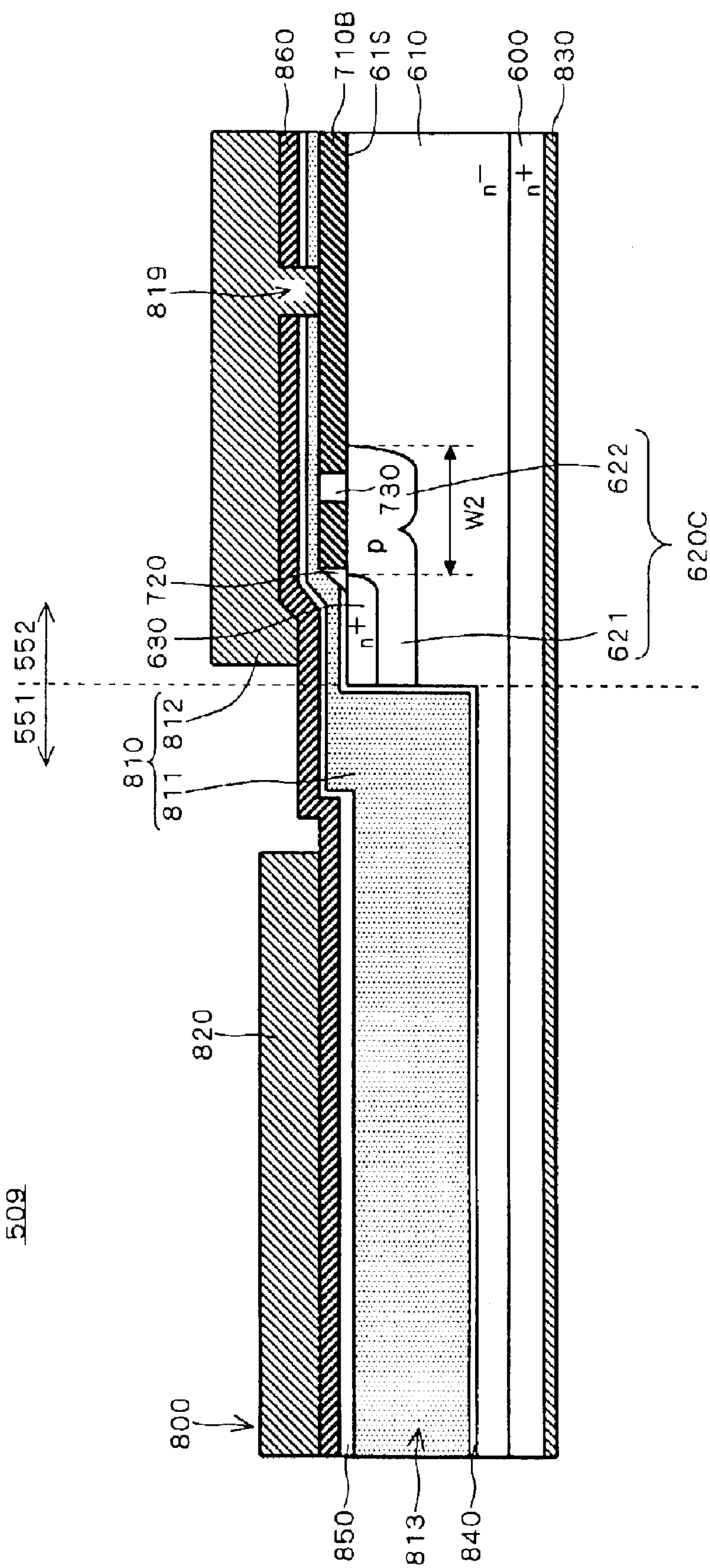
FIG. 60 is a cross-sectional view taken along line 60—60 of FIG. 59.
Figure 62:
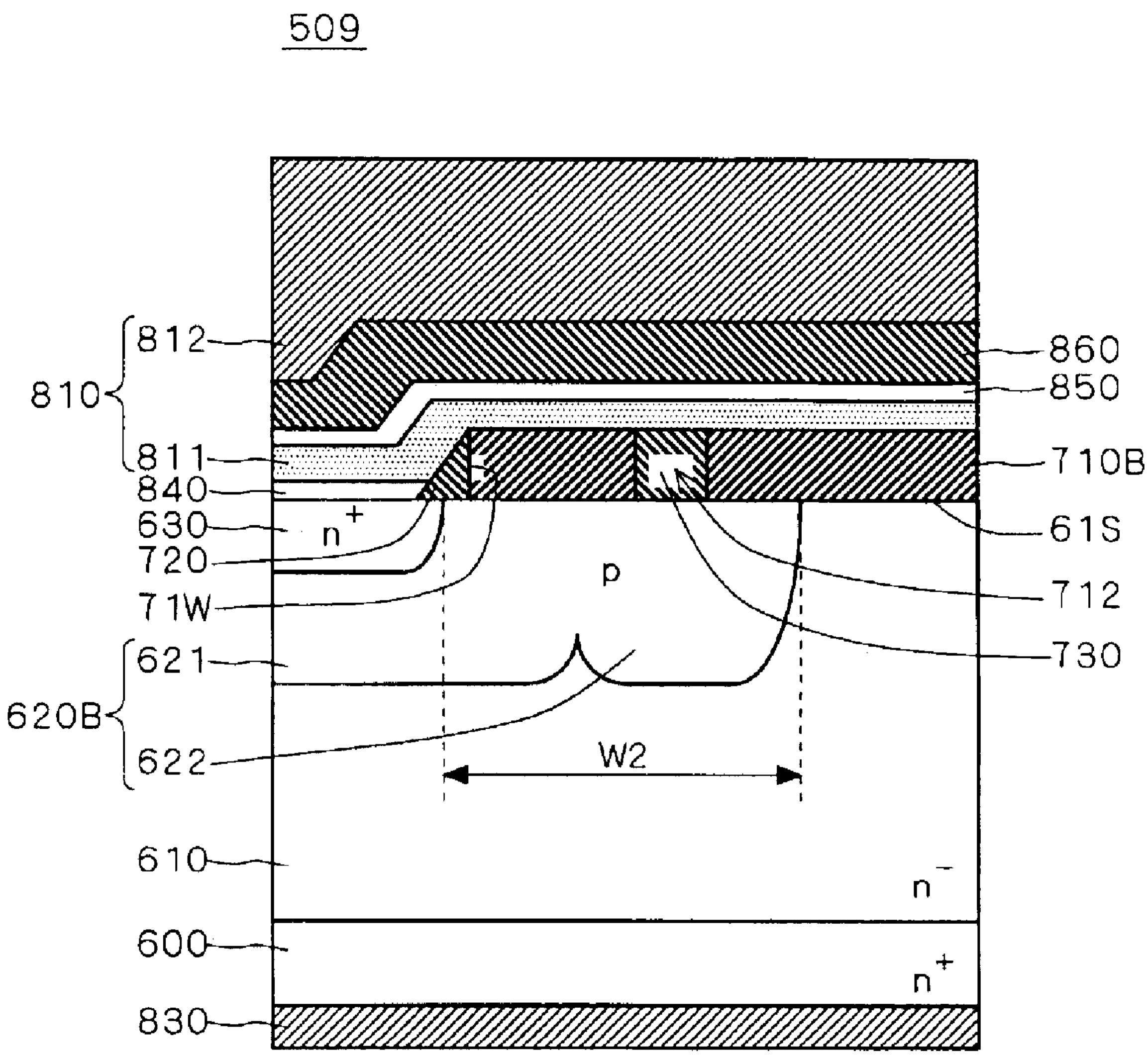
FIG. 62 is a partial enlarged view of FIG. 60.

FIG. 59 shows a plan view for explaining a power semiconductor device 509 according to a ninth preferred embodiment, FIG. 60 shows a cross-sectional view taken along line 60—60 of FIG. 59, and FIG. 61 shows a cross-sectional view taken along line 61—61 of FIG. 59. FIG. 62 shows part of FIG. 60 (or FIG. 61) in enlarged dimension. The semiconductor device 509 is configured by replacing the first insulator 710 and the p-type layer 620 in the semiconductor device 501 (see FIGS. 2–4) with a first insulator 710B and a p-type layer (second semiconductor layer) 620C, respectively. The other parts of the configuration of the semiconductor device 509 are basically identical to those of the previously described semiconductor device 501.

More specifically, the p-type layer 620C includes a first portion 621 formed of the previously described p base layer 621 (see FIGS. 2–4) and a p-type second portion 622 formed outside the first portion 621 (on the side away from the central region 551) in the main surface 61S. The first and second portions 621 and 622 are connected to each other. The first insulator 710B is configured by forming a second opening 712 which extends to the main surface 61S within the outer peripheral region 552 in the previously described first insulator 710 (see FIGS. 2–4). At this time, the second opening 712 of the first insulator 710B faces (the deepest part of) the second portion 622 of the p-type layer 622C, and both the second opening 712 and the second portion 622 are formed outside the first portion 621 of the p-type layer 620C within the outer peripheral region 552. The first insulator 710B has one linear second opening 712 (see FIG. 59) and correspondingly, the p-type layer 620C has one linear second portion 622. The second opening 712 is filled and closed with a third insulator 730 of, for example, silicon oxide.

Figure 64A:
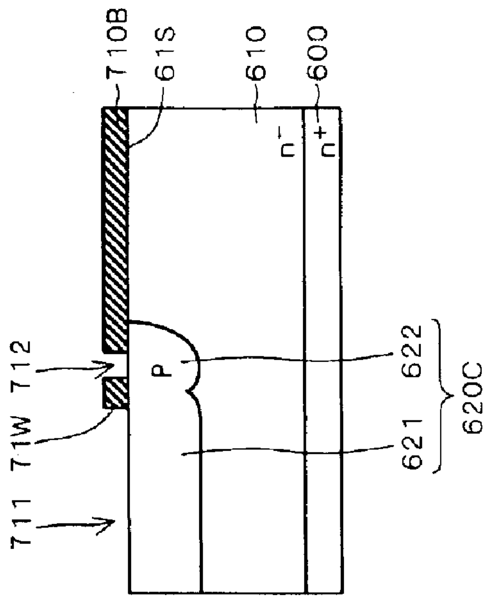
Figure 64B:
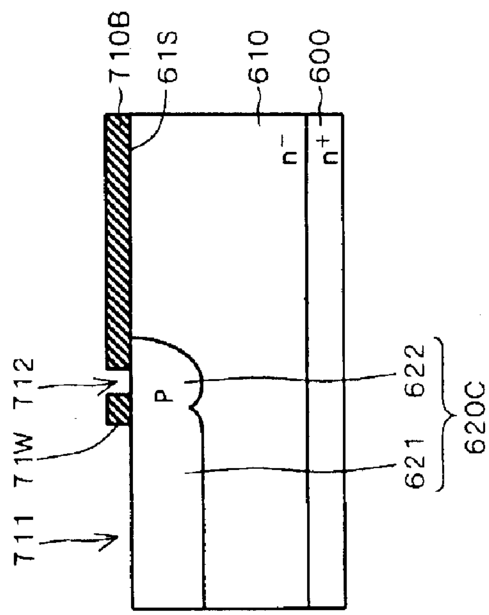
Figure 64C:
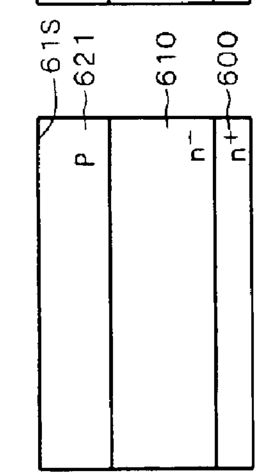
Figure 77A:
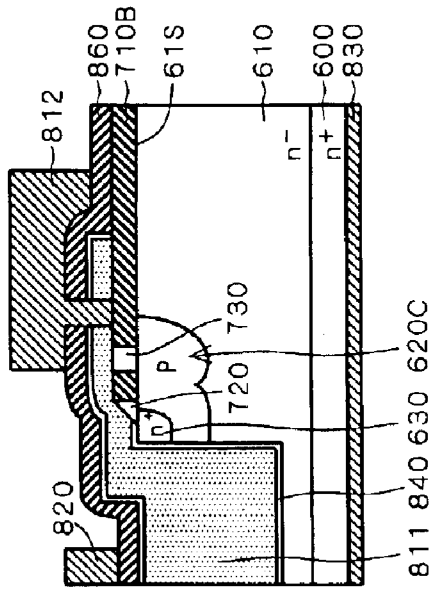
Figure 77B:
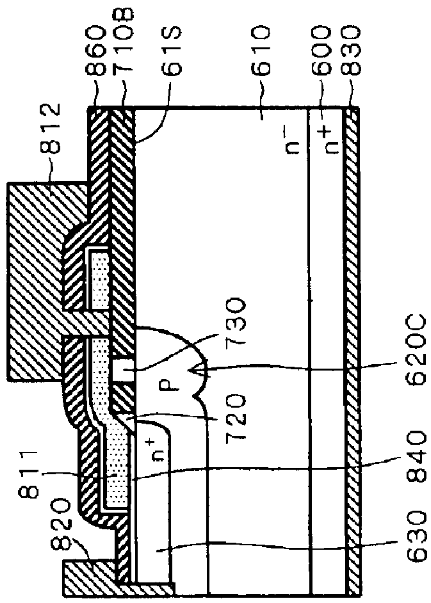
Figure 77C:
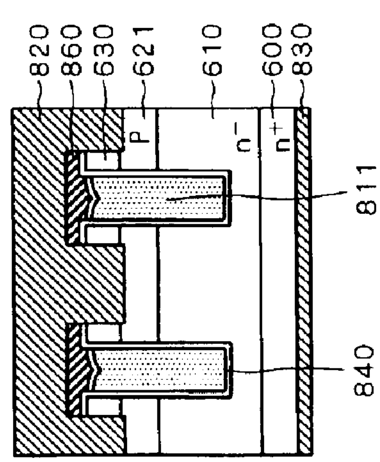

Next, a method of manufacturing the semiconductor device 509 is described with reference also to the cross-sectional views of FIGS. 63 through 77. FIGS. 63A, 64A, and so on through FIG. 77A correspond to FIG. 59; FIGS. 63B, 64B, and so on through FIG. 77B correspond to FIG. 60; and FIGS. 63C, 64C, and so on through FIG. 77C correspond to FIG. 61.

First, the $n^-$-type silicon layer (first semiconductor layer) 610 is grown epitaxially on the $n^+$-type silicon substrate 600 in the same manner as in the previously described manufacturing method of the semiconductor device 501 (see FIG. 7). Then, a first insulating film of, for example, silicon oxide and a photoresist are formed in this order on the entire main surface 61S of the epitaxial layer 610 (that is, the first insulating film and the photoresist film extend across the central region 551 and the outer peripheral region 552).

Using photolithography techniques, the above photoresist is patterned to form a photoresist pattern 900B corresponding to the aforementioned first insulator 710B (see FIG. 63). Then, using the photoresist pattern 900B as a mask, etching is performed to form the first and second openings 711 and 712 in the first insulating film (see FIG. 63). Thereafter, the above photoresist pattern 900B is removed.

Subsequent process steps are basically identical to those in the previously described manufacturing method of the semiconductor device 501. More specifically, p-type impurities (such as boron) are ion implanted using the first insulator 710B as a mask, or in other words, through the openings 711 and 712 of the first insulator 710B and then heat treatment is carried out, thereby to form the p-type layer 620C in the main surface 61S of the epitaxial layer 610 (see FIG. 64). At this time, the first and second portions 621 and 622 of the p-type layer 620C are formed to face the first and second openings 711 and 712, respectively. Especially, the locations (pitches) and sizes of the openings 711 and 712, ion implant conditions, heat treatment conditions, and the like are determined so that both the portions 621 and 622 are connected to each other.

Figure 65A:
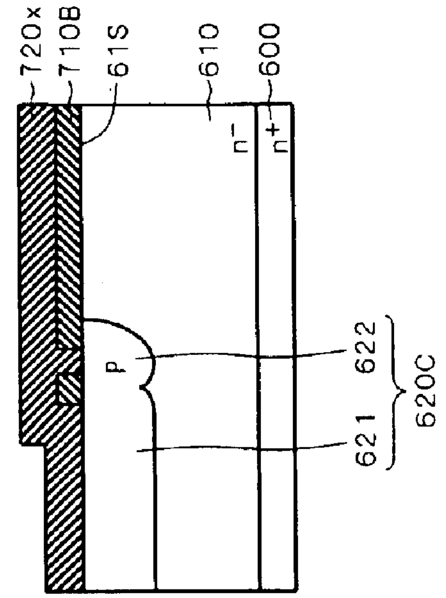
Figure 65B:
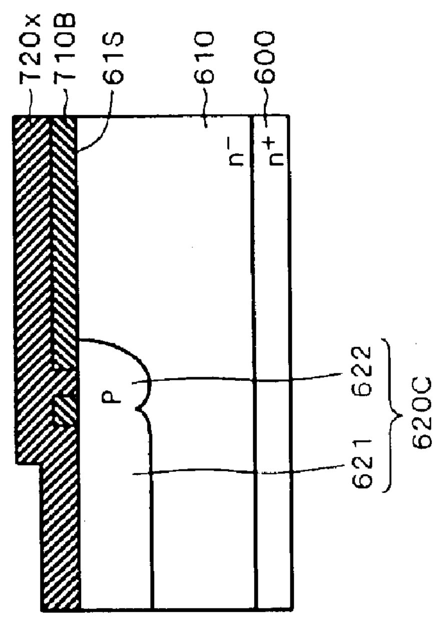
Figure 65C:
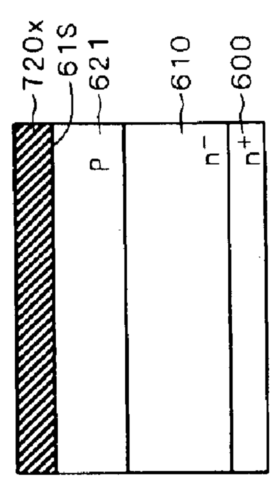
Figure 66A:
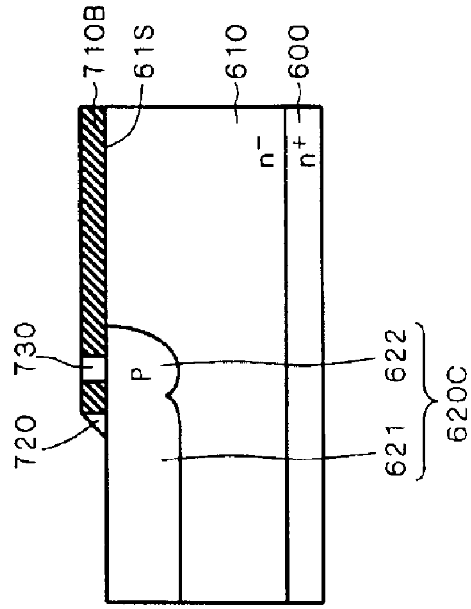
Figure 66B:
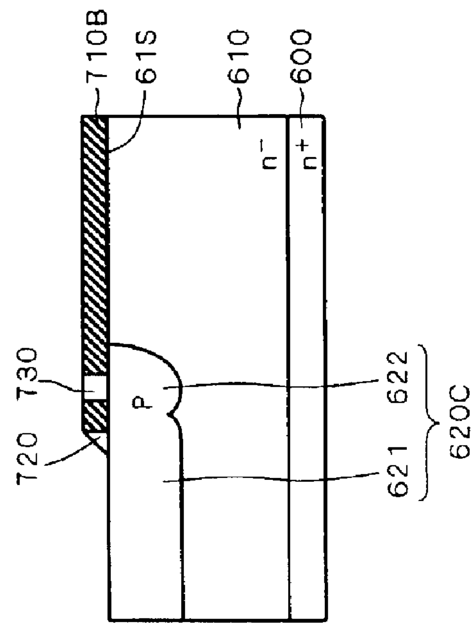
Figure 66C:
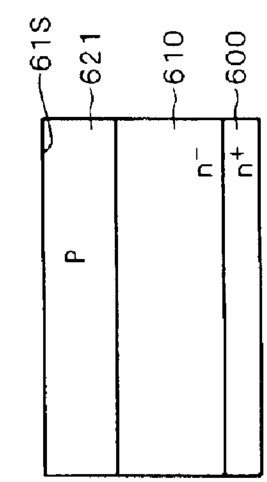

Then, the second insulating film 720x is formed by CVD to fill in the first and second openings 711 and 712 (see FIG. 65). The second insulating film 720x is then etched back to expose the p base layer 621 in the first opening 711 and to form the second and third insulators 720 and 730 from the second insulating film 720x (see FIG. 66). Thereby, the second opening 712 is closed with the third insulator 730.

Figure 67A:
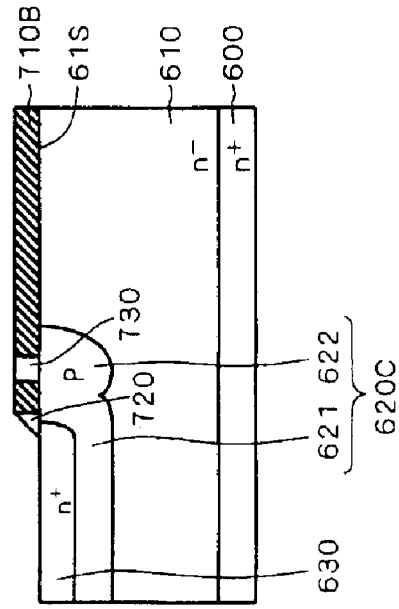
Figure 67B:
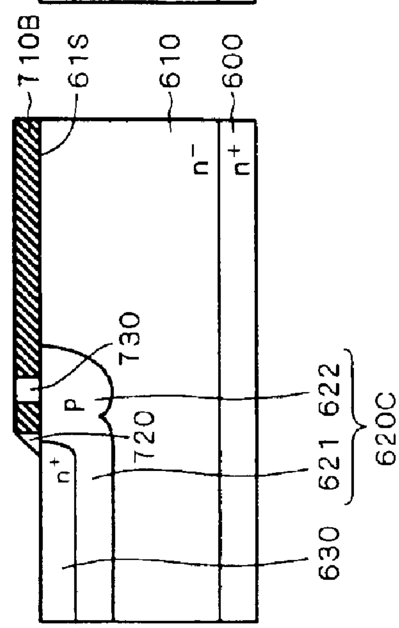
Figure 67C:
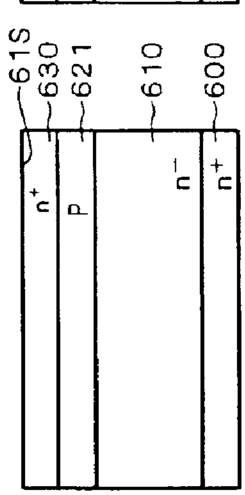

With the presence of the second and third insulators 720 and 730, n-type impurities (such as arsenic) are ion implanted through the first opening 711 and then heat treatment is carried out, thereby to form the $n^+$ source layer 630 in the main surface 61S of the first portion (i. e. , p base layer) 621 of the p-type layer 620C (see FIG. 67).

Figure 68A:
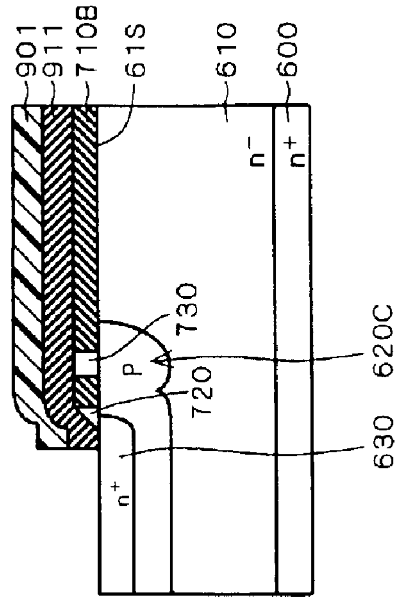
Figure 68B:
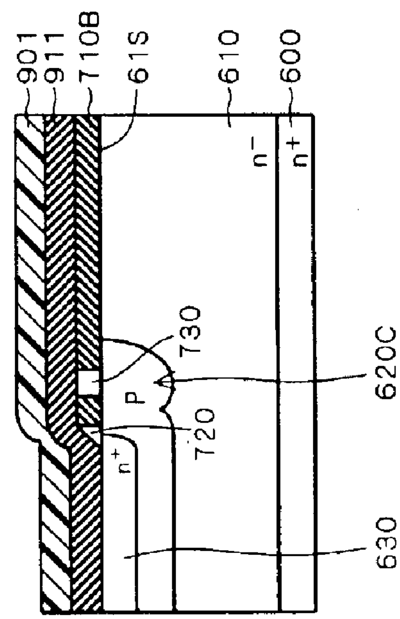
Figure 68C:
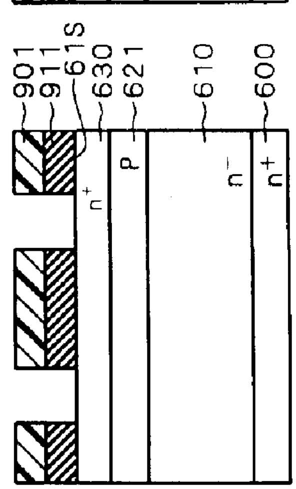
Figure 69A:
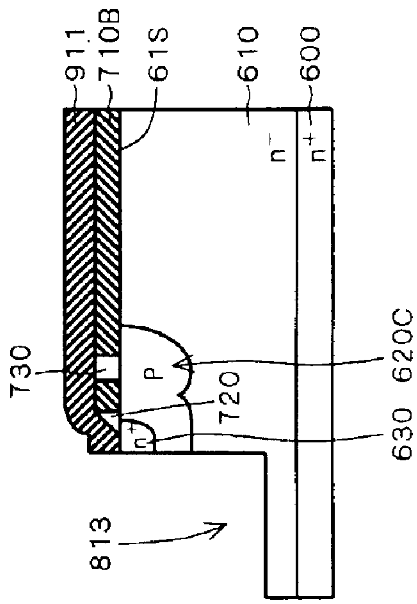
Figure 69B:
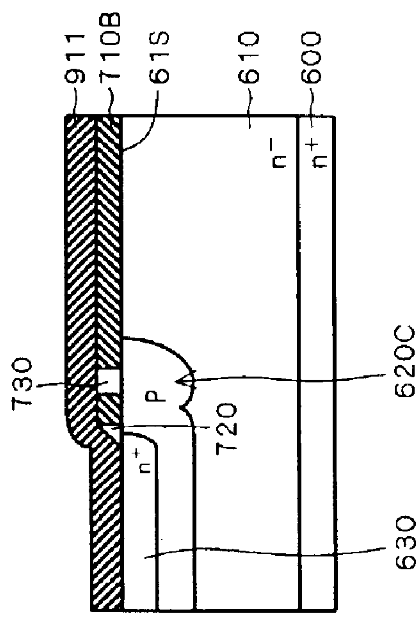
Figure 69C:
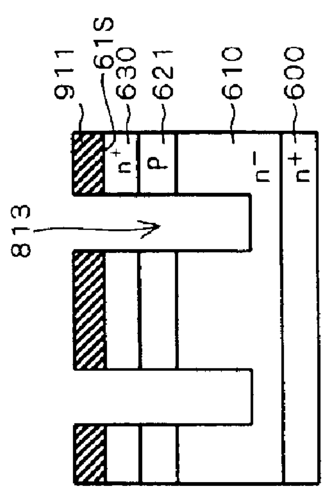
Figures 70A, 70B, 70C:
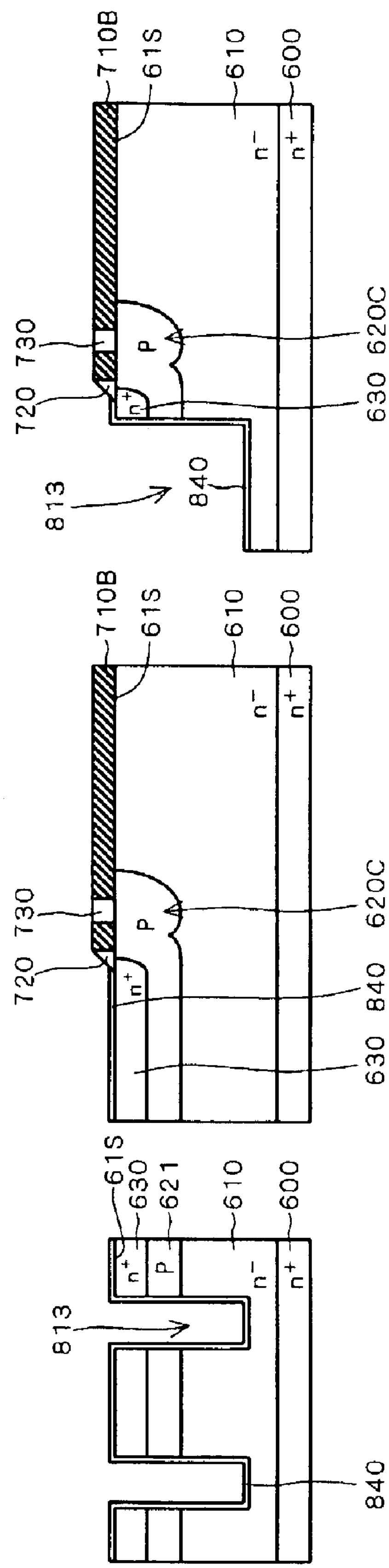
Figure 71A:
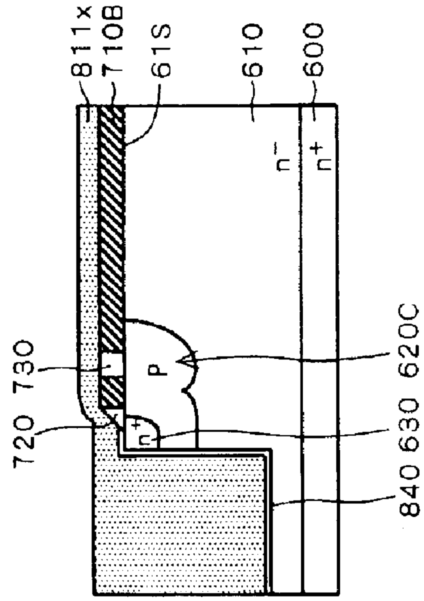
Figure 71B:
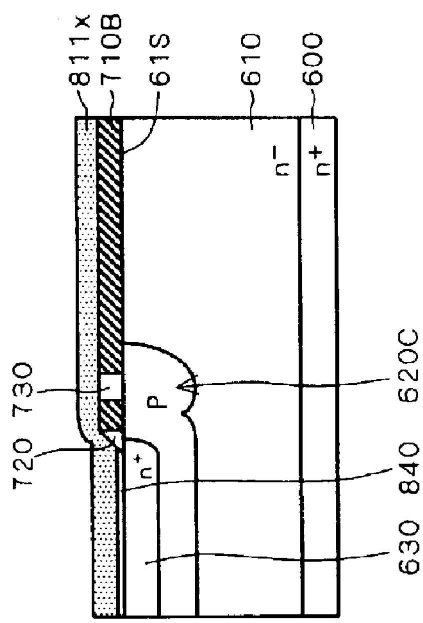
Figure 71C:
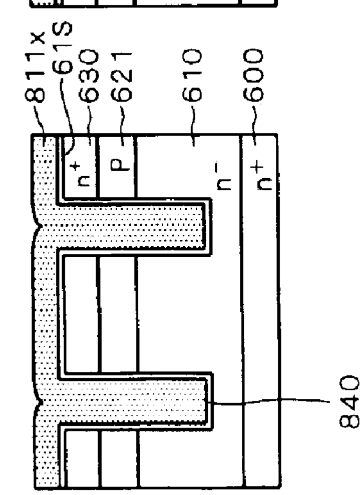

Then, the oxide film 911 is formed and patterned corresponding to the gate trench 813 (see FIG. 68). Using the patterned oxide film 911 as a mask, the gate trench 813 is formed (see FIG. 69). After removal of the oxide film 911, the gate insulating film 840 is formed (see FIG. 70).

Figure 72A:
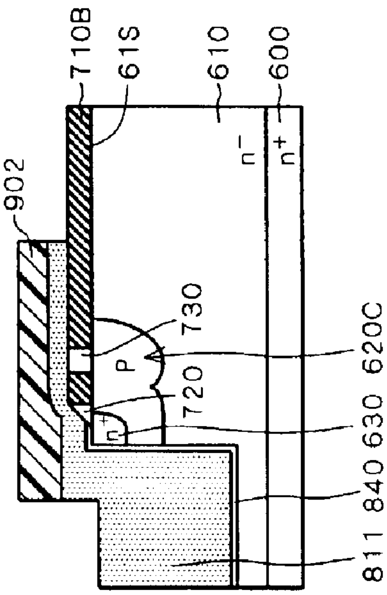
Figure 72B:
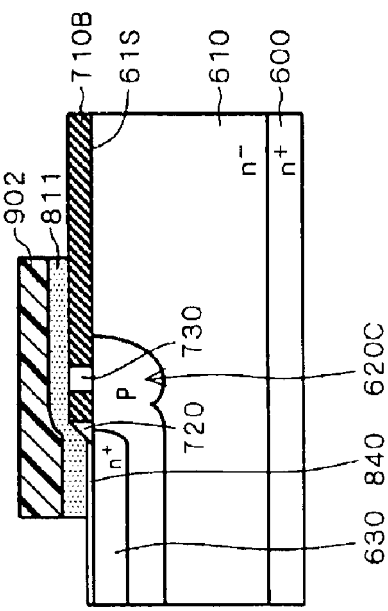
Figure 72C:
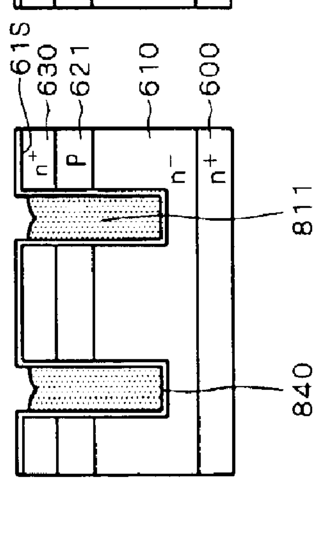
Figure 73A:
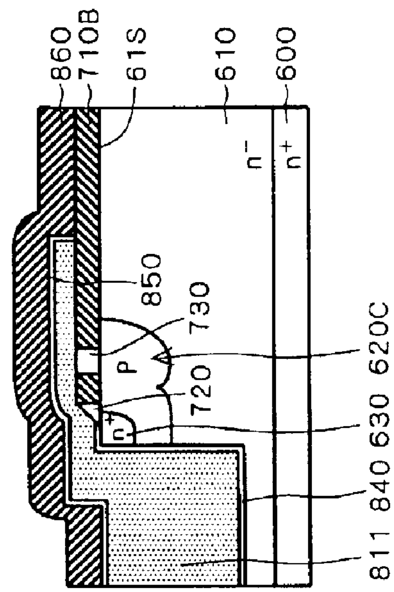
Figure 73B:
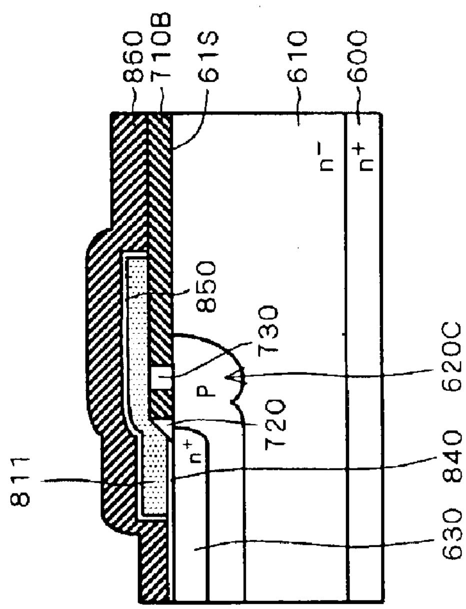
Figure 73C:
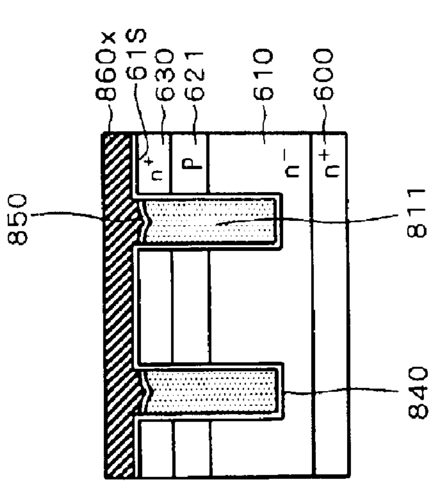
Figure 74A:
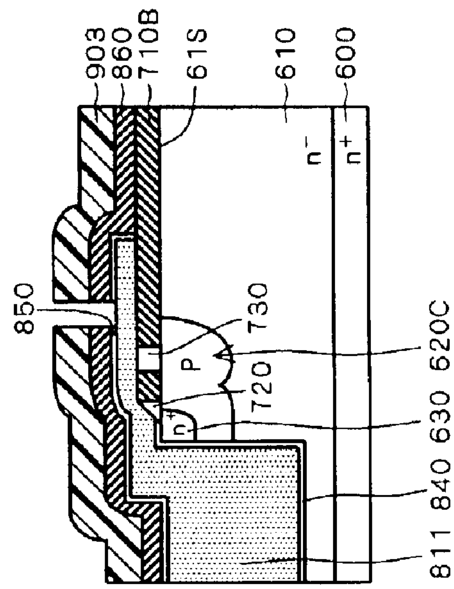
Figure 74B:
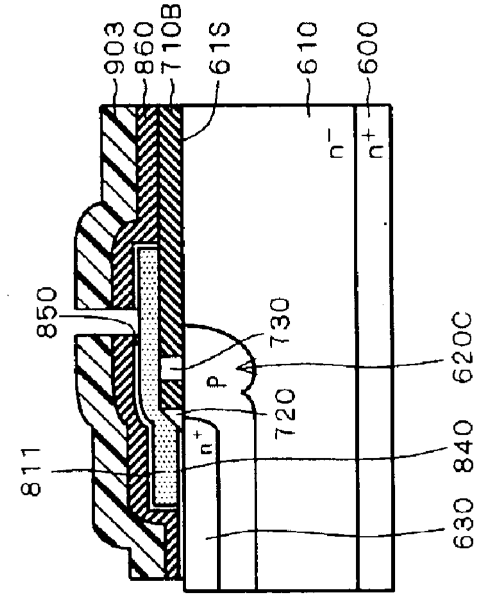
Figure 74C:
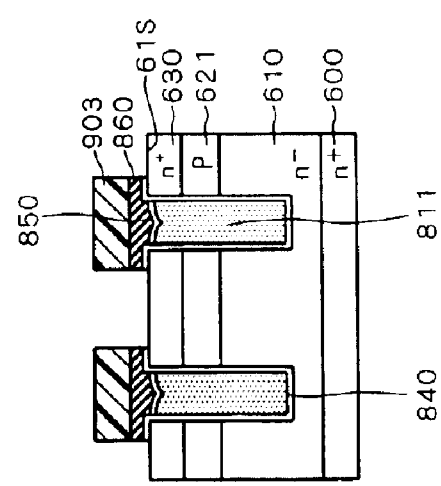
Figure 75A:
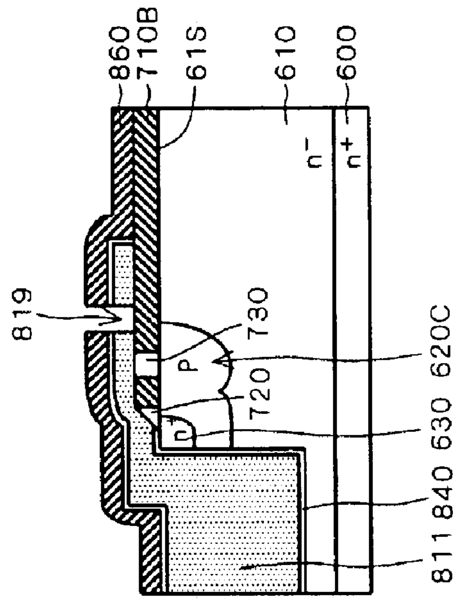
Figure 75B:
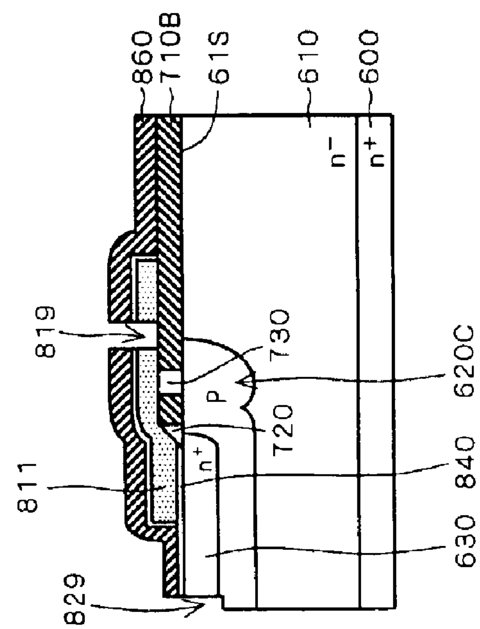
Figure 75C:
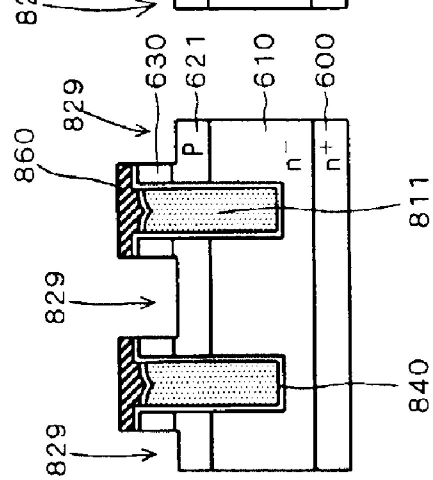
Figure 76A:
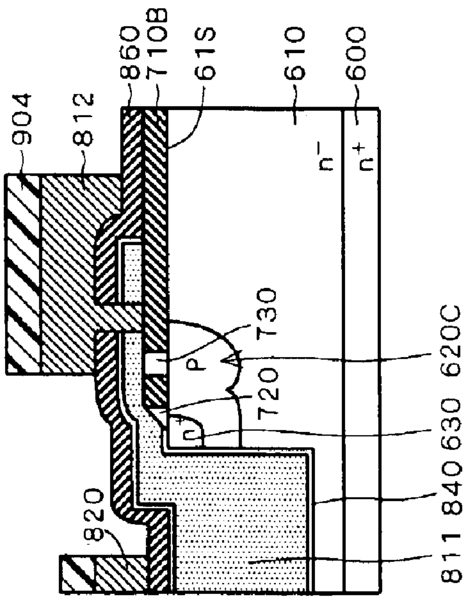
Figure 76B:
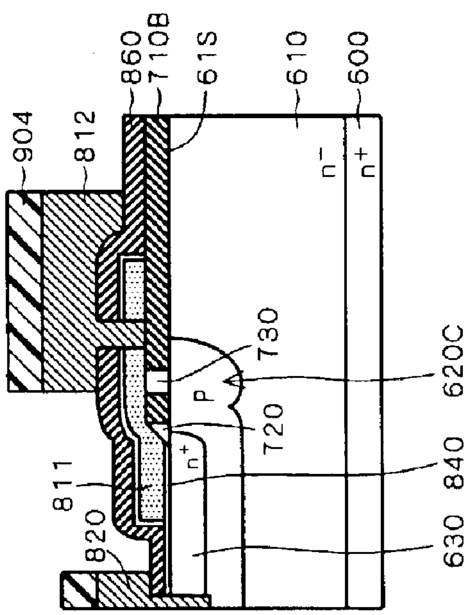
Figure 76C:
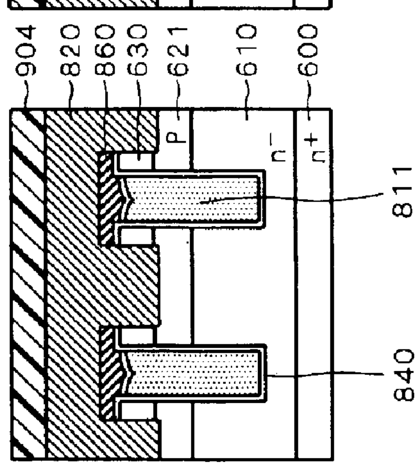

Then, the polysilicon film 811x is formed (see FIG. 71) and patterned to form the gate polysilicon electrode 811 (see FIG. 72). Then, the cap oxide film 850 and the interlayer insulation film 860 are formed (see FIG. 73). The interlayer insulation film 860 and the cap oxide film 850 are then opened (see FIG. 74) to form the gate contact hole 819 and the source contact holes 829 (see FIG. 75). Then, an Al—Si film is formed on the interlayer insulation film 860 and patterned to form the gate aluminum electrode 812 and the source electrode 820 (see FIG. 76). Further, the drain electrode 830 is formed (see FIG. 77).

By ion implantation utilizing the second insulator 720, the power semiconductor device 509, like the semiconductor device 501, can reduce photolithography process steps and can prevent a decrease in breakdown voltage due to the reduction of the process steps. Further, as in the semiconductor device 501, the field plate structure achieved by the gate electrode 810 results in improvement in the breakdown voltage.

Especially since the p-type layer 620C has the second portion 622, a width W2 (see FIGS. 60 and 61) of the outer end portion of the p-type layer 620C, in other words, a distance W2 between the outer peripheries of the p-type layer 620C and the $n^+$ source layer 630 is greater than the corresponding width W1 (see FIGS. 3 and 4) in the previously described semiconductor device 501. This further prevents the occurrence of punch-through at the outer end of the p-type layer 620C.

At this time, the second opening 712 of the first insulator 710B can be formed at the same time as the first opening 711 depending on the design of the photoresist pattern, the second portion 622 of the p-type layer 620C can be formed at the same time as the first portion 621, and the third insulator 730 can be formed at the same time as the second insulator 720. Further, since the second opening 712 is closed with the third insulator 730 after the formation of the second portion 622 of the p-type layer 620C, it is possible, without using another mask, to prevent impurities for the $n^+$ source layer 630 to be ion implanted into the second portion 622. Thus, as compared with the semiconductor device 501, the semiconductor device 509 can be readily manufactured without increasing the number of process steps.

Figure 78:
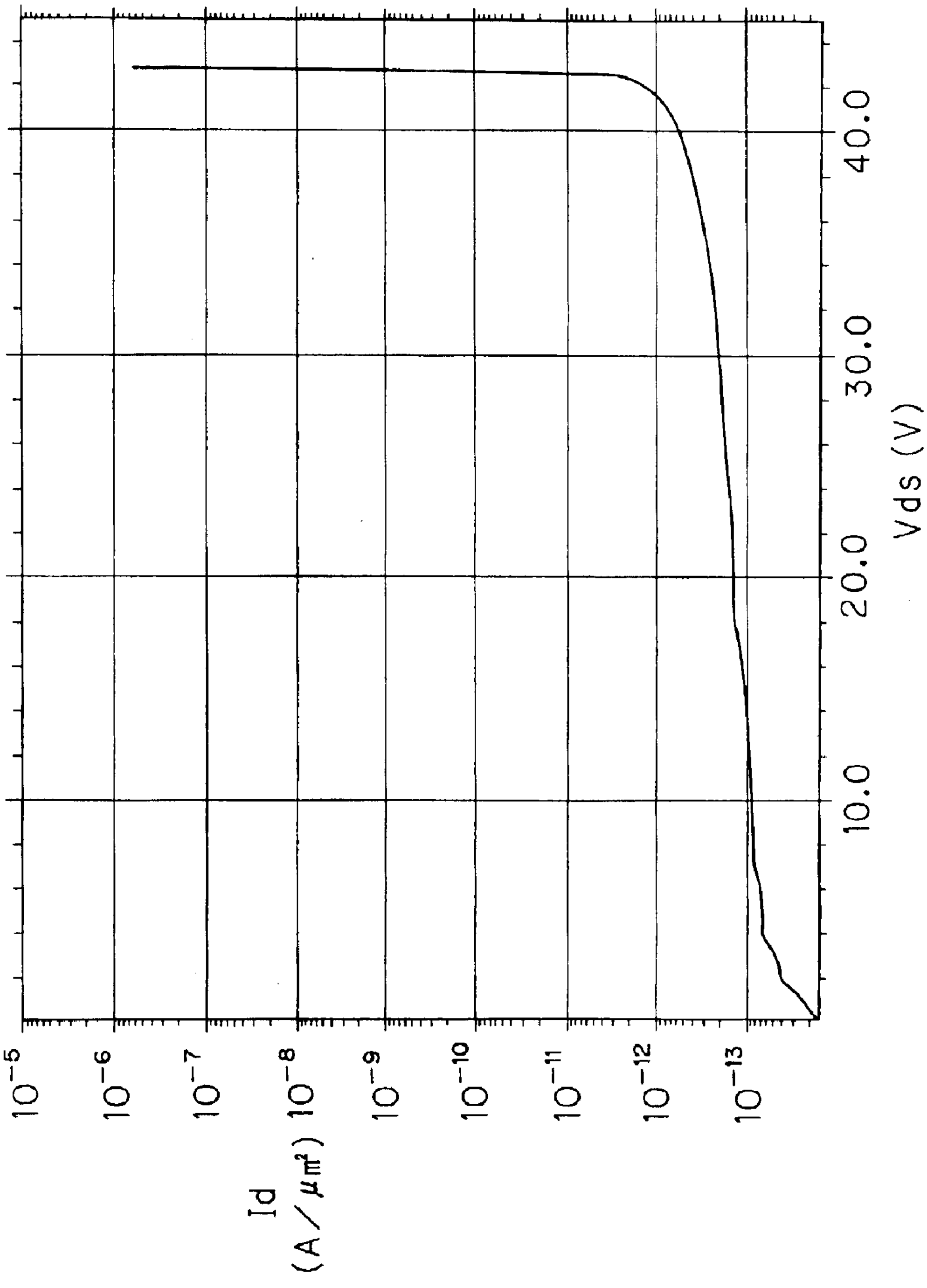
FIG. 78 is a graph for explaining the power semiconductor device according to the ninth preferred embodiment.

The simulation, as is that of the semiconductor device 501, shows that the power semiconductor device 509 achieves a breakdown voltage of 43 V as illustrated in FIG. 78.

Tenth Preferred Embodiment

Figure 79:
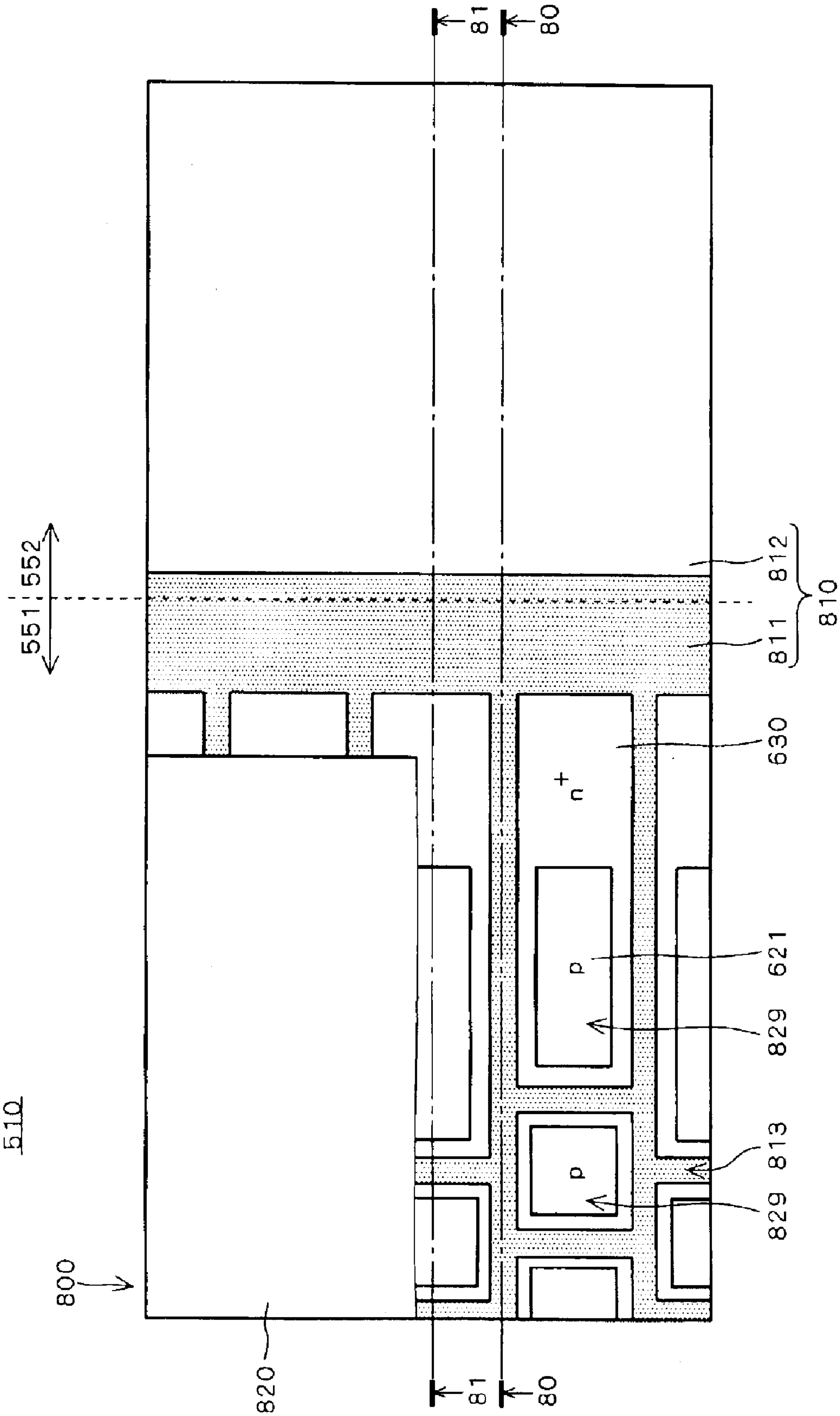
FIG. 79 is a plan view for explaining a power semiconductor device according to a tenth preferred embodiment.
Figure 80:
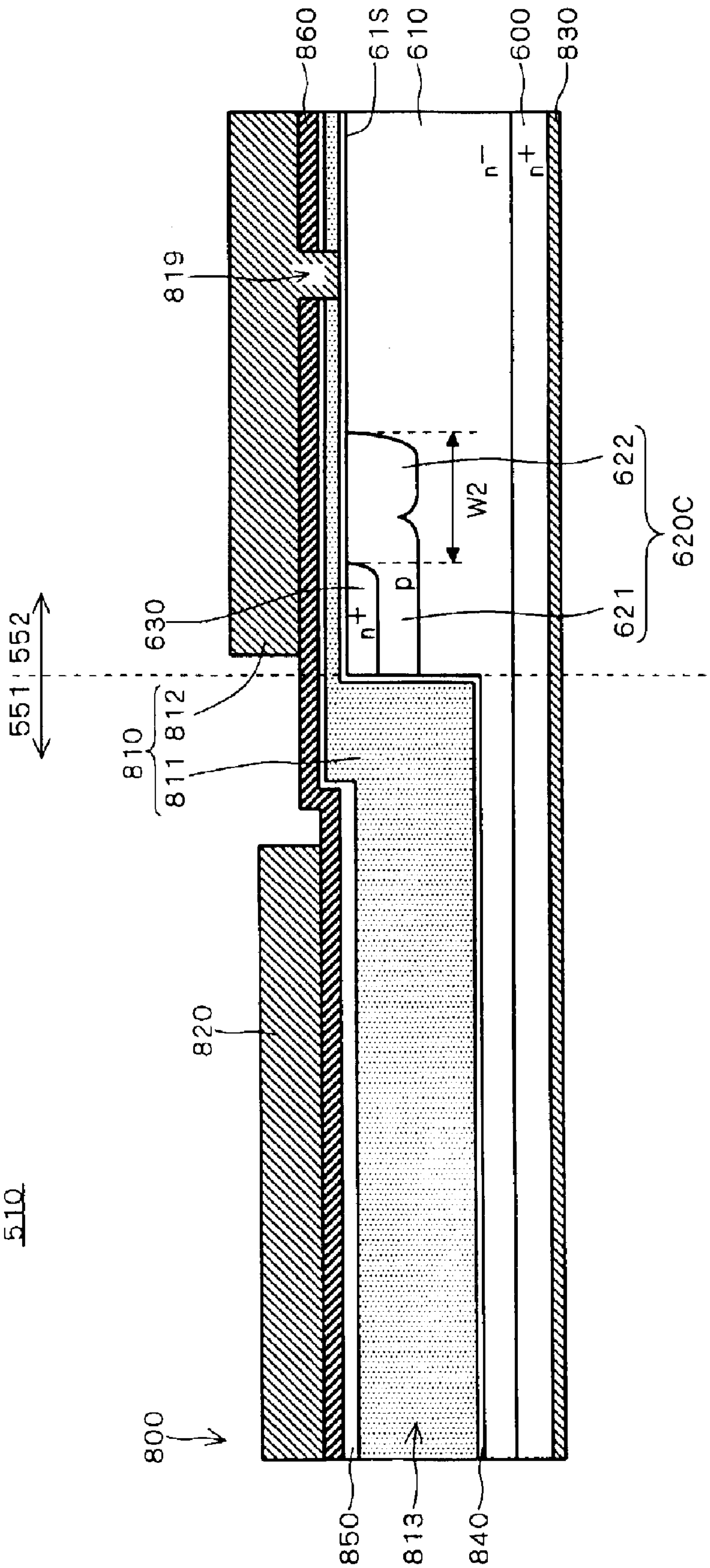
FIG. 80 is a cross-sectional view taken along line 80—80 of FIG. 79.
Figure 81:
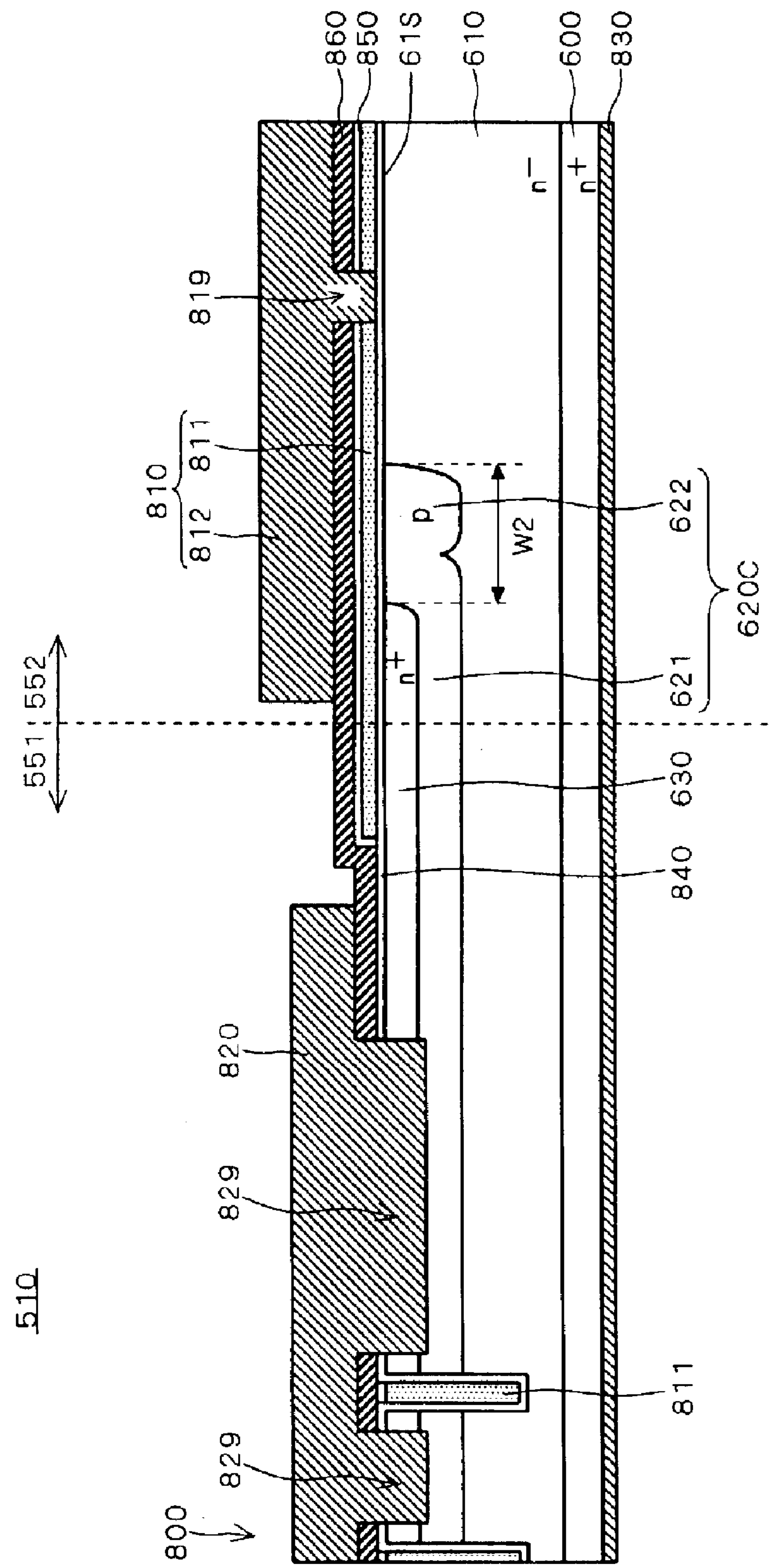
FIG. 81 is a cross-sectional view taken along line 81—81 of FIG. 79.

FIG. 79 shows a plan view for explaining a power semiconductor device 510 according to a tenth preferred embodiment, FIG. 80 shows a cross-sectional view taken along line 80—80 of FIG. 79, and FIG. 81 shows a cross-sectional view taken along line 81—81 of FIG. 79. The semiconductor device 510 is configured by removing the first through third insulators 710B, 720 and 730 from the semiconductor device 509 (see FIGS. 59–62). Thus, like the previously described semiconductor device 502 (see FIGS. 25–27), the semiconductor device 510 has the gate insulating film 840 which extends, outside the trench 813, into a region where the first through third insulators 710B, 720 and 730 had been located. The other parts of the configuration of the semiconductor device 510 are basically identical to those of the previously described semiconductor device 509.

Figure 82A:
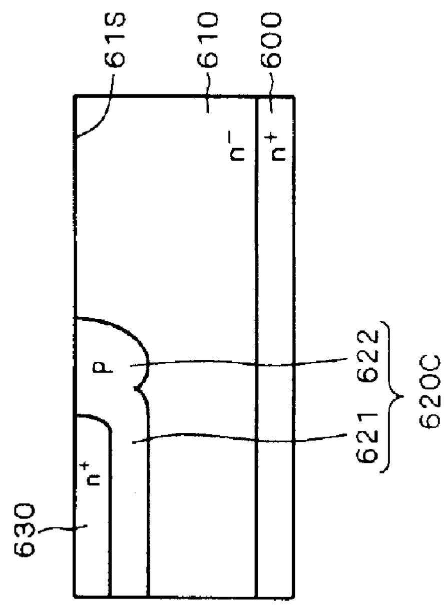
FIGS. 82 through 92 are cross-sectional views for explaining a manufacturing method of the power semiconductor device according to the tenth preferred embodiment.
Figure 82B:
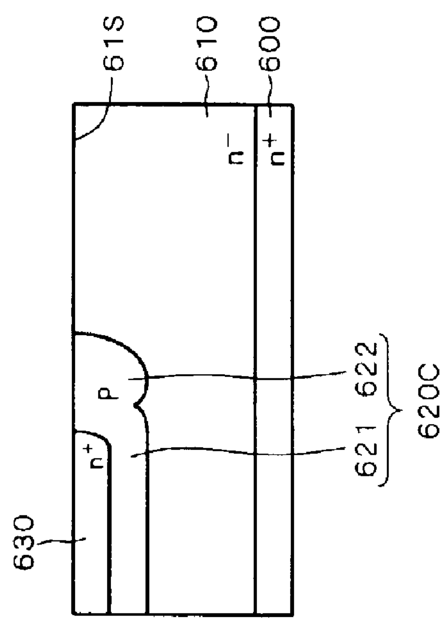
Figure 82C:
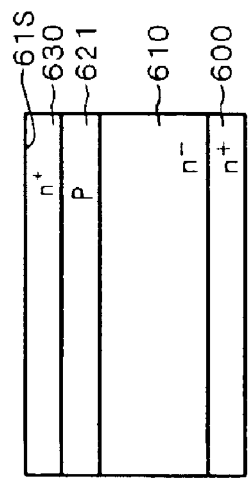
Figure 83A:
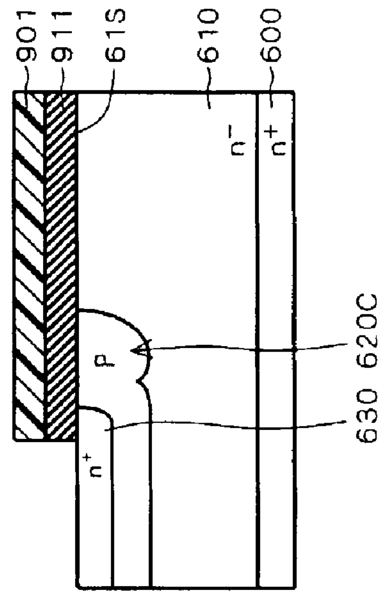
Figure 83B:
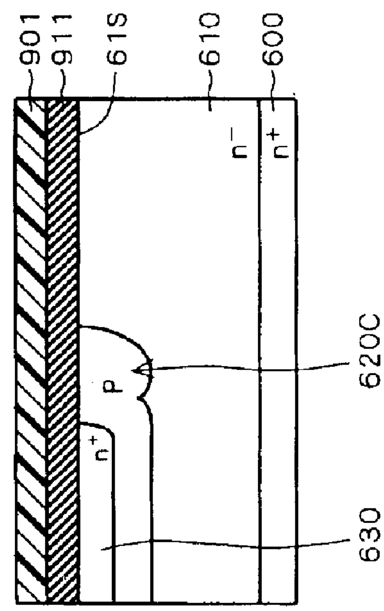
Figure 83C:
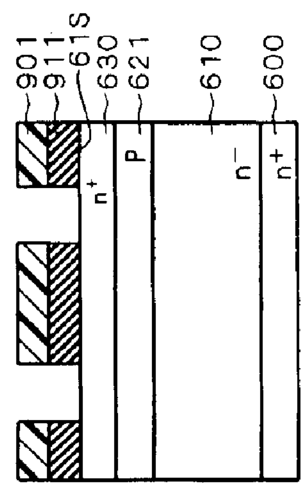
Figure 84A:
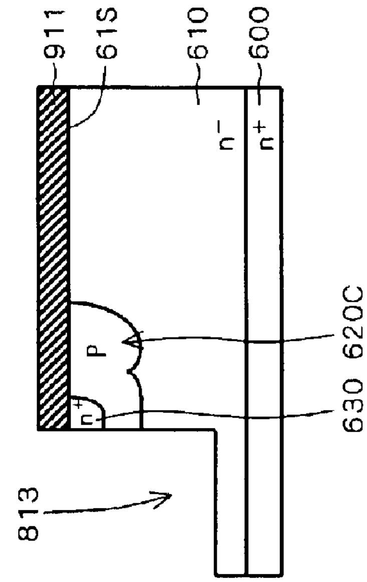
Figure 84B:
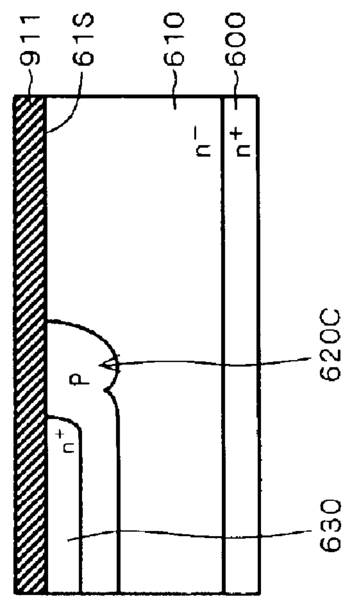
Figure 84C:
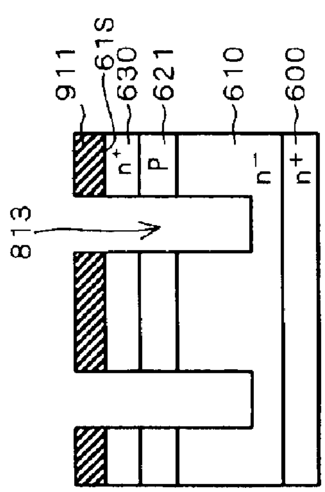

Next, a method of manufacturing the semiconductor device 510 is described with reference also to FIGS. 82 through 92. FIGS. 82A, 83A, and so on through FIG. 92A correspond to FIG. 79; FIGS. 82B, 83B, and so on through FIG. 92B correspond to FIG. 80; and FIGS. 82C, 83C, and so on through FIG. 92C correspond to FIG. 81.

The semiconductor device 510 can be manufactured by a combination of the manufacturing methods of the semiconductor device 509 (see FIGS. 59–62) and the semiconductor device 502 (see FIGS. 25–27). More specifically, first, the process steps until the formation of the $n^+$ source layer 630 are performed according to the previously described manufacturing method of the semiconductor device 509 (see FIG. 67).

Then, the first through third insulators 710B, 720 and 730 are removed by wet etching (see FIG. 82).

Subsequent process steps are basically identical to those in the previously described manufacturing method of the semiconductor device 509. More specifically, the oxide film 911 is formed and patterned corresponding to the gate trench 813 (see FIG. 83). Since, in the manufacturing method of the semiconductor device 510, the first through third insulators 710B, 720 and 730 were removed as previously described, the oxide film 911 is in contact with the main surface 61S in a region where the first through third insulators 710B, 720 and 730 had been located. Then, using the patterned oxide film 911 as a mask, the gate trench 813 is formed (see FIG. 84).

Figure 85A:
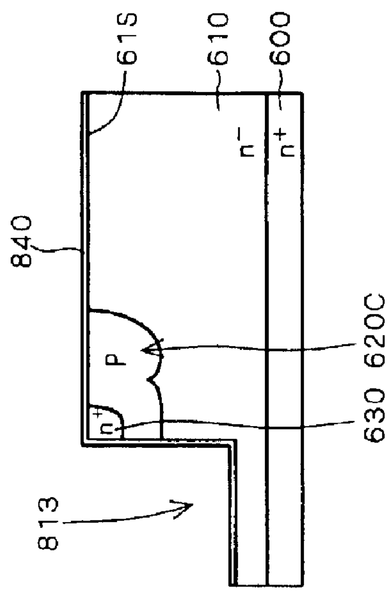
Figure 85B:
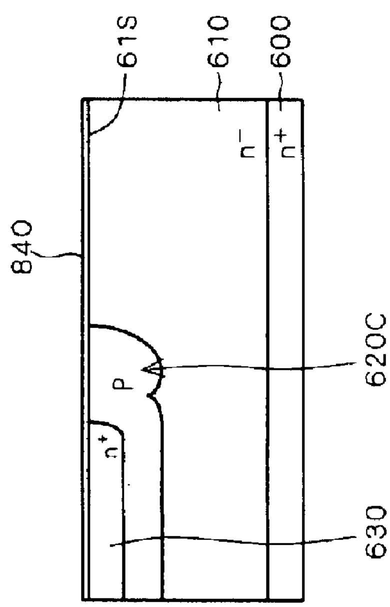
Figure 85C:
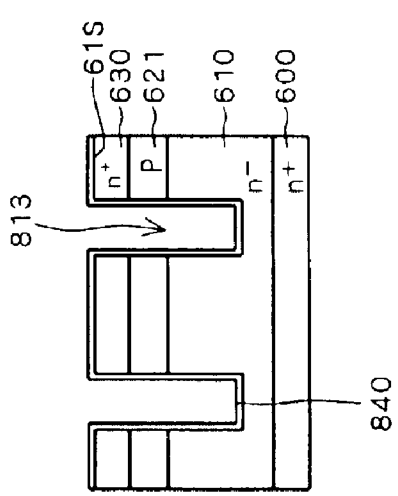
Figure 86A:
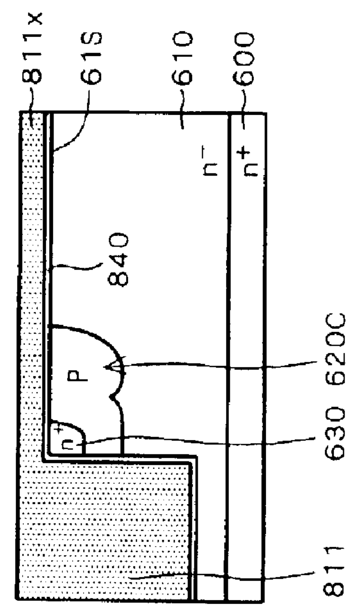
Figure 86B:
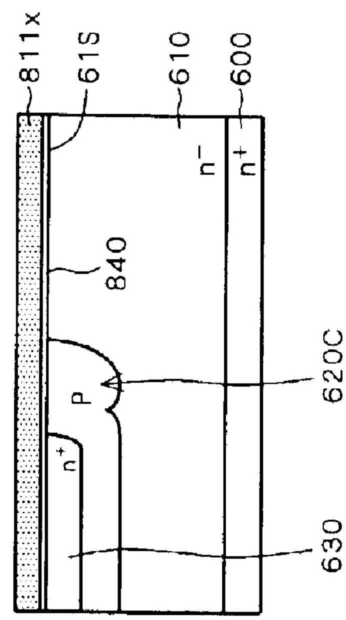
Figure 86C:
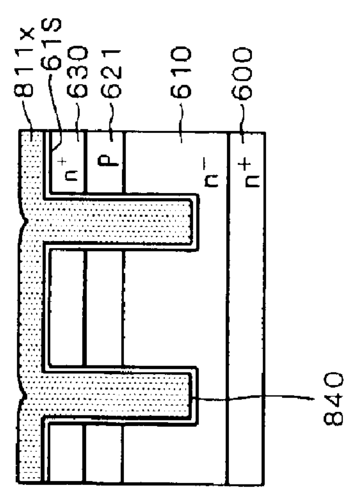

After removal of the oxide film 911, the gate insulating film 840 is formed (see FIG. 85). Since, in the manufacturing method of the semiconductor device 510, the first through third insulators 710B, 720 and 730 were removed as previously described, the gate insulating film 840 extends also into the region where the first through third insulators 710B, 720 and 730 had been located.

Figure 87A:
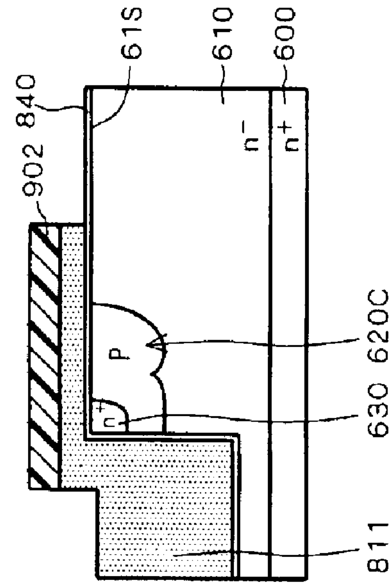
Figure 87B:
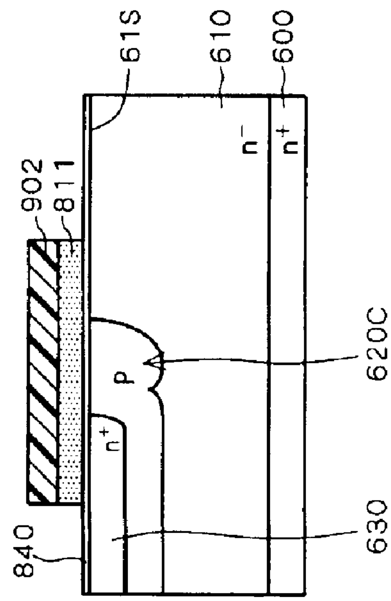
Figure 87C:
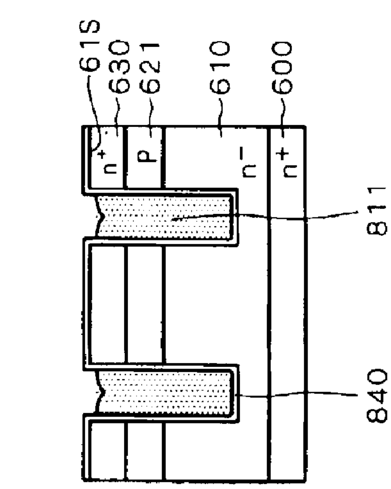
Figure 88A:
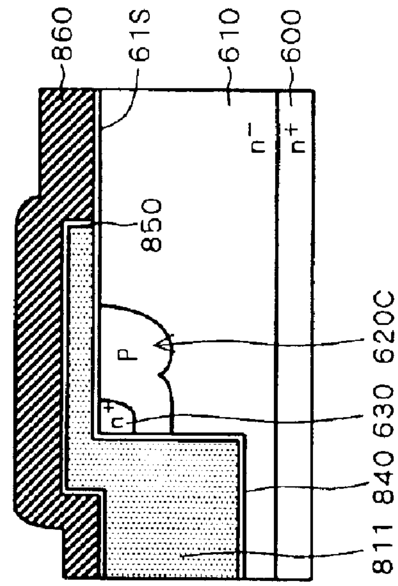
Figure 88B:
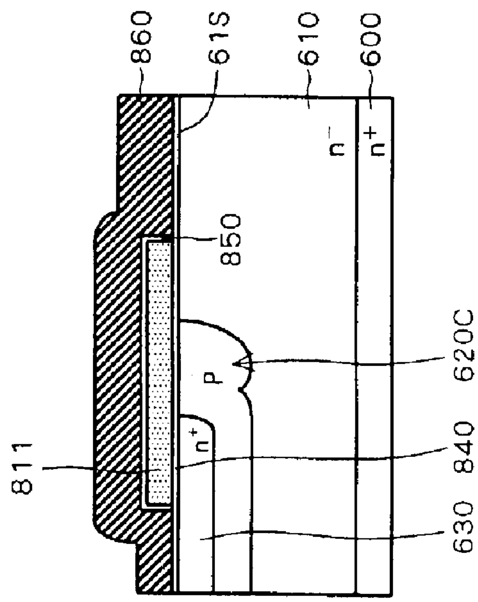
Figure 88C:
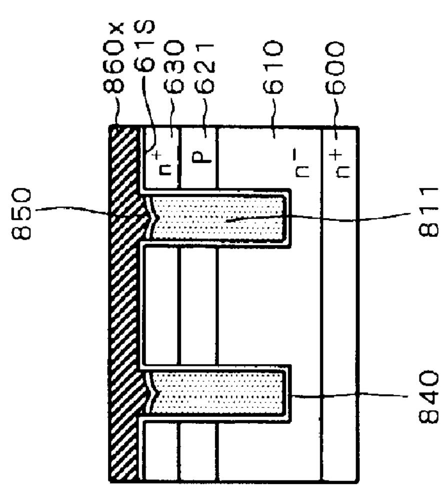
Figure 89A:
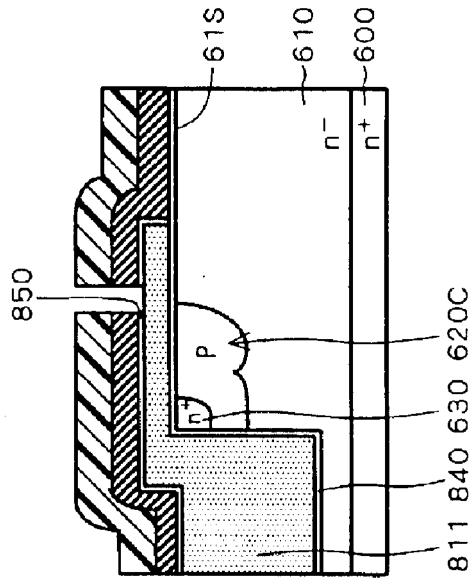
Figure 89B:
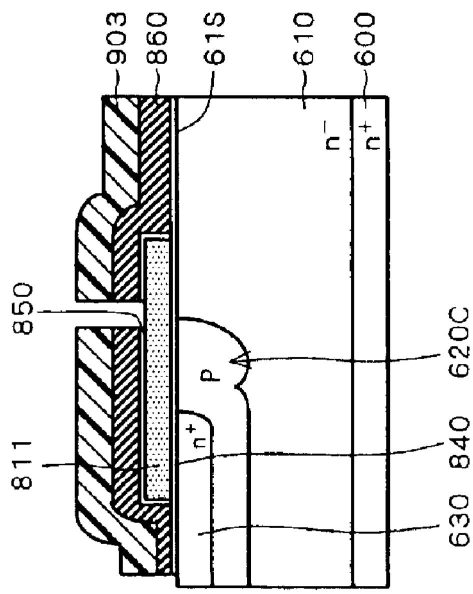
Figure 89C:
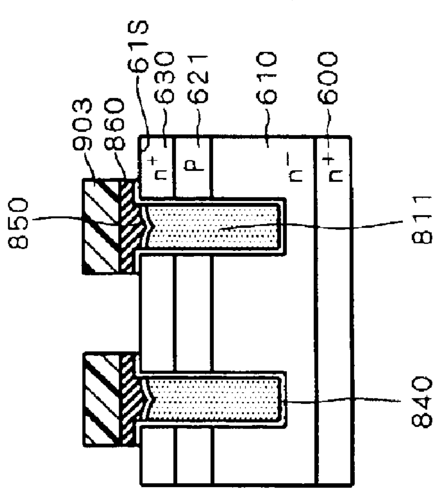
Figure 90A:
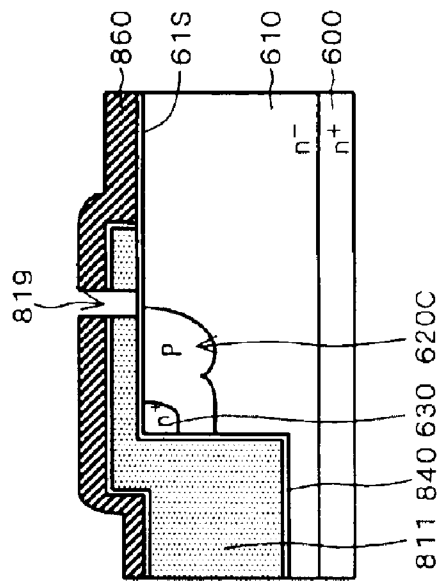
Figure 90B:
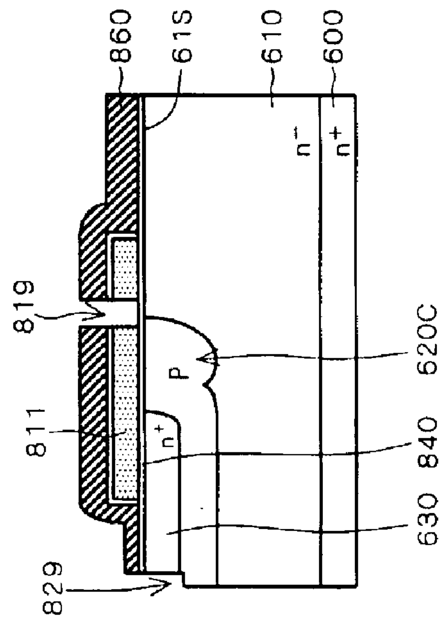
Figure 90C:
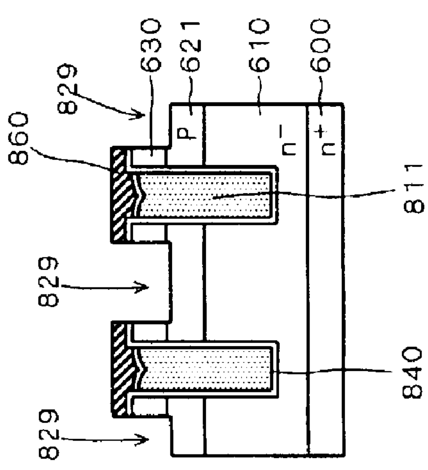
Figures 91A, 91B, 91C:
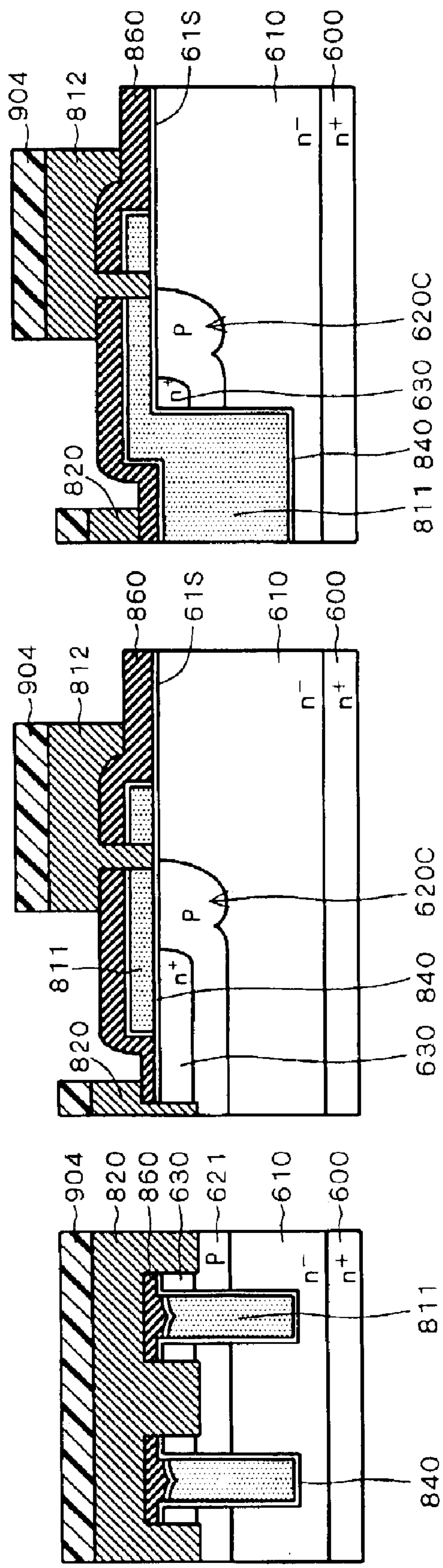
Figure 92A:
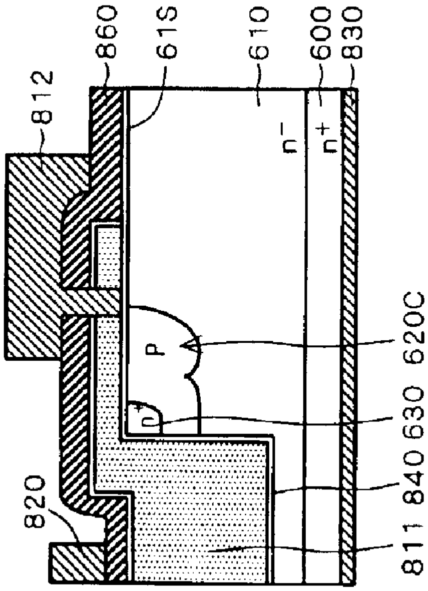
Figure 92B:
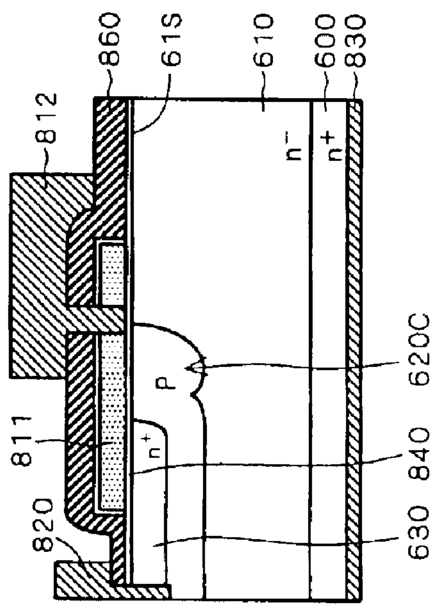
Figure 92C:
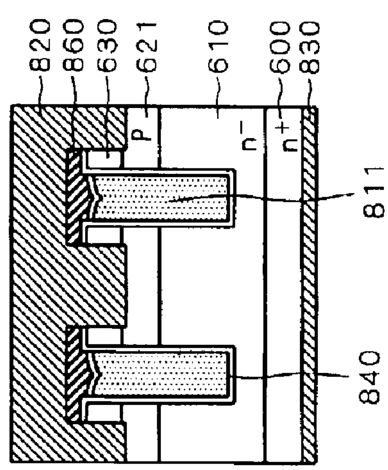

Then, the polysilicon film 811x is formed (see FIG. 86) and patterned to form the gate polysilicon electrode 811 (see FIG. 87). Then, the cap oxide film 850 and the interlayer insulation film 860 are formed (see FIG. 88). The interlayer insulation film 860 and the cap oxide film 850 are then opened (see FIG. 89) to form the gate contact hole 819 and the source contact holes 829 (see FIG. 90). Then, an Al—Si film is formed on the interlayer insulation film 860 and patterned to form the gate aluminum electrode 812 and the source electrode 820 (see FIG. 91). Further, the drain electrode 830 is formed (see FIG. 92).

The power semiconductor device 510 can achieve the same effect as the power semiconductor device 509.

At this time, since the semiconductor device 510 does not have the first through third insulators 710B, 720 and 730, like the semiconductor device 502 (see FIGS. 25–27), it can have a more powerful field plate effect by the gate electrode 810 than the semiconductor device 509 (see FIGS. 59–62), thereby further improving the breakdown voltage.

Eleventh Preferred Embodiment

Figure 94:
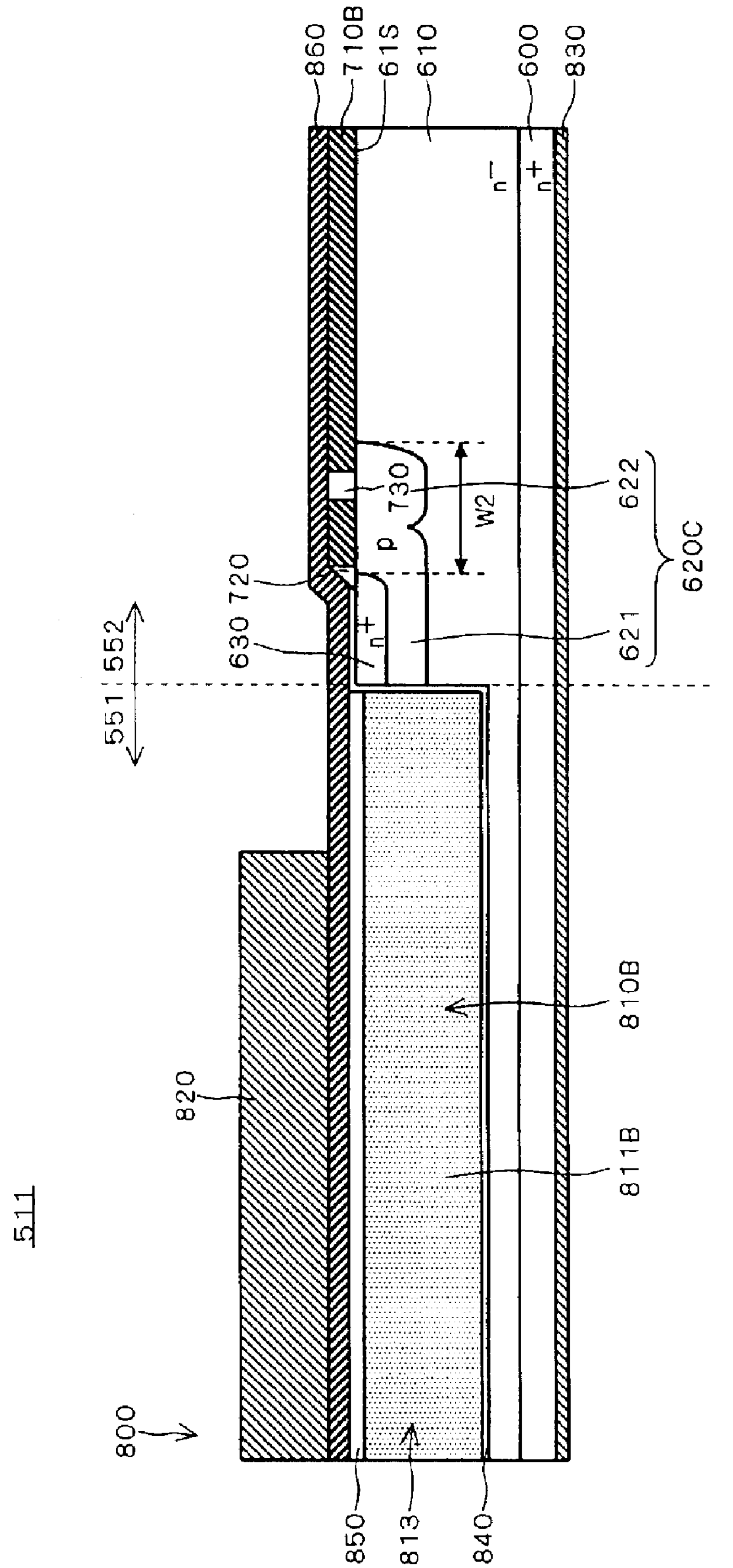
FIG. 94 is a cross-sectional view taken along line 94—94 of FIG. 93.
Figure 95:
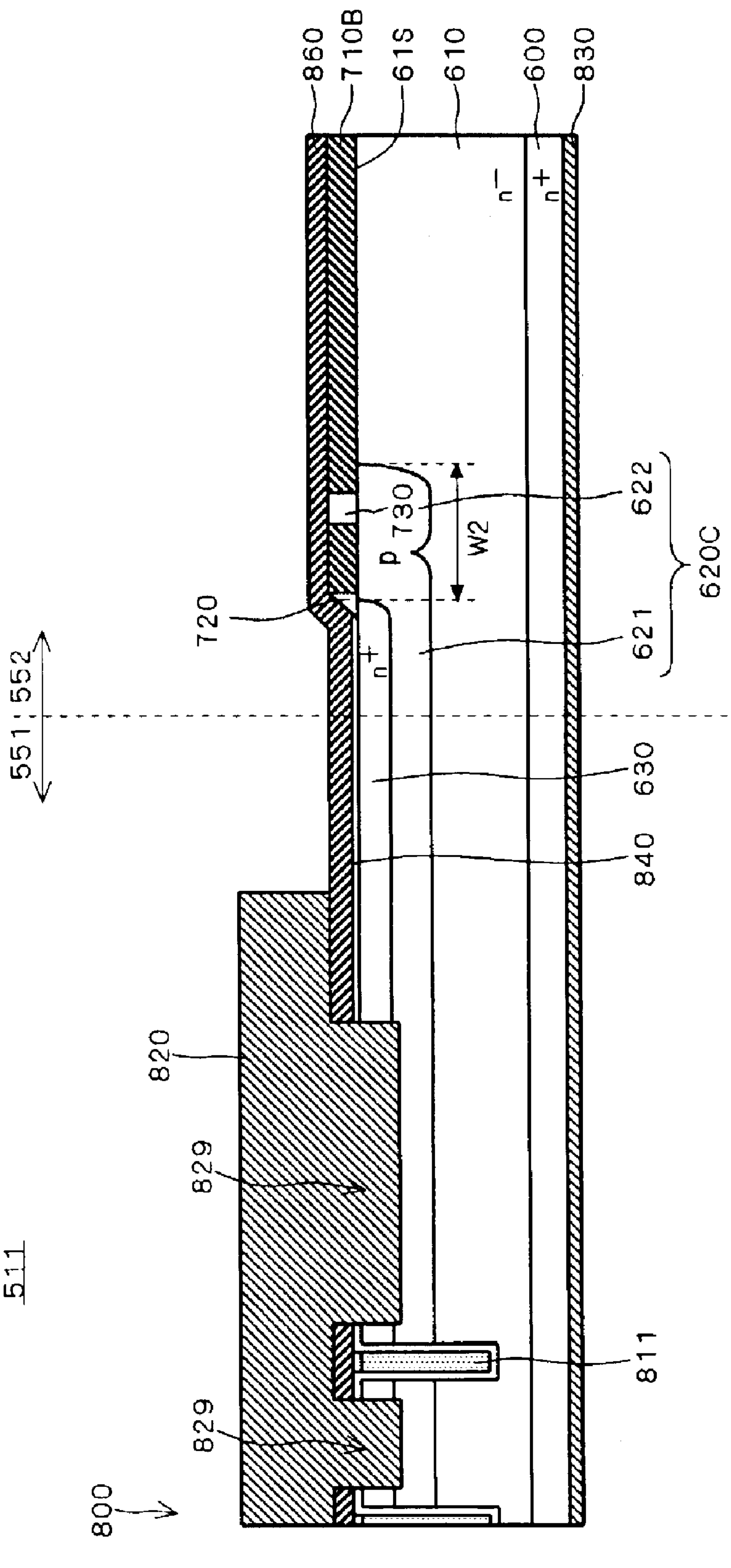
FIG. 95 is a cross-sectional view taken along line 95—95 of FIG. 93.

FIG. 93 shows a plan view for explaining a power semiconductor device 511 according to an eleventh preferred embodiment, FIG. 94 shows a cross-sectional view taken along line 94—94 of FIG. 93, and FIG. 95 shows a cross-sectional view taken along line 95—95 of FIG. 93. The semiconductor device 511 is configured by replacing the gate electrode 810 in the semiconductor device 509 (see FIGS. 59–62) with the previously described gate electrode 810B (see, for example, the semiconductor device 503 of FIGS. 39–41). That is, the semiconductor device 511 has the gate electrode 810B which does not extend into the outer peripheral region 552. The other parts of the configuration of the semiconductor device 511 are basically identical to those of the semiconductor device 509. The semiconductor device 511 can be manufactured by, for example, a combination of the manufacturing methods of the semiconductor devices 509 and 503.

The power semiconductor device 511 can achieve the same effect as the power semiconductor device 509, except the field plate effect achieved by the gate electrode 810.

Twelfth Preferred Embodiment

Figure 96:
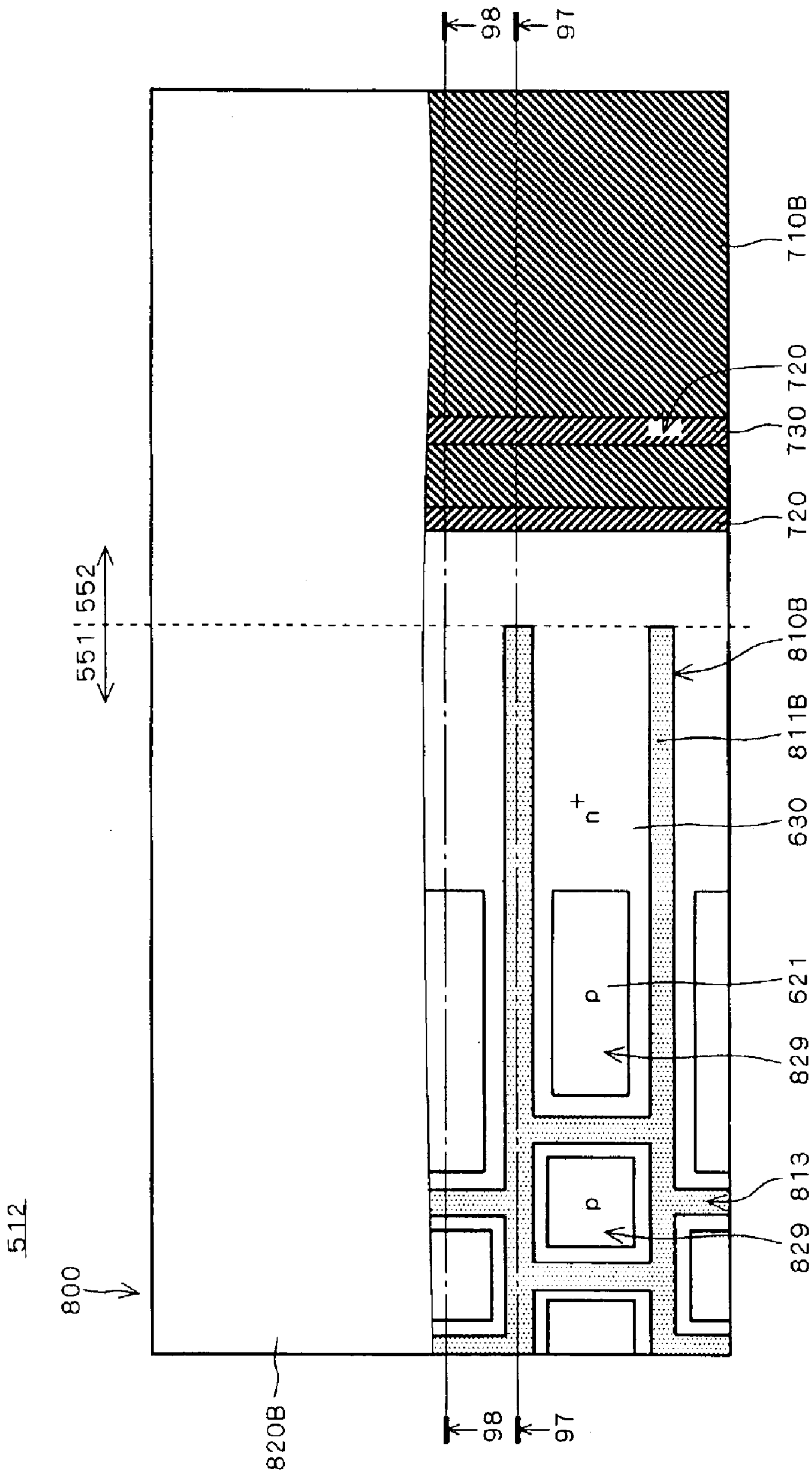
FIG. 96 is a plan view for explaining a power semiconductor device according to a twelfth preferred embodiment.
Figure 97:
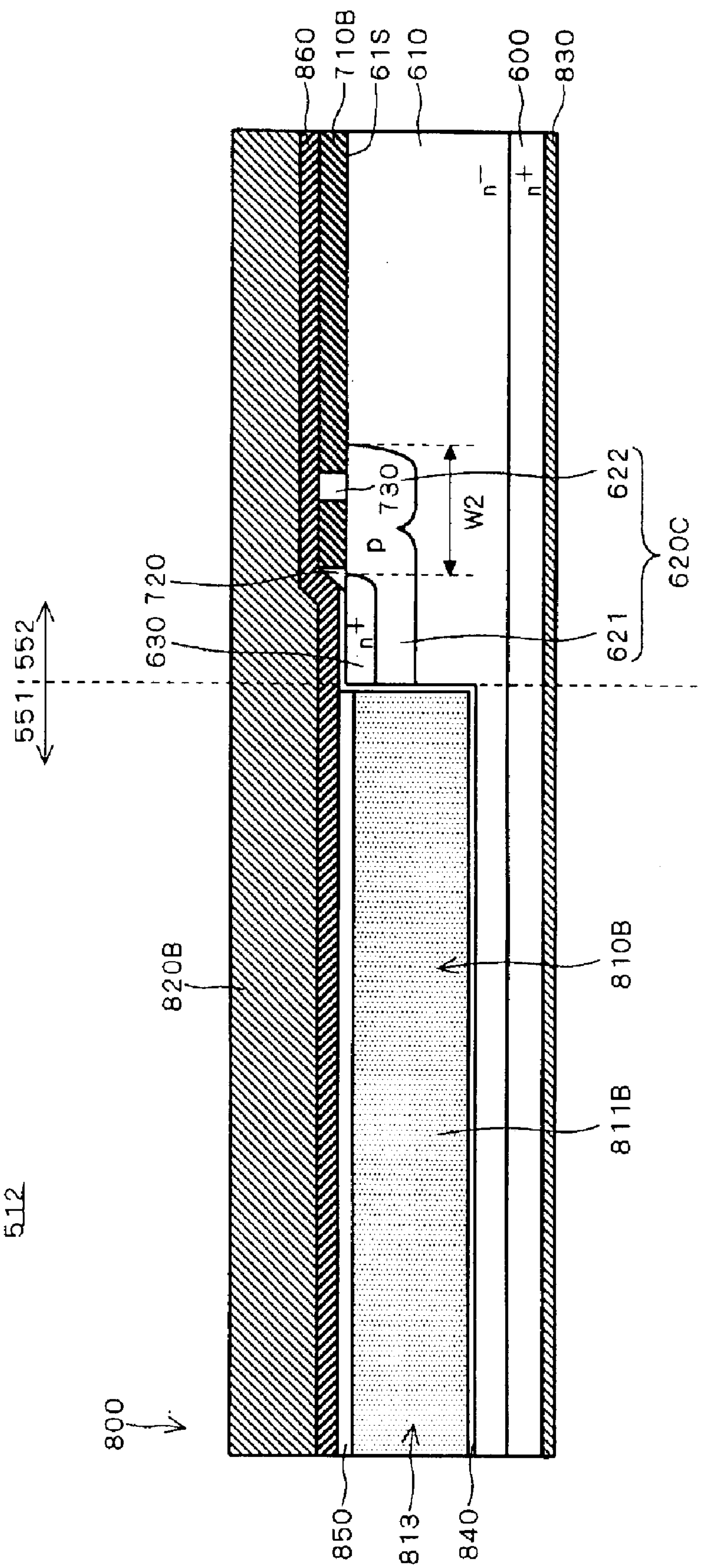
FIG. 97 is a cross-sectional view taken along line 97—97 of FIG. 96.
Figure 98:
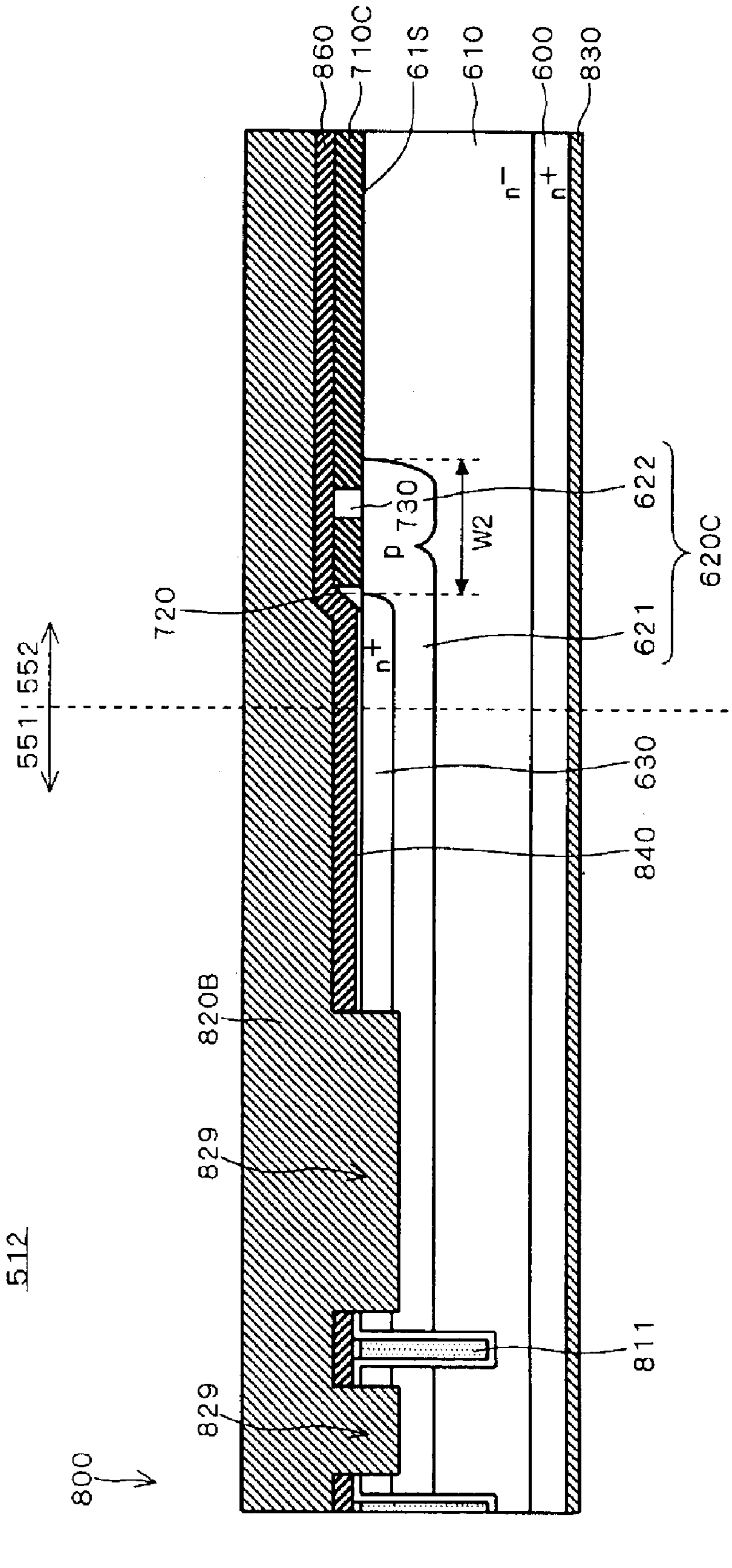
FIG. 98 is a cross-sectional view taken along line 98—98 of FIG. 96.

FIG. 96 shows a plan view for explaining a power semiconductor device 512 according to a twelfth preferred embodiment, FIG. 97 shows a cross-sectional view taken along line 97—97 of FIG. 96, and FIG. 98 shows a cross-sectional view taken along line 98—98 of FIG. 96. The semiconductor device 512 is configured by replacing the source electrode 820 in the aforementioned semiconductor device 511 (see FIGS. 93–95) with the previously described source electrode 820B (see, for example, the semiconductor device 504 shown in FIGS. 42–44), and the other parts of the configuration of the semiconductor device 512 are basically identical to those of the previously described semiconductor device 511. The semiconductor device 512 can be manufactured by, for example, a combination of the manufacturing methods of the semiconductor devices 509 and 504.

The power semiconductor device 512 can achieve the same effect as the aforementioned power semiconductor device 511 and, because of the field plate effect achieved by the source electrode 820B, it can further improve the breakdown voltage as compared with the semiconductor device 511.

Thirteenth Preferred Embodiment

Figure 99:
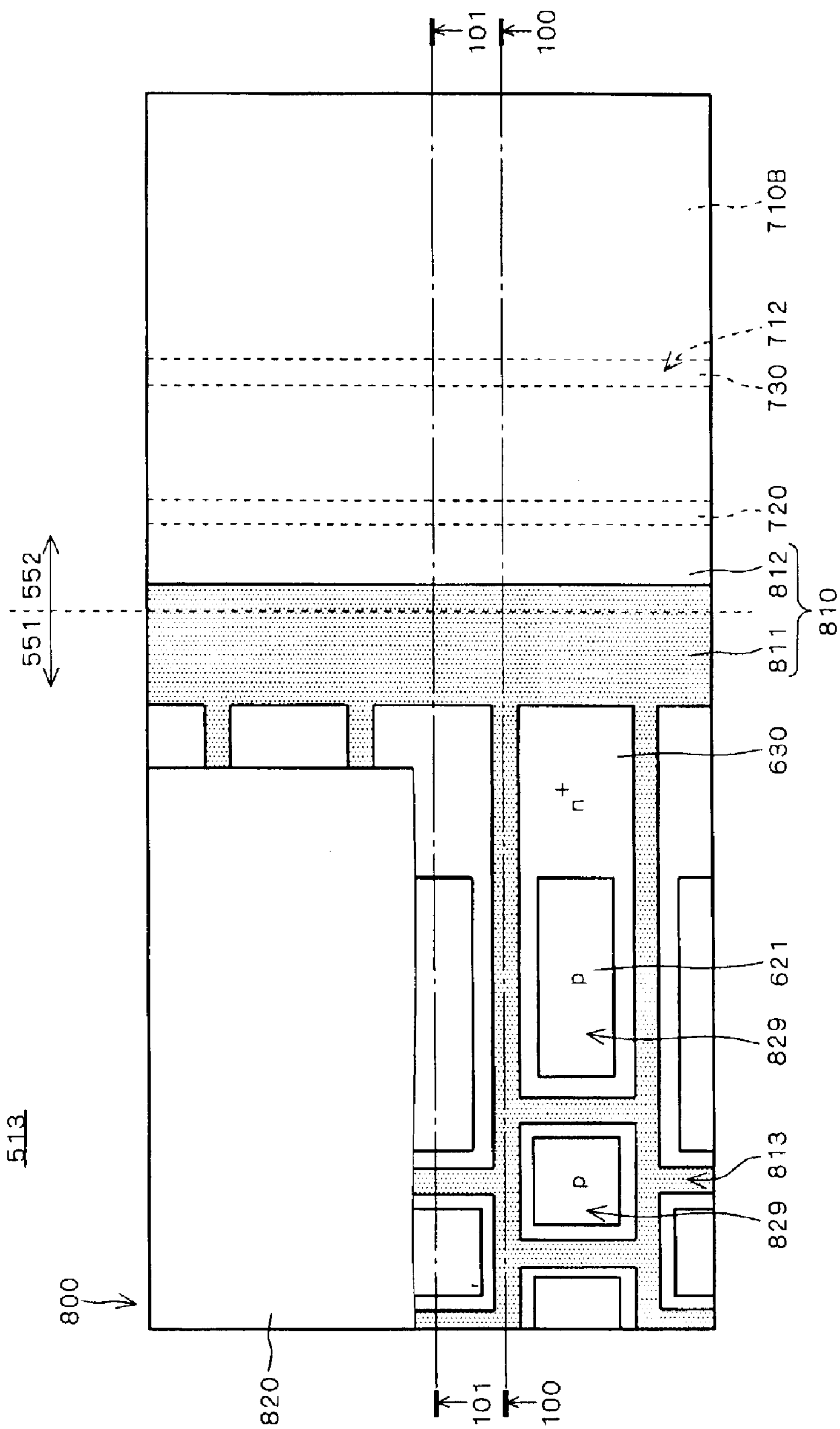
FIG. 99 is a plan view for explaining a power semiconductor device according to a thirteenth preferred embodiment.
Figure 101:
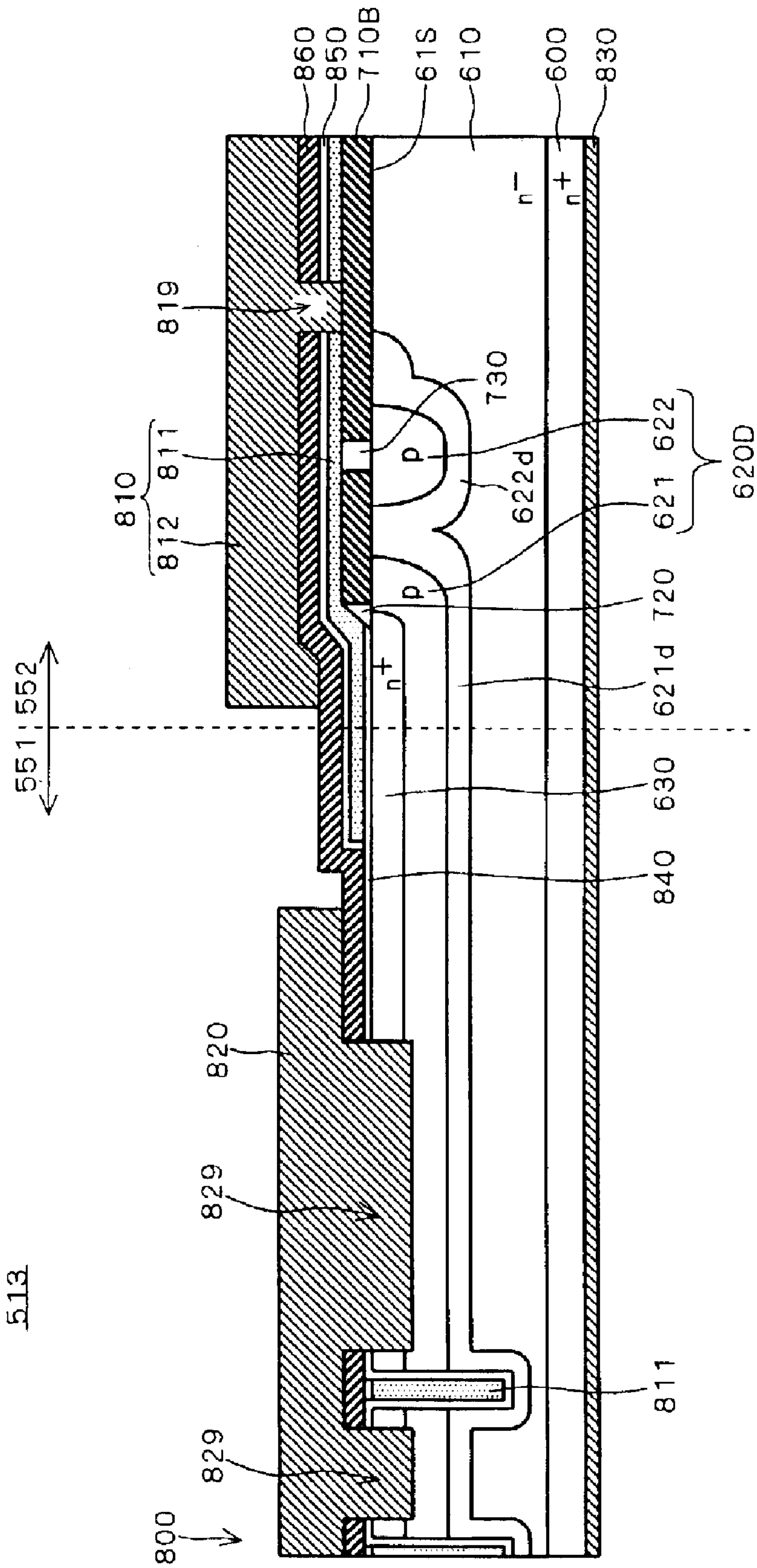
FIG. 101 is a cross-sectional view taken along line 101—101 of FIG. 99.

FIG. 99 shows a plan view for explaining a power semiconductor device 513 according to a thirteenth preferred embodiment, FIG. 100 shows a cross-sectional view taken along line 100—100 of FIG. 99, and FIG. 101 shows a cross-sectional view taken along line 101—101 of FIG. 99. The semiconductor device 513 is configured by replacing the p-type layer 620C in the semiconductor device 509 (see FIGS. 59–62) with a p-type layer (second semiconductor layer) 620D. The other parts of the configuration of the semiconductor device 513 are basically identical to those of the previously described semiconductor device 509.

More specifically, like the previously described p-type layer 620C (see FIGS. 59–62), the p-type layer 620D has the first and second portions 621 and 622; however, those portions 621 and 622 of the p-type layer 620D are not connected to each other. Instead, the first and second portions 621 and 622 are located so that depletion layers 621*d* and 622*d* generated in the vicinity of both the portions 621 and 622 are connected to each other during operation of the semiconductor device 513 (i.e., when the source electrode 820 is placed at a ground potential and the drain electrode 830 is placed at a positive potential) (see FIGS. 100 and 101). The opening 712 of the first insulator 710B (see FIGS. 99 and 62) is formed opposite the second portion 622 of the p-type layer 620D. Both the portions 621 and 622 of the p-type layer 620D can be configured in the aforementioned manner by changing and controlling the locations (pitches) and sizes of the openings 711 and 712, ion implant conditions, heat treatment conditions and the like in the manufacturing method of the semiconductor device 509.

The power semiconductor device 513 can achieve the same effect as the semiconductor device 501. Especially because the second portion 622 of the p-type layer 620D forms a so-called field ring structure or guard ring structure, the semiconductor device 513 can further improve the breakdown voltage as compared with the semiconductor device 501.

Fourteenth Preferred Embodiment

Figure 103:
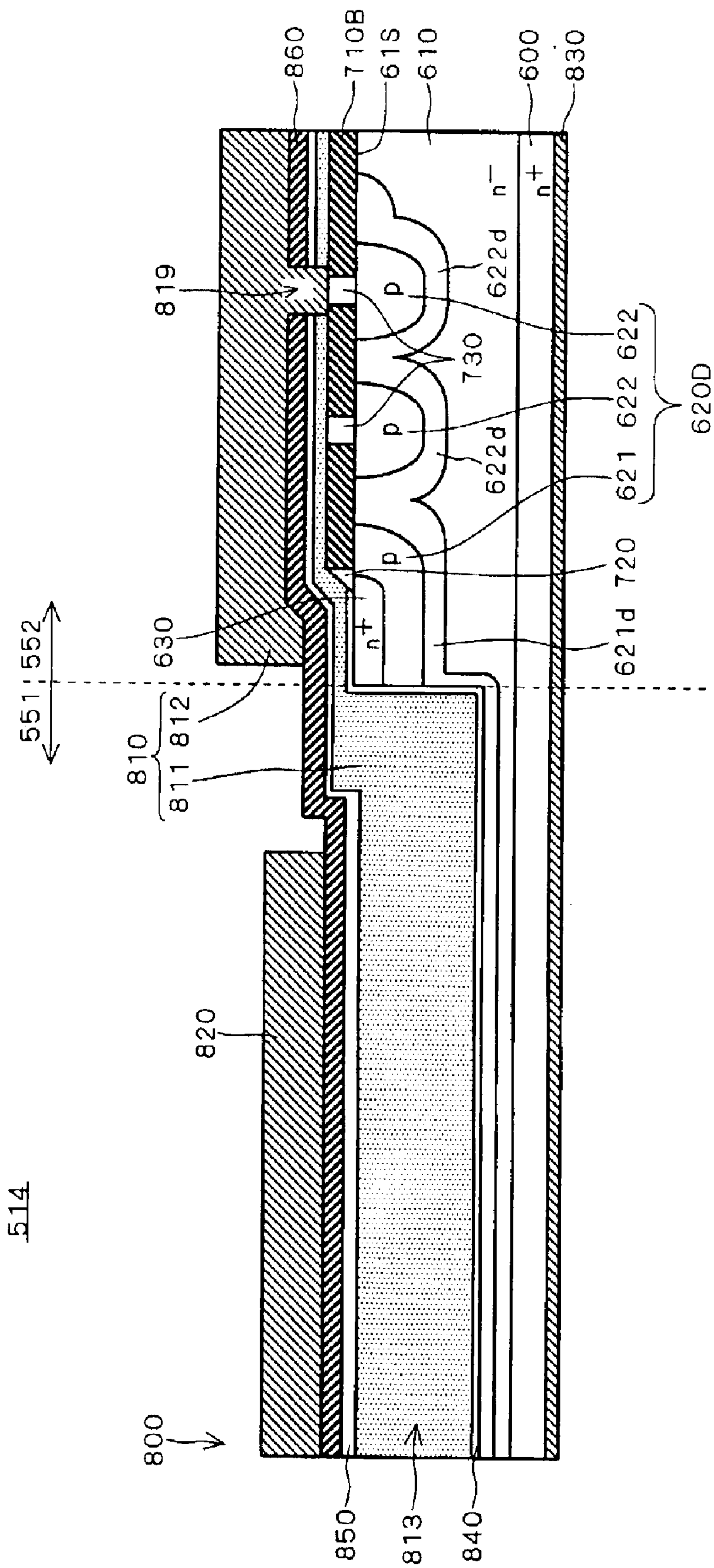
FIG. 103 is a cross-sectional view taken along line 103—103 of FIG. 102.

FIG. 102 shows a plan view for explaining a power semiconductor device 514 according to a fourteenth preferred embodiment, FIG. 103 shows a cross-sectional view taken along line 103—103 of FIG. 102, and FIG. 104 shows a cross-sectional view taken along line 104—104 of FIG. 102.

The semiconductor device 514 is configured by providing a p-type layer 620D with two linear second portions 622 in the semiconductor device 513 (see FIGS. 99–101), and the other parts of the configuration of the semiconductor device 514 are basically identical to those of the semiconductor device 513. The above two second portions 622 are spaced from each other (i.e., not connected to each other), but they are located so that the depletion layers 622*d* generated in the vicinity of adjacent second portions 622 are connected to each other during operation of the semiconductor device 514 (see FIGS. 103 and 104). Further, the first and second portions 621 and 622 are located so that, during the operation, the depletion layer 622*d* generated in the vicinity of the second portion 622 which is located beside the first portion 621 is connected to the depletion layer 621*d* generated in the vicinity of the first portion 621 (it can also be said that the whole depletion layer 622*d* generated in the vicinity of the plurality of second portions 622 is connected to the depletion layer 621*d*) (see FIGS. 103 and 104).

The first insulator 710B has the openings 712 formed opposite the respective second portions 622 (see FIGS. 102 and 62) and the third insulator 730 is located in each of the openings 712. The plurality of second portions 622 of the p-type layer 620D can be configured in the aforementioned manner by controlling the locations (pitches) and sizes of the openings 712, ion implant conditions, heat treatment conditions and the like. It goes without saying that the p-type layer 620D may have three or more such second portions 622.

The power semiconductor device 514 can achieve the same effect as the semiconductor device 513. Especially, the plurality of second portions 622 of the p-type layer 620D allow further improvement in the breakdown voltage as compared with that in the aforementioned semiconductor device 513.

Fifteenth Preferred Embodiment

Figure 105:
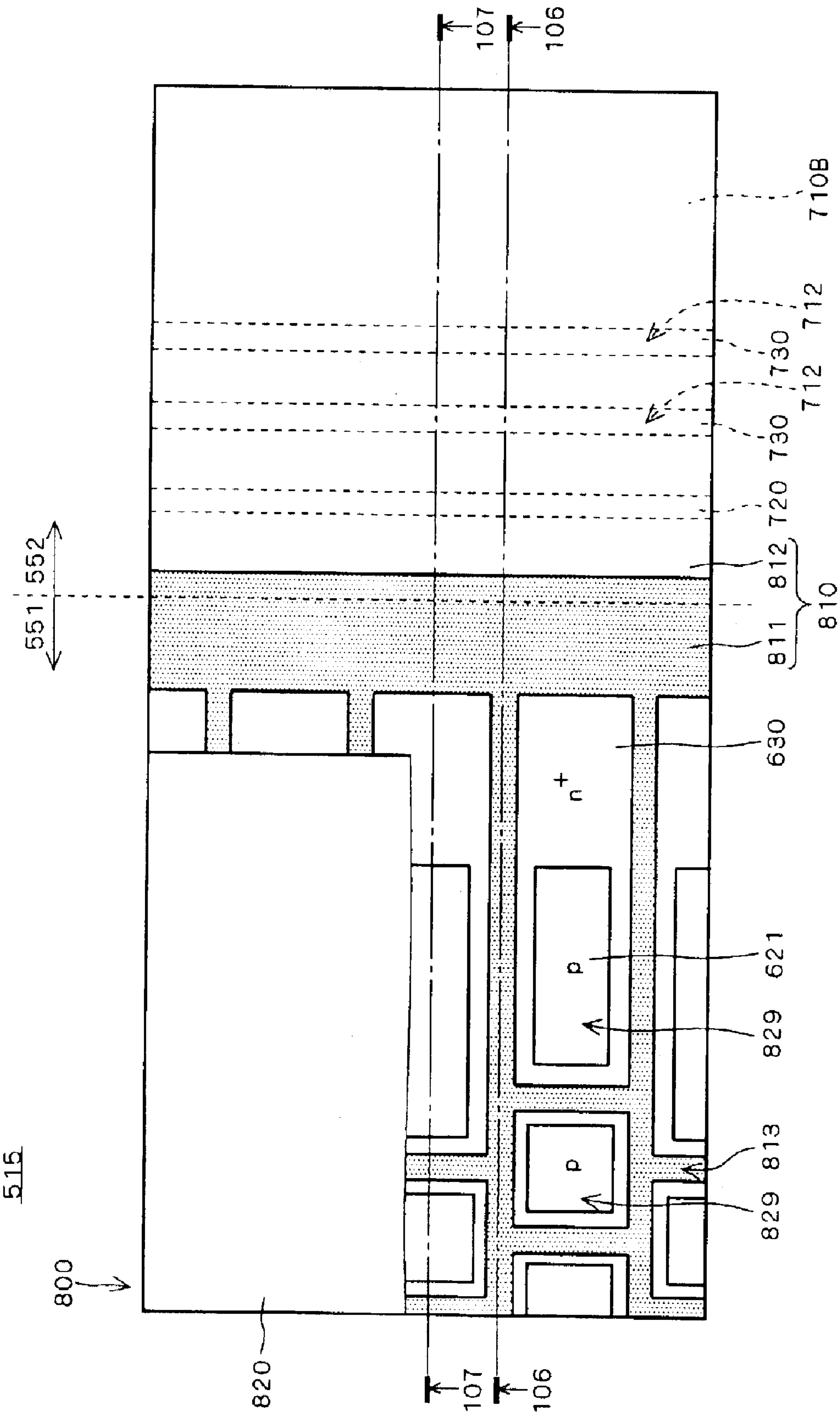
FIG. 105 is a plan view for explaining a power semiconductor device according to a fifteenth preferred embodiment.
Figure 106:
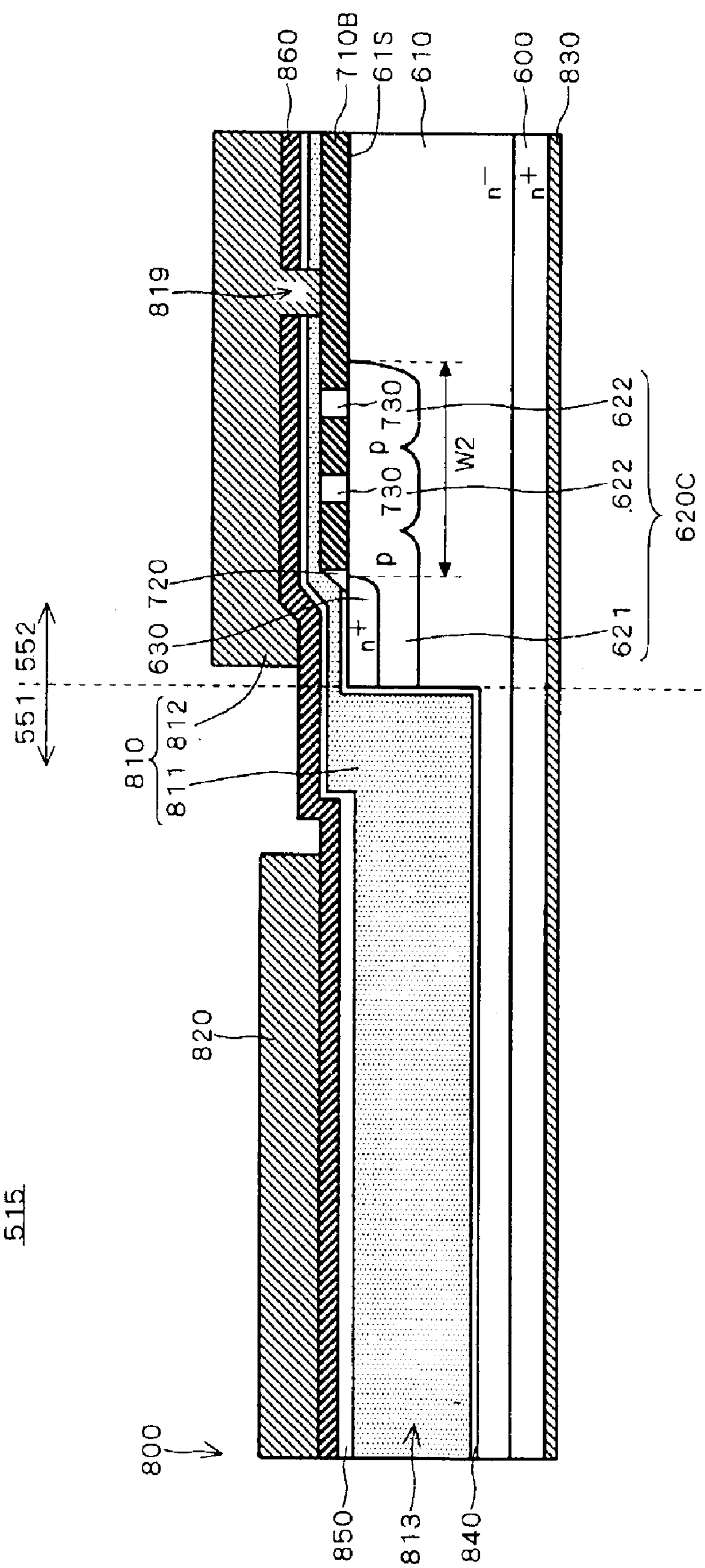
FIG. 106 is a cross-sectional view taken along line 106—106 of FIG. 105.

FIG. 105 shows a plan view for explaining a power semiconductor device 515 according to a fifteenth preferred embodiment, FIG. 106 shows a cross-sectional view taken along line 106—106 of FIG. 105, and FIG. 107 shows a cross-sectional view taken along line 107—107 of FIG. 105.

The semiconductor device 515 is configured by providing a p-type layer 620C with two linear second portions 622 in the semiconductor device 509 (see FIGS. 59–62), and the other parts of the configuration of the semiconductor device 515 are basically identical to those of the semiconductor device 509. The above two second portions 622 are connected to each other, and the second portion 622 located beside the first portion 621 is connected to the first portion 621 (accordingly, the second portions 622 connected to each other are connected to the first portion 621). The first insulator 710B has the openings 712 (see FIGS. 105 and 62) which are formed opposite the respective second portions 622, and the third insulator 730 is located in each of the openings 712. The plurality of second portions 622 of the p-type layer 620C can be configured in the aforementioned manner by controlling the locations (pitches) and sizes of the openings 712, ion implant conditions, heat treatment conditions and the like in the manufacturing method of the semiconductor device 509. It goes without saying that the p-type layer 620C may have three or more such second portions 622.

The power semiconductor device 515 can achieve the same effect as the power semiconductor device 509. Especially, with the presence of the plurality of second portions 622, the width W2 (see FIGS. 106 and 107) of the outer end portion of the p-type layer 620C becomes greater than that of the semiconductor device 509 (see FIGS. 60 and 61), which further prevents the occurrence of punch-through at the outer end of the p-type layer 620C.

Sixteenth Preferred Embodiment

Figure 110:
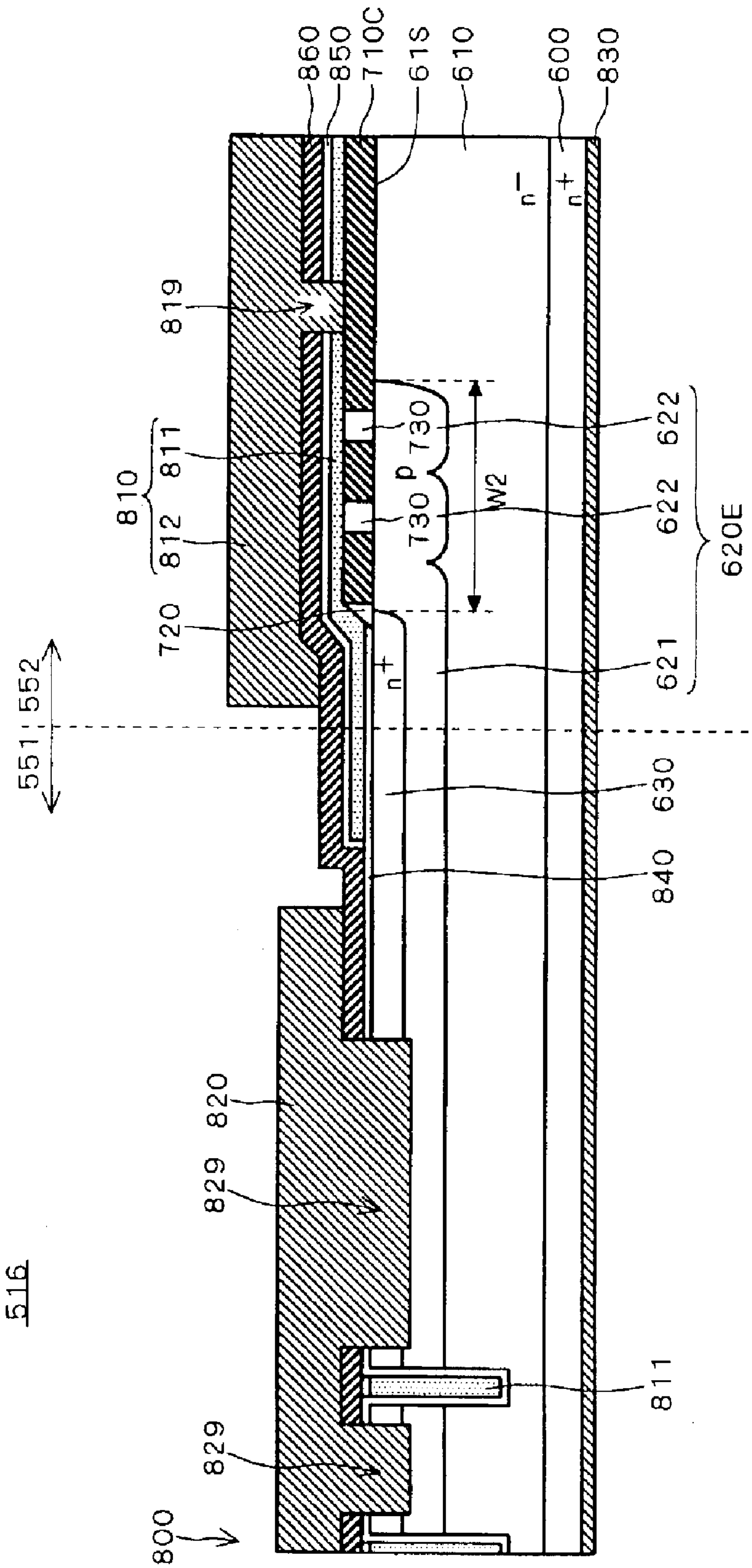
FIG. 110 is a cross-sectional view taken along line 110—110 of FIG. 108.

FIG. 108 shows a plan view for explaining a power semiconductor device 516 according to a sixteenth preferred embodiment, FIG. 109 shows a cross-sectional view taken along line 109—109 of FIG. 108, and FIG. 110 shows a cross-sectional view taken along line 110—110 of FIG. 108. The semiconductor device 516 is configured by replacing the first insulator 710B and the p-type layer 620C in the semiconductor device 509 (see FIGS. 59–62) with a first insulator 710C and a p-type layer (second semiconductor layer) 620E. The other parts of the configuration of the semiconductor device 516 are basically identical to those of the previously described semiconductor device 509.

More specifically, while the previously described first insulator 710B has the linear opening(s) 712, the first insulator 710C has a plurality of scattered second openings 712 as viewed in plan. And, the second portions 622 of the p-type layer 620E are formed (scattered) opposite the respective scattered openings 712. The p-type layer 620E includes those plurality of second portions 622 and the first portion 621 previously described. At this time, adjacent second portions 622 are connected to each other and the second portion 622 which is located beside the first portion 621 is connected to the first portion 621 (accordingly the second portions 622 connected to each other are connected to the first portion 621). The third insulator 730 is located in each of the openings 712. The plurality of second portions 622 of the p-type layer 620E can be configured in the aforementioned fashion by changing the shape of the openings 712 and further controlling the locations (pitches) and sizes of the scattered openings 712, ion implant conditions, heat treatment conditions and the like, in the manufacturing method of the semiconductor device 509.

In FIGS. 108 to 110, the openings 712 and the second portions 622 are arranged to form two lines outside the first portion 621 (see two lines of openings 712 and two lines of second portions 622 previously shown in FIGS. 105 to 107); however, the scattered openings 712 and the scattered second portions 622 may form a single or three or more lines.

The power semiconductor device 516 can achieve the same effect as the semiconductor device 509.

Seventeenth Preferred Embodiment

FIG. 111 shows a plan view for explaining a power semiconductor device 517 according to a seventeenth preferred embodiment, FIG. 112 shows a cross-sectional view taken along line 112—112 of FIG. 111, and FIG. 113 shows a cross-sectional view taken along line 113—113 of FIG. 111. The semiconductor device 517 is configured by replacing the p-type layer 620E in the semiconductor device 516 (see FIGS. 108–110) with a p-type layer (second semiconductor layer) 620F. The other parts of the configuration of the semiconductor device 517 are basically identical to those of the previously described semiconductor device 516.

More specifically, the p-type layer 620F is configured by separating the first portion 621 and the respective scattered second portions 622 from each other in the previously described p-type layer 620E (see FIGS. 108–110). However, the first and second portions 621 and 622 are located such that, during operation of the semiconductor device 517, the depletion layer 621*d* generated in the vicinity of the first portion 621 and the depletion layers 622*d* generated in the vicinity of the second portions 622 adjacent to the first portion 621 are connected to each other and the depletion layers 622*d* generated in the vicinity of adjacent second portions 622 and 113). The scattered openings 712 of the first insulator 710C are formed opposite the respective second portions 622 of the p-type layer 620F, and the third insulator 730 is located in each of the openings 712. Alternatively, the p-type layer 620F may be formed such that some of the second portions 622 are connected to each other. The plurality of second portions 622 of the p-type layer 620F can be configured in the aforementioned manner by controlling the locations (pitches) and sizes of the scattered openings 712, ion implant conditions, heat treatment conditions and the like in the manufacturing method of the semiconductor device 516.

In FIGS. 111 to 113, the openings 712 and the second portions 622 are arranged to form two lines outside the first portion 621 (see two lines of the openings 712 and two lines of the second portions 622 previously shown in FIGS. 105–107); however, the scattered openings 712 and the scattered second portions 622 may form a single or three or more lines.

The power semiconductor device 517 can achieve the same effect as the semiconductor devices 513 and 514 (see FIGS. 99–101 and 102–104).

Eighteenth Preferred Embodiment

Figure 114:
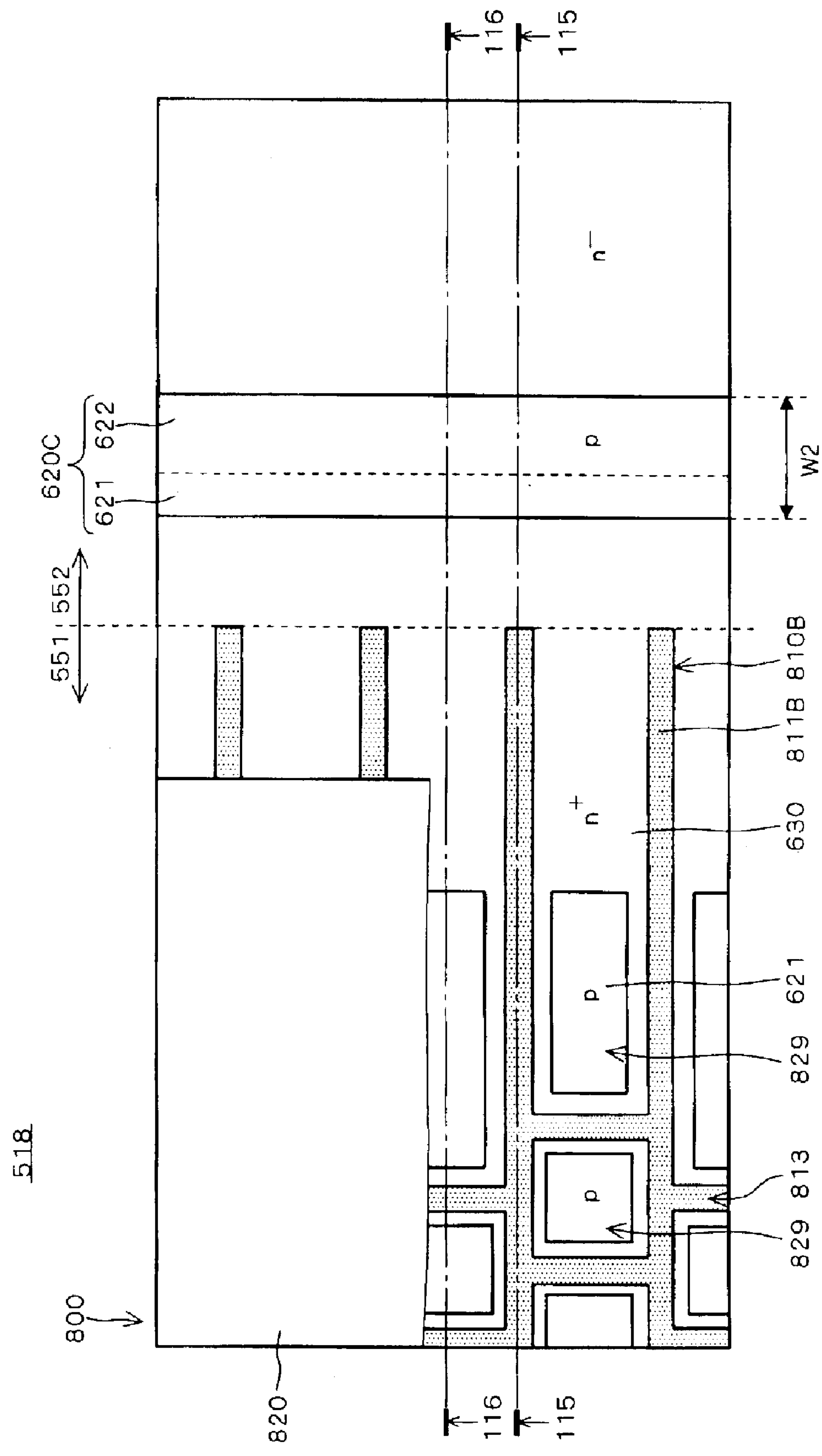
FIG. 114 is a plan view for explaining a power semiconductor device according to an eighteenth preferred embodiment.
Figure 115:
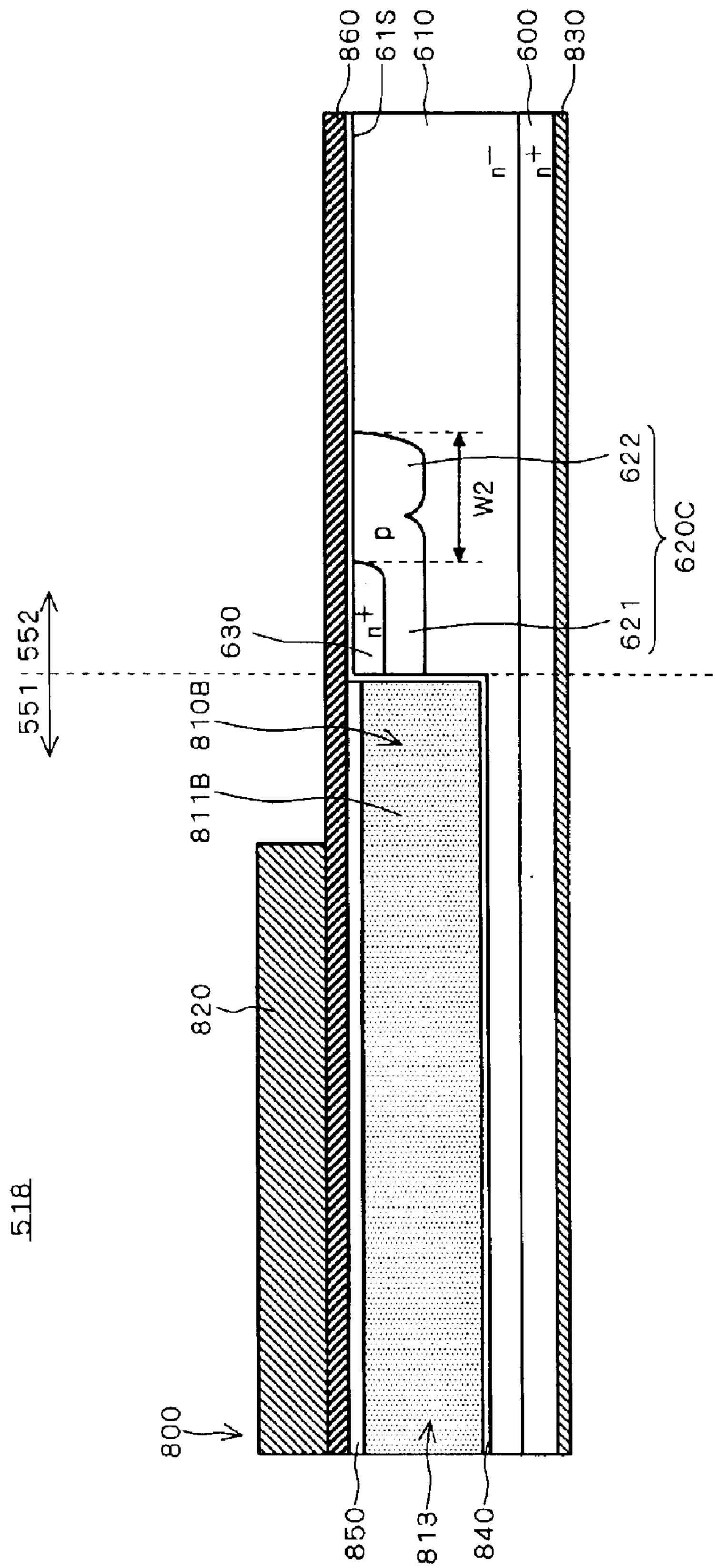
FIG. 115 is a cross-sectional view taken along line 115—115 of FIG. 114.
Figure 116:
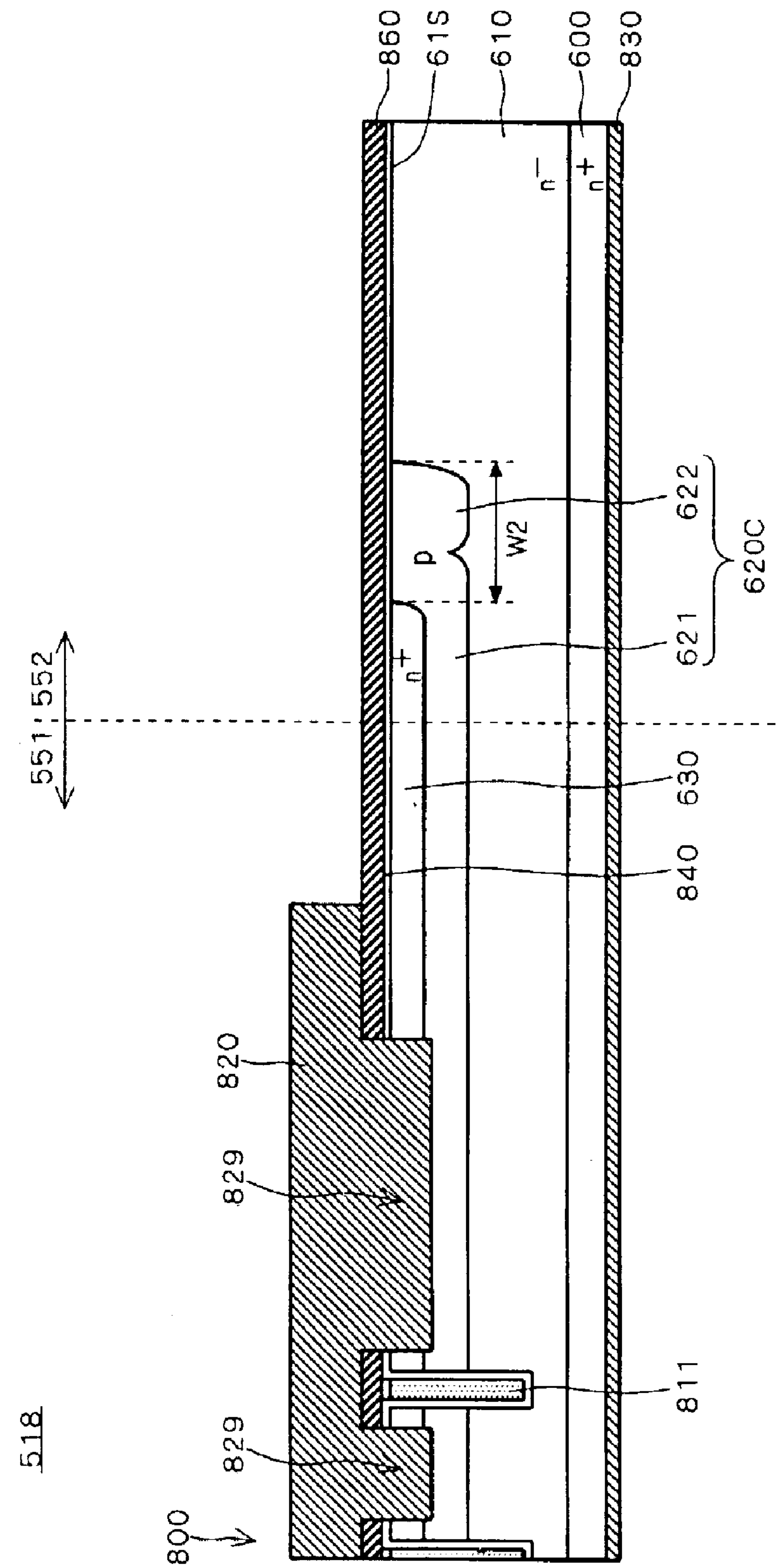
FIG. 116 is a cross-sectional view taken along line 116—116 of FIG. 114.

FIG. 114 shows a plan view for explaining a power semiconductor device 518 according to an eighteenth preferred embodiment, FIG. 115 shows a cross-sectional view taken along line 115—115 of FIG. 114, and FIG. 116 shows a cross-sectional view taken along line 116—116 of FIG. 114.

The semiconductor device 518 has a configuration achieved by a combination of the semiconductor device 510 (see FIGS. 79–81) and the semiconductor device 506 (see FIGS. 50–52). More specifically, the semiconductor device 518 is configured by replacing the gate electrode 810 in the previously described semiconductor device 510 (see FIGS. 79–81) with the gate electrode 810B, and the other parts of the configuration of the semiconductor device 518 are basically identical to those of the previously described semiconductor device 510. In other words, the semiconductor device 518 is configured by replacing the p-type layer 620 in the previously described semiconductor device 506 (see FIGS. 50–52) with the p-type layer 620C, and the other parts of the configuration of the semiconductor device 518 are basically identical to those of the previously described semiconductor device 506. The semiconductor device 518 can be manufactured by, for example, a combination of the manufacturing methods of the semiconductor devices 510 and 506.

The power semiconductor device 518 can achieve the same effect as the power semiconductor devices 510 and 506.

Nineteenth Preferred Embodiment

Figure 117:
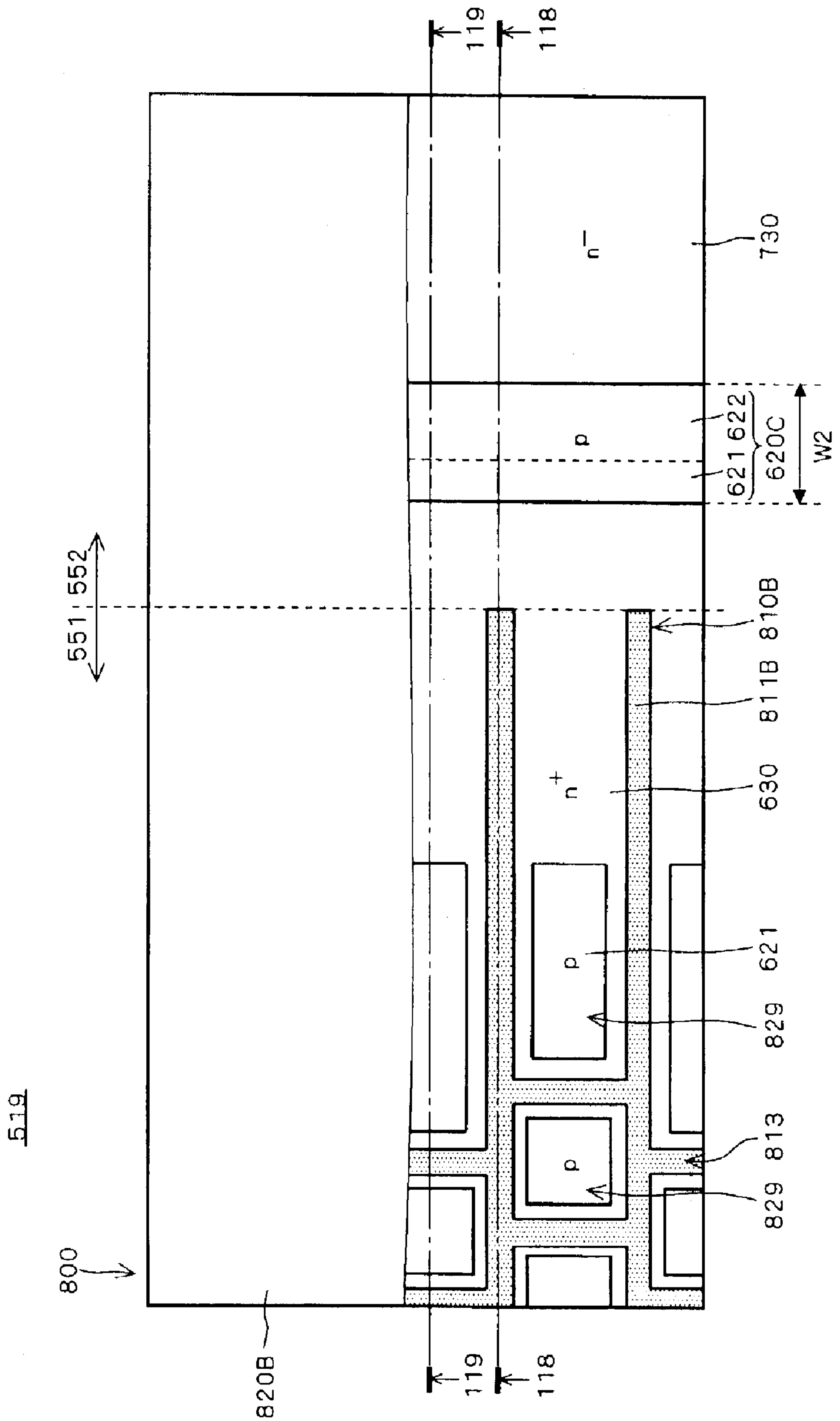
FIG. 117 is a plan view for explaining a power semiconductor device according to a nineteenth preferred embodiment.

FIG. 117 shows a plan view for explaining a power semiconductor device 519 according to a nineteenth preferred embodiment, FIG. 118 shows a cross-sectional view taken along line 118—118 of FIG. 117, and FIG. 119 shows a cross-sectional view taken along line 119—119 of FIG. 117. The semiconductor device 519 can be configured by replacing the source electrode 820 in the aforementioned semiconductor device 518 (see FIGS. 114–116) with the previously described source electrode 820B (see, for example, the semiconductor device 504 of FIGS. 53–57), and the other parts of the configuration of the semiconductor device 519 are basically identical to those of the semiconductor device 518. The semiconductor device 519 can be manufactured by, for example, a combination of the manufacturing methods of the semiconductor devices 518 and 507.

The power semiconductor device 519 can achieve the same effect as the aforementioned power semiconductor device 518, and because of the field plate effect achieved by the source electrode 820B, it can further improve the breakdown voltage as compared with the semiconductor device 518.

Twentieth Preferred Embodiment

Figure 120:
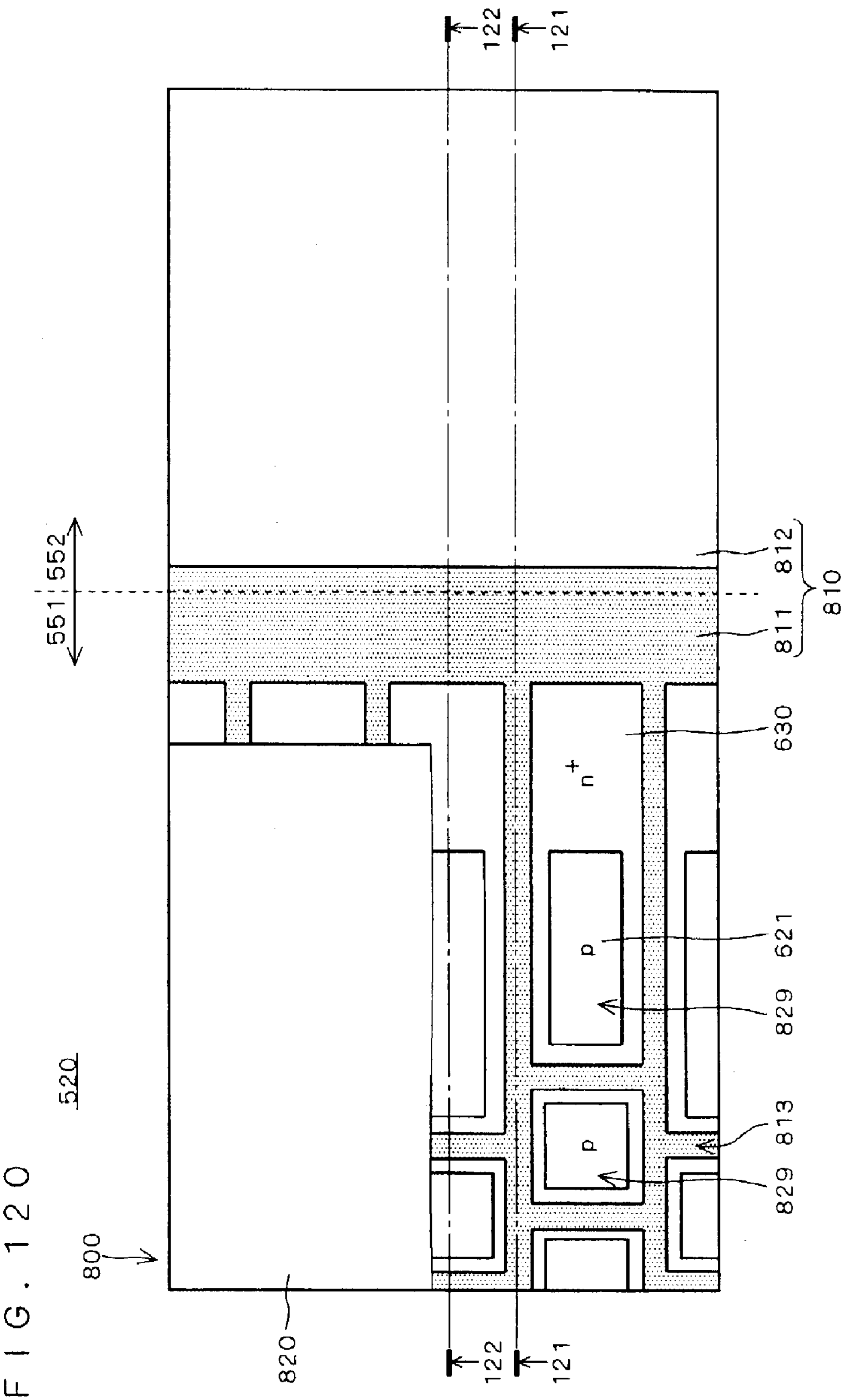
FIG. 120 is a plan view for explaining a power semiconductor device according to a twentieth preferred embodiment.
Figure 121:
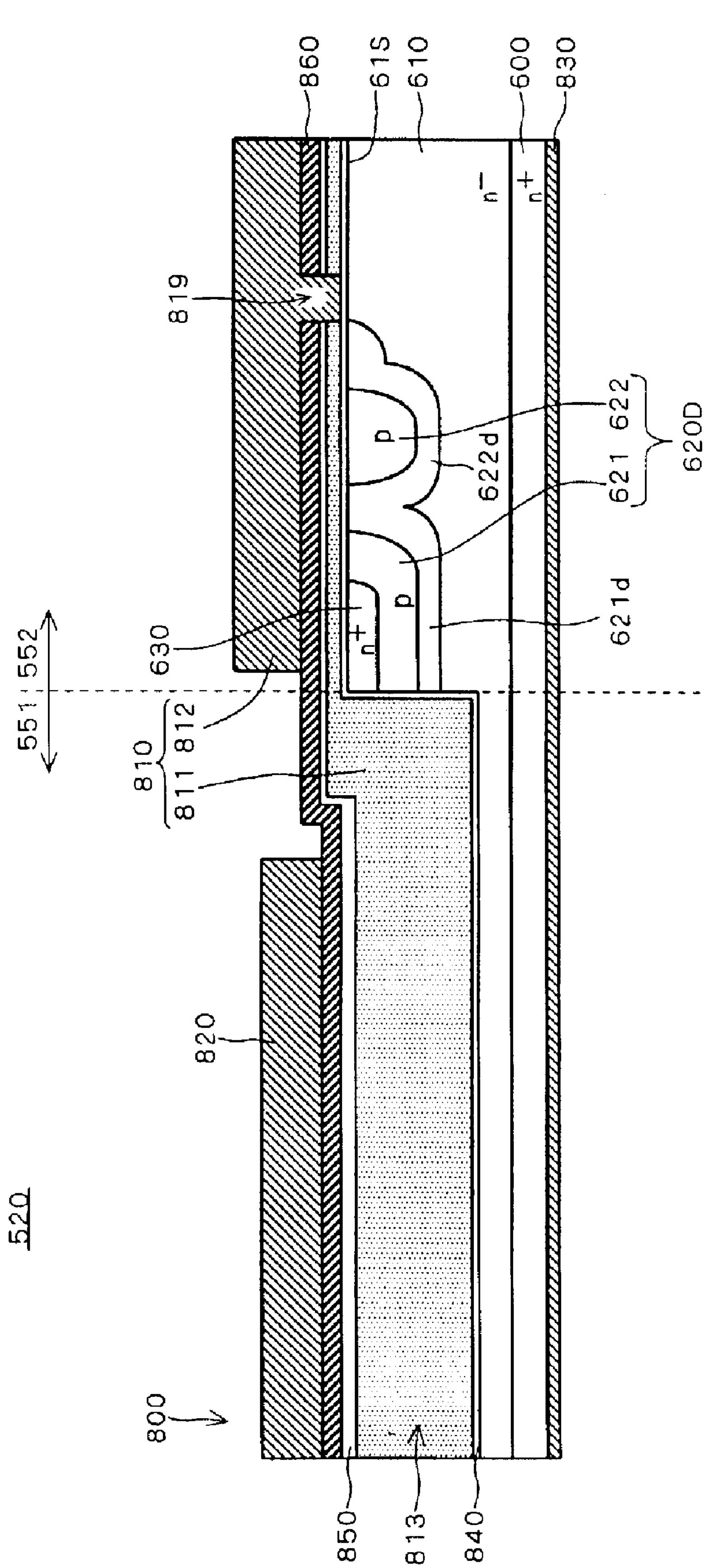
FIG. 121 is a cross-sectional view taken along line 121—121 of FIG. 120.
Figure 122:
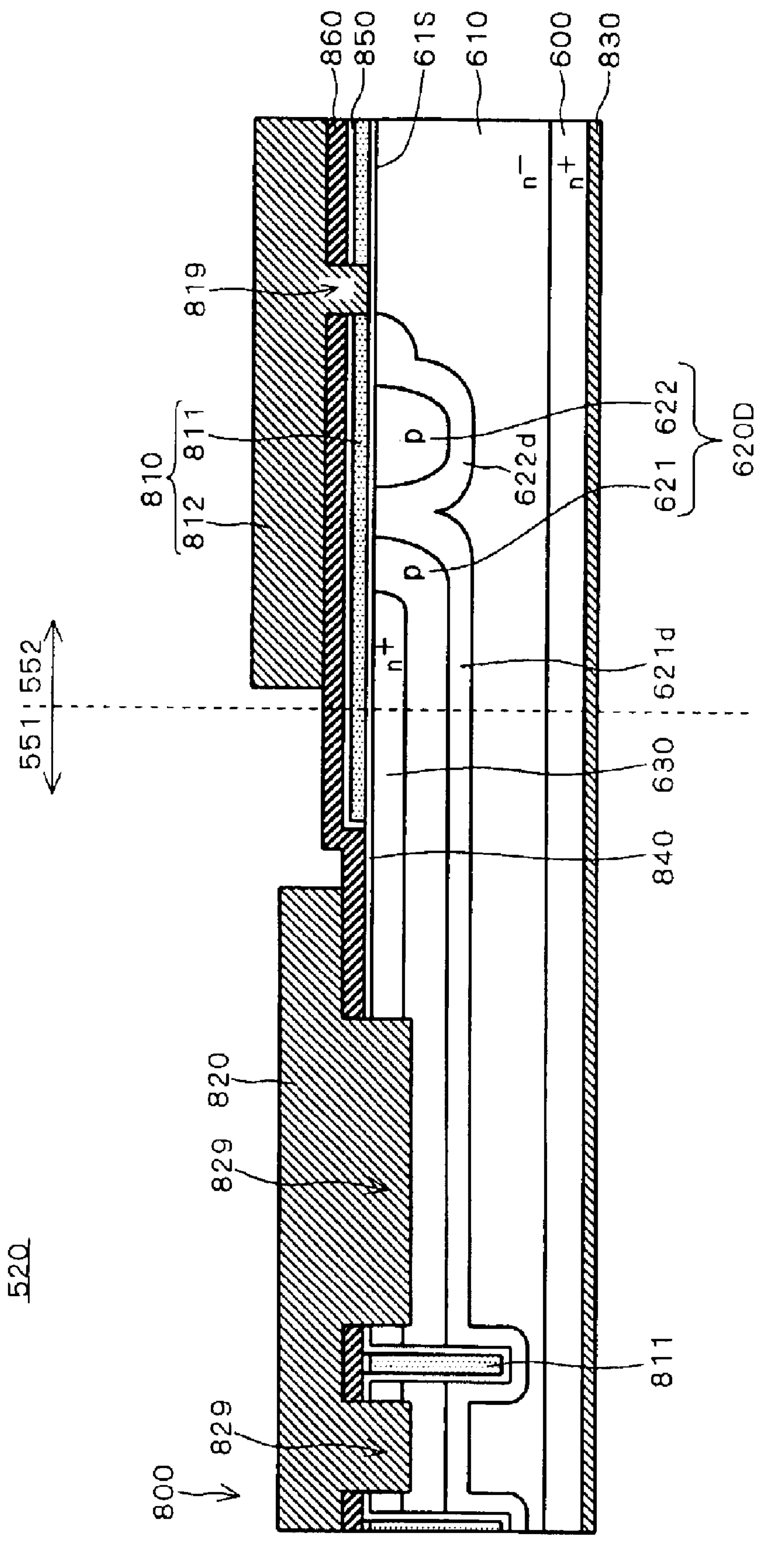
FIG. 122 is a cross-sectional view taken along line 122—122 of FIG. 120.

FIG. 120 shows a plan view for explaining a power semiconductor device 520 according to a twentieth preferred embodiment, FIG. 121 shows a cross-sectional view taken along line 121—121 of FIG. 120, and FIG. 122 shows a cross-sectional view taken along line 122—122 of FIG. 120.

The power semiconductor device 520 has a configuration achieved by a combination of the semiconductor device 510 (see FIGS. 79–81) and the semiconductor device 513 (see FIGS. 99–101). More specifically, the semiconductor device 520 is configured by replacing the p-type layer 620C in the previously described semiconductor device 510 (see FIGS. 79–81) with the previously described p-type layer 620D, and the other parts of the configuration of the semiconductor device 520 are basically identical to those of the previously described semiconductor device 510. In other words, the semiconductor device 520 is configured by removing the first through third insulators 710B, 720 and 730 from the previously described semiconductor device 513 (see FIGS. 99–101), and the other parts of the configuration of the semiconductor device 520 are basically identical to those of the previously described semiconductor device 513. The semiconductor device 520 can be manufactured by, for example, a combination of the manufacturing methods of the semiconductor devices 510 and 513.

The power semiconductor device 520 can achieve the same effect as the power semiconductor devices 510 and 513.

Twenty-First Preferred Embodiment

Figure 125:
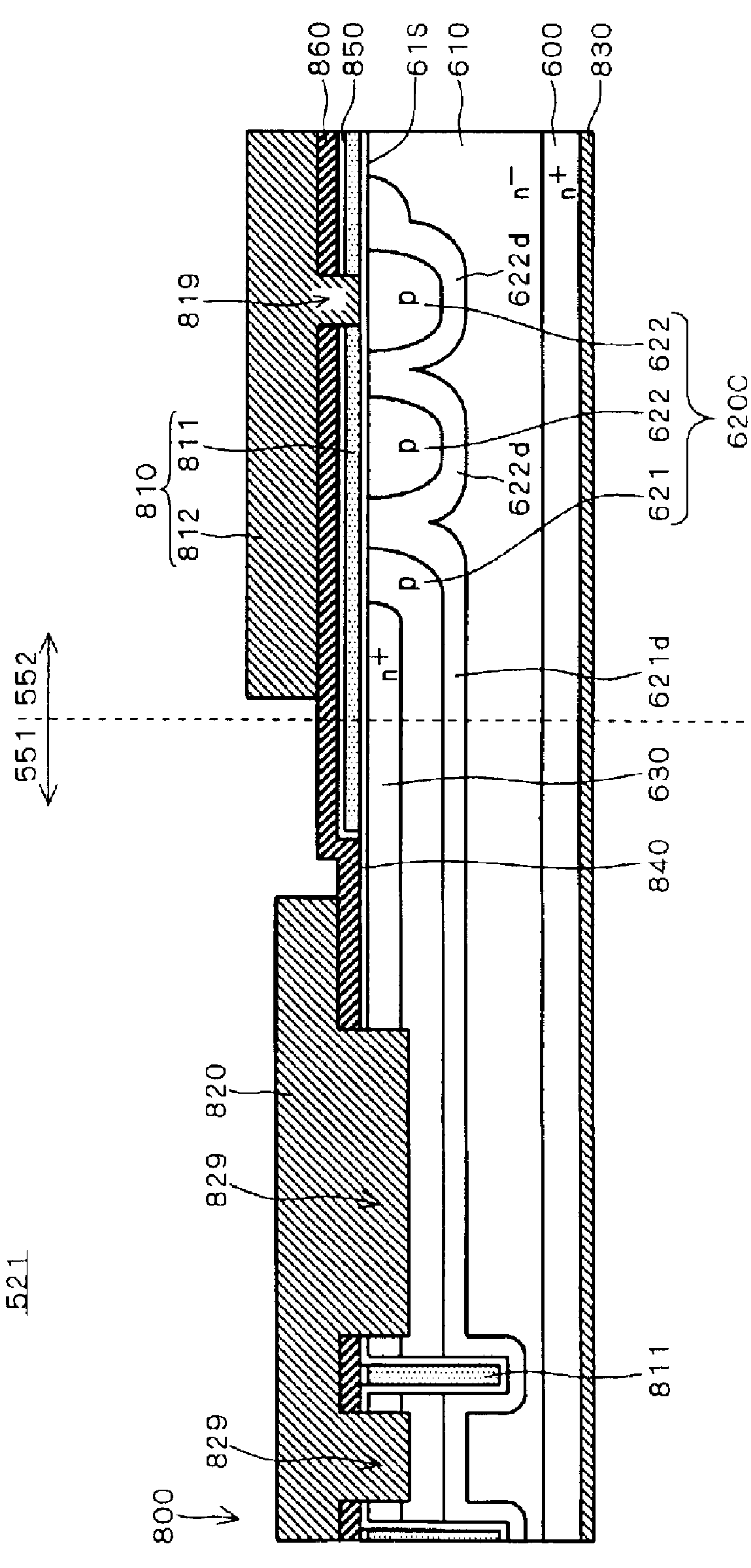
FIG. 125 is a cross-sectional view taken along line 125—125 of FIG. 123.

FIG. 123 shows a plan view for explaining a power semiconductor device 521 according to a twenty-first preferred embodiment, FIG. 124 shows a cross-sectional view taken along line 124—124 of FIG. 123, and FIG. 125 shows a cross-sectional view taken along line 125—125 of FIG. 123.

The power semiconductor device 521 has a configuration achieved by a combination of the semiconductor device 510 (see FIGS. 79–81) and the semiconductor device 514 (see FIGS. 102–104). More specifically, the semiconductor device 521 is configured by providing a p-type layer 620D with a plurality of second portions 622 in the previously described semiconductor device 510 (see FIGS. 79–81) as in the semiconductor device 514 (see FIGS. 102–104), and the other parts of the configuration of the semiconductor device 521 are basically identical to those of the semiconductor device 510. In other words, the semiconductor device 521 is configured by removing the first through third insulators 710B, 720 and 730 from the previously described semiconductor device 514 (see FIGS. 102–104), and the other parts of the configuration of the semiconductor device 521 are basically identical to those of the semiconductor device 514. The semiconductor device 521 can be manufactured by, for example, a combination of the manufacturing methods of the semiconductor devices 510 and 514.

The power semiconductor device 521 can achieve the same effect as the power semiconductor devices 510 and 514.

Twenty-Second Preferred Embodiment

Figure 127:
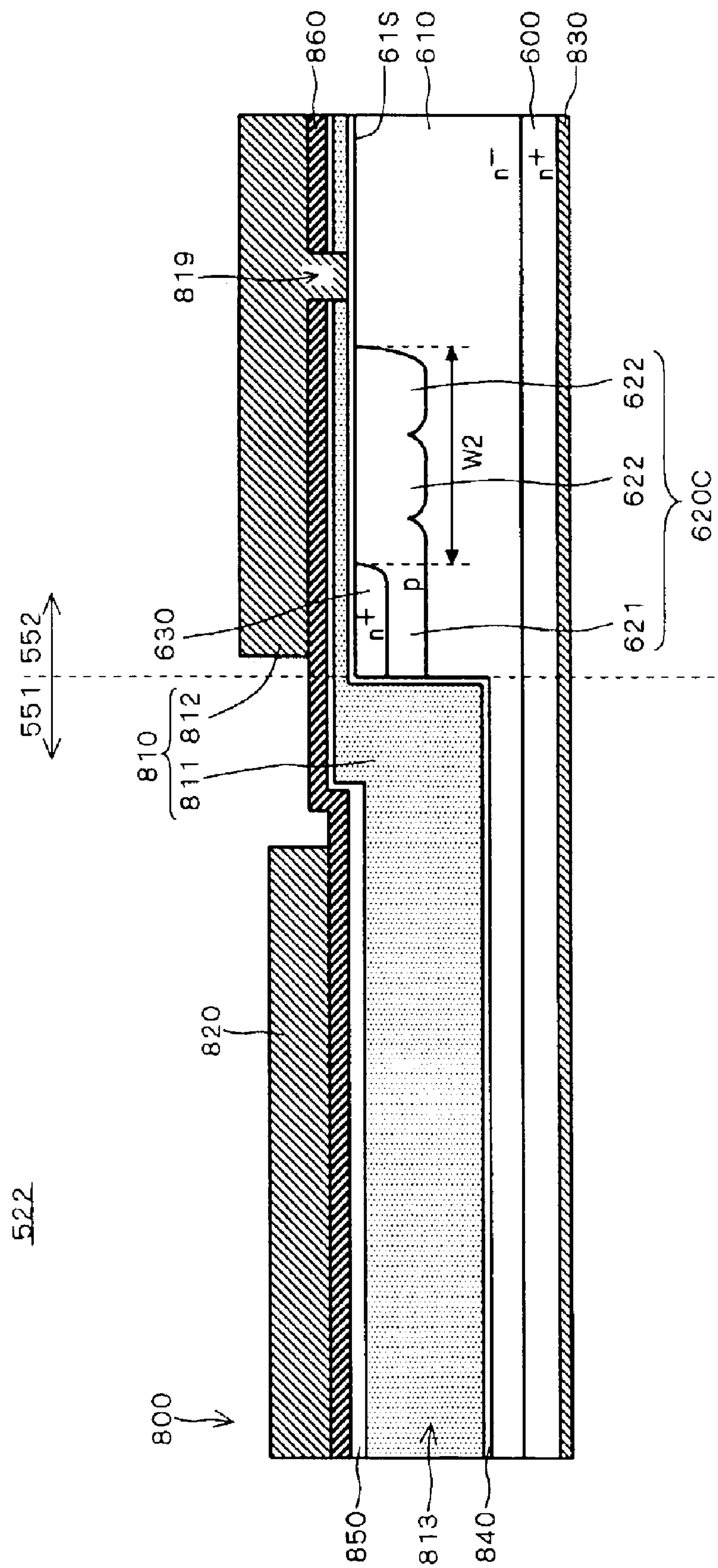
FIG. 127 is a cross-sectional view taken along line 127—127 of FIG. 126.
Figure 128:
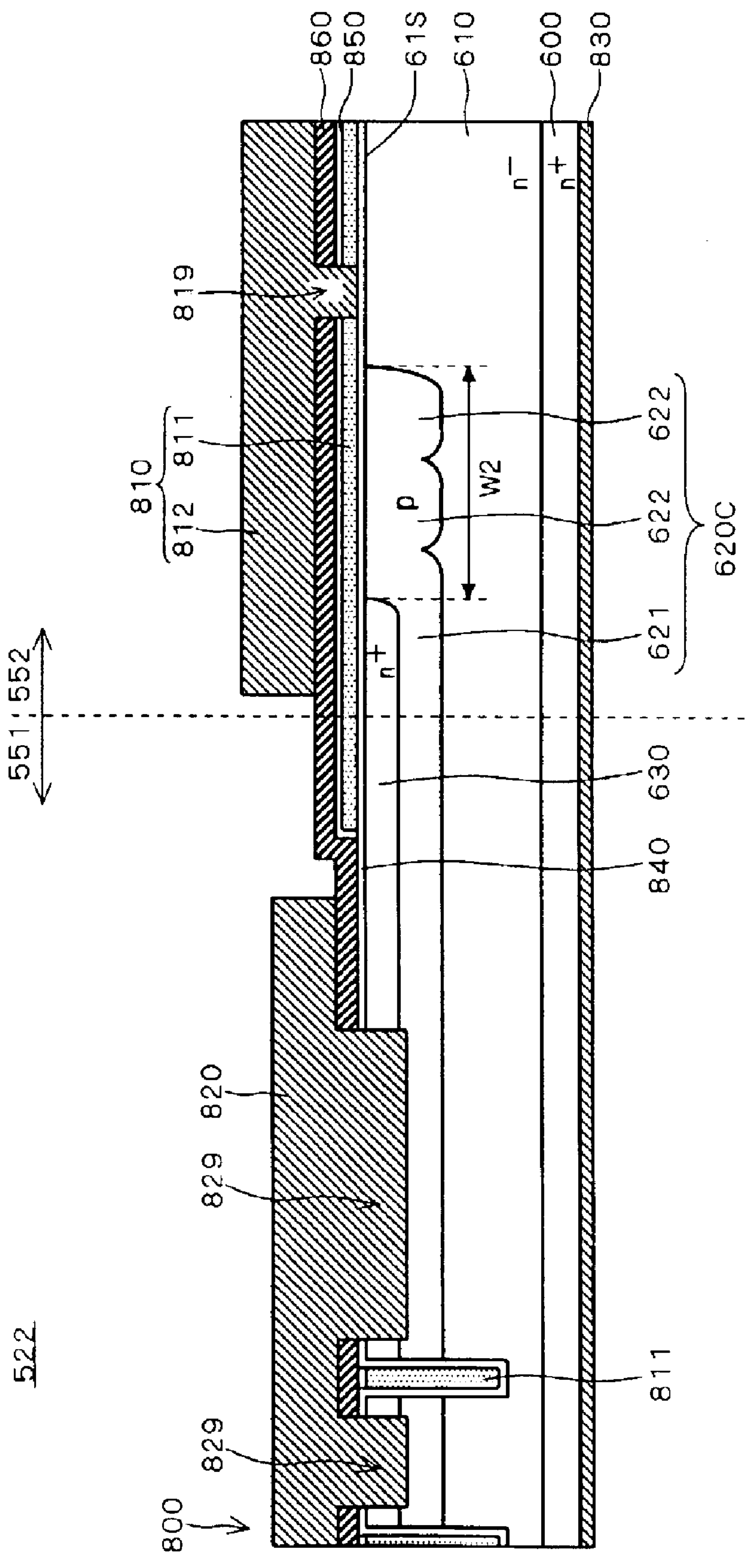
FIG. 128 is a cross-sectional view taken along line 128—128 of FIG. 126.

FIG. 126 shows a plan view for explaining a power semiconductor device 522 according to a twenty-second preferred embodiment, FIG. 127 shows a cross-sectional view taken along line 127—127 of FIG. 126, and FIG. 128 shows a cross-sectional view taken along line 128—128 of FIG. 126.

The power semiconductor device 522 has a configuration achieved by a combination of the semiconductor device 510 (see FIGS. 79–81) and the semiconductor device 515 (see FIGS. 105–107). More specifically, the semiconductor device 522 is configured by providing a p-type layer 620C with a plurality of second portions 622 in the semiconductor device 510 (see FIGS. 79–81) as in the semiconductor device 515 (see FIGS. 105–107), and the other parts of the configuration of the semiconductor device 522 are basically identical to those of the semiconductor device 510. In other words, the semiconductor device 522 is configured by removing the first through third insulators 710B, 720 and 730 from the previously described semiconductor device 515 (see FIGS. 105–107), and the other parts of the configuration of the semiconductor device 522 are basically identical to those of the previously described semiconductor device 515. The semiconductor device 522 can be manufactured by, for example, a combination of the manufacturing methods of the semiconductor devices 510 and 515.

The power semiconductor device 522 can achieve the same effect as the power semiconductor devices 510 and 515.

Twenty-Third Preferred Embodiment

Figure 130:
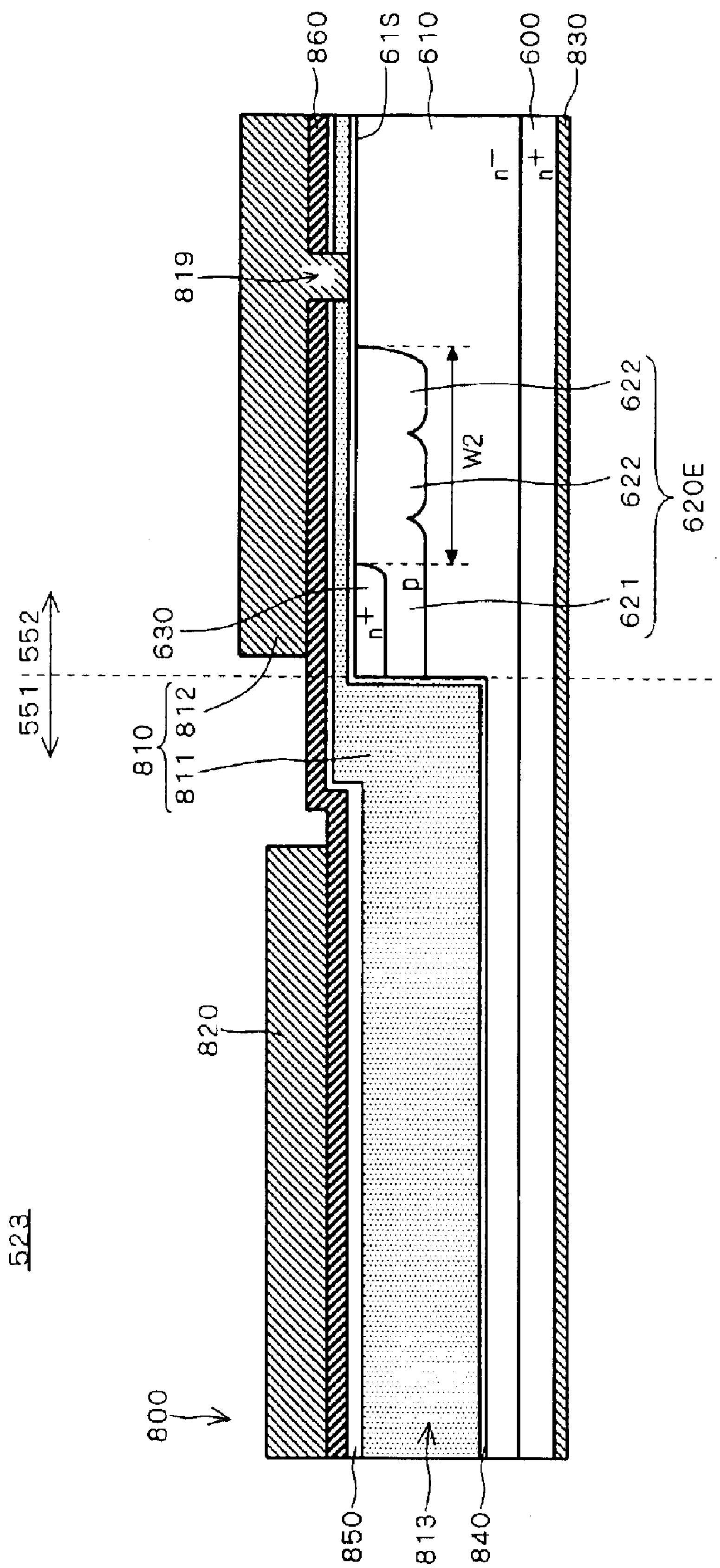
FIG. 130 is a cross-sectional view taken along line 130—130 of FIG. 129.
Figure 131:
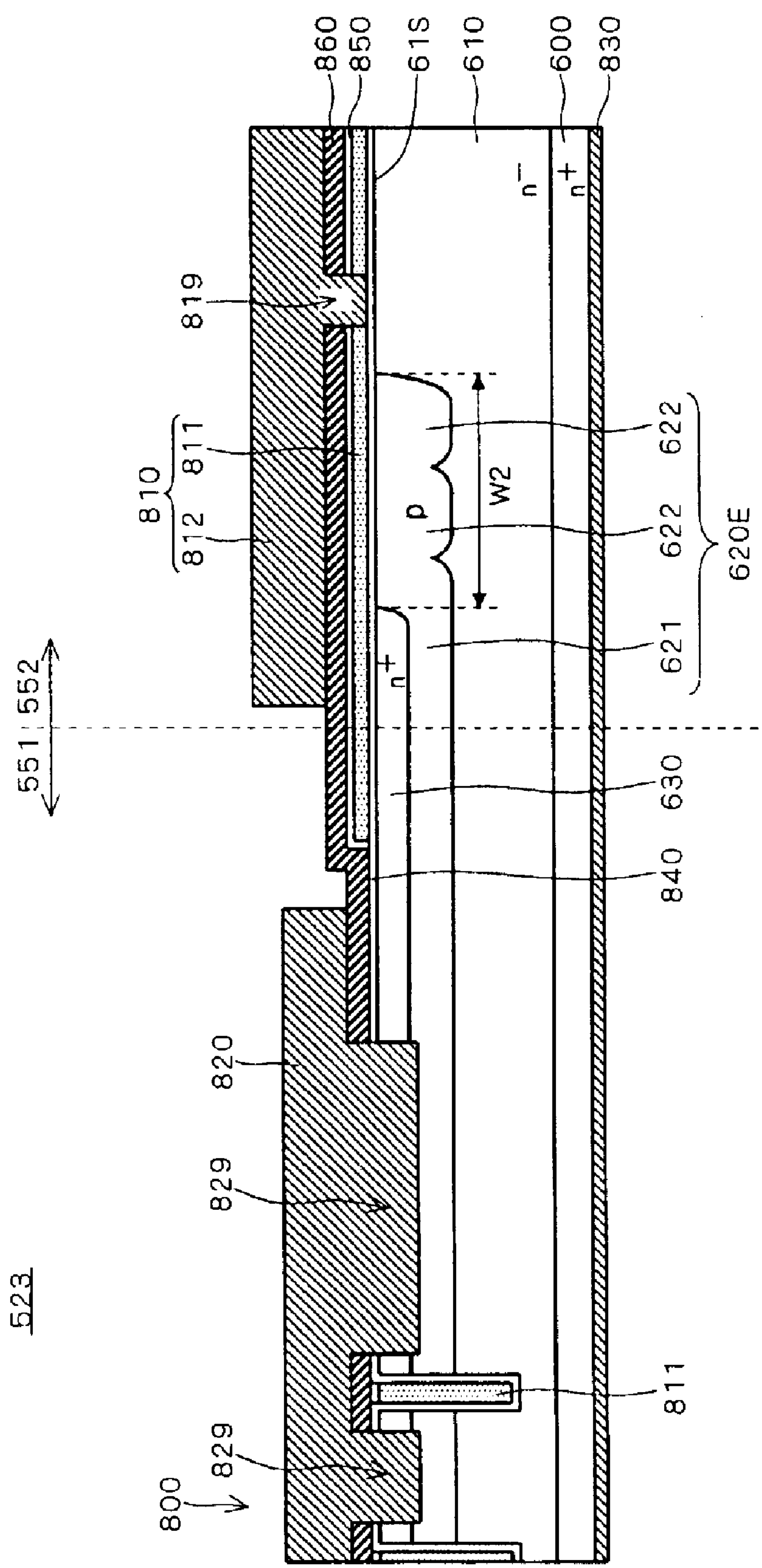
FIG. 131 is a cross-sectional view taken along line 131—131 of FIG. 129.

FIG. 129 shows a plan view for explaining a power semiconductor device 523 according to a twenty-third preferred embodiment, FIG. 130 shows a cross-sectional view taken along line 130—130 of FIG. 129, and FIG. 131 shows a cross-sectional view taken along line 131—131 of FIG. 129.

The power semiconductor device 523 has a configuration achieved by a combination of the semiconductor device 510 (see FIGS. 79–81) and the semiconductor device 516 (see FIGS. 108–110). More specifically, the semiconductor device 523 is configured by replacing the p-type layer 620C in the semiconductor device 510 (see FIGS. 79–81) with the p-type layer 620E in the semiconductor device 516 (see FIGS. 108–110), and the other parts of the configuration of the semiconductor device 523 are basically identical to those of the semiconductor device 510. In other words, the semiconductor device 523 is configured by removing the first through third insulators 720C, 720 and 730 from the previously described semiconductor device 516 (see FIGS. 108–110), and the other parts of the configuration of the semiconductor device 523 are basically identical to those of the previously described semiconductor device 516. The semiconductor device 523 can be manufactured by, for example, a combination of the manufacturing methods of the semiconductor devices 510 and 516.

The power semiconductor device 523 can achieve the same effect as the power semiconductor devices 510 and 516.

Twenty-Fourth Preferred Embodiment

Figure 132:
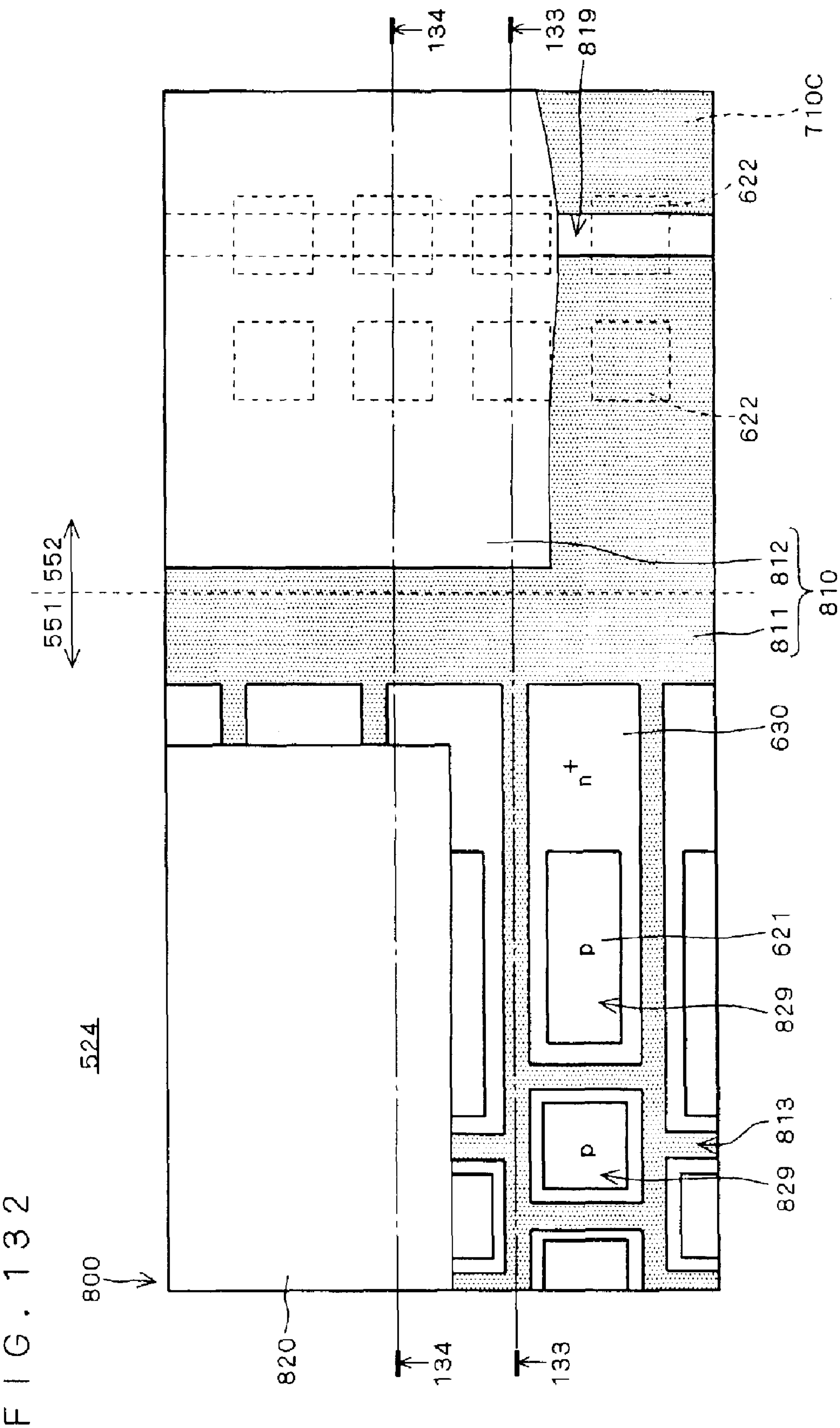
FIG. 132 is a plan view for explaining a power semiconductor device according to a twenty-fourth preferred embodiment.
Figure 133:
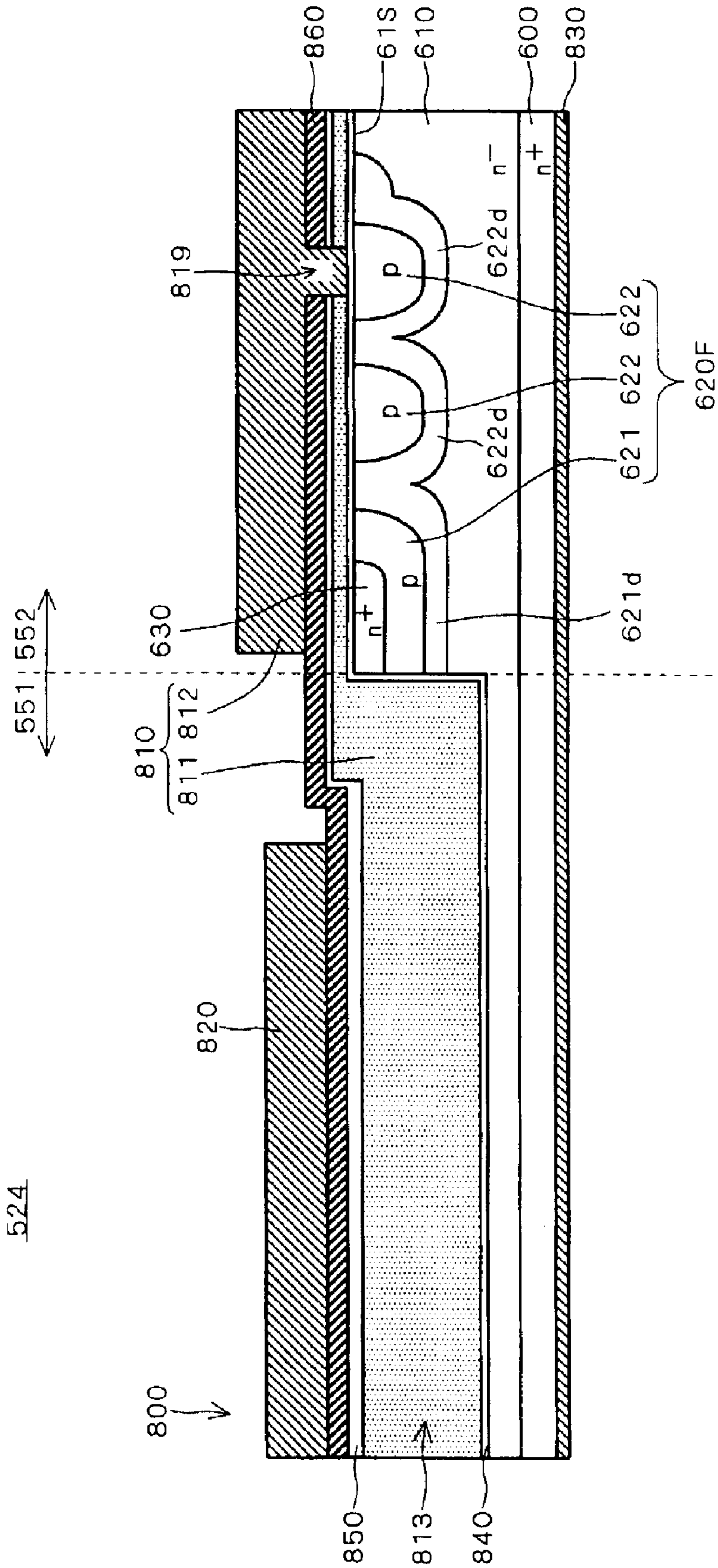
FIG. 133 is a cross-sectional view taken along line 133—133 of FIG. 132.
Figure 134:
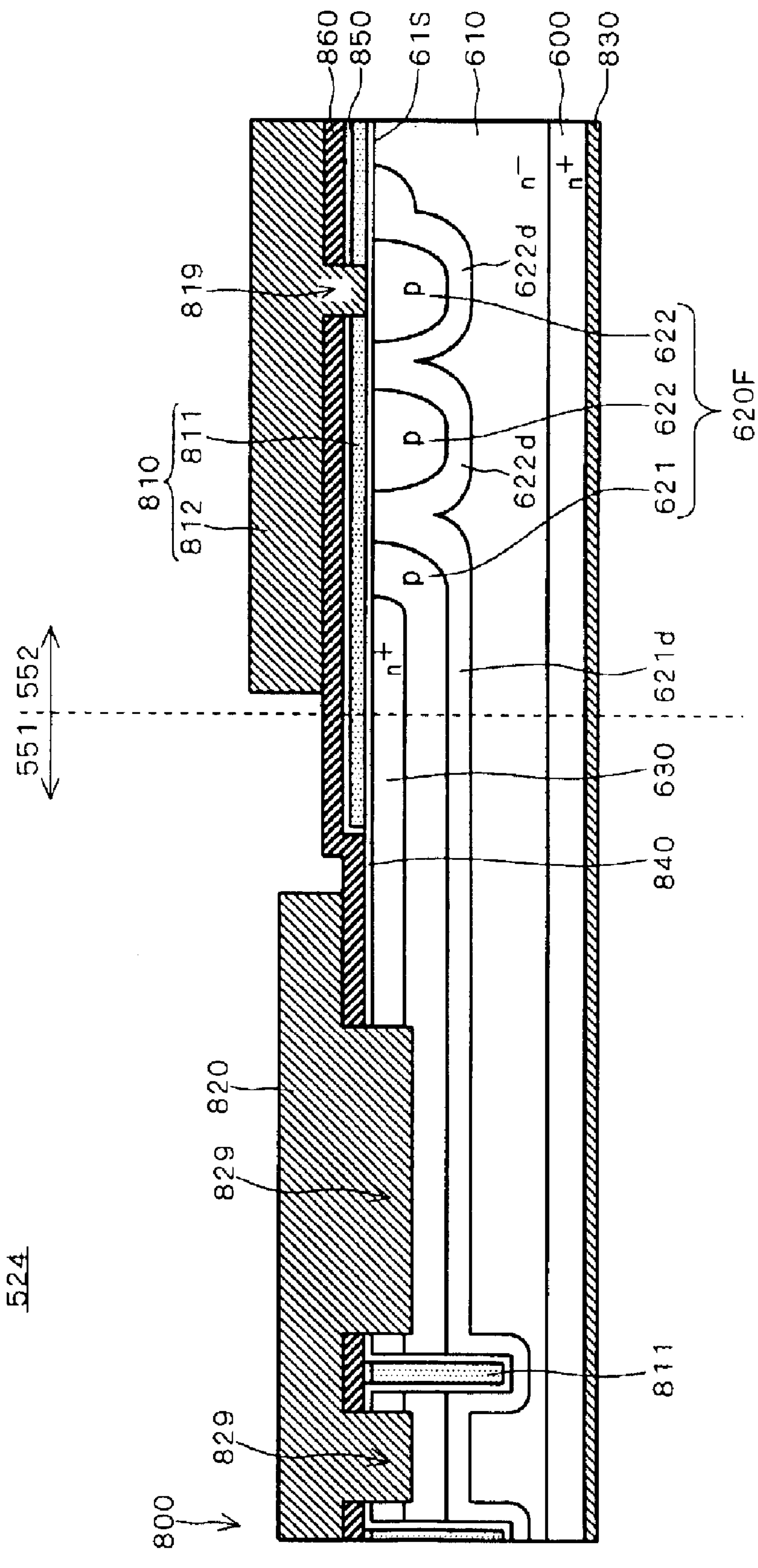
FIG. 134 is a cross-sectional view taken along line 134—134 of FIG. 132.

FIG. 132 shows a plan view for explaining a power semiconductor device 524 according to a twenty-fourth preferred embodiment, FIG. 133 shows a cross-sectional view taken along line 133—133 of FIG. 132, and FIG. 134 shows a cross-sectional view taken along line 134—134 of FIG. 132.

The power semiconductor device 524 has a configuration achieved by a combination of the semiconductor device 510 (see FIGS. 79–81) and the semiconductor device 517 (see FIGS. 111–113). More specifically, the semiconductor device 524 is configured by replacing the p-type layer 620C in the semiconductor device 510 (see FIGS. 79–81) with the p-type layer 620F in the semiconductor device 517 (see FIGS. 111–113), and the other parts of the configuration of the semiconductor device 524 are basically identical to those of the semiconductor device 510. In other words, the semiconductor device 524 is configured by removing the first through third insulators 710C, 720 and 730 from the semiconductor device 517 (see FIGS. 111–113), and the other parts of the configuration of the semiconductor device 524 are basically identical to those of the semiconductor device 517. The semiconductor device 524 can be manufactured by, for example, a combination of the manufacturing methods of the semiconductor devices 510 and 517.

The power semiconductor device 524 can achieve the same effect as the power semiconductor devices 510 and 517.

Twenty-Fifth Preferred Embodiment

FIGS. 135 and 136 are cross-sectional views for explaining a semiconductor device 525 according to a twenty-fifth preferred embodiment. FIGS. 135 and 136 correspond to, for example, FIGS. 3 and 4. The power semiconductor device 525 is configured by replacing the $n^+$-type substrate 600 in the previously described semiconductor device 501 (see FIGS. 3 and 4) with a $p^+$-type silicon substrate 600B which contains a high concentration of p-type impurities, and the other parts of the configuration of the semiconductor device 525 are basically identical to those of the semiconductor device 501. That is, the semiconductor device 525 employs an IGBT (Insulated Gate Bipolar Transistor) as the power semiconductor element 800. The semiconductor device 525 can also achieve the same effect as the semiconductor device 501.

The semiconductor device 525 has a so-called non-punchthrough (NPT) structure having no buffer, but it can be modified to have a punchthrough (PT) structure provided with an $n^+$-type layer as a buffer between the $p^+$-type substrate 600B and the epitaxial layer 610. The IGBT is also applicable to the semiconductor devices 502 through 524. Further, the aforementioned high voltage proof structures and the like of the semiconductor devices 501 through 525 are applicable to, for example, a high-voltage integrated circuit (HVIC) that packages an inverter, a driving circuit for the inverter, a protective circuit and the like in a single chip.

Modifications of First through Twenty-Fifth Preferred Embodiment

Besides the aforementioned examples, various combinations of the components of the power semiconductor devices 501 through 525 are possible. For example, the first portion 621 of the p-type layer 620C (see, for example, FIGS. 60 and 61) and the p-type layer 620D (see, for example, FIGS. 100 and 101) may be replaced with the p base layer 621B (see, for example, FIGS. 46 and 47), and such semiconductor devices can also achieve the previously described effect.

Further, even if the conductivity type of the semiconductor is changed in, for example, the power semiconductor device 501, the same effect can be achieved. That is, a p-channel type power MOSFET may be applied as the power semiconductor element 800 of the semiconductor device 501.

Still further, insulators other than silicon oxide is also applicable to the gate insulating film 840. In view of this fact, it can be said that the power semiconductor element 800 includes a MIS (Metal Insulator Semiconductor) transistor structure.

Still further, a barrier metal may be inserted between aluminum electrode and silicon, e.g., between the gate aluminum electrode 812 and the gate polysilicon electrode 811. This reduces interconnect resistance, thereby achieving improved characteristics.

Still further, semiconductor materials and insulator materials are not limited to silicon and silicon oxide suggested in the aforementioned examples. Also, the electrodes 811 and 811B may be formed of electrode materials such as W—Si or Al other than polysilicon, and the drain electrode 830 may be formed of electrode materials such as Ti—Ni—Ag alloy or Al—Mo—Ni—Au-alloy other than Ti—Ni—Au alloy. Also in those cases, the previously described effect can be achieved.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device including a power semiconductor element within an element configuration part having a central region and an outer peripheral region, comprising:

a first semiconductor layer of a first conductivity type including a main surface extending across said central region and said outer peripheral region;

a first insulator provided on said main surface to have a first opening within said central region and including a side surface forming said first opening;

a second insulator provided on said side surface of said first insulator to narrow said first opening;

a second semiconductor layer of a second conductivity type opposite said first conductivity type, provided in said main surface and including a first portion which forms part of said power semiconductor element within said central region and which extends on the side of said outer peripheral region to face said first insulator; and a third semiconductor layer of said first conductivity type provided in a portion of said main surface where said first portion is provided, forming another part of said power semiconductor element in said central region in said portion where said first portion is provided, and extending on the side of said outer peripheral region to be in contact with said second insulator, the third semiconductor layer not being in contact with said first insulator.

2. The power semiconductor device according to claim 1, wherein said first insulator further includes at least one second opening which is provided outside said first portion of said second semiconductor layer and which extends to said main surface, and said second semiconductor layer further includes at least one second portion of said second conductivity type which is provided in said main surface to face said at least one second opening.

3. The power semiconductor device according to claim 2, wherein said at least one second portion is spaced from said first portion, but it is located such that, during operation of said power semiconductor device, a depletion layer generated in the vicinity of said at least one second portion is connected to a depletion layer generated in the vicinity of said first portion.

4. The power semiconductor device according to claim 3, wherein said at least one second portion includes a plurality of second portions spaced from each other and located such that, during said operation, a depletion layer generated in the vicinity of each of said second portions is connected to a depletion layer generated in the vicinity of adjacent one of said second portions.

5. The power semiconductor device according to claim 2, wherein said at least one second portion is connected to said first portion.

6. The power semiconductor device according to claim 2, wherein said at least one second opening is provided in a linear or scattered manner.

7. The power semiconductor device according to claim 1, wherein said power semiconductor element includes a MIS transistor structure having two main electrodes which are provided to sandwich said first through third semiconductor layers in a direction of stack of said first through third semiconductor layers, and a control electrode for controlling a path between said two main electrodes, and one of said two main electrodes and said control electrode is provided to face said main surface with said first insulator sandwiched in between and to extend away from said central region beyond said second semiconductor layer.

8. The power semiconductor device according to claim 1, wherein said first portion of said second semiconductor layer has an end portion which extends deeper than a portion thereof within said central region.

9. The power semiconductor device according to claim 1, wherein said power semiconductor element includes a MIS transistor structure having two main electrodes which are provided to sandwich said first through third semiconductor layers in a direction of stack of said first through third semiconductor layers, and a control electrode for controlling a path between said two main electrodes, said control electrode not extending into said outer peripheral region.

10. A method of manufacturing a power semiconductor device including a power semiconductor element within an element configuration part having a central region and an outer peripheral region, comprising the steps of:

(a) preparing a first semiconductor layer of a first conductivity type, said first semiconductor layer having a main surface extending across said central region and said outer peripheral region;

(b) forming a first insulating film on said main surface across said central region and said outer peripheral region;

(c) opening said first insulating film to form a first insulator having at least one opening;

(d) ion implanting impurities of a second conductivity type opposite said first conductivity type through said at least one opening;

(e) carrying out heat treatment after said step (d);

(f) forming a second insulating film to fill in said at least one opening; and (g) etching back said second insulating film, said at least one opening including a first opening within said central region, said step (c) including the step of (c-1) forming said first opening in said first insulating film, said step (d) including the step of (d-1) ion implanting said impurities of said second conductivity type through said first opening, to form a first portion of a second semiconductor layer of said second conductivity type in said main surface, said step (g) including the step of (g-1) forming a second insulator from said second insulating film on a side surface of said first insulator which forms said first opening, to narrow said first opening, said manufacturing method further comprising the step of:

(h) after said step (g), ion implanting impurities of said first conductivity type through said first opening under conditions where said second insulator is present, to form a third semiconductor layer of said first conductivity type in a portion of said main surface where said first portion is provided.

11. The method of manufacturing a power semiconductor device according to claim 10, further comprising the step of:

(i) after said step (h), removing said first and second insulators.

12. The method of manufacturing a power semiconductor device according to claim 10, wherein said at least one opening further includes at least one second opening within said outer peripheral region, said step (c) further includes the step of (c-2) forming said at least one second opening in said first insulating film within said outer peripheral region, said step (d) further includes the step of (d-2) ion implanting said impurities of said second conductivity type through said at least one second opening, to form at least one second portion of said second semiconductor layer in said main surface, and said step (g) further includes the step of (g-2) forming at least one third insulator from said second insulating film in said at least one second opening, to close said at least one second opening.

13. The method of manufacturing a power semiconductor device according to claim 12, further comprising the step of:

(j) after said step (h), removing said first through third insulators.

14. The method of manufacturing a power semiconductor device according to claim 12, wherein the location and size of said at least one second opening and the conditions for said steps (d-2) and (e) are set such that said at least one second portion is spaced from said first portion, but during operation of said power semiconductor device, a depletion layer generated in the vicinity of said at least one second portion is connected to a depletion layer generated in the vicinity of said first portion.

15. The method of manufacturing a power semiconductor device according to claim 14, wherein said at least one second portion includes a plurality of second portions spaced from each other, and the location and size of said at least one second opening and the conditions for said steps (d-2) and (e) are set such that, during said operation, a depletion layer generated in the vicinity of each of said second portions is connected to a depletion layer generated in the vicinity of adjacent one of said second portions.

16. The method of manufacturing a power semiconductor device according to claim 12, wherein the location and size of said at least one second opening and the conditions for said steps (d-2) and (e) are set such that said at least one second portion is connected to said first portion.

17. The method of manufacturing a power semiconductor device according to claim 12, wherein said step (c-2) includes the step of forming said at least one second opening in a linear or scattered manner.

18. The method of manufacturing a power semiconductor device according to claim 10, wherein said power semiconductor element includes a MIS transistor structure having two main electrodes which are provided to sandwich said first through third semiconductor layers in a direction of stack of said first through third semiconductor layers, and a control electrode for controlling a path between said two main electrodes, said manufacturing method further comprising the step of:

(k) forming one of said two main electrodes and said control electrode to face said main surface and to extend away from said central region beyond said second semiconductor layer.

19. The method of manufacturing a power semiconductor device according to claim 10, wherein said first portion of said second semiconductor layer has an end portion which extends deeper than a subportion thereof within said central region, and said step (d-1) further includes the steps of:

forming said subportion of said first portion within said central region; and forming said end portion of said first portion.

20. The method of manufacturing a power semiconductor device according to claim 10, wherein said power semiconductor element includes a MIS transistor structure having two main electrodes which are provided to sandwich said first through third semiconductor layers in a direction of stack of said first through third semiconductor layers, and a control electrode for controlling a path between said two main electrodes, said manufacturing method further comprising the step of:

(l) forming said control electrode not to extend into said outer peripheral region.

21. The power semiconductor device according to claim 1, wherein said second insulator is in contact with said side surface of said first insulator.

22. A power semiconductor device including a power semiconductor element within an element configuration part having a central region and an outer peripheral region, comprising:

a first semiconductor layer of a first conductivity type including a main surface extending across said central region and said outer peripheral region;

a first insulator provided on said main surface to have a first opening within said central region and including a side surface forming said first opening;

a second insulator provided on said side surface of said first insulator to narrow said first opening;

a second semiconductor layer of a second conductivity type opposite said first conductivity type, provided in said main surface and including a first portion which forms part of said power semiconductor element within said central region and which extends on the side of said outer peripheral region to face said first insulator; and a third semiconductor layer of said first conductivity type provided in a portion of said main surface where said first portion is provided, forming another part of said power semiconductor element in said central region in said portion where said first portion is provided, and extending on the side of said outer peripheral region to face said second insulator, wherein said first insulator further includes at least one second opening which is provided outside said first portion of said second semiconductor layer and which extends to said main surface, and said second semiconductor layer further includes at least one second portion of said second conductivity type which is provided in said main surface to face said at least one second opening.

23. The power semiconductor device according to claim 22, wherein said at least one second portion is spaced from said first portion, but it is located such that, during operation of said power semiconductor device, a depletion layer generated in the vicinity of said at least one second portion is connected to a depletion layer generated in the vicinity of said first portion.

24. The power semiconductor device according to claim 23, wherein said at least one second portion includes a plurality of second portions spaced from each other and located such that, during said operation, a depletion layer generated in the vicinity of each of said second portions is connected to a depletion layer generated in the vicinity of adjacent one of said second portions.

25. The power semiconductor device according to claim 22, wherein said at least one second portion is connected to said first portion.

26. The power semiconductor device according to claim 22, wherein said at least one second opening is provided in a linear or scattered manner.

27. A power semiconductor device including a power semiconductor element within an element configuration part having a central region and an outer peripheral region, comprising:

a first semiconductor layer of a first conductivity type including a main surface extending across said central region and said outer peripheral region;

a first insulator provided on said main surface to have a first opening within said central region and including a side surface forming said first opening;

a second insulator provided on said side surface of said first insulator to narrow said first opening;

a second semiconductor layer of a second conductivity type opposite said first conductivity type, provided in said main surface and including a first portion which forms part of said power semiconductor element within said central region and which extends on the side of said outer peripheral region to face said first insulator; and a third semiconductor layer of said first conductivity type provided in a portion of said main surface where said first portion is provided, forming another part of said power semiconductor element in said central region in said portion where said first portion is provided, and extending on the side of said outer peripheral region to face said second insulator, wherein said power semiconductor element includes a MIS transistor structure having two main electrodes which are provided to sandwich said first through third semiconductor layer in a direction of stack of said first through third semiconductor layers,and a control electrode for controlling a path between said two main electrodes, and one of said two main electrodes and said control electrode is provided to face said main surface with said first insulator sandwiched in between and to extend away from said central region beyond said second semiconductor layer.

28. A power semiconductor device including a power semiconductor element within an element configuration part having a central region and an outer peripheral region, comprising:

a first semiconductor layer of a first conductivity type including a main surface extending across said central region and said outer peripheral region;

a first insulator provided on said main surface to have a first opening within said central region and including a side surface forming said first opening;

a second insulator provided on said side surface of said first insulator to narrow said first opening;

a second semiconductor layer of a second conductivity type opposite said first conductivity type, provided in said main surface and including a first portion which forms part of said power semiconductor element within said central region and which extends on the side of said outer peripheral region to face said first insulator; and a third semiconductor layer of said first conductivity type provided in a portion of said main surface where said first portion is provided, forming another part of said power semiconductor element in said central region in said portion where said first portion is provided, and extending on the side of said outer peripheral region to face said second insulator, wherein said first portion of said second semiconductor layer has an end portion which extends deeper than a portion thereof within said central region.

* * * * *